United States Patent [19]
Tobita et al.

[11] Patent Number: 6,078,520
[45] Date of Patent: Jun. 20, 2000

[54] FLASH MEMORY CONTROL METHOD AND INFORMATION PROCESSING SYSTEM THEREWITH

[75] Inventors: Tsunehiro Tobita; Jun Kitahara, both of Yokohama; Takashi Tsunehiro, Ebina; Kunihiro Katayama, Yokohama; Ryuichi Hattori, Kawasaki; Yukihiro Seki, Yokohama; Hajime Yamagami, Ebina; Takashi Totsuka, Machida; Takeshi Wada, Akishima; Yosio Takaya, Funabashi; Manabu Saito, Chiba-ken; Kenichi Kaki, Zama; Takao Okubo, Oume; Takashi Kikuchi, Sagamihara; Masamichi Kishi, Tachikawa; Takeshi Suzuki, Inagi; Shigeru Kadowaki, Akishima, all of Japan

[73] Assignees: Hitachi, Ltd.; Hitachi Keiyo Engineering Co., Ltd.; Hitachi ULSI, all of Tokyo, Japan

[21] Appl. No.: 09/357,931

[22] Filed: Jul. 21, 1999

Related U.S. Application Data

[60] Continuation of application No. 09/182,630, Oct. 30, 1995, Pat. No. 5,973,964, which is a division of application No. 08/640,998, Apr. 30, 1996, Pat. No. 5,862,083, which is a division of application No. 08/225,313, Apr. 8, 1994, Pat. No. 5,530,673.

[30] Foreign Application Priority Data

| Apr. 8, 1993 | [JP] | Japan | 5-81642 |
| May 25, 1993 | [JP] | Japan | 5-122401 |
| Jul. 14, 1993 | [JP] | Japan | 5-174372 |
| Jul. 15, 1993 | [JP] | Japan | 5-175619 |
| Oct. 1, 1993 | [JP] | Japan | 5-246520 |

[51] Int. Cl.[7] ................................................ G11C 17/00
[52] U.S. Cl. ............... 365/185.09; 365/200; 365/185.33; 365/185.29; 365/185.11; 365/230.03
[58] Field of Search .................. 365/185.01, 185.09, 365/200, 185.33, 185.29, 185.11, 230.03

[56] References Cited

U.S. PATENT DOCUMENTS

| 4,530,054 | 7/1985 | Hamstra et al. ........................ 364/200 |
| 4,563,752 | 1/1986 | Pelgrom et al. ........................ 364/900 |
| 4,899,272 | 2/1990 | Fung et al. ........................ 365/230.03 |

(List continued on next page.)

FOREIGN PATENT DOCUMENTS

0392895   10/1990   European Pat. Off. .

(List continued on next page.)

OTHER PUBLICATIONS

Patent Abstracts of Japan, vol. 16, No. 382, Aug. 14, 1992.

(List continued on next page.)

*Primary Examiner*—Viet Q. Nguyen
*Attorney, Agent, or Firm*—Antonelli, Terry, Stout & Kraus, LLP

[57] ABSTRACT

A control method and system when a flash memory is used as a semiconductor disk or a main memory in an information processing system. A semiconductor file system comprises a first nonvolatile memory electrically erasable, a second nonvolatile memory not electrically erasable, a volatile memory, a controller which controls the memories, and a control section which controls the controller wherein a physical address corresponding to a logical address specified from an external system is accessed. The first nonvolatile memory stores data for the external system to perform operations, first management information indicating the correspondence between physical addresses at which the data is stored and logical addresses, and second management information indicating a state of the first nonvolatile memory. The second nonvolatile memory previously stores interface information required for inputting and outputting the data from and to the external system and read-only data of the data. The controller has a control means for determining a physical sector address forming predetermined high-order bits of the physical address when data is output from the first nonvolatile memory or when data is input to the volatile memory, means for storing the determined physical sector address, and means for consecutively generating addresses in a sector determined by the physical sector address.

8 Claims, 103 Drawing Sheets

U.S. PATENT DOCUMENTS

| | | | |
|---|---|---|---|
| 4,924,375 | 5/1990 | Fung et al. | 364/200 |
| 5,043,940 | 8/1991 | Harari | 365/168 |
| 5,053,990 | 10/1991 | Kreifels et al. | 395/425 |
| 5,065,364 | 11/1991 | Atwood et al. | 365/218 |
| 5,245,572 | 9/1993 | Kosonocky et al. | 365/218 |
| 5,263,003 | 11/1993 | Cowles et al. | 365/900 |
| 5,267,218 | 11/1993 | Elbert | 365/900 |
| 5,268,870 | 12/1993 | Harari | 365/218 |
| 5,280,447 | 1/1994 | Hazen et al. | 365/218 |
| 5,295,255 | 3/1994 | Malecek et al. | 395/425 |
| 5,297,148 | 3/1994 | Harari et al. | 371/102 |
| 5,341,339 | 8/1994 | Wells | 365/218 |
| 5,341,489 | 8/1994 | Heiberger et al. | 395/425 |
| 5,357,473 | 10/1994 | Mizuno et al. | 365/201 |
| 5,359,569 | 10/1994 | Fujita et al. | 365/229 |
| 5,418,752 | 5/1995 | Harari et al. | 365/218 |
| 5,437,020 | 7/1995 | Wells et al. | 395/425 |
| 5,530,673 | 6/1996 | Tobita et al. | 365/185.09 |
| 5,530,828 | 6/1996 | Kaki et al. | 395/430 |
| 5,535,328 | 7/1996 | Harari et al. | 365/218 |
| 5,544,356 | 8/1996 | Robinson et al. | 395/600 |
| 5,572,446 | 11/1996 | Sukegawa | 365/185.33 |
| 5,572,466 | 11/1996 | Sukegawa | 365/185.33 |
| 5,663,901 | 9/1997 | Wallace et al. | 711/103 |
| 5,671,229 | 9/1997 | Harari | 365/200 |
| 5,689,676 | 11/1997 | Hirose et al. | 711/103 |
| 5,696,917 | 12/1997 | Mills et al. | 710/35 |
| 5,696,929 | 12/1997 | Hasbun . | |
| 5,719,808 | 2/1998 | Harari | 365/185.33 |
| 5,737,764 | 4/1998 | Shigeeda | 711/170 |
| 5,778,425 | 7/1998 | Shigeeda | 711/122 |
| 5,805,854 | 9/1998 | Shigeeda | 365/201 |
| 5,862,083 | 1/1999 | Tobita et al. | 365/185.09 |

FOREIGN PATENT DOCUMENTS

| | | |
|---|---|---|
| 0492106 | 7/1992 | European Pat. Off. . |
| 0522780 | 1/1993 | European Pat. Off. . |
| 0569040 | 11/1993 | European Pat. Off. . |
| 0615193 | 9/1994 | European Pat. Off. . |
| 2840305 | 3/1980 | Germany . |
| 3200872 | 7/1983 | Germany . |
| 62-036799 | 2/1987 | Japan . |
| 1-235075 | 9/1989 | Japan . |
| 2-189790 | 7/1990 | Japan . |
| 2-292798 | 12/1990 | Japan . |
| 3-25798 | 2/1991 | Japan . |
| 3-30034 | 2/1991 | Japan . |
| 3-283094 | 12/1991 | Japan . |
| 4-123243 | 4/1992 | Japan . |
| 4-243096 | 8/1992 | Japan . |
| 5-027924 | 2/1993 | Japan . |
| 5-028039 | 2/1993 | Japan . |
| 5-204561 | 8/1993 | Japan . |
| 5-241741 | 9/1993 | Japan . |
| 2251323 | 7/1992 | United Kingdom . |
| 2251324 | 7/1992 | United Kingdom . |
| WO92/18928 | 10/1992 | WIPO . |
| WO93/11491 | 6/1993 | WIPO . |

OTHER PUBLICATIONS

Patent Abstract of Japan, vol. 10, No. 30, Feb. 5, 1986.

Computer Technology Review, "Flash Memory for Top Speeds in Mobile Computing", vol. 12, No. 7, Jun. 1992, pp. 36–37.

Communications of the Association for Computing Machinery, "Asymmetric Memory Hierarchies", vol. 16, No. 4, Apr., 1973, pp. 213–222.

FULL WHEN 128

FIG. 60

TRANSLATION TABLE

| LOGICAL ADDRESS | WRITE BUFFER MEMORY | FLASH MEMORY (PHYSICAL SECTOR NO.) | | FLAG |
|---|---|---|---|---|
| | BLOCK NO. | CHIP NO. | SECTOR NO. | |
| 0 | 1 | 0 | 3 | 1 |
| 1 | 2 | 1 | 2 | 1 |
| 2 | 3 | 2 | 7 | 1 |
| 3 | 0 | 0 | 0 | 0 |
| ⋮ | ⋮ | ⋮ | ⋮ | ⋮ |

FLASH MEMORY CONTROL METHOD AND INFORMATION PROCESSING SYSTEM THEREWITH

CROSS-REFERENCE TO RELATED APPLICATIONS

This application is a continuation of application Ser. No. 09/182,630, filed Oct. 30, 1998, now U.S. Pat. No. 5,973,964, which is a divisional of application Ser. No. 08/640,998, filed Apr. 30, 1996, now U.S. Pat. No. 5,862,083, which, in turn, was a divisional of application Ser. No. 08/225,313, filed Apr. 8, 1994, now U.S. Pat. No. 5,530,673, the entire disclosures of which are incorporated herein by reference.

BACKGROUND OF THE INVENTION

1. Field of the Invention

This invention relates to a control method and system when a flash memory is used as a semiconductor disk or a main memory in an information processing system.

2. Description of the Related Art

A flash memory is available as one of the memories used with small information devices, machines, etc. The flash memory has the following four advantages as a promising memory replacing a hard disk:
1. Data is retained in a flash memory even if power is turned off (data in DRAM is lost when power is turned off).
2. Reading of data of a flash memory is relatively fast as compared with a hard disk.
3. A flash memory semiconductor device has good resistance to vibration as compared with that of a hard disk.
4. A flash memory is less expensive as compared with a SRAM.

However, the flash memory has the following disadvantages:
1. When data is written, the write area contents must have been erased.
2. Erasure is made in chip units or block units of a given size.
3. It takes time for a write operation to be implemented for reasons 1 and 2.
4. Since elements are degraded by repeating a write operation, the write count is limited.

FIG. 97 is a schematic diagram of a flash memory containing 1024 blocks each consisting of 512 bytes (524288 bytes in total). In FIG. 97, numeral 4110 denotes one block in the flash memory and numeral 4111 denotes a 1-byte data retention section in the block 4110, which will be hereinafter referred to as a cell. Numeral 4105 is a control circuit. When a read access is made to the flash memory, data is read from the cell determined by address signal A0–A8, a buffer 4121, and a decoder 4122 in the block determined by address signal A9–A18, a buffer 4131, and a decoder 4132, and is output via a register 4141 to I/O0–I/O7. Numeral 4123 is a control signal of the buffer 4121 and the decoder 4122. Numeral 4133 is a control signal of the buffer 4131 and the decoder 4132. Numeral 4142 is a control signal of the register 4141. On the other hand, when a write access is made to the flash memory in FIG. 97, the contents of the block determined by the address signal A9–A18, the buffer 4131, and the decoder 4132 are erased and input data from I/O0–I/O7 is written via the register 4141 into the cell determined by the address signal A0–A8, the buffer 4121, and the decoder 4122. Numeral 401 is a control signal of the controller 4105.

The limit of the write count mentioned above will introduce a serious problem with the use of the flash memory as storage media of a semiconductor disk. For example, data is written into areas such as a directory and FAT (file allocation table) on a disk more frequently than other areas, that is, data is frequently written into only specific blocks of the flash memory allocated to the directory and FAT and there is a good chance that the write count limit of the flash memory will be exceeded in the specific blocks faster than in other blocks. If the write count limit is exceeded, the elements are degraded and it may be impossible to carry out a normal read or write. If a directory or FAT on a disk is destroyed, the entire disk cannot be read. Therefore, malfunction only in specific blocks makes the entire semiconductor disk unusable, leading to poor efficiency.

A flash EEPROM (electrically erasable and programmable read only memory) system is described in Japanese Patent Laid-Open No.Hei 2-292798 as the related art of a file storage using a flash memory as storage media.

The related art provides a corrective action when a defective cell occurs in the flash memory. For example, the related art proposes that alternate cells are provided and that error correction control is performed so as to correct data disordered due to occurrence of a defective cell to normal data, whereby the write count limit as the disadvantage of the flash memory is overcome and the system life is extended. Also, the system is provided with a write cache memory and write back into the flash memory is executed based on the elapsed time from the last write into the cache memory. Data frequently rewritten is rewritten into the cache memory rather than the flash memory to reduce the operation of the flash memory in order to extend the over all system life.

In the error correction control, an error correction code is given for each sector (512 bytes), which is a storage unit of the flash memory conforming to a storage unit of the magnetic disk apparatus and when a data error occurs due to an element failure, it is detected and corrected based on the error correction code, thereby substantially increasing the number of times a write operation can be made. In the time monitor control of file rewrite, specifically the time until a once written file is next rewritten is monitored and if the file is not the longest unrewritten file, the data in the file is stored in a volatile buffer (cache memory) in order to reduce the substantial write count of the flash memory for frequently rewritten files such as a directory and FAT.

The idea is intended to ensure the practical life of a storage using the flash memory.

However, to use the error correction codes, it requires much time and enormous throughput to generate the codes and detect and correct errors, lowering performance and complicating circuitry.

Use of the volatile buffer memory (cache memory) is not intended for covering slow rewrite which is another disadvantage of the flash memory. Frequently rewritten files are stored in the cache memory, but a large file cannot be stored in the cache memory.

For example, a large file first written is written directly into a flash memory having slow write speed rather than a cache memory, thus a write access becomes slow. For large-capacity continuous data that can be accessed at high speed on a magnetic disk unit, the file system is very inferior to the magnetic disk unit in access performance.

In Japanese Patent Laid-Open No.Hei 5-204561 filed previously by the present applicant, to solve the problem, an alternate memory area is provided to prolong the semiconductor disk life. However, since the alternate memory area is previously allocated as a fixed area, once it runs out of space, additional alternate memory area becomes unavailable.

In addition, in Japanese Patent Laid-Open No.Hei 2-292798, data is transferred from the cache memory to the flash memory when extra space is required in the cache memory. However, when extra space is required, a request to store data may occur within the system, thus a write into the flash memory which is slow in rewriting would lower system performance.

As described above, control is intended to write frequently written data only into the cache memory, thus not all write data can be written at high speed. When a defective cell occurs on one sector, it takes time to perform the corresponding proper action.

As a result, the data transfer time is prolonged and data transfer is delayed. Particularly, processing using the error correction code becomes complicated. The cache system in Japanese Patent Laid-Open No.Hei 2-292798 is provided to extend the system life. Although the technique about handling of cache data at data write is disclosed, no techniques about transfer of read data from the host which is an external system are disclosed. Therefore, the related art does not provide means accessible at high speed.

The main purpose of the related art is considered to replace magnetic disk units. The related art assumes an access in sector units via an external I/O bus provided for the system to transfer data to and from the external devices. However, it does not consider a random access from the CPU when the flash memory is used as the main memory, that is, direct data transfer in small units of several bytes, etc. The alternate cell method and error correction code processing are designed to transfer data in sector units; data cannot be transferred in byte or word units.

On the other hand, high-performance personal computers, etc., often use a DRAM-SRAM cache system as means for shortening the read or write time. Generally, the cache memory is located between the CPU and storage taking time to access for serving as a buffer memory. When the CPU reads the storage, the read address and data are stored in the cache memory. When the CPU then reads the same read address of the storage, the data corresponding to the address is obtained from the cache memory, thereby shortening the access time. The two systems of cache memory are known: Write through and copy back. The write through system is a system which rewrites the storage as well as the cache memory at the same time in response to a write request into a storage. On the other hand, the copy back system is a system which is responsive to a write request into a storage for rewriting only the cache memory without rewriting the storage which requires a lot of processing time and is intended to shorten the access time.

The cache memory system generally used with information processing systems such as personal computers at present includes the main memory of DRAM (dynamic random access memory) and a cache memory of SRAM (static random access memory) to cover the weak point that the DRAM access operation cannot keep up with the CPU operation speed. Accessed addresses are allocated to the SRAM and the DRAM accessed at slow speed is used to back up data as if the SRAM accessed at fast speed were the main memory when viewed from the CPU. In this technique, the SRAM access speed is several times as fast as the DRAM access speed, and although it i less than ten times as fast. Thus, when a write access is made to an address not allocated to the cache memory, namely, when write miss occurs, the recovery time is not so great. If the flash memory is adopted as the main memory, the flash memory has the rewrite time 1000 to 100000 times longer than the DRAM, and the recovery time at write miss becomes very great, lowering system performance. Therefore, this point must be considered when implementing a system.

To reduce flash memory chip costs, those skilled in the art focus attention on a cell structure for reducing the flash memory chip area. For example, a flash memory having a so-called NAND structure is adopted. In this structure, a line access rather than a random access is made and data is input/output in series in line units. For the future flash memory, it is considered that the line access system intended for high integration of memory will become the main stream. In addition, development of a memory adopting an access system similar to the line access system is pursued. Even if a memory of such a structure is used, it will become an important technology with regard to making random accesses at high speed. This point is not considered in the related art including Japanese Patent Laid-Open No.Hei 2-292798 discussed above.

Whether the main memory is volatile or nonvolatile makes a great system difference.

For example, when the main memory is volatile, if the system power is turned off with only the cache memory rewritten, data stored in both the main memory and the cache memory is cleared, introducing no problem. However, when the main memory is nonvolatile, if the power is turned off with the most recent data stored only in the cache memory, in fact the data just entered and still being considered by the user can disappear from the cache memory.

If the main memory of an information processing system is volatile, it is common practice to provide an auxiliary storage for saving file data. However, if the main memory system is nonvolatile, no auxiliary storage is required. (The main memory serves as a data save area.) This point is one of the merits of the system provided with the nonvolatile main memory, but it introduces a problem. For example, information processing systems may career out of control due to a program error or operator mistake. When this fault occurs, if the main memory is volatile, it is possible to reset the hardware or, as a last resort, temporarily turn off the power and restart the system, thereby clearing the main memory contents and again loading data into the main memory from the auxiliary storage for restoring the system to the normal state. However, if the main memory is nonvolatile, when the system careers out of control and data stored in the main memory is destroyed, correct data is lost and it is difficult to restore the system to the normal state.

Therefore, the information processing systems having a nonvolatile main memory must be provided with a corrective system for crashing of the processing system.

SUMMARY OF THE INVENTION

It is therefore an object of the invention to provide a file system using a high-performance and inexpensive flash memory as storage media.

Specifically, the file system life is prolonged without using a write buffer (cache memory) or error detection correction code.

A file system that can rewrite a flash memory at high speed is provided.

A file system which enables access to areas of data at high speed is provided.

A file system which suppresses deterioration of a flash memory by a simple configuration and simple processing is provided.

It is another object of the invention to dynamically change alternate storage areas for replacing degraded storage areas of a flash file system thereby further extending the life and to inform the user that alternate areas are no longer usable when no further alternate areas are available, thereby improving a user interface.

It is a further object of the invention to provide an information processing system having a flash memory as the main memory.

Specifically, a random access from the CPU is made possible.

Further, an information processing system which can support or is compatible with a high-integrated flash memory in a line access system is provided.

Further, the recovery time from a miss hit access is shortened for improving performance.

Further, action when the power is turned off is considered for improving reliability to prevent important data from being destroyed due to careering of control due to a program error or operator mistake, and after operation is stopped, access performance when operation is restarted is improved for enhancing total operability.

To these ends, according to the invention, there is provided a semiconductor file system comprising a first nonvolatile memory which is electrically erasable, a second nonvolatile memory which is not electrically erasable, a volatile memory, a controller which controls the memories, and a control section which controls the controller wherein a physical address corresponding to a logical address specified from an external system is accessed, the first nonvolatile memory storing data for the external system to perform operations, first management information indicating the correspondence between physical addresses at which the data is stored and logical addresses, and second management information indicating a state of the first nonvolatile memory, the second nonvolatile memory previously storing interface information required for inputting and outputting the data from and to the external system and read-only data of the data, the controller including control means for determining a physical sector address forming predetermined high-order bits of the physical address when data is output from the first nonvolatile memory or when data is input to the volatile memory, means for storing the determined physical sector address, and means for consecutively generating addresses in a sector determined by the physical sector address, the control section responsive to the interface information, the first management information, and the second management information for controlling input/output of data from/to the external system and for temporarily storing write data into the first nonvolatile memory from the external system in the volatile memory and then transferring the write data from the volatile memory to the first nonvolatile memory, and the consecutive address generation means and the sector address storage means for outputting the physical sector address and the consecutively generated addresses to the first nonvolatile memory and the volatile memory when data at the physical sector address is output from the first nonvolatile memory or when data at the physical sector address is input to the volatile memory.

In the invention, the data store unit is made the same as one sector of hard disk. Data is always transferred in sector units to and from the host. To transfer the data at high speed, means for generating addresses at high speed is provided. To match the write speed with the high-speed address generation, the nonvolatile memory is used as a write buffer, and all write data is temporarily stored in the write buffer. The write buffer is used to temporarily save data. After data transfer from the host terminates, the data is transferred from the write buffer to the flash memory quickly. That is, the write buffer is not used to prolong the flash memory life and is used only for high-speed data transfer. The flash memory life is prolonged, for example, by managing the erasure count. The erasure count is recorded as the second management information in flash memory erasure units. How much the flash memory is degraded is decided according to the erasure count and write locations are determined for averaging progress of degradation. Thus, the erasure counts are recorded in the volatile memory used for the write buffer.

On the other hand, flash memory electrically erasable (first nonvolatile memory) and nonvolatile memory not electrically erasable (second nonvolatile memory), such as mask ROM or one-time PROM, are used as a memory to store data. The nonvolatile memory not electrically erasable is used as a memory to store interface information, such as the IC card internal configuration and access format.

Thus, when data is transferred from the host to the semiconductor file system, an address is generated matching with the data transfer speed of the host and is given to the volatile memory used as the write buffer, thereby enabling high-speed writing independently of the flash memory rewrite speed.

On the other hand, when data is read, if an address generated by the address generation means is given to the flash memory, it is possible to match data read rate with the host. This point is useful particularly when the operation speed of the control means in the semiconductor file system is slow compared with the host, and address generation from the control means produces a bottleneck.

The flash memory life can be prolonged by managing the erasure counts. Since the storage means required to manage the erasure counts is the volatile memory used as the write buffer, the number of parts does not increase.

The nonvolatile memory is used as a memory to store the first management information and the second management information, whereby the management information can be stored and fetched at high speed and efficiently.

On the other hand, in addition to the flash memory, inexpensive nonvolatile memory not electrically erasable is used as data memory, whereby less expensive file storage media can be provided.

If the nonvolatile memory not electrically erasable is used to store IC card information, it is made possible to be compliant with the PCMCIA specifications (standard specifications), etc. If all the above-mentioned points are implemented, the three types of memory can cover various applications and the number of parts can be reduced compared with installation of a memory for each application. Particularly in intending miniaturization for IC cards, etc., it contributes greatly to reduction of the number of parts.

According to the invention, there is further provided a flash memory system comprising a flash memory for storing data from an external system, means for temporarily storing the data from the external system upon receipt of a request to write the data into the flash memory, and a control section which stores the data in the data storage means upon receipt of the request to write the data, then transfers the data to the flash memory, wherein upon receipt of a request to read or write data from the external system before completion of transfer of the data to the flash memory, the control section interrupts the data transfer to the flash memory and responds to the request to read or write the external data.

According to the invention, there is further provided a flash memory system comprising a flash memory for storing data from an external system, means for temporarily storing the data from the external system upon receipt of a request to write the data into the flash memory, and a control section which stores the data in the data storage means upon receipt of the request to write the data, then transfers the data to the flash memory, wherein upon receipt of a new request to write data into the same address from the external system before completion of transfer of the data to the flash memory, the control section interrupts the data transfer to the flash memory and stores the new data from the external system in the data storage means and invalidates the current data being transferred to the flash memory.

According to the invention, there is provided a flash memory system comprising a flash memory for storing data from an external system, means for measuring the time required to write the data into the flash memory, means responsive to the measurement result of the write time measurement means for diagnosing a degradation degree of the flash memory, means for storing the diagnosis result offered by the degradation degree diagnosis means, and control means responsive to the diagnosis result for determining a storage location in the flash memory for the data and storing the data in the location.

As described above, the write buffer memory (data storage means) for temporarily storing data is provided for writing at high speed. The data stored in the buffer memory is transferred to the flash memory when the external system, such as the host system, does not make an access request, that is, when the flash memory system waits for the external system to make an access request. Thus, the transfer time is substantially hidden within the entire memory system. All data requested to be written from the host system is always stored in the buffer memory. Data is not directly written into the flash memory, which has a slow write speed, from the host system. Data transfer from the buffer memory to the flash memory is started upon completion of data write from the host system. The data can be transferred from the buffer memory to the flash memory until a request to access the data or another data is received from the host system, that is, while the flash memory system waits for the host system to make an access request. When receiving an access request from the host system, the controller immediately interrupts data transfer from the buffer memory to the flash memory and responds to the access request. Upon completion of processing for the request, the interrupted data transfer from the buffer memory to the flash memory is resumed at the interrupt point. As a result, writing of data from the host system into the buffer memory is completed quickly and the host system can perform the next processing without waiting for the data to be actually transferred to the flash memory, thereby improving performance of the entire flash memory system. That is, the flash memory write speed is transparent to the host system; the slow flash memory write speed can be hidden. Upon completion of processing for the access request received from the host system, the data in the buffer memory is transferred to the flash memory; the data transfer is continued until the host system makes a new access request. Therefore, the host system can interrupt the current data transfer from the buffer memory to the flash memory to make another transfer request; there is no host system wait time.

The buffer memory is provided with more than sufficient capacity to store data from the host system in the normal operating state to prevent the host system from waiting because the buffer memory overflows with data from the host system.

To reduce the data transfer time from the buffer memory to the flash memory as much as possible, when the same data as not yet transferred to the flash memory and left in the buffer memory, for example, the data in the same file, is retransferred from the host system, the current data is invalidated and the most recent data is always transferred to the flash memory. In retransmission of the same file, the old data in the file is unnecessary and may be invalidated; unnecessary data transfer need not be executed and the flash memory write count can be reduced.

To enable consecutive writing of mass data from the host system, it is also necessary to write data into the flash memory as fast as possible. However, as the flash memory is degraded, the time required for writing or erasing is prolonged, leading to slow writing. To deal with this problem, the time required for writing or erasing is measured to always be aware of how much the flash memory is degraded, and a less degraded location is selected for writing data. Shortening the write time will make it possible to prevent the buffer memory from becoming insufficient to store data in consecutive writing of mass data from the host system.

According to the invention, there is further provided a storage system having a semiconductor memory section comprising a storage section using a flash memory as a storage medium and a host system which transfers information to and from the semiconductor memory section, wherein the semiconductor memory section includes an interface circuit for transferring information to and from the host system, a control circuit for controlling a read/write of information from/into the storage section and detecting an area of the storage section where errors occur, and memory management means for retaining a used or unused state for each area of the storage section, upon detection of an error by the control circuit, for allocating an unused area as an alternate area in place of the area of the storage section where errors occur and retaining the correspondence between the allocated alternate area and the area where errors occur, and the control circuit references the memory management means for controlling a read/write of information from/into the storage section.

In this case, the control circuit can comprise information means, upon detection of an area of the storage section where errors occur, for sending error information indicating detection of the unreliable area of the storage section to the host system and the host system can comprise means for detecting receipt of the error information from the information means and means for outputting error information upon detection of receipt of the error information by the information detection means.

The semiconductor memory section may further include means for retaining predetermined error information. The control circuit, upon detection of an unreliable area of the storage section, may set error information indicating detection of the unreliable area of the storage section in the error information retention means, and the host system may comprise detection means for referencing the error information retention means for detecting the error information and means for outputting error information upon detection of the error information by the detection means. The host system can be provided with visual information means such as LED display or error message display on a CRT and voice information means with beep sound, synthetic voice, etc.

The control circuit can further detect that no alternate area becomes available in the storage section and can further set error information indicating that no alternate area becomes available in the storage section in the error information retention means.

The host system comprises input means for accepting an instruction for previously setting a data area for storing data and the alternate area of the storage section as initialization information and setting means responsive to the instruction accepted through the input means for setting the initialization information in the memory management means and the memory management means is responsive to the setting of the setting means for dividing the storage section into the data area and the alternate area for management. The memory management means comprises reallocation means for detecting an unused block of an empty area of the data area when the alternate area is not available, and reallocating the detected unused block to the alternate area and reallocation information means for informing the host system that the unused block is set as the alternate area when the block is reallocated by the reallocation means, and the host system can inhibit use of the unused block upon receipt of reallocation information from the reallocation information means.

According to the invention, there is provided a method for controlling storage in a semiconductor memory using a flash memory as a storage medium comprising the steps of previously retaining a write address corresponding to address information indicated for a write from an external system, retaining a used or unused state of an area indicated by the storage medium write address and upon receipt of a write instruction together with address information from the external system, referencing the previously retained write address corresponding to the address information, writing into the area indicated by the write address, setting the used state for the area when writing and retaining the state, determining whether or not a write error occurs during writing, if a write error occurs, allocating an unused area as an alternate area in place of the area where an error occurred and writing into the alternate area, changing the previously retained write address to a write address of the alternate area for updating the write address, and informing the external system that the alternate area is used.

According to the invention, there is provided another method for controlling storage in a semiconductor memory using a flash memory as a storage medium comprising the steps of accepting an instruction for dividing a semiconductor memory area into a data area for storing data and an alternate area, when a write error occurs, for allocating an area other than the area where the error occurred and previously retaining a write address of the data area corresponding to address information and an address of the alternate area in response to the instruction, retaining a used or unused state of the data area and the alternate area for each address, upon receipt of a write instruction together with address information, referencing the previously retained write address corresponding to the address information, writing into the area indicated by the write address, setting the used state for the area when writing and retaining the state, determining whether or not a write error occurs during the writing, if a write error occurs, allocating an unused area as an alternate area in place of the unreliable area and writing into the alternate area, changing the previously retained write address to a write address of the alternate area for updating the write address, and setting the used state for the alternate area and retaining the state.

The used or unused state for each block of the storage section is retained in the memory management means (memory block management table). When an error is detected by the control circuit, an unused block is allocated as an alternate block in place of the error incurring block of the storage section and the correspondence between the allocated alternate area and the error incurring block is retained in the memory management means or table.

To write data, the host system sends a write instruction together with address information (block identification information if data is written into each block) to the semiconductor memory section. When receiving the write instruction via the interface circuit, the control circuit of the semiconductor memory section reads the write address of the semiconductor memory section corresponding to the given address information from the memory block management table, and writes the given data into the target area (block) of the data memory. When the control circuit detects that an error occurs in the block at time of writing, the memory management means reads address information of an unused block of the alternate memory section, allocates it as an alternate block, and sets information indicating that the alternate block is used. The control circuit writes the data into the alternate block.

If an empty area for writing data when an error occurs does not exist at the write operation, the host system is informed of error information indicating detection of error incurring area of the storage section by the information means. An interrupt signal can be used as the information means. The information detection means in the host system detects receipt of the error information from the information means and the output means outputs error information when the information detection means detects receipt of the error information. If the semiconductor memory section includes the means for retaining predetermined error information, the control circuit, upon detection of an error incurring area of the storage section, sets error information indicating detection of the error incurring area of the storage section in the error information retention means. The detection means in the host system references the error information retention means for detecting the error information, and the output means outputs error information upon detection of the error information by the detection means. The control circuit may detect that no alternate area becomes available in the storage section and may set error information indicating that no alternate area becomes available in the storage section in the error information retention means.

Thus, the error information can be displayed on the output means such as a CRT for informing the user that the disk does not contain any empty area, whereby the user can take proper action.

Further, the input means in the host system accepts an instruction for previously setting a data area for storing data and the alternate area of the storage section as initialization information. The setting means can be responsive to the instruction accepted through the input means for setting the initialization information in the memory management means. The memory management means may be responsive to the setting of the setting means for dividing the storage section into the data area and the alternate area for management. In this case, the memory management means comprises reallocation means for detecting an unused block of an empty area of the data area when the alternate area is not available, and reallocating the detected unused block to the alternate area and reallocation information means for informing the host system that the unused block is set as the alternate area when the block is reallocated by the reallocation means, and the host system can inhibit use of the unused block upon receipt of reallocation information from the reallocation information means.

To read data in the target block from the semiconductor disk, the semiconductor memory area corresponding to the address information for the data to be read is read from the memory management means and the data is read from the target block of the storage section. If an error occurs in the block, address information of the alternate area to the block is read from the memory management means and the data is read from the alternate area.

According to the invention, there is further provided an information processing system comprising a central processing unit, input means for inputting data, output means for outputting data, volatile storage means for storing data, nonvolatile storage means being capable of electrically rewriting stored data to which an address space accessible by the central processing unit is allocated, data control means for at least transferring data between the volatile storage means and the nonvolatile storage means, means for registering addresses of data stored in the volatile storage means by the data control means from the nonvolatile storage means in the nonvolatile storage means, and means for comparing the addresses registered in the address registration means with an address output by the central processing unit to make a data access.

When the address output by the central processing unit to make a data access is input to the address comparison means and the address comparison means makes a comparison therebetween and outputs a comparison result, the data control means determines whether or not the address is one of the addresses registered in the address registration means in response to the comparison result, and when the address is one of the registered addresses, accesses the registered address in the volatile storage means; in contrast, when the address is not any of the registered addresses, the data control means newly registers at least a predetermined range of addresses containing the address in the address registration means, newly stores data in the nonvolatile storage means corresponding to the newly registered addresses in the volatile storage means, and accesses at least one of the newly registered addresses.

Specific operation of the means will be described as an example.

To enable the CPU to directly access stored data in the flash memory not via an external I/O bus, a high-speed random access must be provided. In a direct access to the flash memory, the flash memory of random access type enables a high-speed random access like DRAM in a read access, but can be rewritten only in block units at low speed in a write access. As described above, the flash memory in the line access system, which is considered likely to become the mainstream in the future, is not adaptable to a random access even in a read access.

Then, a buffer memory which serves as a cache memory is located between the flash memory and CPU. In an optimum situation, the cache memory is made of DRAM or SRAM.

An address array for recording addresses of data stored in the cache memory and storage means for recording an access history to the cache memory are provided.

To overcome a problem of very slow flash memory rewrite compared with an access to the cache memory, an empty area is provided in the cache memory so that data at unstored addresses can always be written.

To prevent data in the main memory from being destroyed by the system careering out of control, a write protect (inhibit) flag is provided for each data area. If an attempt is made to rewrite write-protected data, the flag can be used to interrupt the CPU for warning. When the flag is rewritten, the CPU is also interrupted for warning, thereby giving double safety. After this, if the CPU does not write a predetermined code into a specific write request register, data rewrite is not enabled.

For high-speed operation, if data in the cache memory is rewritten by the CPU, the flash memory area corresponding to the data is previously erased to save the time taken to erase the flash memory area when the data is written back.

If a power supply to the system is turned off, the data in the address registration means is not lost and is retained when the power supply is again started to restart the system operation. The data in the cache memory is restored based on the data in the address registration means.

More specific description will be given.

By installing the cache memory, the demerit of the flash memory being slow in rewriting can be covered and an external interface is connected by the serial buffer for enabling a random access to the cache memory for the flash memory to which a high-speed random access cannot be made. They can be used apparently as the main memory provided with the flash memory directly connected to the CPU memory bus.

As described above, the address array for recording logical addresses of data stored in the cache memory and the storage area for recording an access history indicating oldness of data stored in the cache memory are provided whereby a determination can be made as to whether or not one address existing in the cache memory is accessed. If an address not existing in the cache memory is accessed, the access history is searched for the data least accessed since the last access occurs and the data is written back into the flash memory, the main memory to create an empty area in the cache memory in which new data is stored. This is known as a cache memory replacement algorithm.

When a data write request is received from the CPU, if the address corresponding to the data is not stored in the cache memory, large performance degradation occurs in the slow write operation flash memory if an empty area for storing the write data is created after the request is received. Then, an empty area is always reserved in the cache memory and the data is temporarily stored in the reserved empty area. After the write data from the CPU has been transferred, a step of creating an empty area in the flash memory may be started.

Further, a write protect (inhibit) flag is provided to cope with the system careering out of control. When the flag is rewritten or an attempt is made to rewrite a write-protected area, the CPU is interrupted and responds to the interrupt with an alarm, thereby checking whether or not the CPU attempts to execute an abnormal rewrite.

If the CPU does not rewrite data into a specific register, stored data is not rewritten, thereby preventing the data in the crash occurs.

When receiving the interrupt, the CPU may execute a routine for requesting the user to determine whether or not data rewrite is to be executed. In the routine, the user determines whether or not the system careers out of control, and gives a proper instruction to the information processing system. In this case, needless to say, preferably the user can instruct the system operation to be stopped or restarted.

Referring to FIG. 98, the operation of an information processing system for implementing the configuration mentioned above is discussed. When the CPU 4101 makes a read access to the memory 4104, if cache memory block 4300 is hit, target data is read from the cache memory block 4300. If the cache memory block 4300 is miss at the read access, the CPU 4101 reads data directly from the memory 4104. Then, the data and address are retained in a new selected register in the cache memory block 4300 according to the replacement algorithm described above. If the address and data updated at the previous access are retained in the new selected register, the address and data are written back into the memory 4104, then the new data and write address are retained in the register. Since the memory 4104 is made of flash memory in the invention, if the block is not erased in writing them, the block is erased before they are written.

On the other hand, since the cache memory block 4300 of the invention is a copy back system cache, if the cache memory block 4300 is hit at a write access from the CPU 4101, only the register in the cache memory block 4300 is updated and writing into the memory 4104 is skipped. That is, data is written back into the corresponding block of the memory 4104 at later replacement. This means that the data in the corresponding block of the memory 4104 will be erased in the future. Therefore, in the invention, when the block is not yet erased, the block is previously erased. In the previous erasure process, the CPU 4101 does not immediately write into the block whose erasure is complete, and thus it need not wait for the erasure process to be completed. After this, when it becomes necessary to write data back into the block, the erasure process preceding the writing is skipped (has already been executed), shortening the access time.

If the cache memory block 4300 is miss at the write access from the CPU 4101, a new replacement target register in the cache memory block 4300 is selected and if the register is already updated, the updated data stored in the register is written back into the memory 4104, then the access address and data from the CPU 4101 are stored in the register in the cache memory block 4300. If the replacement target register is not yet updated, the register is updated. The write back process into the memory 4104 is similar to the write process into the memory 4104 when the cache memory block 4300 is miss at the read access.

Next, the operation for retaining data in the address registration means is discussed. The data stored in the cache memory is temporarily placed here so that the data can be read/written at high speed from the CPU. Since the capacity of the cache memory is limited, the data having the highest access probability and frequency from the CPU is selected and placed in the cache memory. If data not placed in the cache memory is successively accessed, system performance degrades remarkably. To prevent such an event from occurring, the cache memory structure, replacement algorithm, etc., must be optimized. However, even if they are optimized, when the data in the cache memory is lost and no data is stored in the cache memory, a miss always occurs at a read access, degrading system performance remarkably. The read access speed is slow until some degree of data is restored in the cache memory from the main memory. However, even if the data in the cache memory is lost due to power supply stop, the cache memory data can be restored to the state before the power supply stops if even comparatively small-capacity information in the address registration means is retained. The address information registered in the address registration means may be expanded in the cache memory from the main memory. One method of retaining the data in the address registration means is to retain the data in a memory with battery backup as the address registration means or to use a nonvolatile memory that can be read/written at random as the address registration means. As an alternative, when the power supply stops, the data in the address registration means is saved in a part of the main memory, which is a nonvolatile memory, or an equivalent memory, and when the power supply is restarted, the data is restored in the address registration means.

BRIEF DESCRIPTION OF THE DRAWINGS

In the accompanying drawings:

FIG. 60 is an illustration of an address translation table in second embodiment of the invention;

DESCRIPTION OF THE PREFERRED EMBODIMENTS

Referring now to the accompanying drawings, there are shown preferred embodiments of the invention.

Embodiment 1

A first embodiment of the invention is described.

Figure 1:
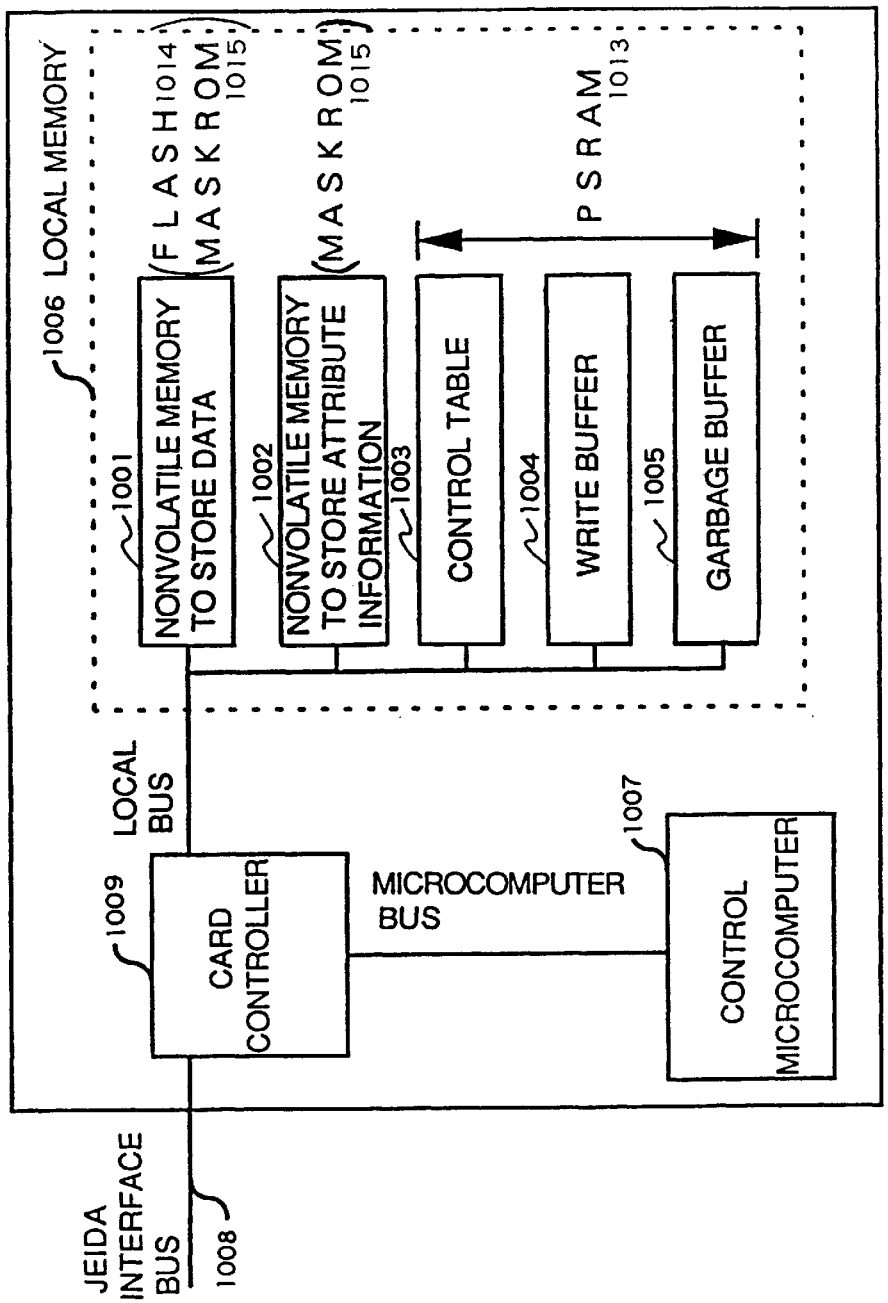
FIG. 1 is a block diagram of a semiconductor file system according to first embodiment of the present invention.
Figure 2:
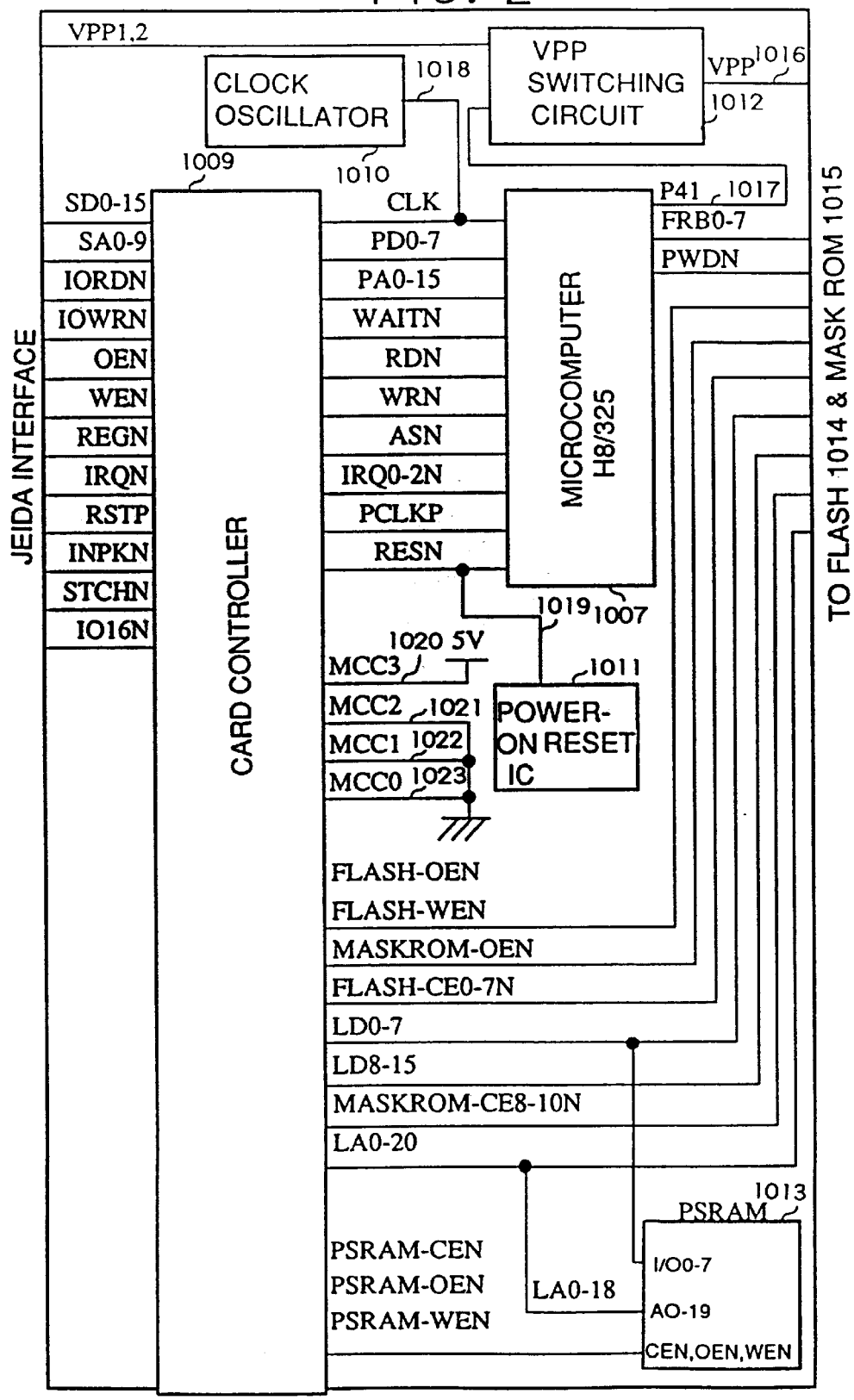
FIG. 2 is a circuit diagram of the card in FIG. 1.
Figure 3:
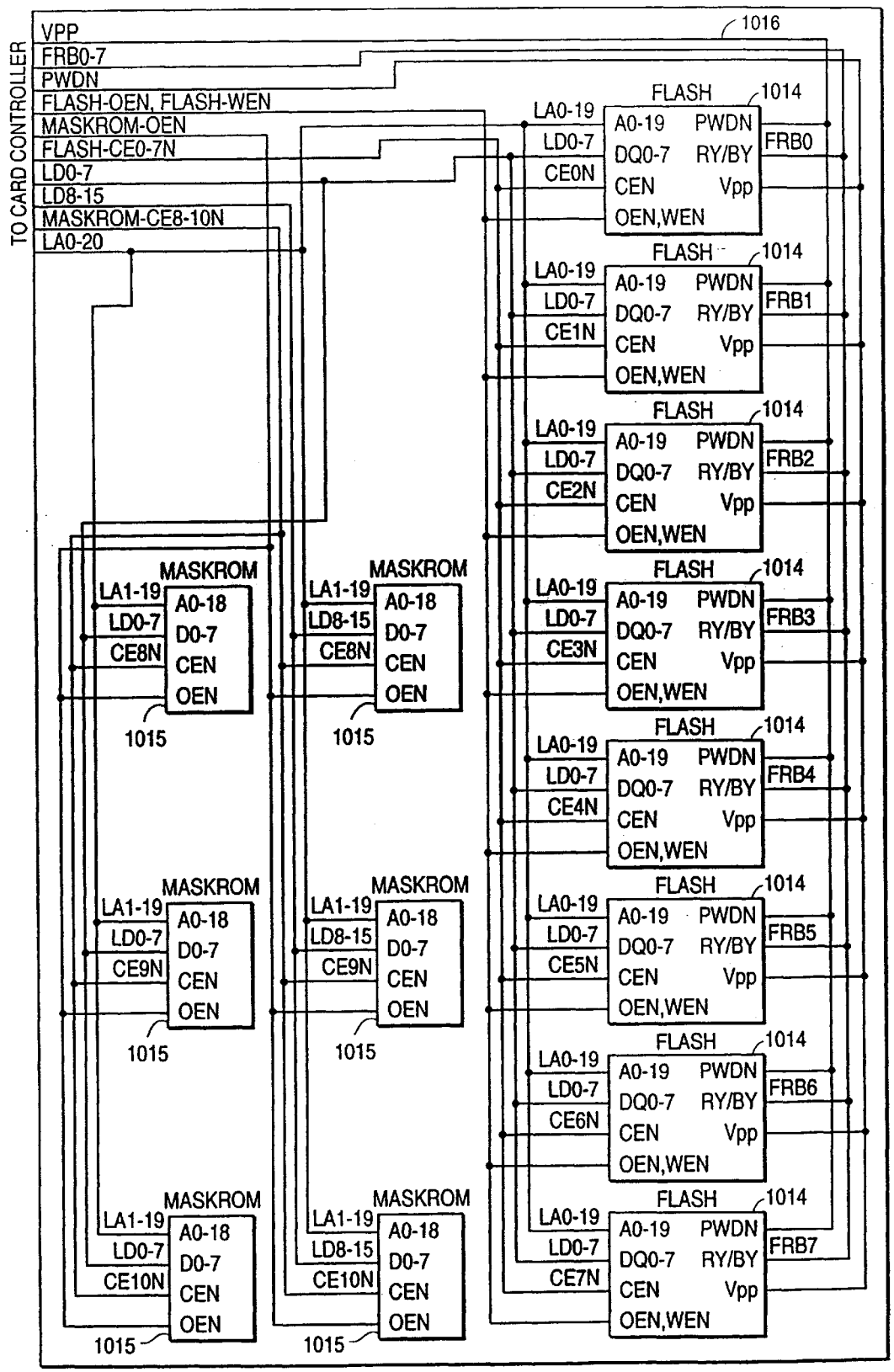
FIG. 3 is a circuit diagram of the card in FIG. 1.

FIG. 1 shows a block diagram of one embodiment of a semiconductor file system. The semiconductor file system has a local memory 1006, a control microcomputer (control section) 1007, and a card controller (controller) 1009 which controls transfer of data to and from a JEIDA (Japan Electronic Industry Development Association) interface bus 1008. The local memory 1006 has a nonvolatile memory to store data 1001, a nonvolatile memory to store attribute information 1002, a control table 1003, a write buffer 1004, and a garbage buffer 1005. FIGS. 2 and 3 show detailed circuit diagrams of the semiconductor file system. The semiconductor file system consists of the card controller 1009, the microcomputer (H8/325) 1007, a clock oscillator 1010, a power-on reset IC 1011, a VPP switching circuit 1012, a PSRAM (pseudo static random access memory) chip 1013 (512 KW ×8 bits), eight FLASH chips 1014 (each 1 MW ×8 bits), and six MASK ROM chips 1015 (each 512 KW ×8 bits). The card controller 1009 serves as an interface with the JEIDA interface bus 1008 of the semiconductor file system, and data is always transferred via the card controller 1009 to and from the host. Access command signals of the PSRAM 1013, FLASH 1014, and MASK ROM 1015 are generated by the card controller 1009. VPP 1016 is required at FLASH write. The VPP switching circuit 1012 is switched by means of a port P41 (1017) of the microcomputer 1007 for turning on/off supplying the VPP 1016 to the FLASH 1014. The 20-MHz clock oscillator 1010 is installed in the semiconductor file system, and the card controller 1009 and the microcomputer 1007 operate in synchronization with a clock signal 1018 of the clock oscillator 1010. The power-on reset IC 1011 is a circuit for generating a reset signal 1019 of the card controller 1009 and the microcomputer 1007 when the power is turned on. In the semiconductor file system, the installation capacity of the FLASH 1014 and MASK ROM 1015 can be changed by means of external pins MCC0–MCC3 (1020–1023).

Figure 4:
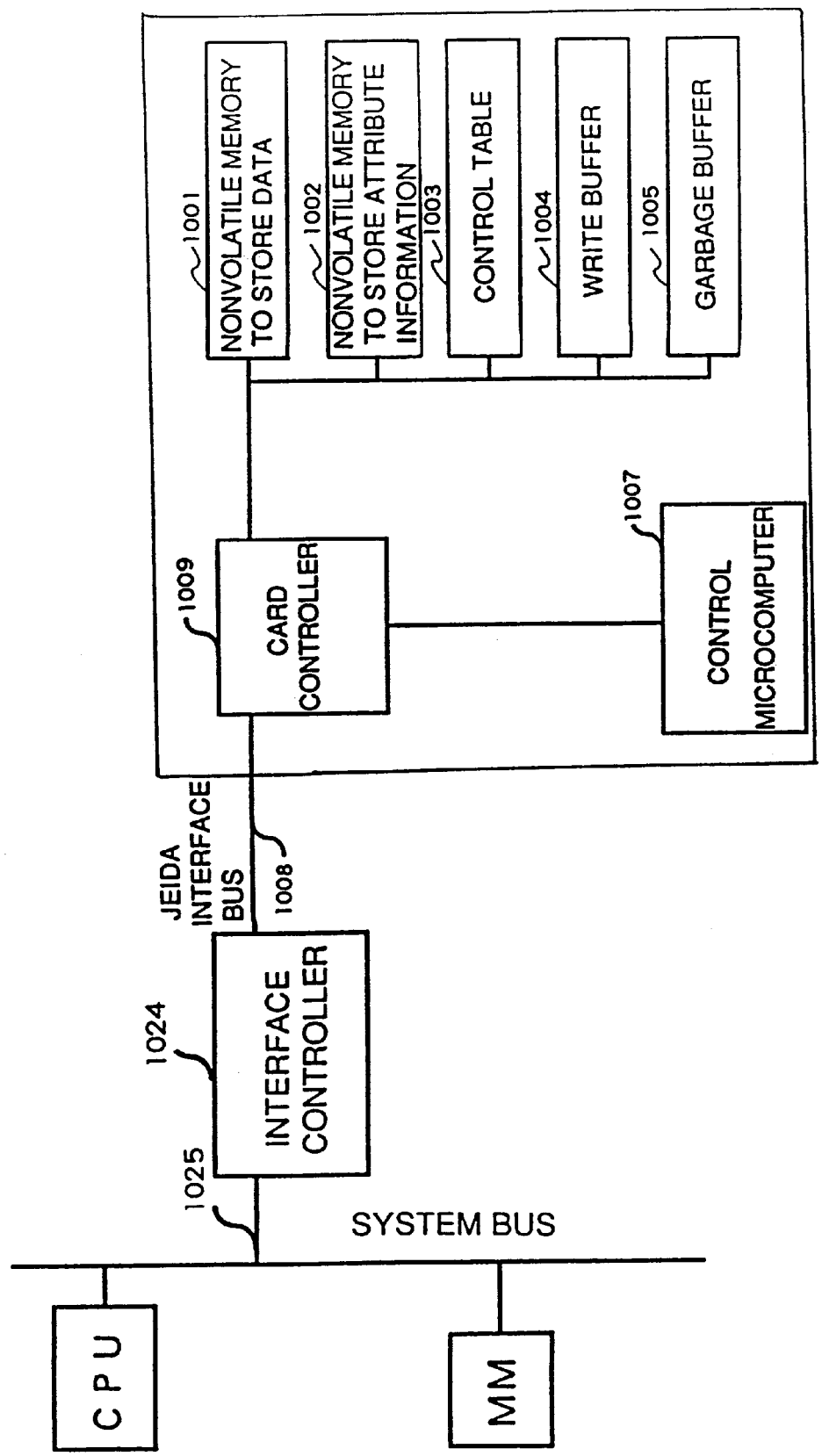
FIG. 4 is a connection diagram to a host according to first embodiment of the present invention.

Next, the interface specifications are shown. As shown in FIG. 4, the semiconductor file system is connected via an interface controller 1024 to a system bus 1025 of the host for transferring data to and from the host.

Figure 5:
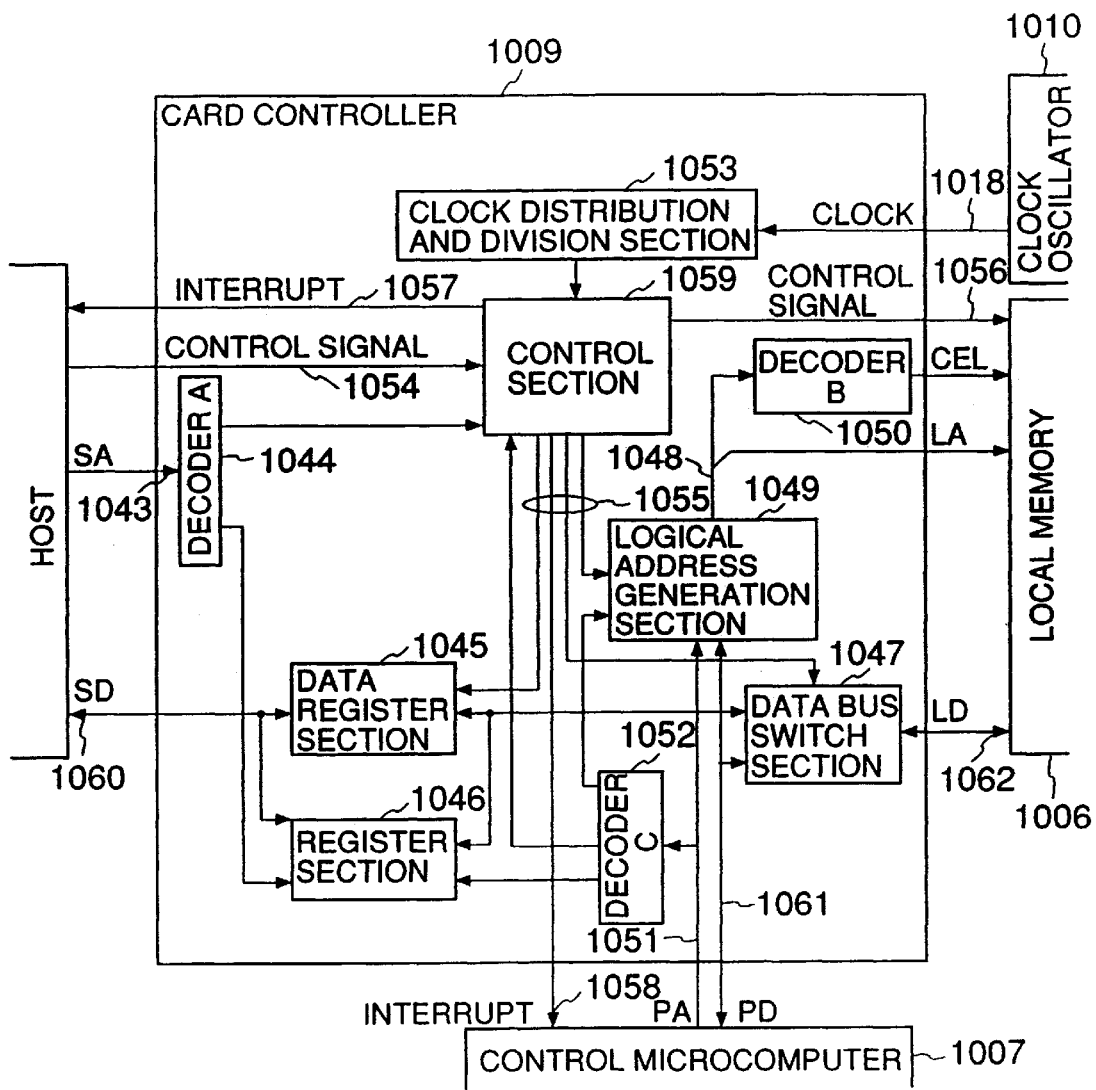
FIG. 5 is a block diagram of a card controller according to first embodiment of the present invention.

Next, the blocks in the semiconductor file system are discussed. First, the card controller 1009 is described. FIG. 5 shows a block diagram of the card controller 1009. The card controller 1009 comprises a decoder A 1044 for decoding a host address 1043, a data register section 1045 which serves as a transfer port of file data to and from the host, a register section 1046 consisting of I/O space registers, a data bus switch section 1047, a local address generation section (address generation section) 1049 which generates an address 1048 of the local memory 1006, a decoder B 1050 for decoding the local address 1048, a decoder C 1052 for decoding an address of the control microcomputer 1007, a clock distribution and division section 1053 which divides the clock 1018 from the clock oscillator 1010 into 10 MHz and 5 MHz and distributes the resultant signals to the blocks, and a control section 1059 which receives a control signal 1054 from the host and generates control signals 1055 of the blocks and control signal 1059 of the local memory 1006 and also generates an interrupt signal 1057 given to the host and an interrupt signal 1058 given to the control microcomputer 1007. Here, the host address bus 1043 is named SA, host data bus 1060 SD, microcomputer address bus 1051 PA, microcomputer data bus 1061 PD, local address bus 48 LA, and local data bus 1062 LD.

Figure 6:
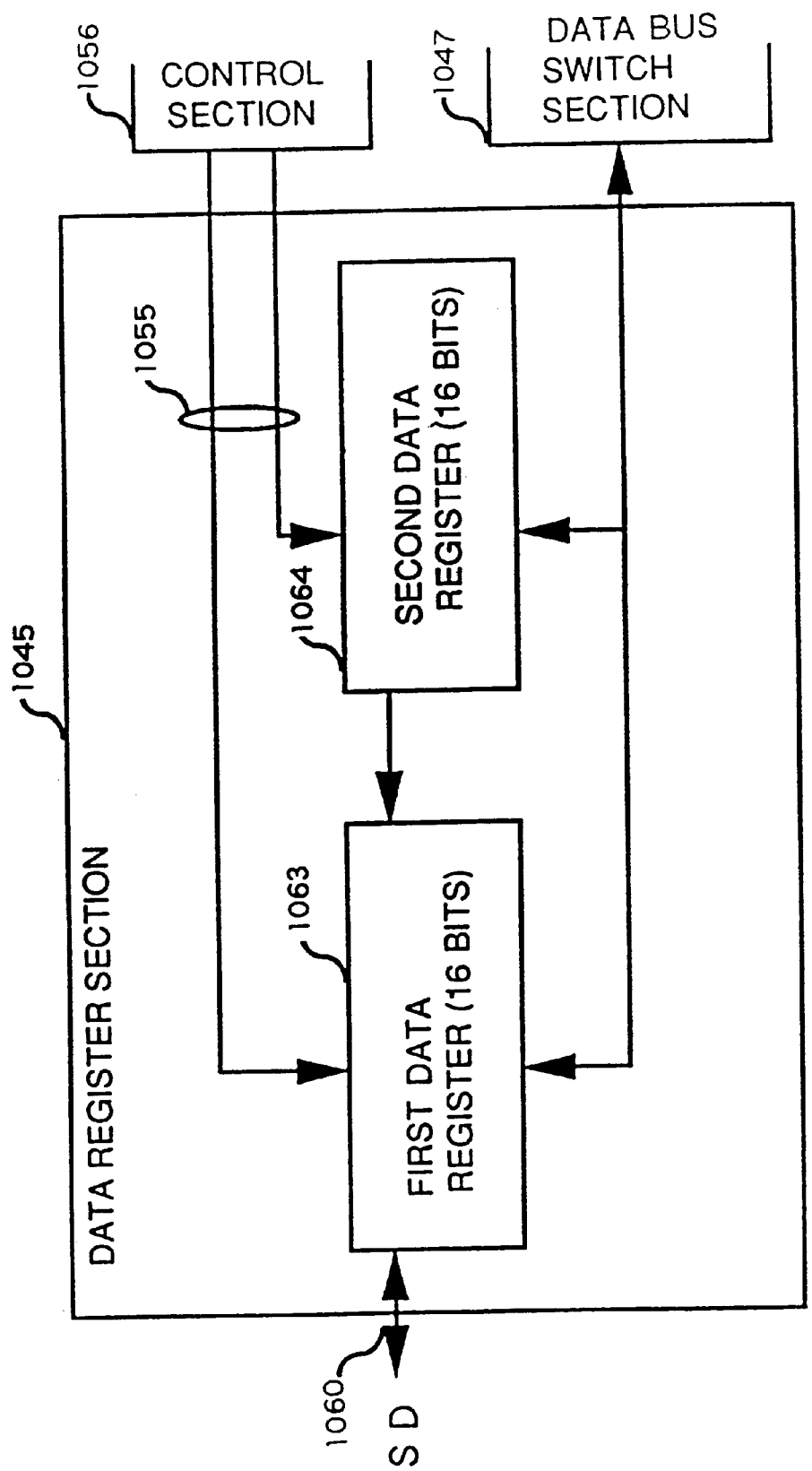
FIG. 6 is a block diagram of a data register section according to first embodiment of the present invention.

Next, the blocks of the card controller are described. FIG. 6 shows a block diagram of the data register section 1045. The data register section 1045 consists of a first data register 1063 and a second data register 1064. The first data register 1063 is connected to the SD 1060 and both the first and second data registers 1063 and 1064 are connected to the data bus switch section 1047. The first data register 1063 has the functions of latching 16-bit data from the host and outputting eight bits at a time to the local data bus, latching 16-bit data contained in the second data register 1064 and outputting it to the host, and latching 16-bit data from the local memory and outputting it to the host. The second data register 1064 is a 16-bit register which latches data from the local memory eight bits at a time and outputs it to the first data register 1053. The control signals 1055 of the first and second data registers are generated by the control section 1056.

Figure 7:
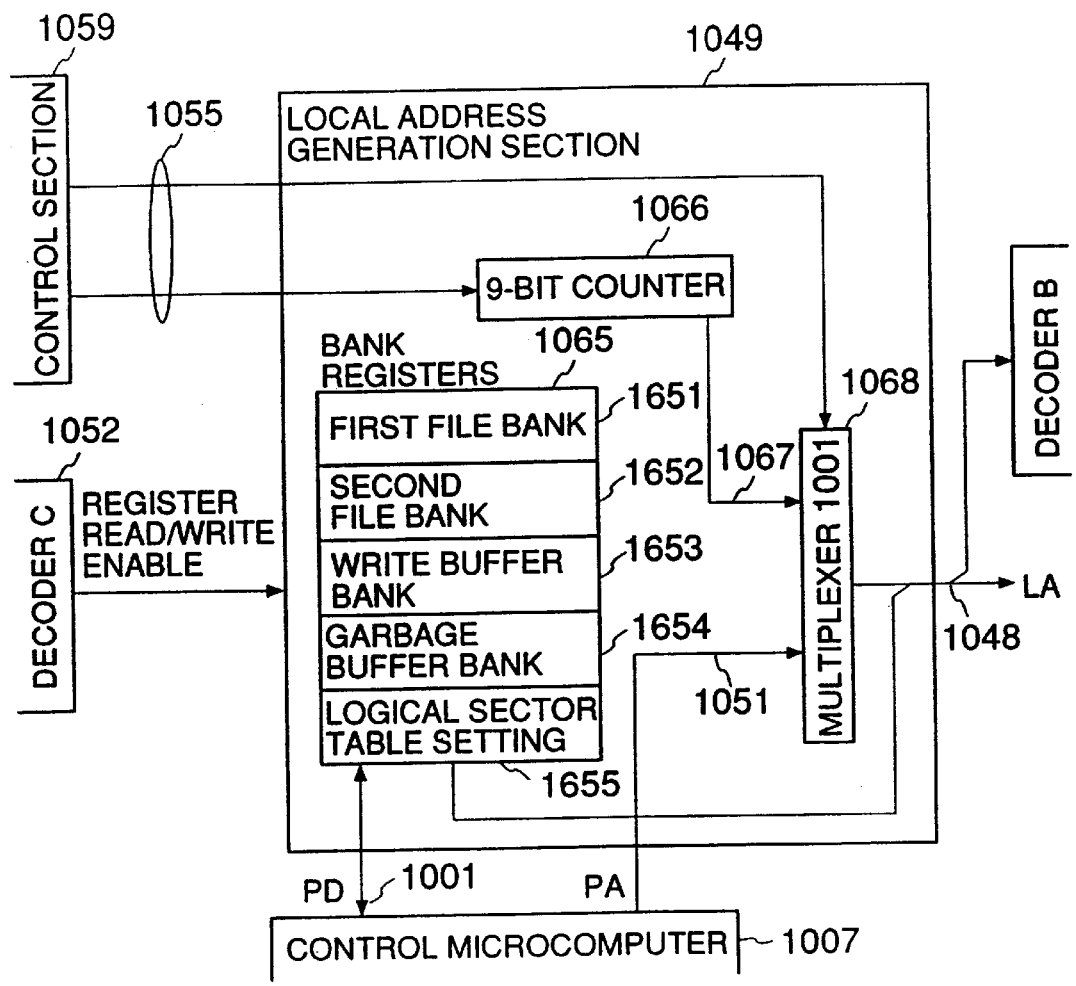
FIG. 7 is a block diagram of a local address generation section according to first embodiment of the present invention.

FIG. 7 shows a block diagram of the local address generation section 1049. The local address generation section 1049 consists of bank registers 1065 for outputting the high-order address of a local address 1048, a 9-bit counter 1066 for generating the low-order address at sector transfer (continuous address generation means and means for outputting a signal for accepting a physical sector address contained in one sector address storage means by the other sector address storage means after termination of input/output of 1-sector data in multisector transfer), and a multiplexer 1068 for selecting an output 1067 of the 9-bit counter 1066 or the PA 1051. The bank registers 1065 can be accessed from the microcomputer 1007 and are connected to the PD 1061 and selected by the decoder C 1052. A first file bank register 1651 and a second file bank register 1652 which are sector address storage means are contained in the bank registers 1065.

The control signals 1055 of the 9-bit counter 1066 and the multiplexer 1068 are generated by the control section 1059.

Figure 8:
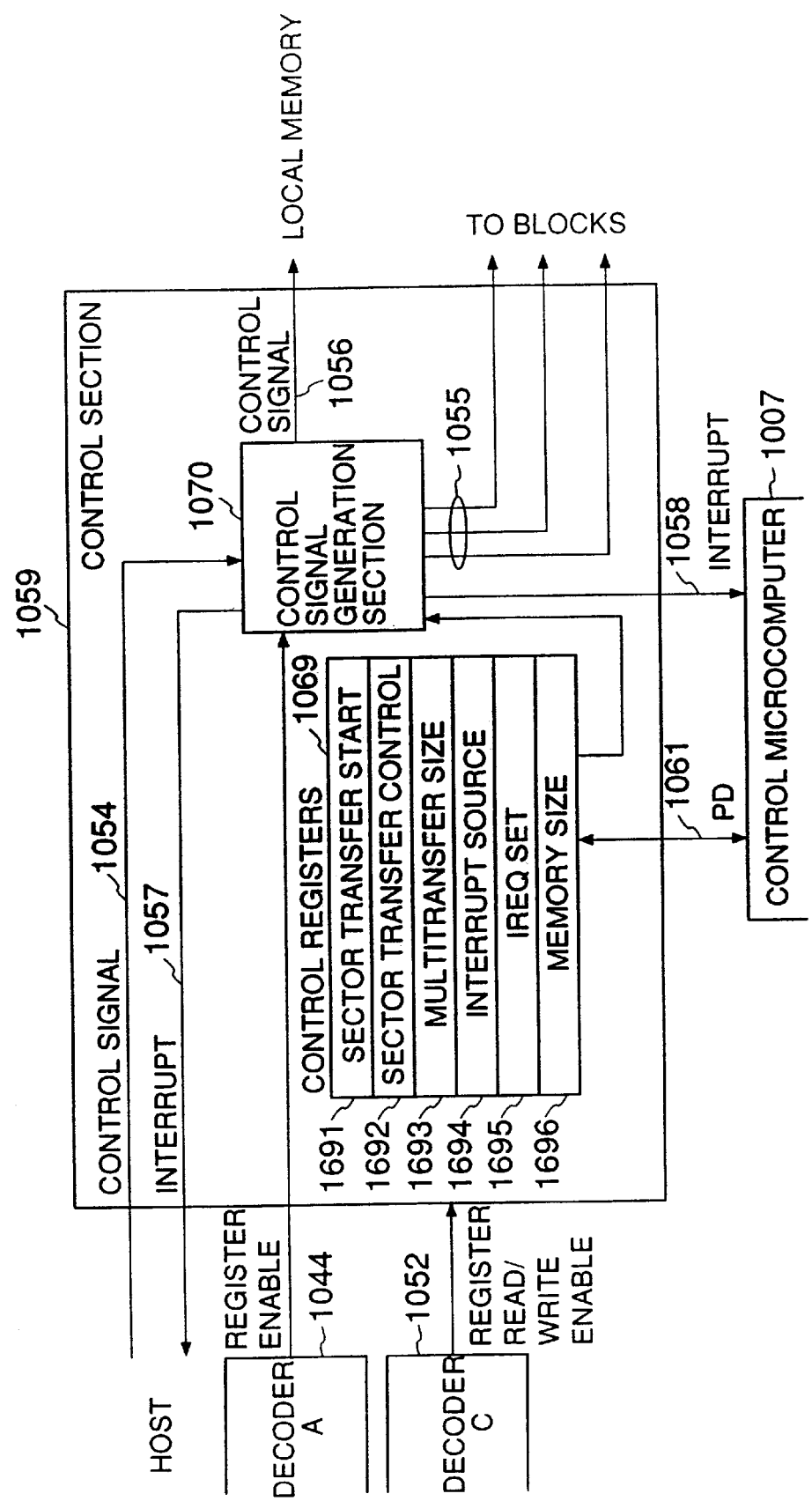
FIG. 8 is a block diagram of a control section according to first embodiment of the present invention.

FIG. 8 shows a block diagram of the control section 1059. The control section 1059 consists of control registers 1069 read/written by the microcomputer 1007 to control sector transfer and a control signal generation section 1070 which receives a control signal 54 from the host and generates control signals 1055 of the blocks, control signal 1056 of the local memory, and interrupt signals 1057 and 1058. The control registers 1069 can be accessed from the microcomputer 1007 and are connected to the PD 1061 and selected by the decoder C 1052.

The operation of the semiconductor file system according to the embodiment is discussed. First, sector transfer is described. The sector transfer includes a sector write for executing sector transfer from the host to a write buffer in PSRAM, a sector read for executing sector transfer from PSRAM, FLASH, and MASK ROM to the host, multitransfer for executing the sector transfer a plurality of times, and long transfer with ECC data. The sector transfer mode is selected by the microcomputer which analyzes a command written into a command register (not shown) contained in the register section 1046 shown in FIG. 5 and writes the transfer mode into a sector transfer control register 1692 shown in FIG. 8. After the transfer mode is set in the sector transfer start register 1691 by the microcomputer, the sector transfer is started as triggered from the host.

Figure 9:
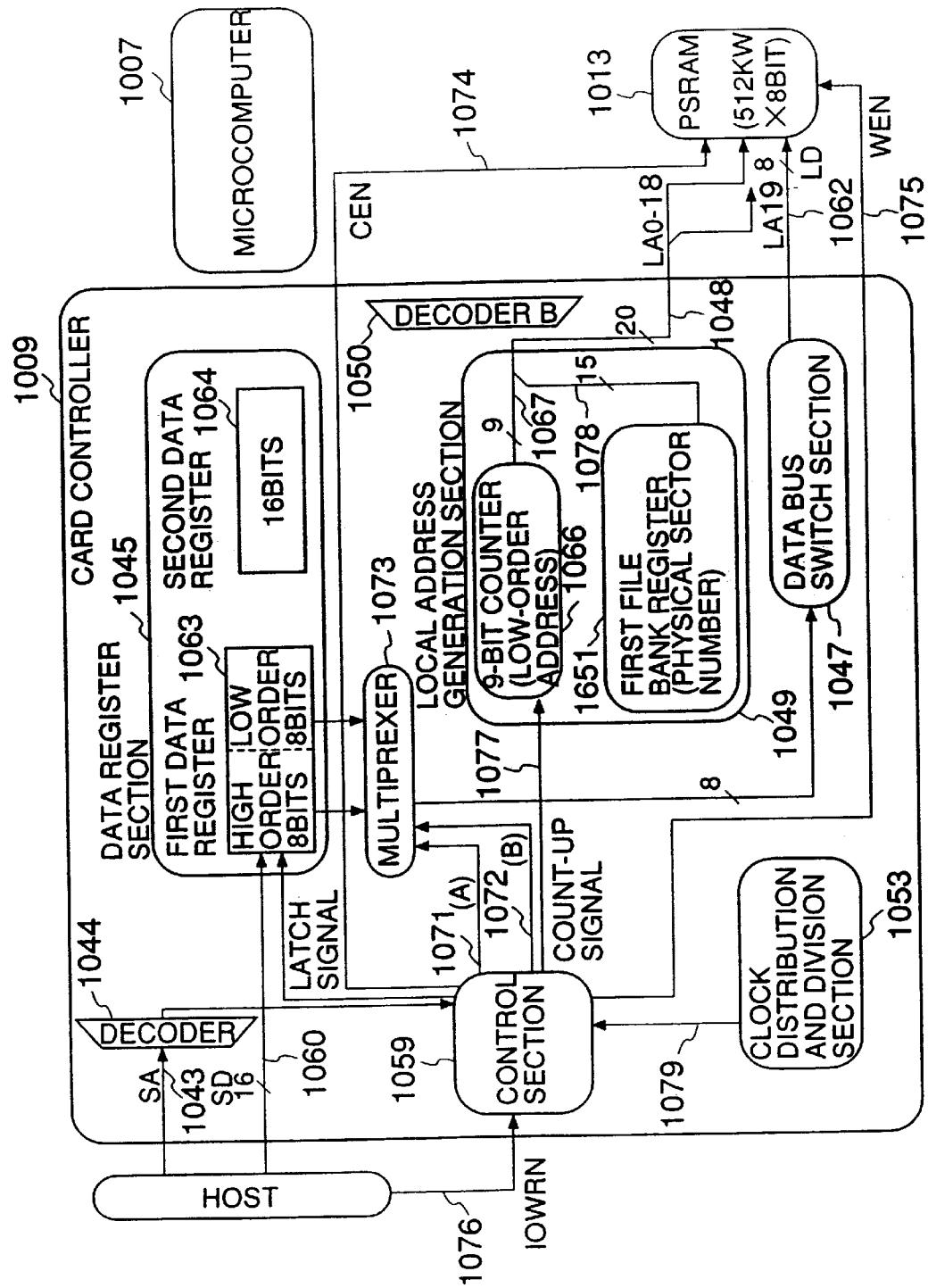
FIG. 9 is an illustration of a data flow at sector write according to first embodiment of the present invention.
Figure 10:
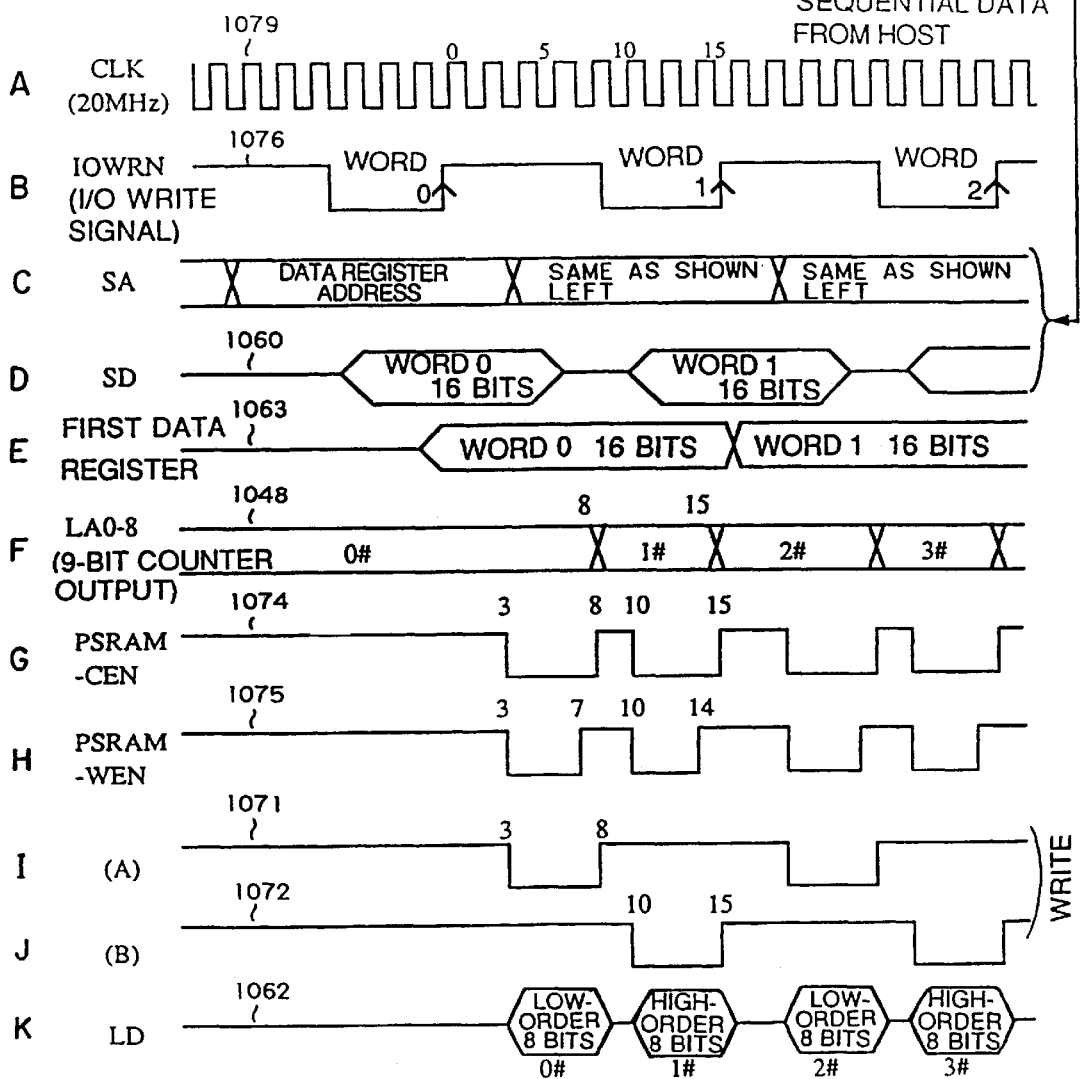
FIG. 10 is a timing chart at sector write according to first embodiment of the present invention.

First, the operation of the sector write transfer is discussed with reference to FIG. 9 (hardware configuration) and FIG. 10 (timing chart). Since PSRAM 1013 is connected to the card controller 1009 by the 8-bit bus, the sector write transfer is executed in the following sequence. 16-bit data 1060 from the host is stored in the first data register 1063 and selection signals (A) 1071 and (B) 1072 for the low-order eight and high-order eight bits are generated by the control section 1059. When the signal (A) 1071 is asserted, the low-order 8-bit data is output through the multiplexer 1073 to the LD 1062; when the signal (B) 1072 is asserted, the high-order 8-bit data is output. Signals CEN 1074 and WEN 1075 for PSRAM 1013 are generated by the control section 1059. A count-up signal 1077 generated by the control section 1059 in synchronization with LOWRN 1076 is output to the local address generation section 1049 and low-order address 1067 is generated at the 9-bit counter 1066 and is combined with physical sector number 1078 to generate local address 1048. The local address 1048 is output to PSRAM 1013. As shown in FIG. 10, 16-bit data input from the SD 1060 is latched in the first data register 1063 on the rising edge of IOWRN 1076. Then, the data is written into PSRAM 1013 in order of low-order eight bits and high-order eight bits as data of 512 words ×8 bits by using (A) 1071, (B) 1072, CEN 1074, and WEN 1075 generated by using the rising edges of IOWRN 1076 and the 20-MHz clock 1079 and LA 1048 whose count-up timing conforms to these signals. The digits in FIG. 10 denote which timing of the clock 1079 synchronization is made at. After the sector transfer, the microcomputer 1007 performs internal processing of data transfer from PSRAM to FLASH one byte at a time.

Figure 11:
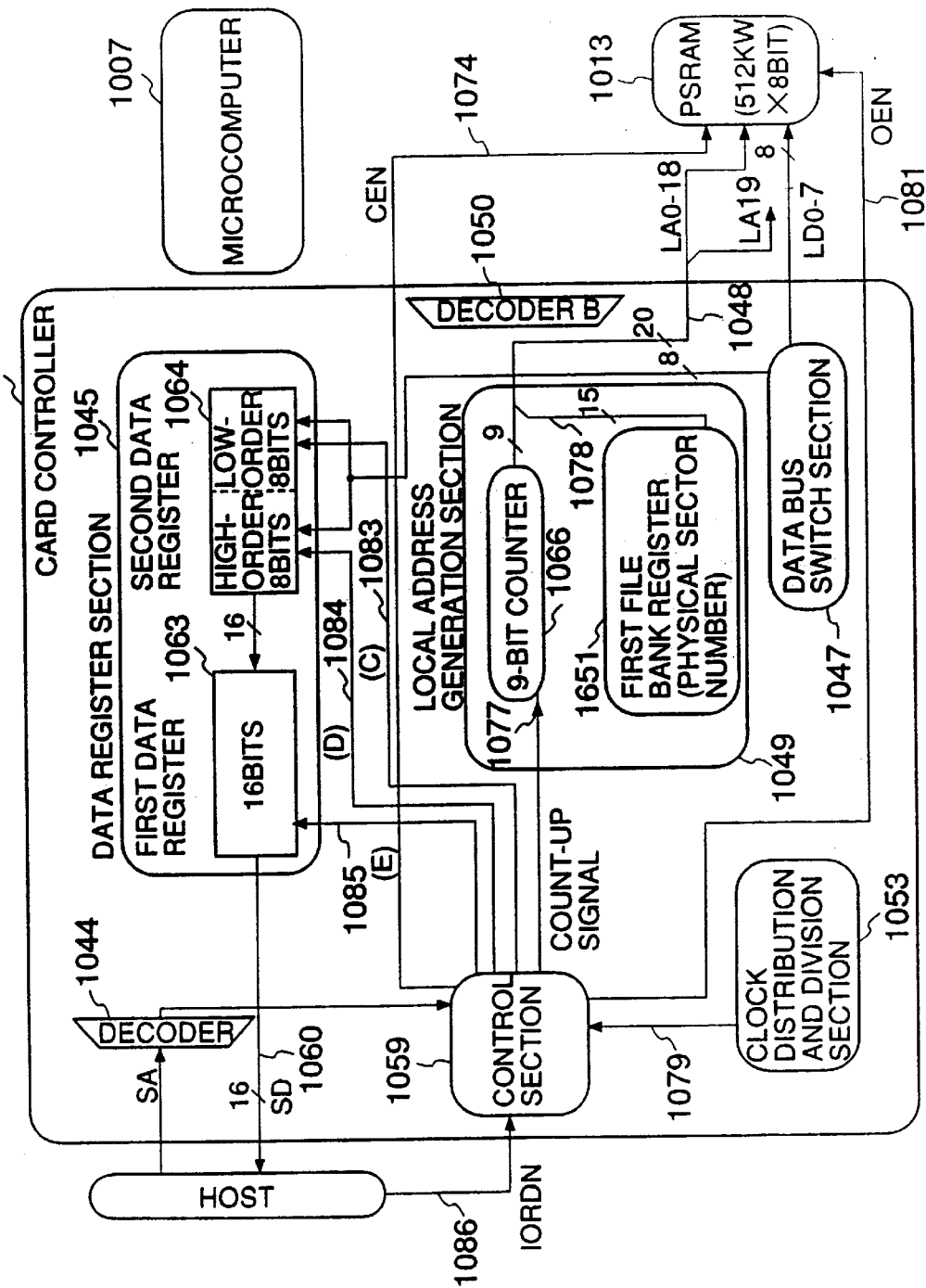
FIG. 11 is an illustration of a data flow at PSRAM sector read according to first embodiment of the present invention.
Figure 12:
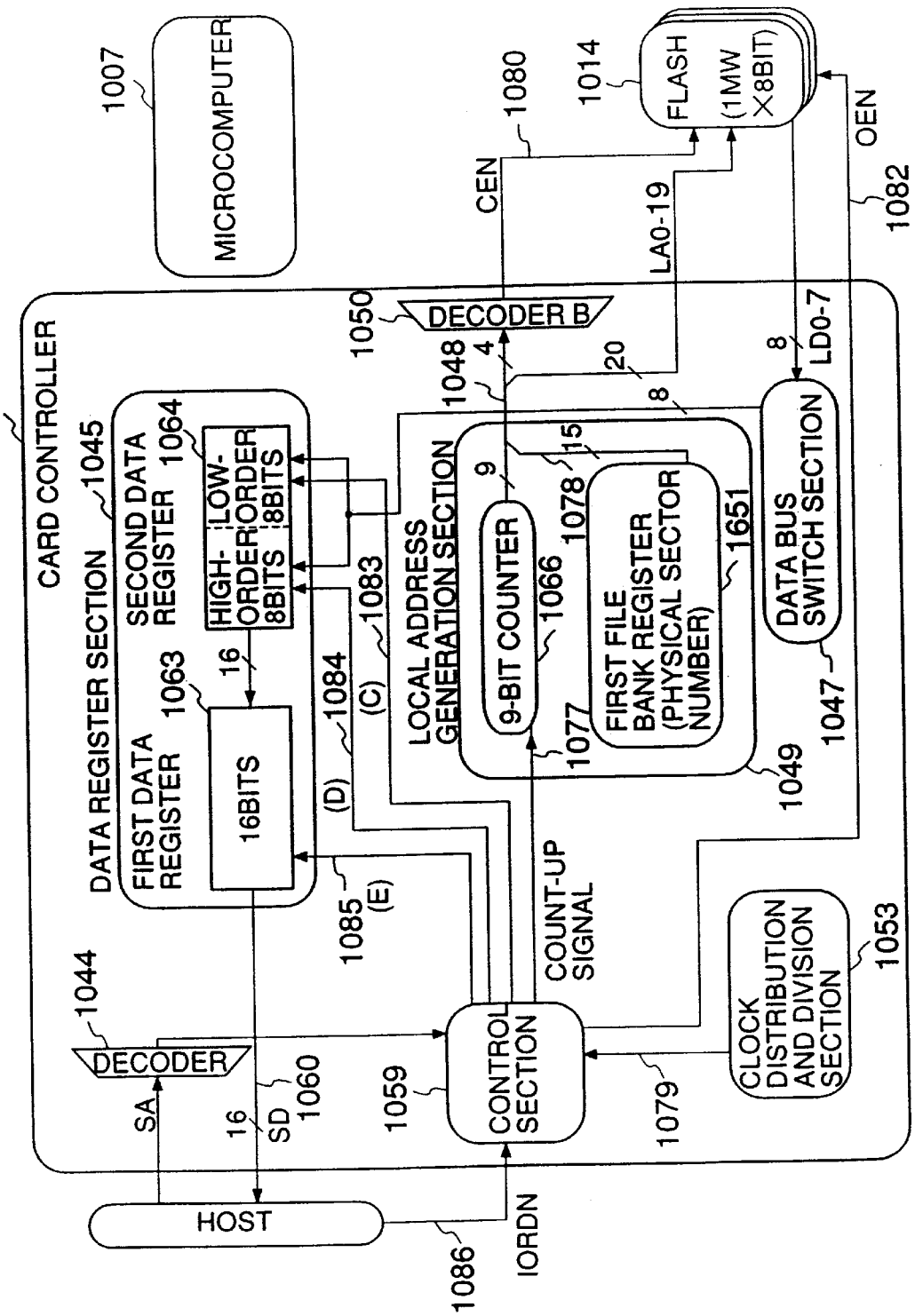
FIG. 12 is an illustration of a data flow at FLASH sector read according to first embodiment of the present invention.
Figure 13:
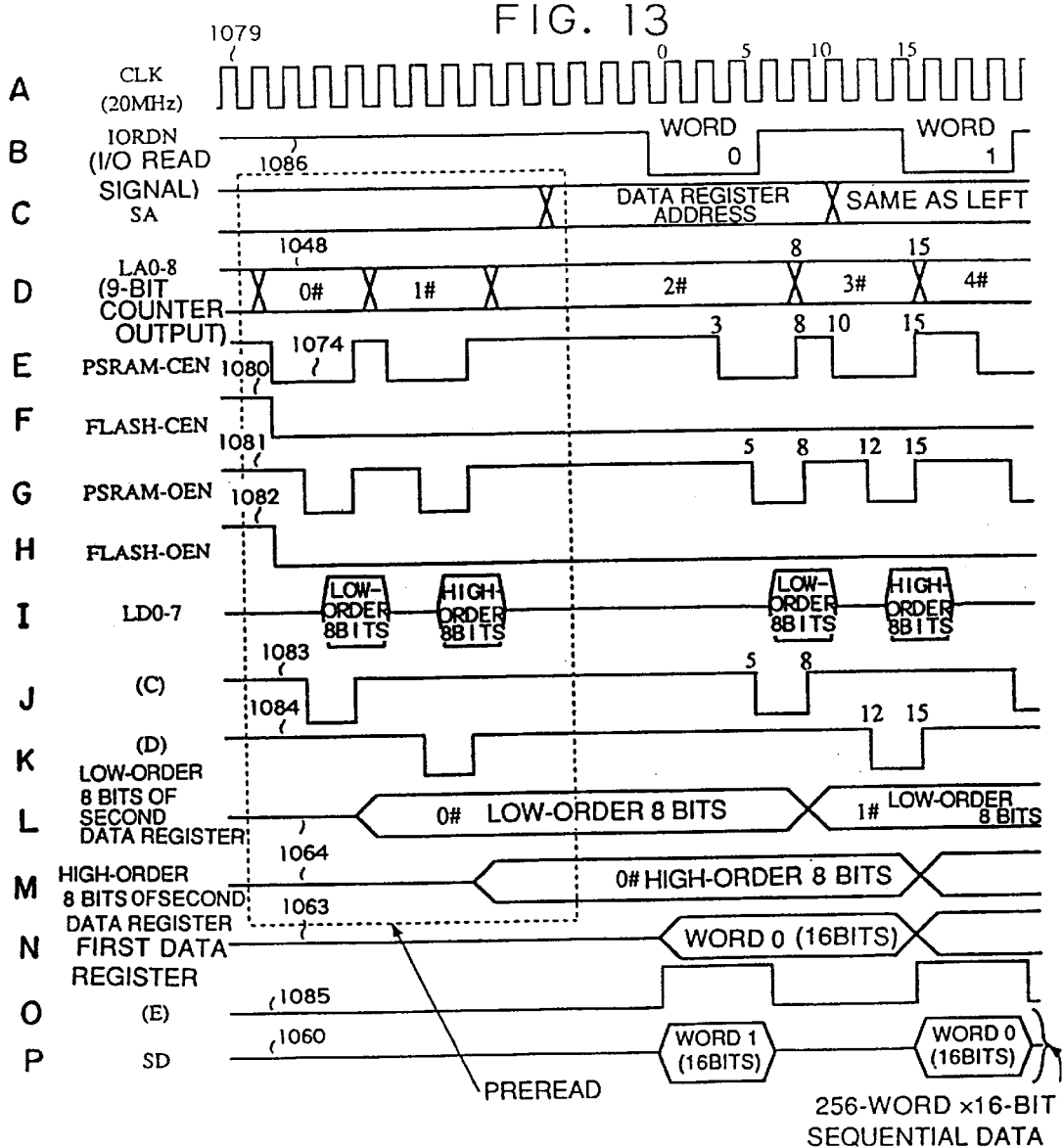
FIG. 13 is a timing chart at FLASH sector read and PSRAM sector read according to first embodiment of the present invention.

Next, the sector read transfer operation from PSRAM and that from FLASH are described with reference to FIGS. 11 and 12. The timings are described with reference to a common timing chart in FIG. 13 because the sector read transfer from FLASH 1014 and that from PSRAM 1013 are performed in the same sequence. Before sector read transfer is started, the first 1-word data is latched in the low-order eight bits and high-order eight bits of the second data register 1064 from FLASH 1014 or PSRAM 1013. (This process will be hereinafter called simply preread.) For the preread, a count-up signal 1077 of LA 1048, PSRAM-CEN 1074, FLASH-CEN 1080, PSRAM-OEN 1081, FLASH-OEN 1082, (C) 1083, and (D) 1084 are generated by the control section 1059 in response to the timing of setting the sector transfer start register at sector transfer preprocessing. Next, 8-bit data from PSRAM 1013 or FLASH 1014 is input to the low-order 8-bit part of the second data register 1064 on the rising edge of the (C) signal, and the following 8-bit data is input to the high-order 8-bit part of the second data register 1064 on the rising edge of the (D) signal. The data in the second data register 1064 is input as 16-bit data to the first data register 1063 on the rising edge of the (E) signal 1085. While the (E) signal 1085 remains high, the 16-bit data is output to the host data bus SD 1060. Thus, 512 words ×8 bits are converted into sequential data of 256 words ×16 bits. The falling edge of IORDN 1086 is synchronized with the clock 1079 and the signals PSRAM-CEN 1074, PSRAM-OEN 1081, (C) 1083, and (D) 1084 are generated at the timings indicated by the digits in FIG. 13. (E) 1085 is a signal provided by inverting IORDN 1086. FLASH-CEN 1080 and FLASH-OEN 1082 remains asserted during the data transfer because they need not be negated at address switching.

Figure 14:
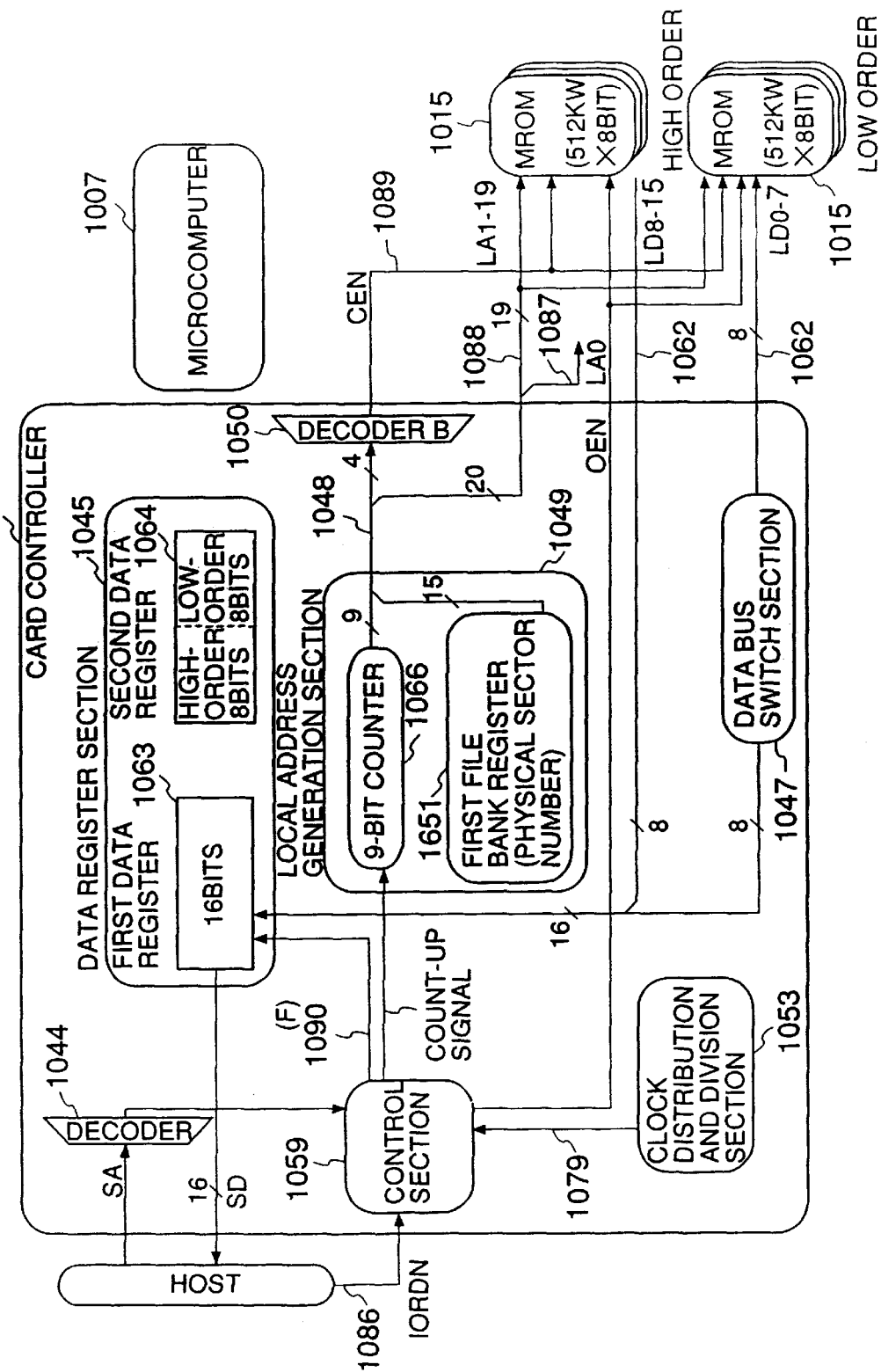
FIG. 14 is an illustration of a data flow at MASK ROM sector read according to first embodiment of the present invention.
Figure 15:
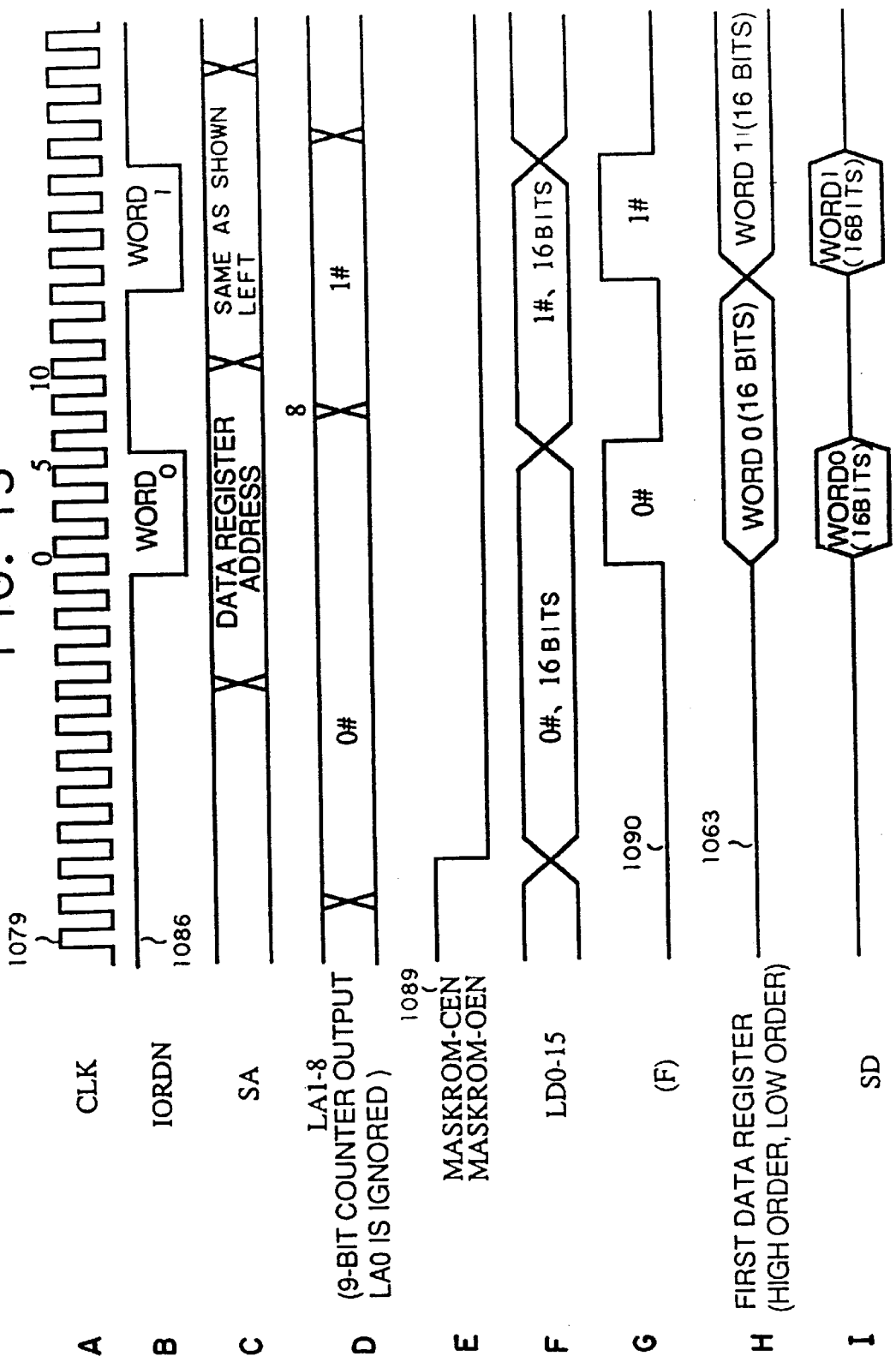
FIG. 15 is a timing chart at MASK ROM sector read according to first embodiment of the present invention.

Next, the sector read transfer operation from MASK ROM is described with reference to FIG. 14 (hardware configuration) and FIG. 15 (timing chart). In the example, the access time to MASK ROM 1015 is slow and 8-bit interleave transfer as in PSRAM and FLASH sector read transfer cannot be executed, thus MASK ROM is connected to the card controller 1009 by a 16-bit bus for latching data of 16-bit length in the first data register 1063 not via the second data register 1065. In this case, local addresses 48 may be generated for 256 words and LA0 1087 (output of the 9-bit counter 1066) used to switch the low-order and high-order bytes becomes unnecessary, thus LA1–LA19 1088 are input to address A0–A18 of MASK ROM and CEN 1089 is made common to the low-order and high-order parts. Data is input to the first data register 1063 on the rising edge of the (F) signal 1090. When the (F) signal 1090 is asserted, the data in the first data register 1063 is output to the host. The (F) signal 1090 is provided by inverting IORDN 1086. The rising edge of IORDN 1086 is synchronized with the 20-MHz clock 1079 and the address is counted up at the timings indicated by the digits in FIG. 15.

Figure 16:
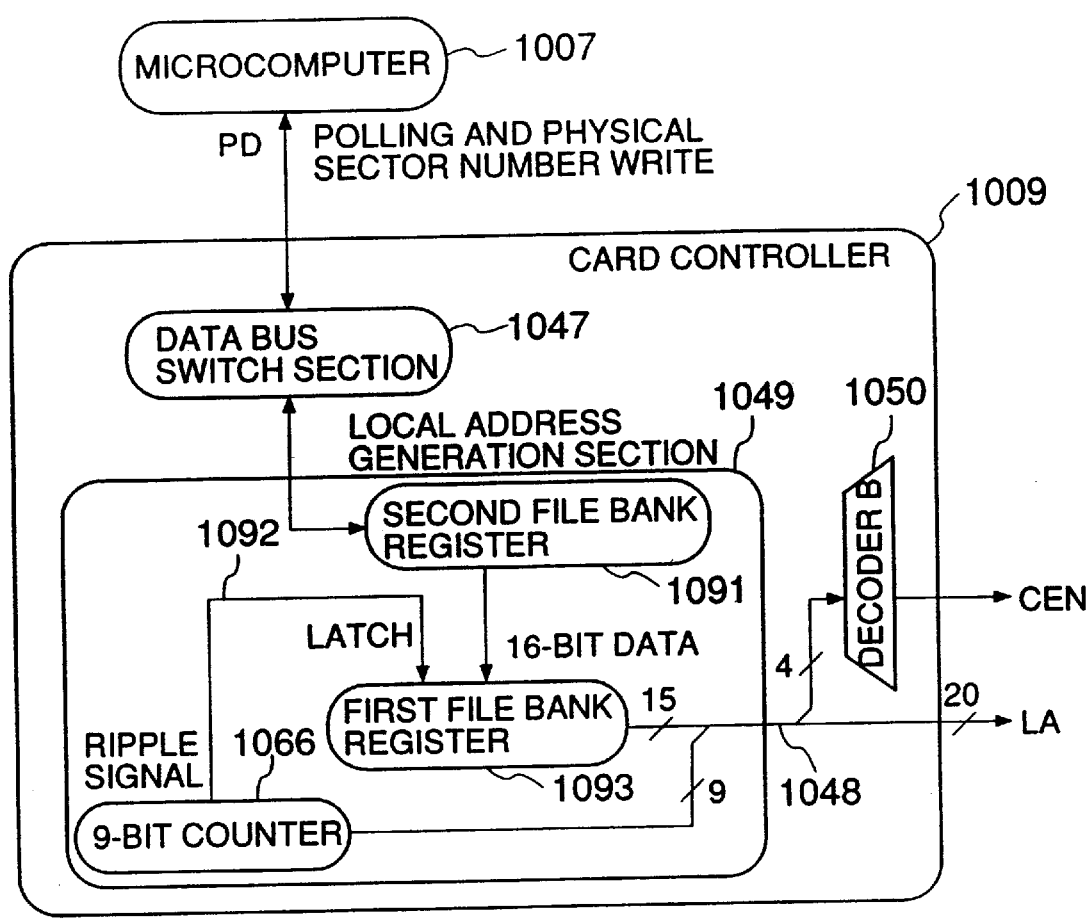
FIG. 16 is an illustration of physical sector number change operation in multisector transfer mode according to first embodiment of the present invention.
Figure 17:
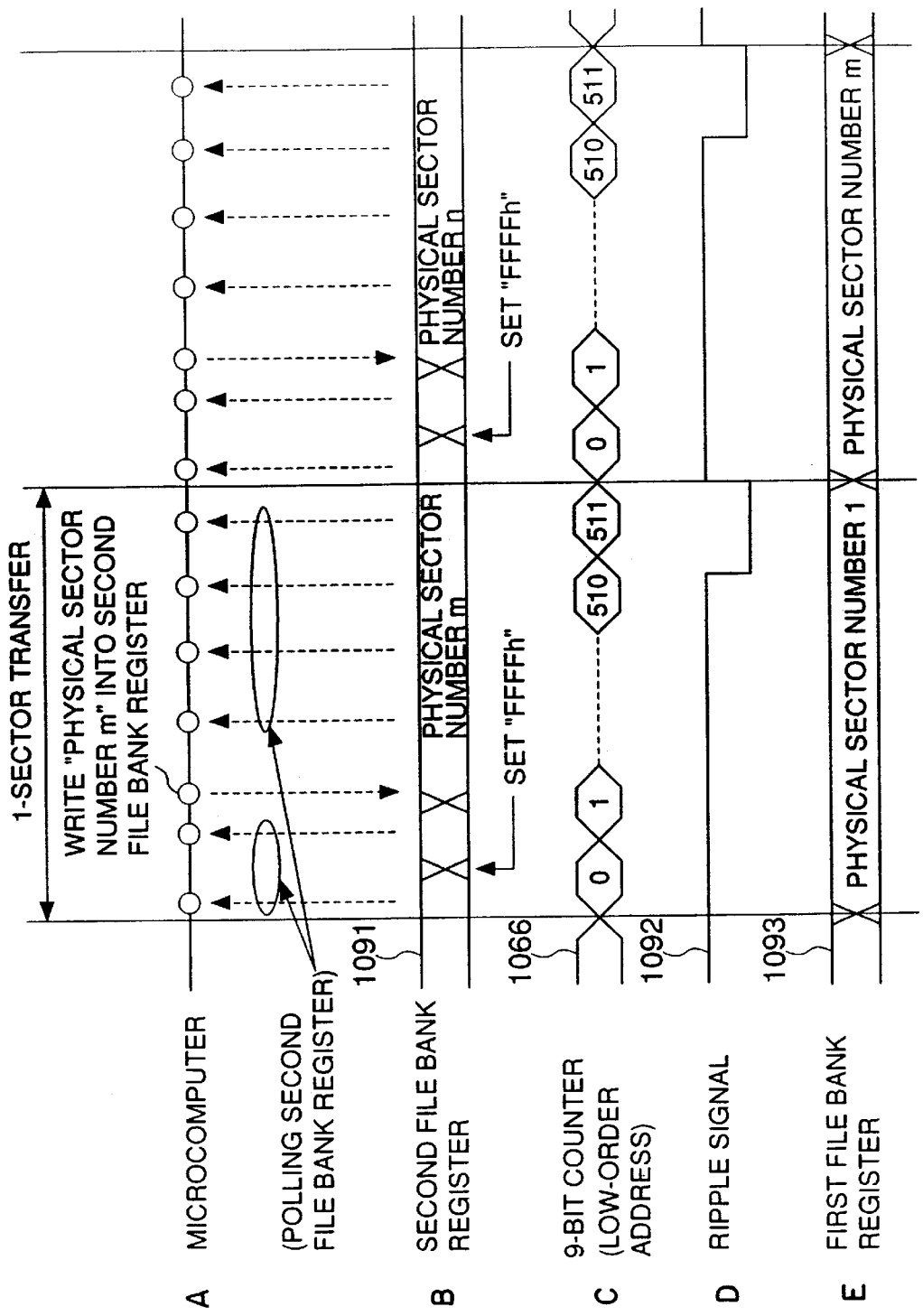
FIG. 17 is a timing chart in multisector transfer mode according to first embodiment of the present invention.

Next, multisector transfer is described. The multisector transfer is executed by repeating sector transfer. The transfer method is the same as the 1-sector transfer method described above. How to change physical sector numbers between one sector transfer and another sector transfer is discussed with reference to FIG. 16 (hardware configuration) and FIG. 17 (timing chart). First, the microcomputer 1007 polls the second file bank register 1091. If it is "FFFFh," the microcomputer 1007 writes a physical sector number (in the example, physical sector number m) into the second file bank register 1091. Next, the 9-bit counter counts 512. At count 512, a ripple signal 1092 is output. On the rising edge of the ripple signal 1092, the physical sector number, which is the 16-bit data written into the second file bank register 1091, is latched in the first file bank register 1093. At the same time, it is output to LA 1048. Thus, the sector number can be set at the timing at which the address changes from 511 to 0, enabling multisector transfer. After the physical sector number is changed, the card controller 1009 sets the second file bank register 1091 to data "FFFFh" unassigned as physical sector number. When the microcomputer 1007 acknowledges the fact by polling the second file bank register 1091, it writes the next physical sector number (in the example, n) into the second file bank register 1091. This process is repeated as many times as the number of sectors. The control section manages the number of repetitions in such a manner that the microcomputer 1007 reads the sector count written in a sector count register (not shown) contained in the register section 1046 shown in FIG. 5 and writes it into a multitransfer size register 1693 shown in FIG. 8. For the first sector, the physical sector number is written into the second file bank register 1091 at sector transfer preprocessing and when the sector transfer start register is set, the physical sector number is transferred from the second file bank register 1091 to the first file bank register 1093. After this, the second file bank register 1093 is automatically set to "FFFFh."

Next, long transfer is discussed. The long transfer method is the same as the 1-sector transfer method except that when four bytes of 8-bit ECC data are output after 256-word ×16-bit data is input from the host for sector write transfer, the card controller prolongs the sector transfer end during the time for writing the ECC data and except that after 256-word ×16-bit data is output to the host for sector read transfer, the card controller prolongs the sector transfer end for generating and outputting four bytes of 8-bit ECC data.

Next, the local address generation operation is discussed.

Figure 18:
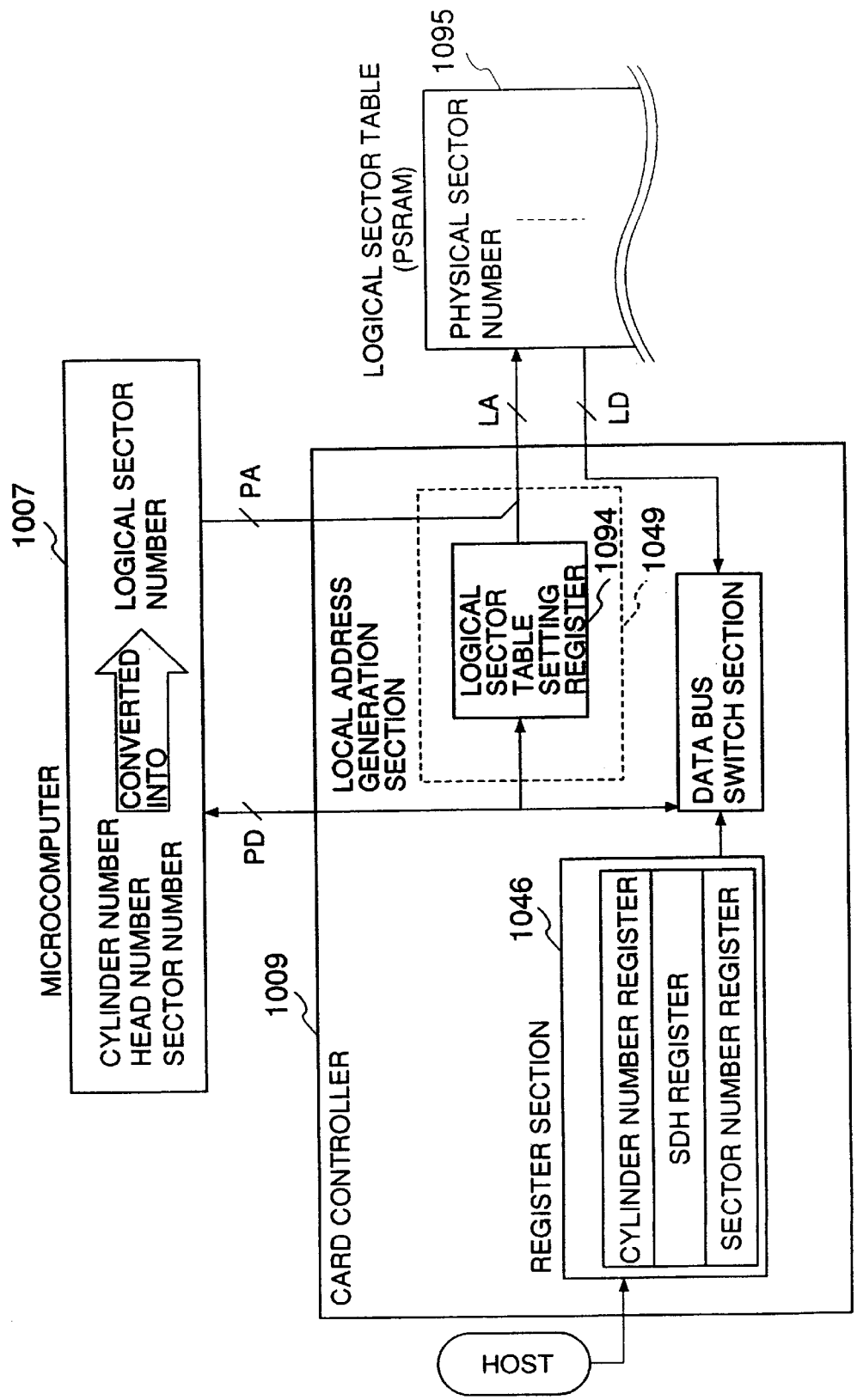
FIG. 18 is an illustration of local address generation operation according to first embodiment of the present invention.
Figure 19:
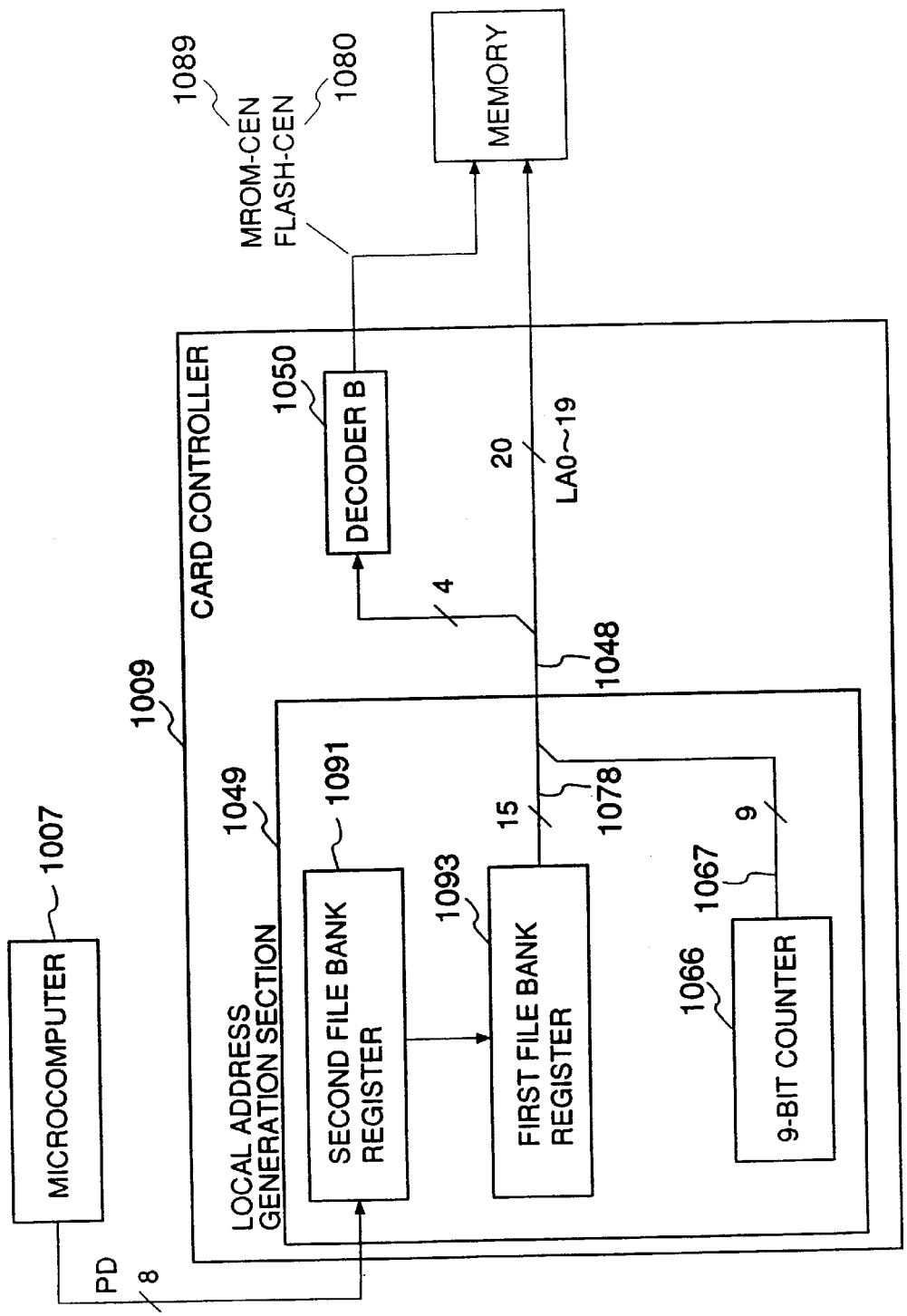
FIG. 19 is an illustration of local address generation operation according to first embodiment of the present invention.

First, the local address generation operation in the sector transfer mode is described with reference to FIGS. 18 and 19 (hardware configuration). The calculation operation of a physical sector number is discussed with reference to FIG. 18. The host writes a cylinder number, head number, and sector number into registers in the register section 1046. Then, the microcomputer 1007 reads the three numbers for analysis and converts the numbers into a logical sector number. Further, the microcomputer 1007 writes the logical sector number into a logical sector table setting register 1094 in the local address generation section 1049, then reads a PSRAM logical sector table 1095 on a microcomputer address map to input the physical sector number corresponding to the logical sector number. The logical sector table 1095 is a table which stores physical sector numbers corresponding to logical sector numbers.

The subsequent operation is discussed with reference to FIG. 19. The input physical sector number is written into the second file bank register 1091 by the microcomputer 1007. Then, when transfer is started, the physical sector number in the second file bank register 1091 is latched in the first file bank register 1093 and 15 bits (1096) are output. A 9-bit serial address in the range of 0 to 511 (1067) is output from the 9-bit counter. The 15-bit data (high-order part) 1096 and the 9-bit data (low-order part) 1067 are combined to generate a 24-bit local address. The high-order four bits of the 24-bit data are input to the decoder B 1050 to generate MASKROM-CEN 1089 and FLASH-CEN 1080. The low-order 20 bits are output as LA0–LA19.

Figure 20:
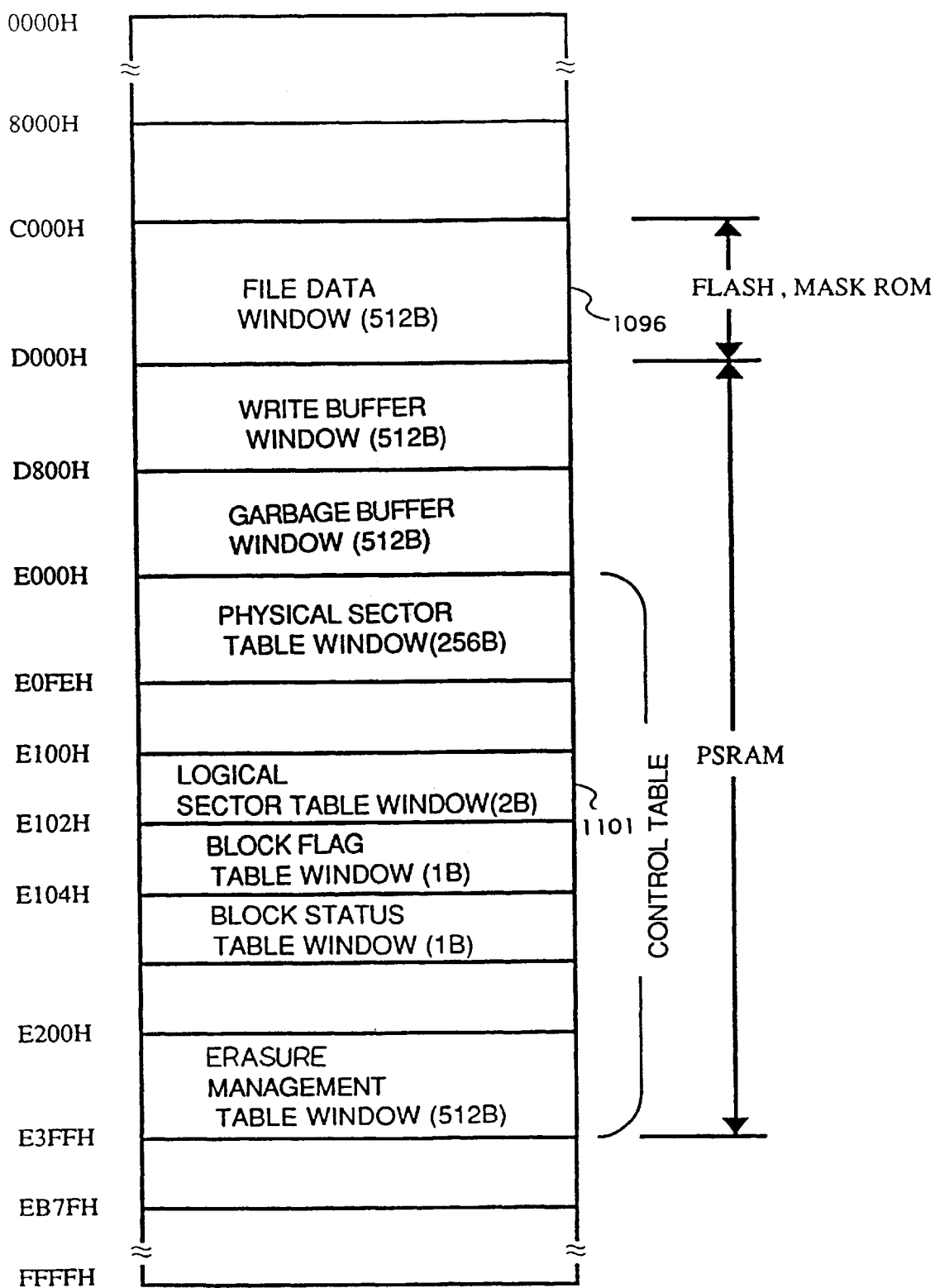
FIG. 20 is an illustration of a microcomputer address map according to first embodiment of the present invention.
Figure 21:
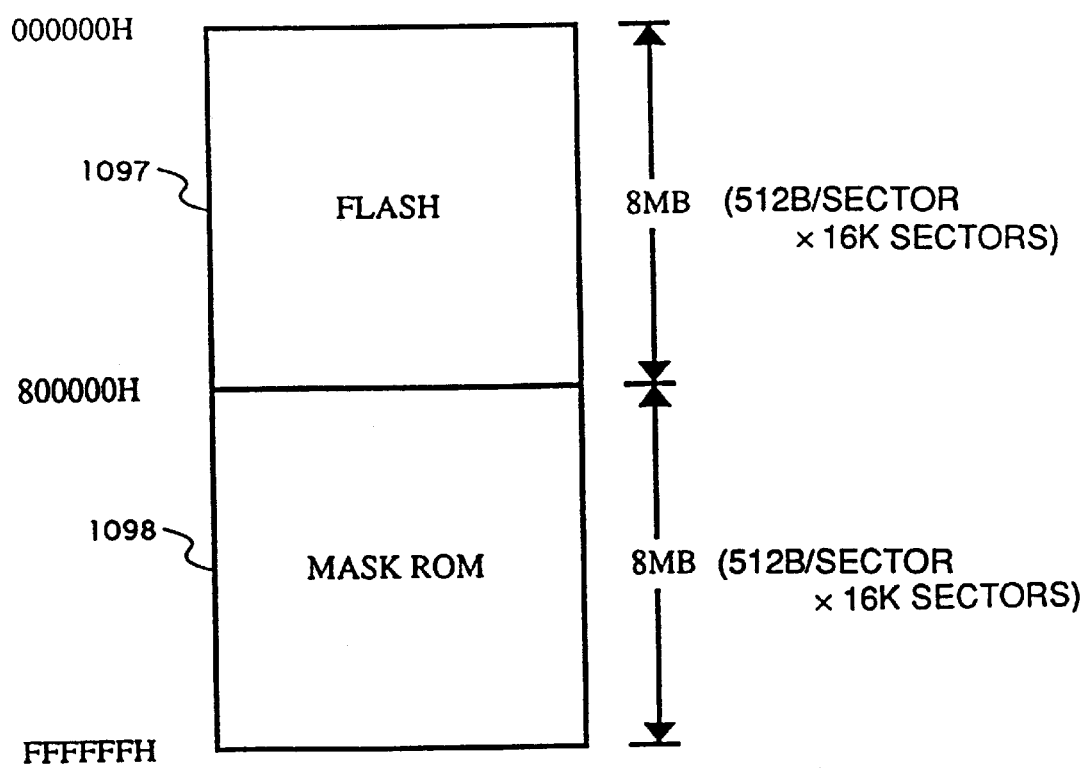
FIG. 21 is an illustration of a physical address map of a file area according to first embodiment of the present invention.
Figure 22:
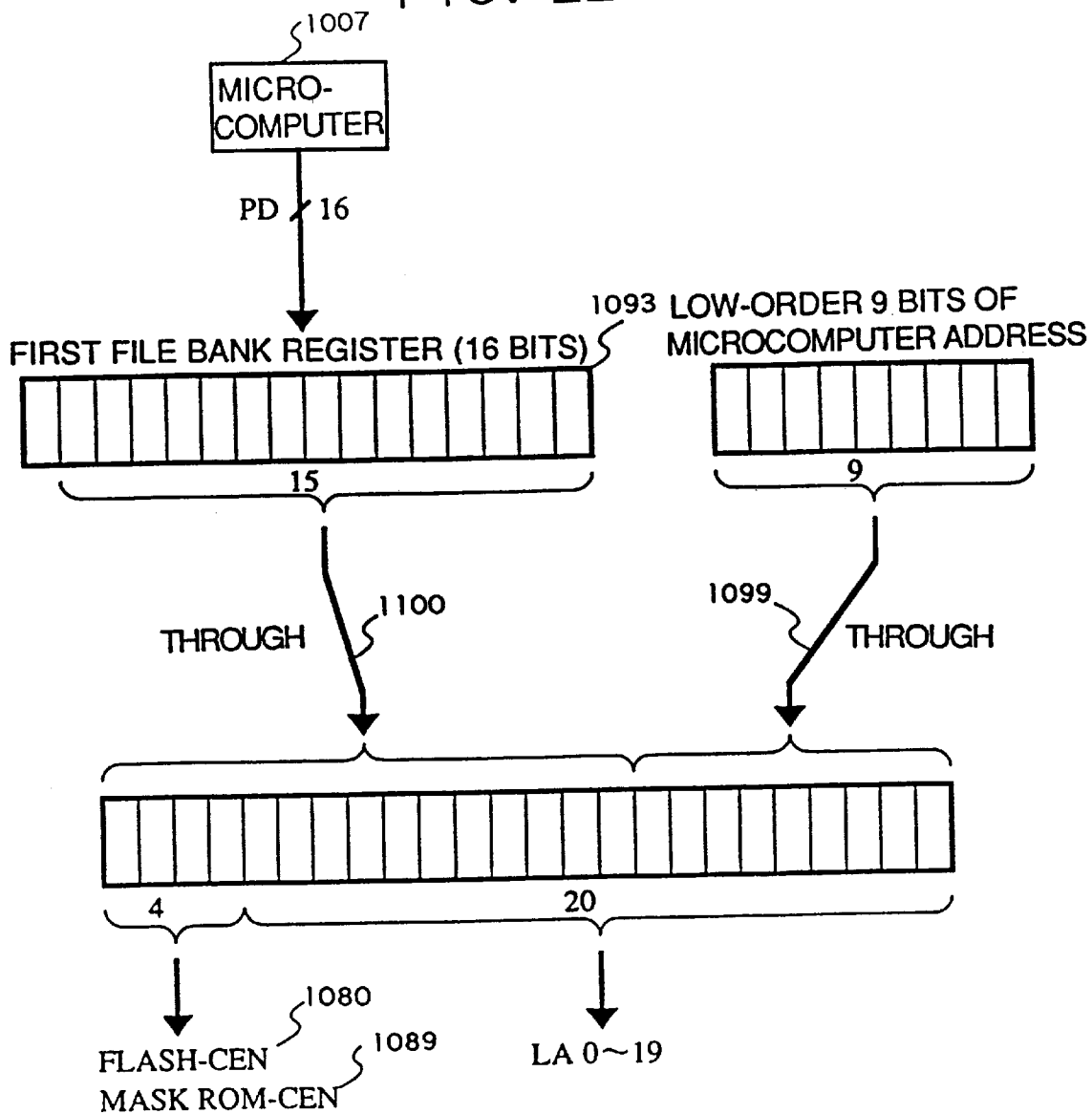
FIG. 22 is an illustration of a file area local address generation sequence according to first embodiment of the present invention.

The local address generation operation for the microcomputer 1007 to access the local memory is described by taking a file data access as an example with reference to FIG. 20 (microcomputer address map), FIG. 21 (physical address map of file area), and FIG. 22 (local address generation sequence). In the embodiment, by specifying an address on a microcomputer memory map shown in FIG. 20, FLASH space 1097 and MASK ROM space 1098 (16M bytes in total) shown in FIG. 21 can be accessed through a 512-byte (1-sector) window 1096. Specifically, the physical sector number of the sector to be accessed is written into the first file bank register 1093 in FIG. 22 by the microcomputer. Then, when the file data window 1096 on the microcomputer address map in FIG. 20 is read/written by the microcomputer, the low-order nine bits of the microcomputer address are assigned to the low-order nine bits of local address (1099) and the physical sector number in the first file bank register is assigned to the high-order address (1100), as shown in FIG. 22. FLASH-CEN 1080 and MASKROM-CEN 1091 are generated by decoding the high-order four bits. Thus, file data space larger than the microcomputer address space can be accessed.

Figure 23:
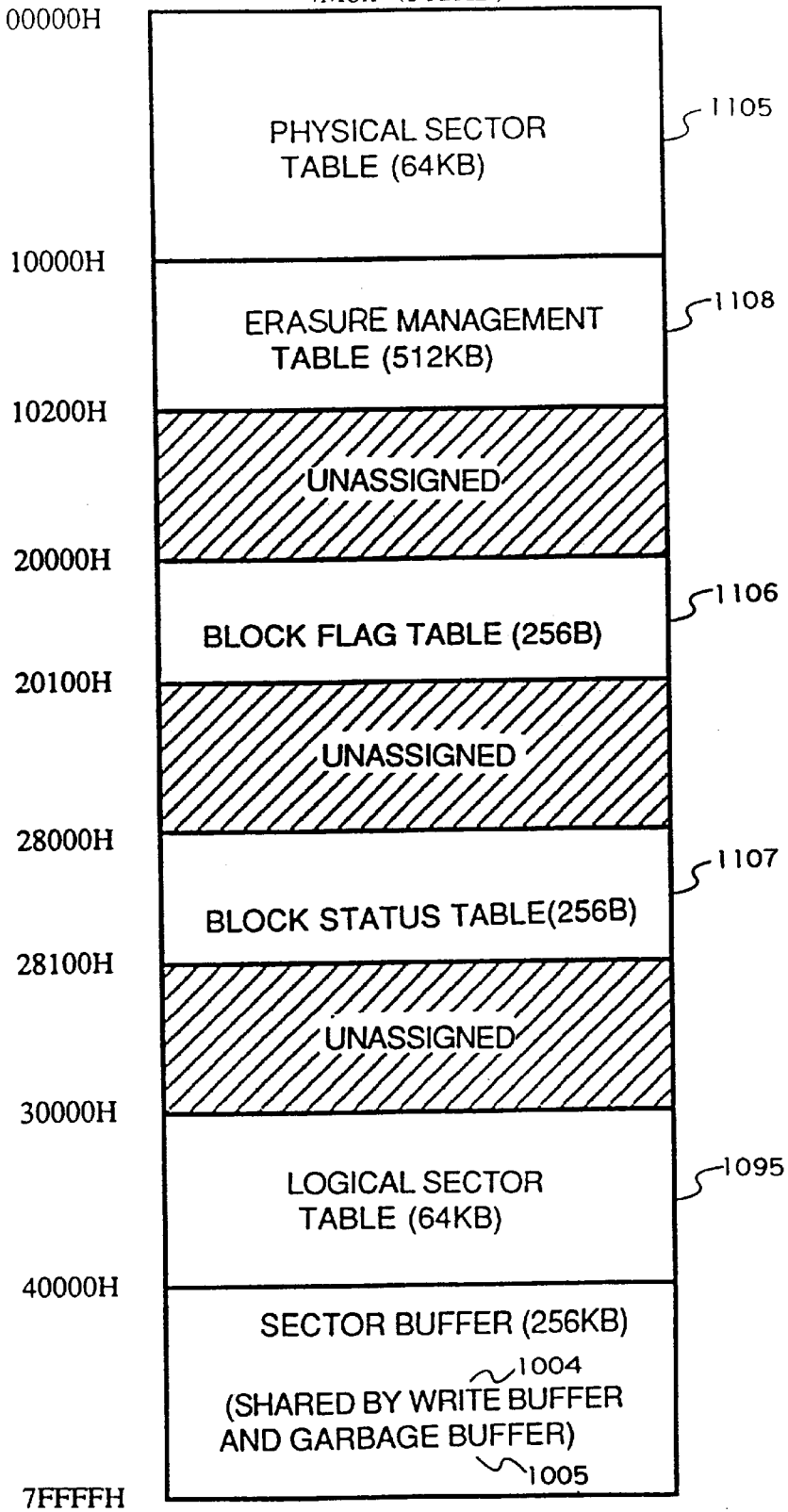
FIG. 23 is an illustration of a physical address map of PSRAM according to first embodiment of the present invention.
Figure 24:
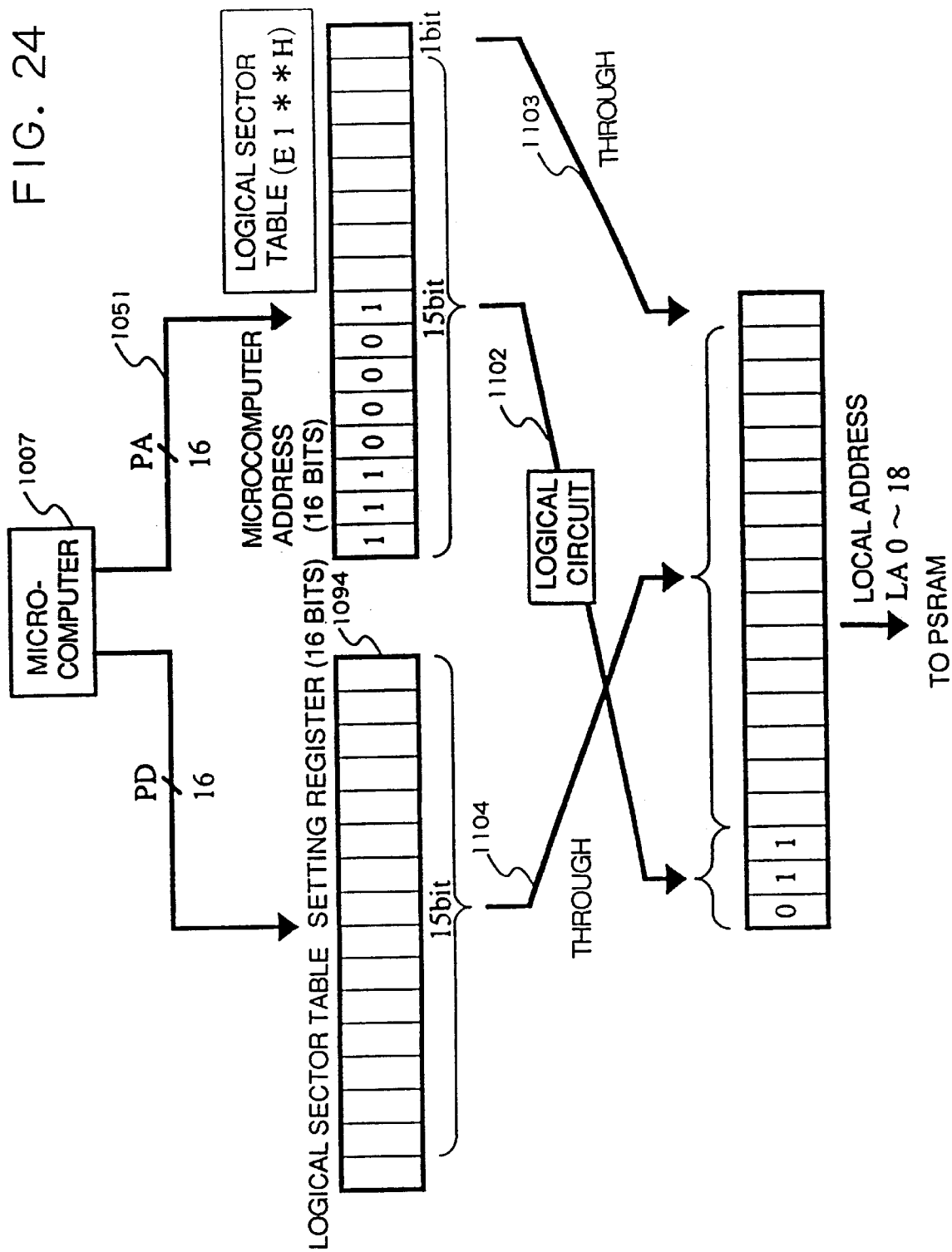
FIG. 24 is an illustration of PSRAM local address generation sequence according to first embodiment of the present invention.

Next, the local address generation operation is described by taking an access to a logical sector table in the control table as an example with reference to FIG. 20 (microcomputer address map), FIG. 23 (physical address map of PSRAM), and FIG. 24 (local address generation sequence). By specifying the address of a logical sector table window 1101 on the memory map shown in FIG. 20, a 64K-byte logical sector table 1095 in PSRAM shown in FIG. 23 can be accessed through the 2-byte window. Specifically, the logical sector number is written into the logical sector table setting register 1094 by the microcomputer. Then, when the logical sector table window 1101 on the microcomputer address map is accessed, the low-order three bits of the local address (LA16–LA18) are set to 011 by a logical circuit (1102) from the high-order 15 bits of microcomputer address 1051 and the least significant bit is output to the least significant bit of the local address intact (1103), as shown in FIG. 24. Further, the low-order 15 bits of the first file bank register are set in LA1–LA15 of the local address through (1104). Thus, local address bits LA0–LA18 to PSRAM are generated. The first file bank register 1093 is used for a physical sector table 1105, block flag table 1106, and block status table 1107. The write buffer bank register is used for write buffer 1004 and the garbage buffer bank register is used for garbage buffer 1005. Since the window size equals the physical space size, no bank register is used for an erasure management table 1108, and the high-order address is generated by means of the logical circuit only.

Figure 25:
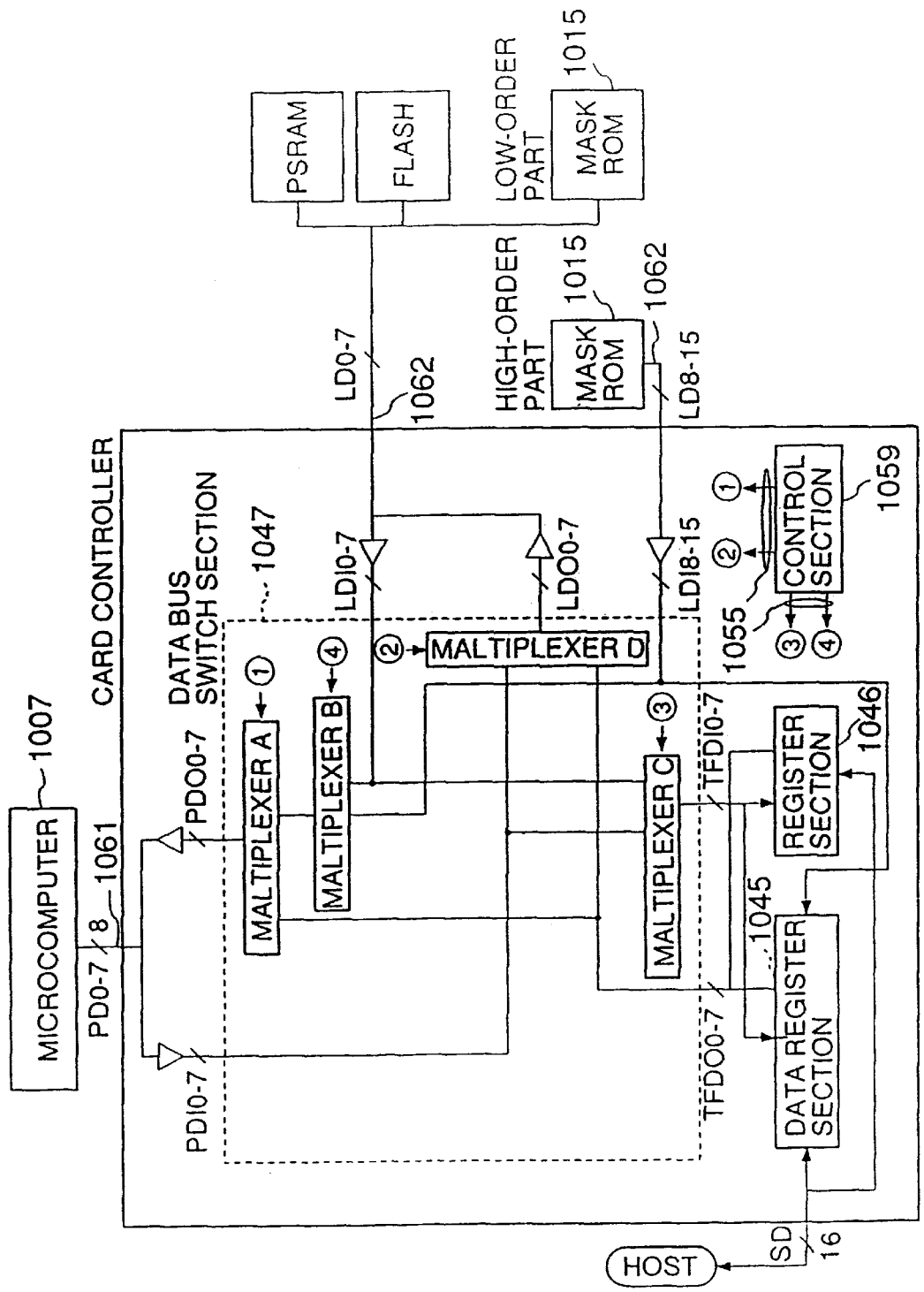
FIG. 25 is a block diagram of a data bus switch section according to first embodiment of the present invention.

Next, the data bus switch operation is discussed with reference to FIG. 25 (hardware configuration). PD0–PD7 1061 and the low-order eight bits of the local data bus 1062, LD0–LD7, are bidirectional and are separated into input and output buses in the card controller. The high-order eight bits of the local data bus 1062, LD8–LD15, serve as an input bus dedicated to MASK ROM 1015 (high-order byte part). TFDO0–TFDO7 and TFDI0–TFDI7 are output and input buses from and to the data register section 1045 and the register section 1046. The data bus switch section 1047 performs bus switching by using control signals 1055 generated by the control section 1059.

Figure 26:
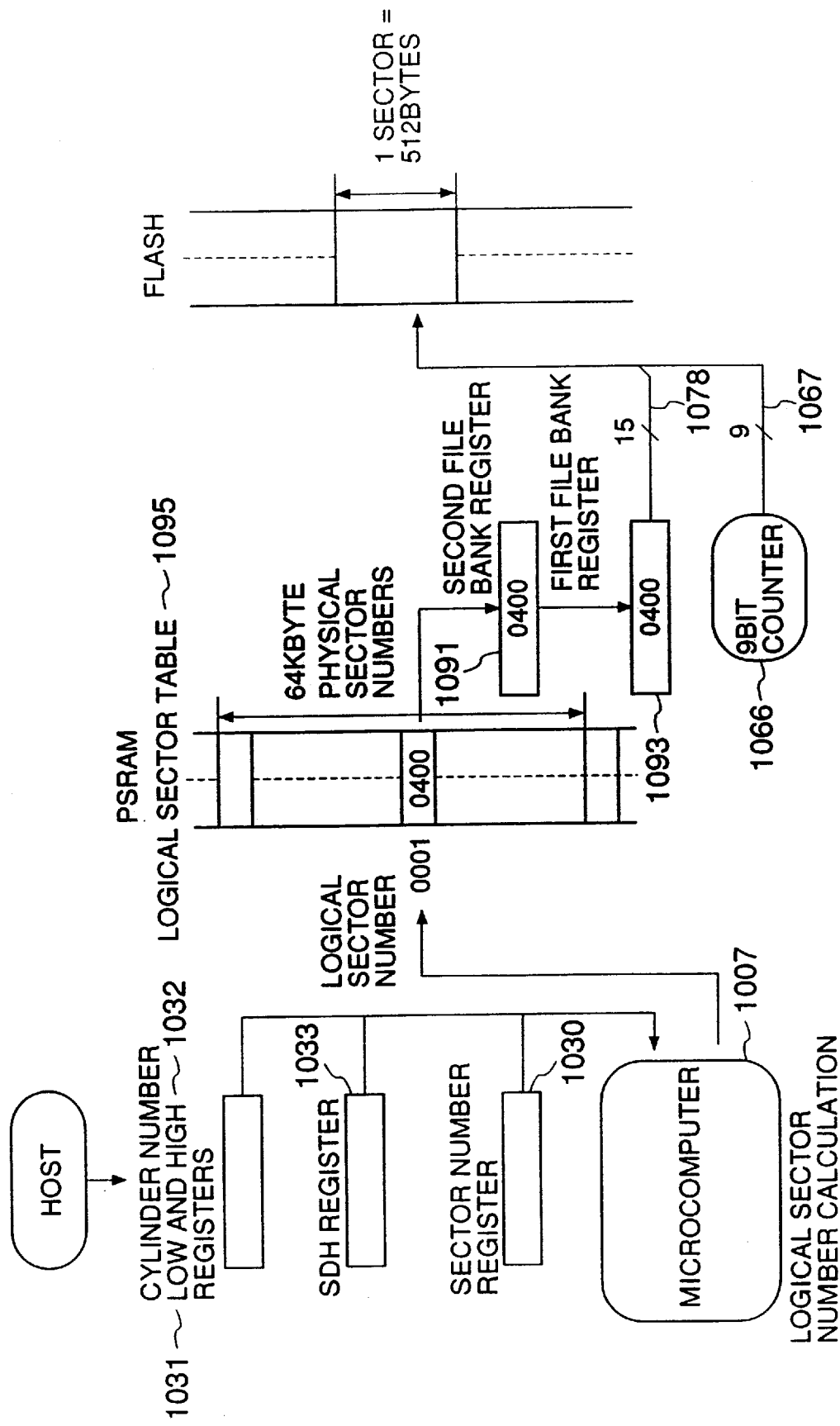
FIG. 26 is an illustration of a logical sector table according to first embodiment of the present invention.

Next, how to use the control table is described. The control table consists of the five tables: Logical sector table, physical sector table, erasure management table, block flag table, and block status table, First, the role of the logical sector table 1095 in the FLASH sector read transfer mode is discussed with reference to FIG. 26. The logical sector table 1095 is a 64K-byte table which stores physical sector numbers corresponding to logical sector numbers. The stored physical sector numbers match the addresses of the physical sector table 1005; numbers 1–16384 are defined as valid sectors, FFFFh is defined as a writable sector, and 0 is defined as an invalid sector. The host writes a cylinder number into cylinder number low and high registers 1031 and 1032, a head number into an SDH register 1033, and a sector number into a sector number register 1030. Then, when the host writes a command, the microcomputer 1007 reads and decodes the command and calculates a logical sector number. The microcomputer 1007 references the address of the logical sector table 1095 indicated by the logical sector number and writes the physical sector number stored at the address into the second file bank register 1091 of the card controller. The physical sector number in the second file bank register 1091 is transferred to the first file bank register 1093 for use as the high-order 15 bits of local address (1078). The low-order nine bits 1067 are generated at the 9-bit counter 1066. By counting the low-order nine bits (1067) 512 times, data on any one sector of FLASH can be accessed.

Figure 27:
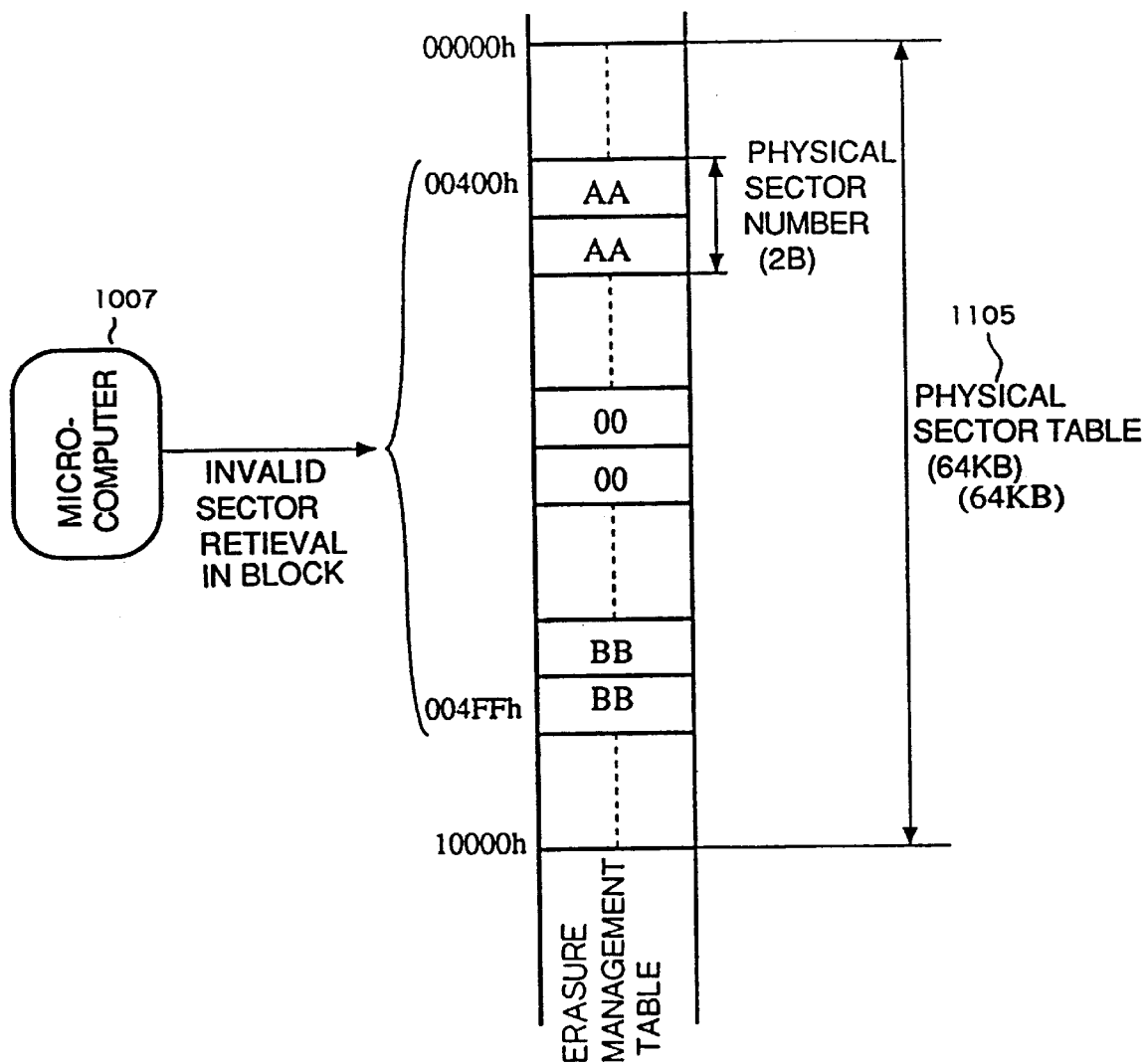
FIG. 27 is an illustration of a physical sector table according to first embodiment of the present invention.
Figure 28:
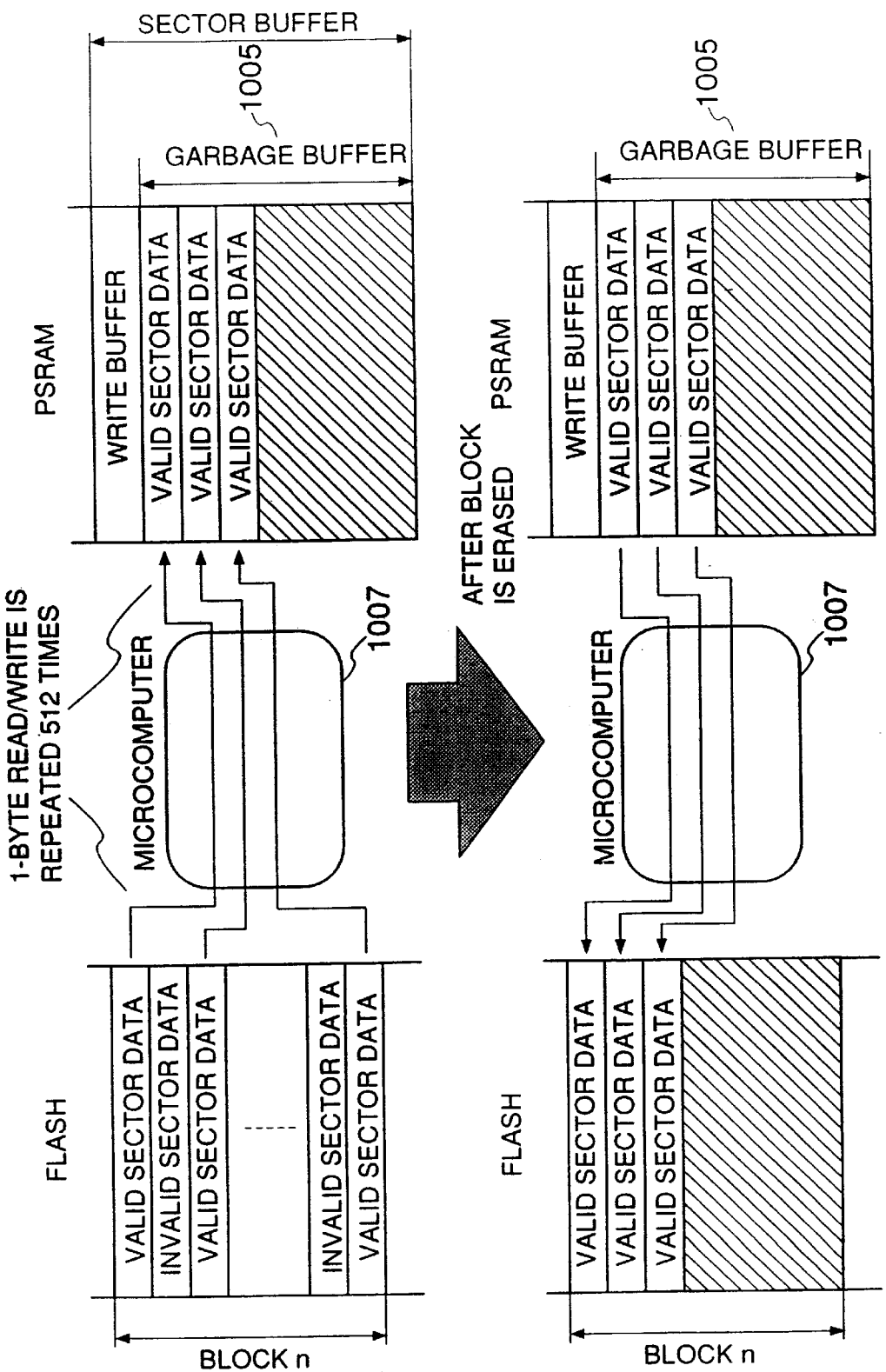
FIG. 28 is an illustration of garbage collection according to first embodiment of the present invention.

Next, the physical sector table 1105 is described with reference to FIG. 27. The physical sector table 1105 is a 64K-byte table which stores logical sector numbers corresponding to physical sector numbers. The stored logical sector numbers match the addresses of the logical sector table; numbers 1–16384 are defined as valid sectors, FFFFh is defined as a writable sector, and 0 is defined as an invalid sector. The table is used to determine whether or not garbage collection is to be executed for the block to which the physical sector pointed to by a write pointer belongs when internal processing after sector write transfer is performed, namely, when data is written into FLASH from the write buffer. Specifically, the microcomputer 1007 retrieves "0" in the physical sector table 1105 for the block (in the example, 00400H to 004FFh). If "0" exists, namely, an invalid sector exists, garbage collection is started. The write pointer is a pointer indicating the physical sector of FLASH into which a write is executed, and is managed by the microcomputer 1007. The garbage collection is described with reference to FIG. 28. The microcomputer 1007 condenses and transfers only data on valid sectors in the FLASH block (in the example, block n) to the garbage buffer 1005. After this, the microcomputer 1007 erases the block and writes the data in the garbage buffer 1005 into the block. That is, the condensed data is written into the same block of FLASH. After this, the physical sector table and the logical sector table are updated conforming to the condense processing. To update the physical sector table, the same condense processing as described above is performed. The logical sector table is updated based on the physical sector table condensed.

Figure 29:
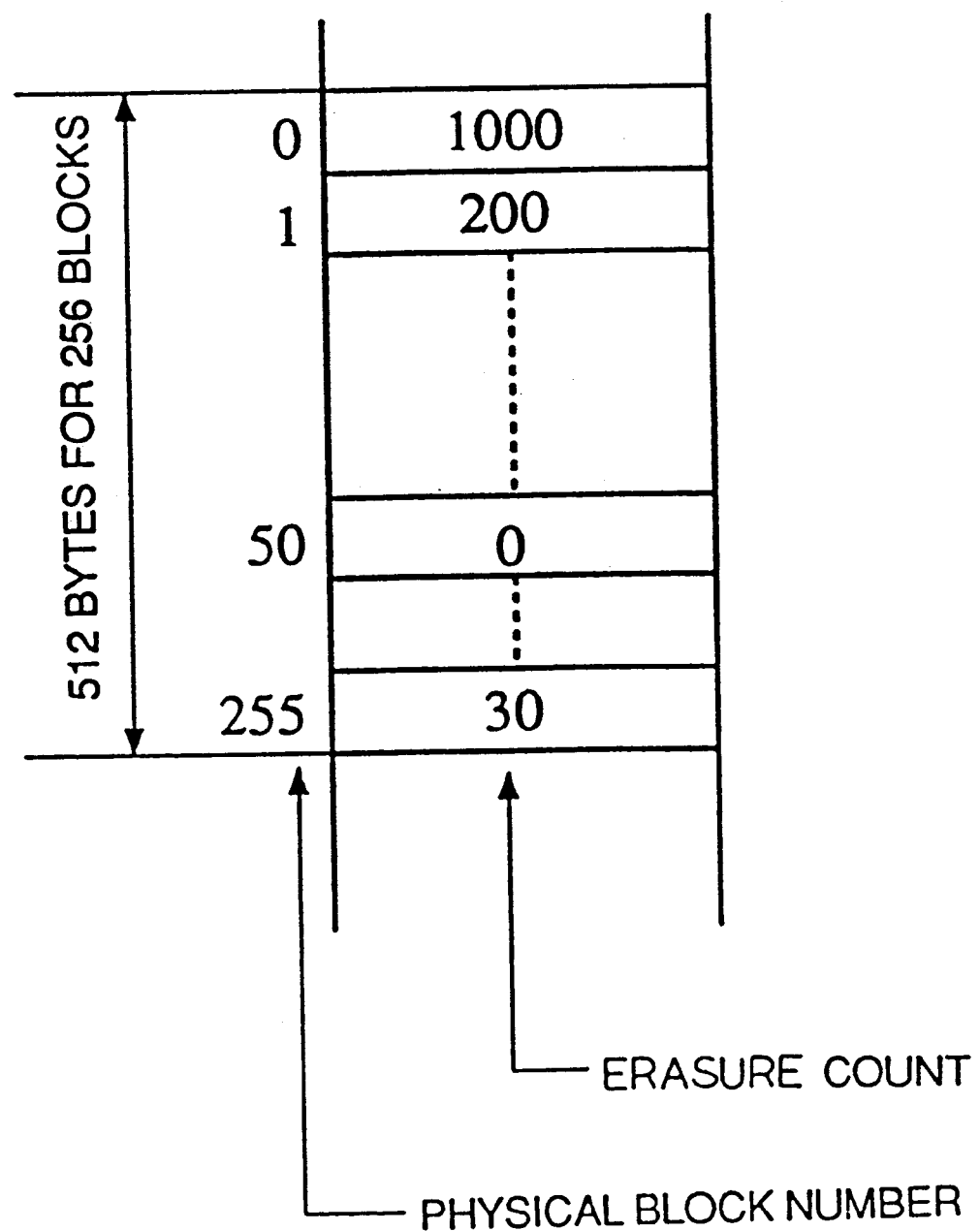
FIG. 29 is an illustration of an erasure management table according to first embodiment of the present invention.

Next, the erasure management table is discussed with reference to FIG. 29. The erasure management table 1108 is a 512-byte table for erasure management of FLASH and stores the erasure count (0–65536) for each FLASH block in the order of the FLASH physical block numbers. The table can cover a maximum of 16 chips each consisting of 16 blocks, namely, a maximum of 256 blocks.

Figure 30:
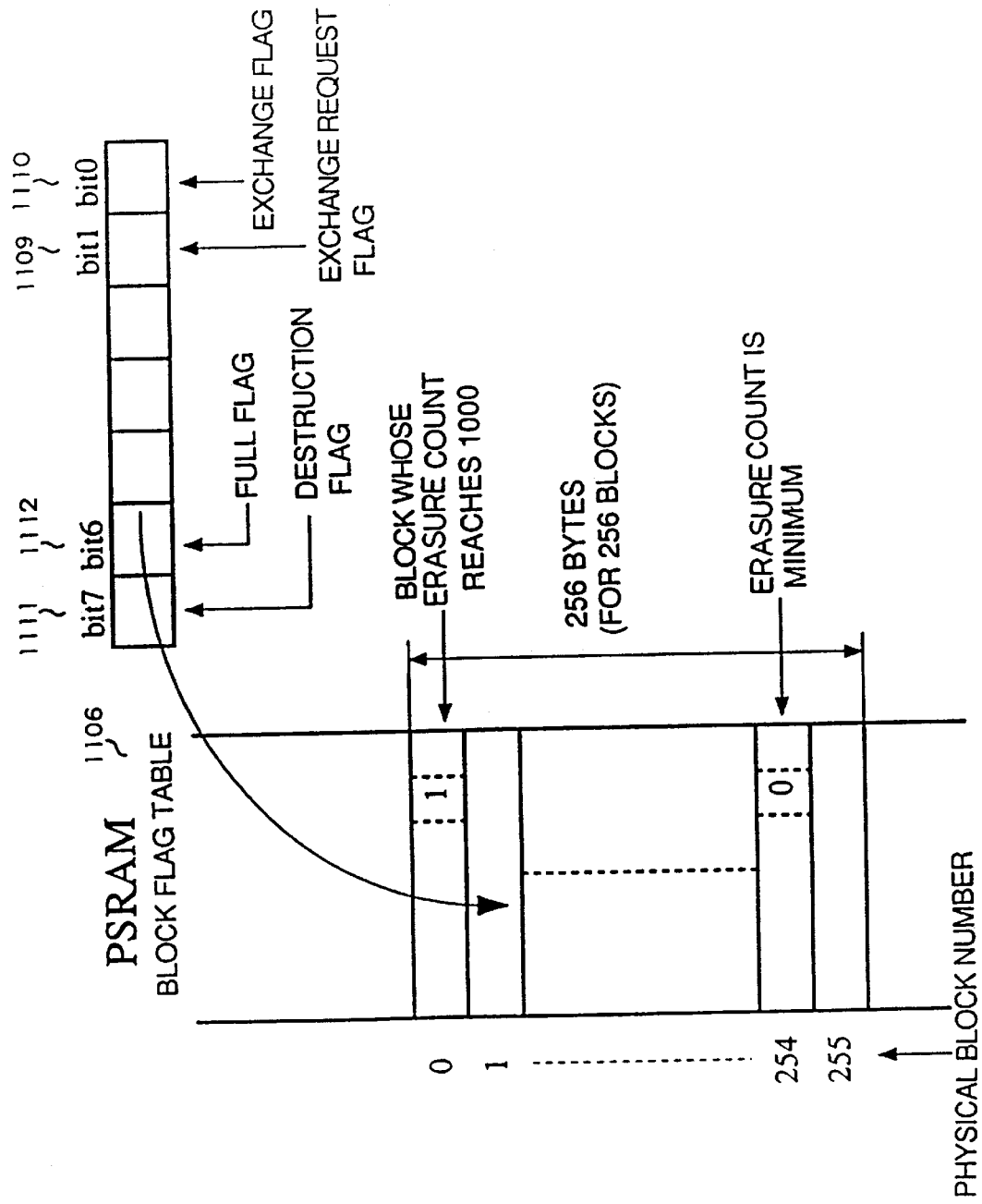
FIG. 30 is an illustration of a block flag table according to first embodiment of the present invention.
Figure 31:
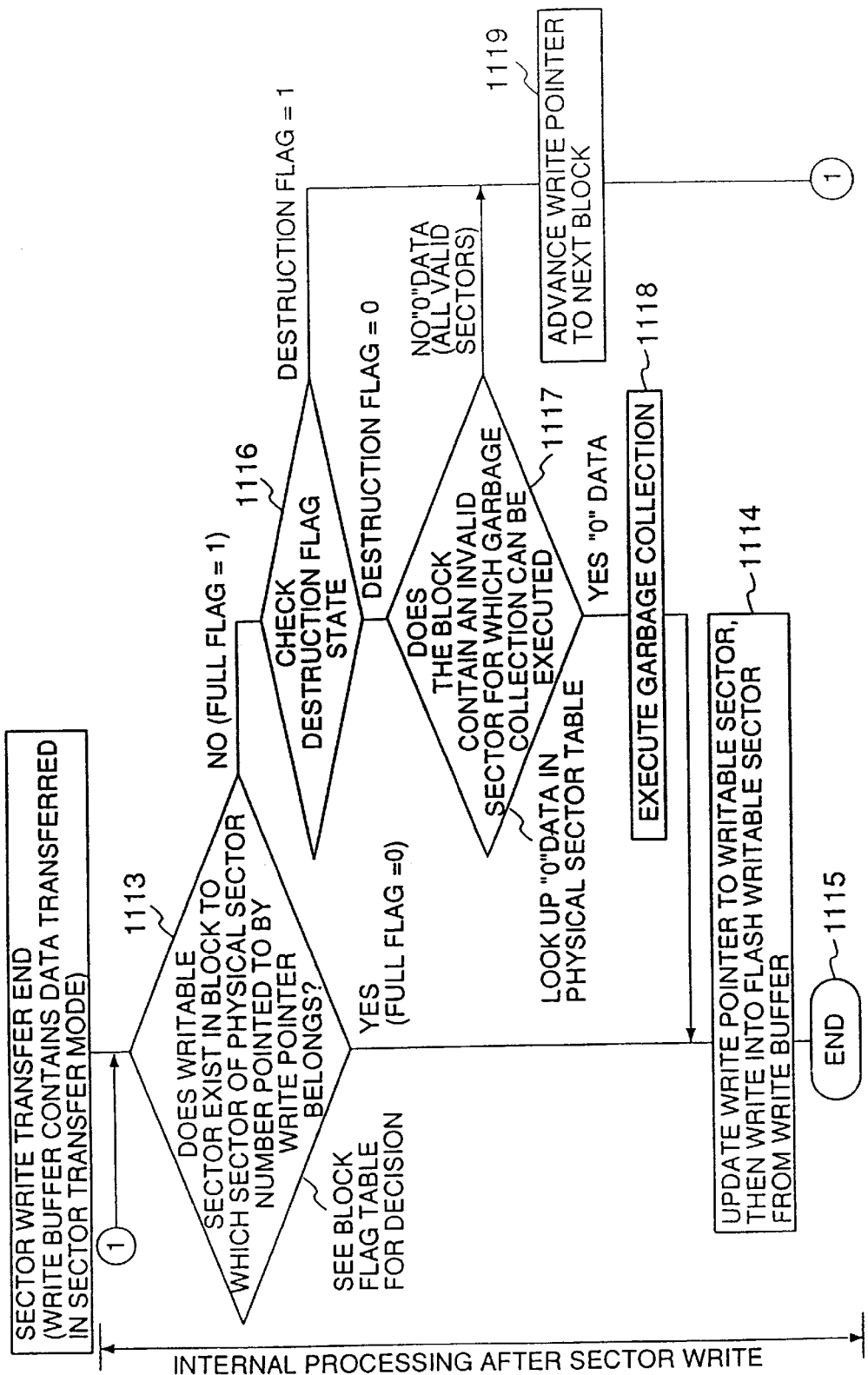
FIG. 31 is a flowchart of internal processing after sector write transfer according to first embodiment of the present invention.

Next, the block flag table is described with reference to FIG. 30. The block flag table 1106 is a 256-byte table which stores the writable state for each FLASH block in the order of the FLASH physical block numbers. An exchange request flag 1109, an exchanged flag 1110, a destruction flag 1111, and a full flag 1112 contained in the table are described. The exchange request flag 1109 is set by the microcomputer 1007 each time the erasure count of a block exceeds n ×1000 (n is a natural number). When the power is turned on, the microcomputer sees the flag and exchanges data in the block corresponding to the flag and data in the block having the minimum erasure count. The flag is cleared after the exchange is executed. The exchanged flag 1110 is set in the block exceeding the erasure count n to prevent another exchange from being made. Thus, the data having high access frequency and the data having low access frequency are exchanged to spread out the erasure counts in FLASH. The erasure management table is referenced and the destruction flag 1111 is set to 1 for a block that cannot be erased/written as a destruction block. When a block becomes full with valid and invalid sectors and contains no writable sectors, the full flag 1112 is set to 1 for the block. The flag is used for checking to see if a writable sector exists in the block to which the physical sector pointed to by the write pointer belongs. FIG. 31 shows a flowchart of internal processing after sector write transfer. If the full flag 1112 is 0 at step 1113, data in the write buffer is written into a writable sector of FLASH at step 1114 and the operation is terminated at step 1115. If the full flag is 1 at step 1113 and the destruction flag is 0 at step 1116 and the block contains an invalid sector for which garbage collection can be executed at step 1117, garbage collection is executed at step 1118, then a write is executed at step 1114 and the operation is terminated at step 1115. If the full flag is 1 at step 1113 and the destruction flag is 0 at step 1116 and all sectors contained in the block are valid sectors at step 1117, the write pointer is advanced to the next block at step 1119 and internal processing is again executed starting at referencing the block flag table at step 1113. If the destruction flag is 1 at step 1116, the write pointer is advanced to the next block at step 1119 and internal processing is again executed starting at referencing the block flag table at step 1113. The branch is taken by retrieving the physical sector table as described above.

Figure 32A:
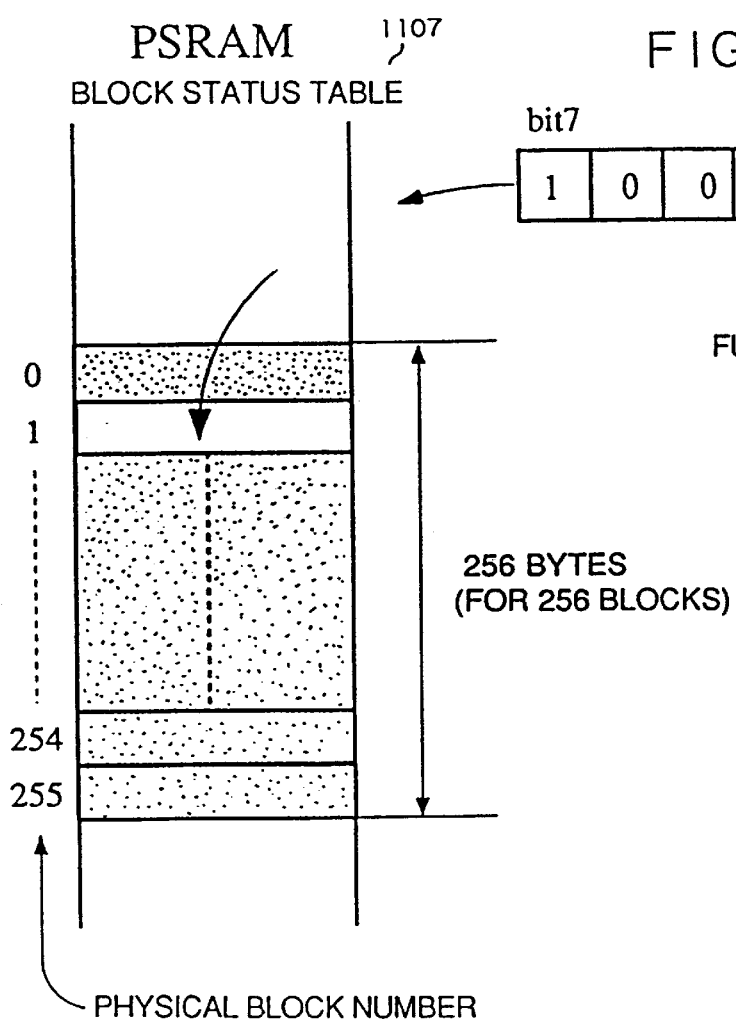
FIG. 32 is an illustration of a block status table according to first embodiment of the present invention.
Figure 32B:
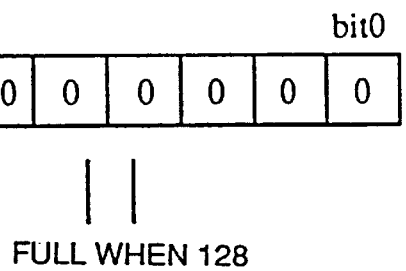

Next, the block status table 1107 is discussed with reference to FIG. 32. The block status table 1107 is a 256-byte table which stores the number of write sectors for each FLASH block in the order of FLASH physical block numbers. The number of write sectors ranges from 0 to 128; when it is 128, it indicates that the block is full. The table is used to see how many writable sectors each block contains when data extending over a number of sectors is written into a single block.

Figure 33:
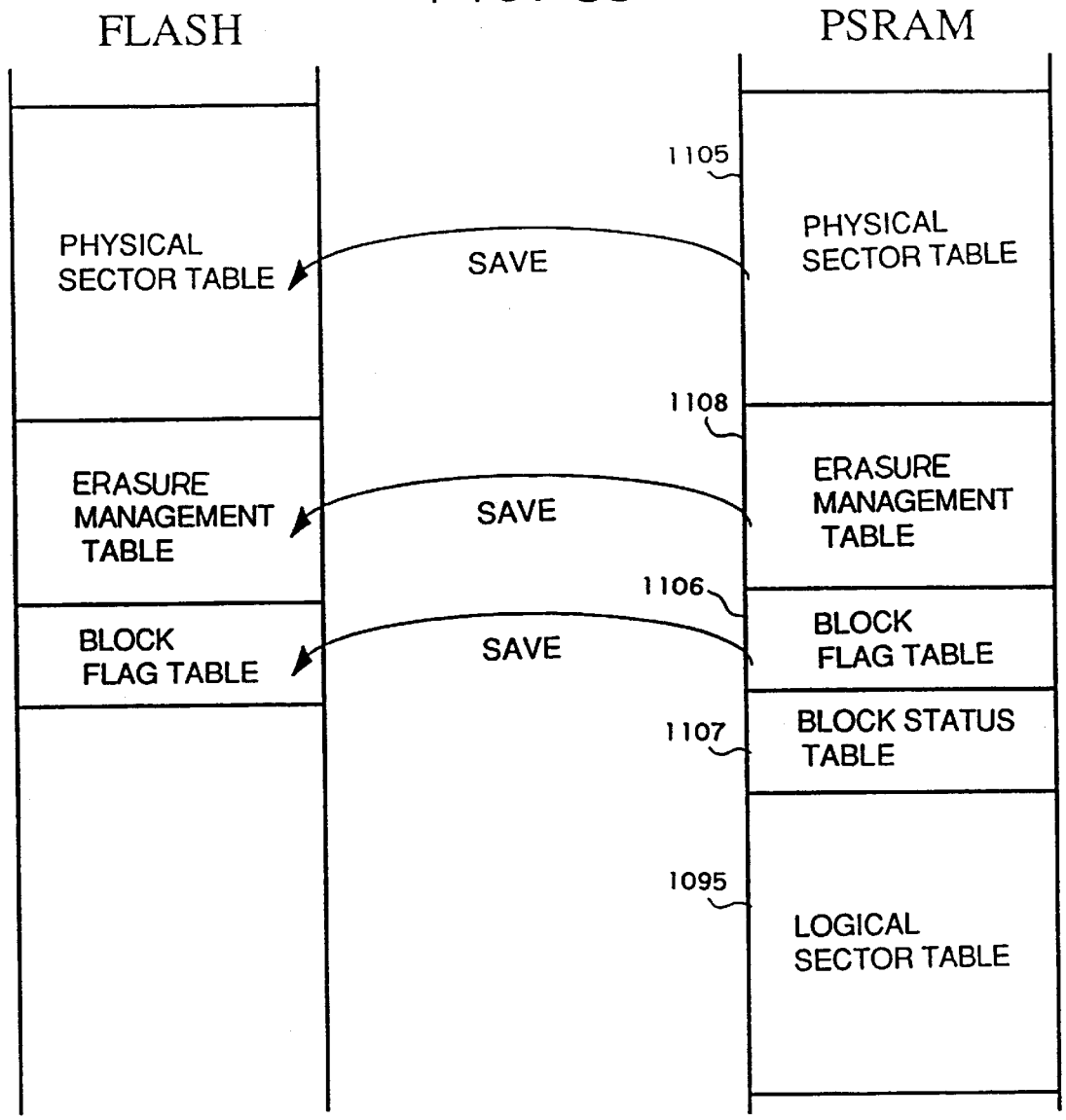
FIG. 33 is an illustration of processing when power is turned off according to first embodiment of the present invention.
Figure 34:
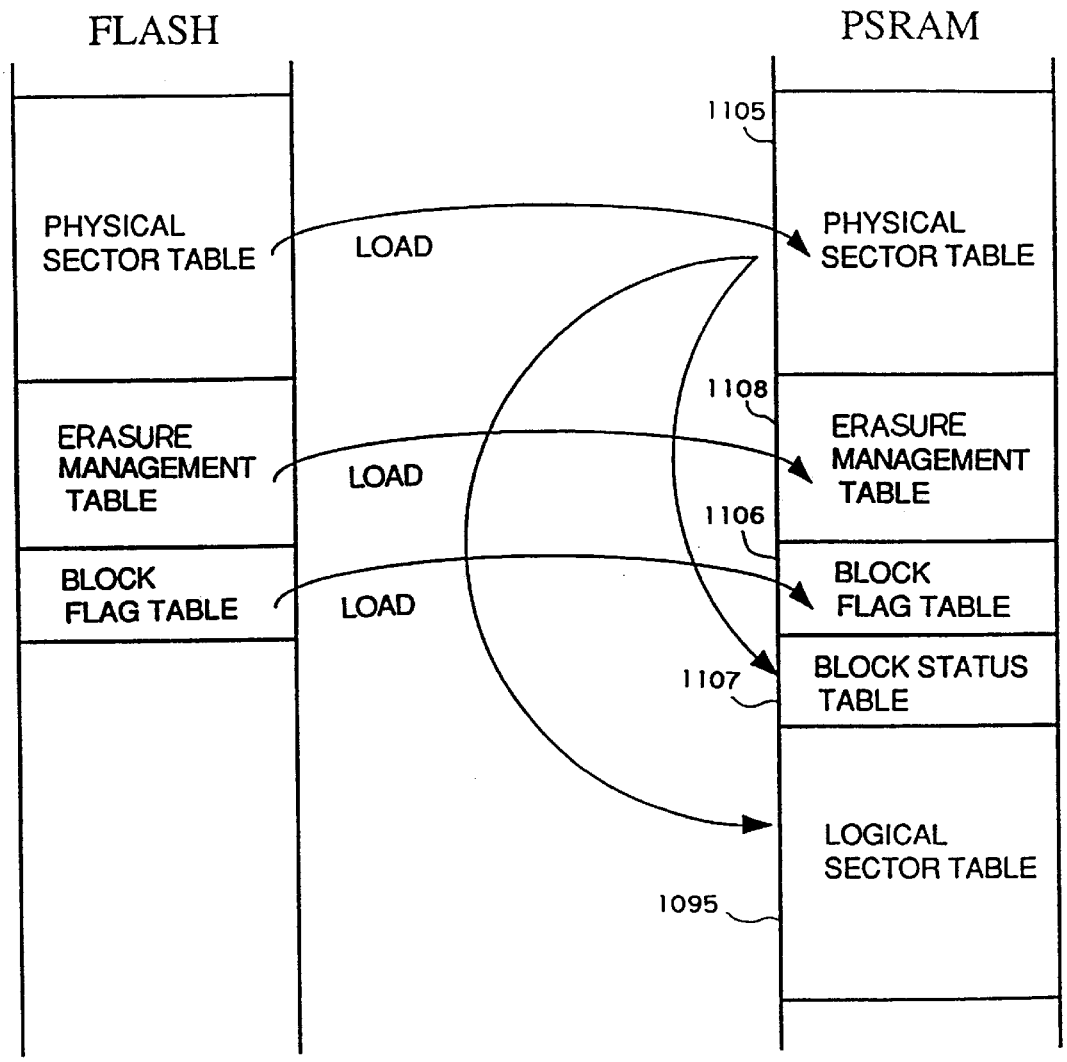
FIG. 34 is an illustration of processing when power is turned on according to first embodiment of the present invention.

Processing of the information tables when the power is turned off is described with reference to FIG. 33 and that when the power is turned off is described with reference to FIG. 34. The physical sector table 1105, erasure management table 1108, and block flag table 1106 are tables resident in both PSRAM and FLASH areas. The tables on PSRAM are nonsave tables and updated whenever necessary; the tables on FLASH are save tables and updated only when the power is turned off. When the power is turned off, the data in the physical sector table 1105, erasure management table 1108, and block flag table 1106 is saved in the FLASH area. When the power is turned on, the data in the three tables in the FLASH area is loaded into PSRAM. Based on the logical sector numbers written in the physical sector table 1105, the physical sector numbers which are addresses of the physical sector table 1105 are written into the logical sector table 1095 in order. The number of write sectors in the physical sector table 1105 is counted and the block status table 1107 is prepared. At this time, if the microcomputer acknowledges that an exchange request flag in the block flag table 1106 is set, then it starts block exchange processing corresponding to the exchange request flag. After the power is turned on, the tables on PSRAM are updated whenever necessary.

Figure 35:
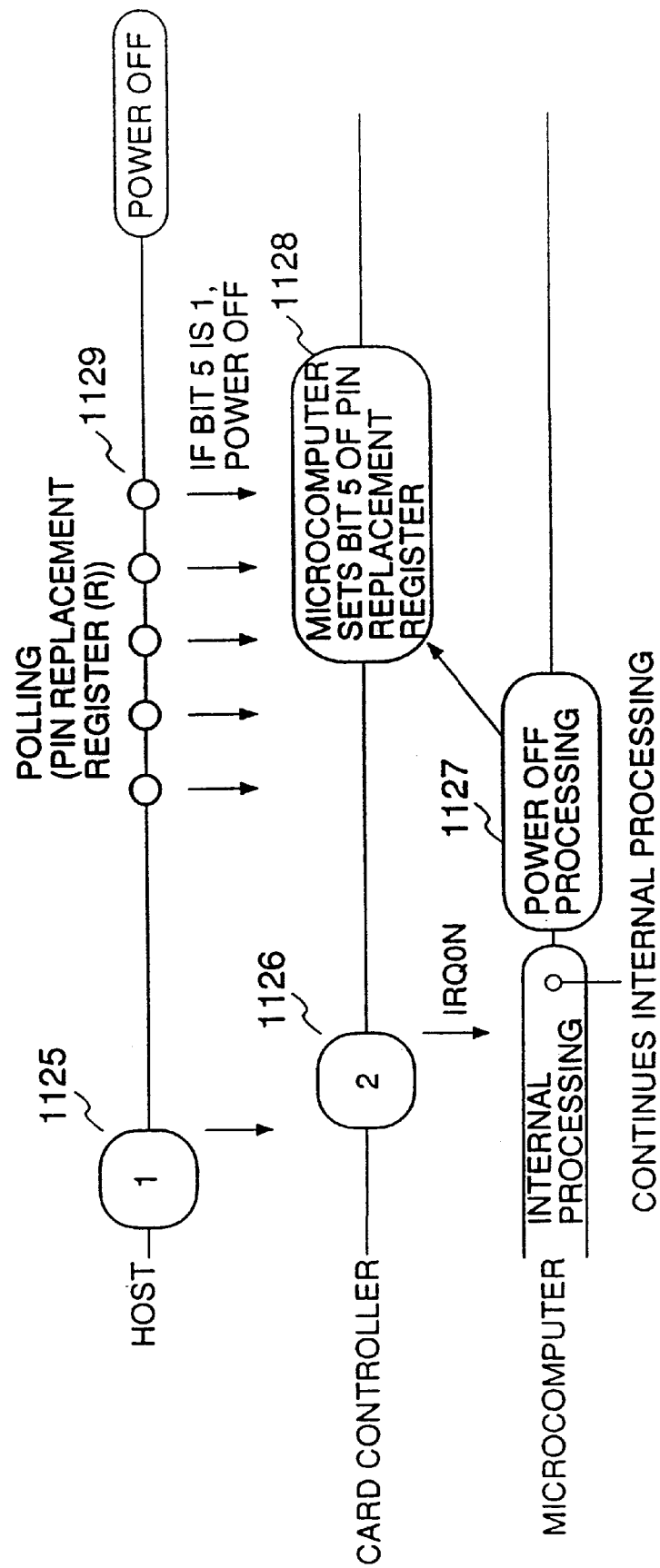
FIG. 35 is a sequence flow when power is turned off according to first embodiment of the present invention.

A sequence flow when the power is turned off is described with reference to FIG. 35. When the power is turned off, the host writes 1 into bit 2 of a configuration status register at step 1125. When receiving it, the card controller clears bit 5 of a pin replacement register at step 1126, then sends an interrupt signal (IRQ0N) to the microcomputer. When receiving the interrupt signal, the microcomputer performs power off processing such as storing save tables at step 1127 after completing the current executing processing. Upon completion of the power off processing, the microcomputer sets bit 5 of the pin replacement register in the card controller at step 1128. Meanwhile, the host polls the pin replacement register and when bit 5 is set to 1 at step 1129, turns off the power.

Figure 36:
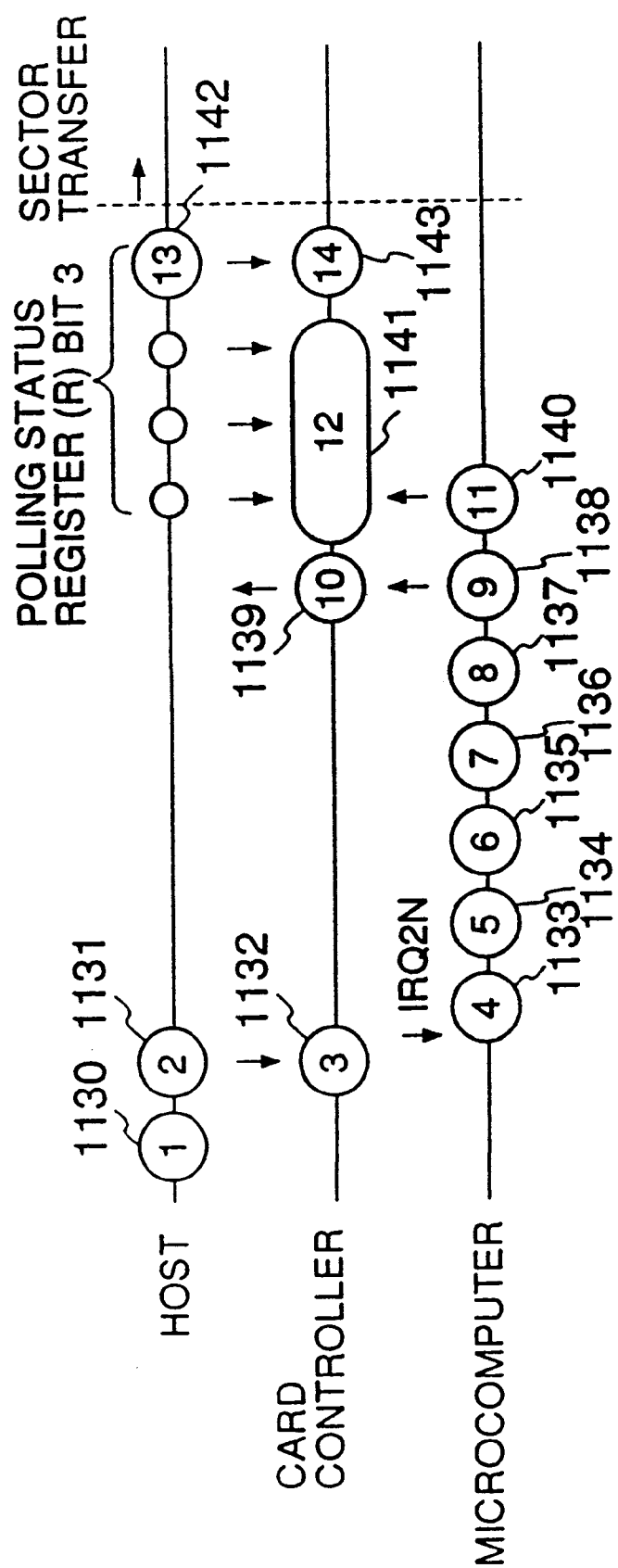
FIG. 36 is a sequence flow of sector transfer preprocessing according to first embodiment of the present invention.

A sequence flow of sector transfer preprocessing is described with reference to FIG. 36. First, the host writes a cylinder number, head number, and sector number into the corresponding registers at step 1130 and a command into a command register at step 1131. Next, the card controller analyzes the command and writes its source into an interrupt source register and sends an interrupt signal (IRQ2N) to the microcomputer at step 1132. When receiving the interrupt signal, the microcomputer reads the interrupt source register at step 1133 for recognizing sector transfer and reads the command register at step 1134 to analyze the command contents. After this, the microcomputer reads the logical sector number in the sector number register and writes it into the logical sector table setting register. Next, when the microcomputer accesses address E100 in memory address space, the physical sector number is read from the PSRAM logical sector table at step 1135 and in the sector read mode, is written into the second file bank register at step 1136. In the sector write mode, the sector number in the sector buffer is written into the second file bank register at step 1136. Next, the microcomputer sets the sector transfer mode in the sector transfer control register at step 1137 and writes 1 into the IREQ register at step 1138. When receiving it, the card controller asserts an interrupt signal (IREQN) sent to the host at step 1139. Next, when the microcomputer sets the sector transfer start register at step 1140, the card controller writes the data in the second file bank register (physical sector number) into the first file bank register and writes 1 into bit 3 of the status register at step 1141. The host, which receives the interrupt signal, polls the status register and if bit 3 (data transfer request bit) is 1, starts sector transfer at step 1142. In response to reading the status register, the card controller negates IREQN at step 1143.

Figure 37:
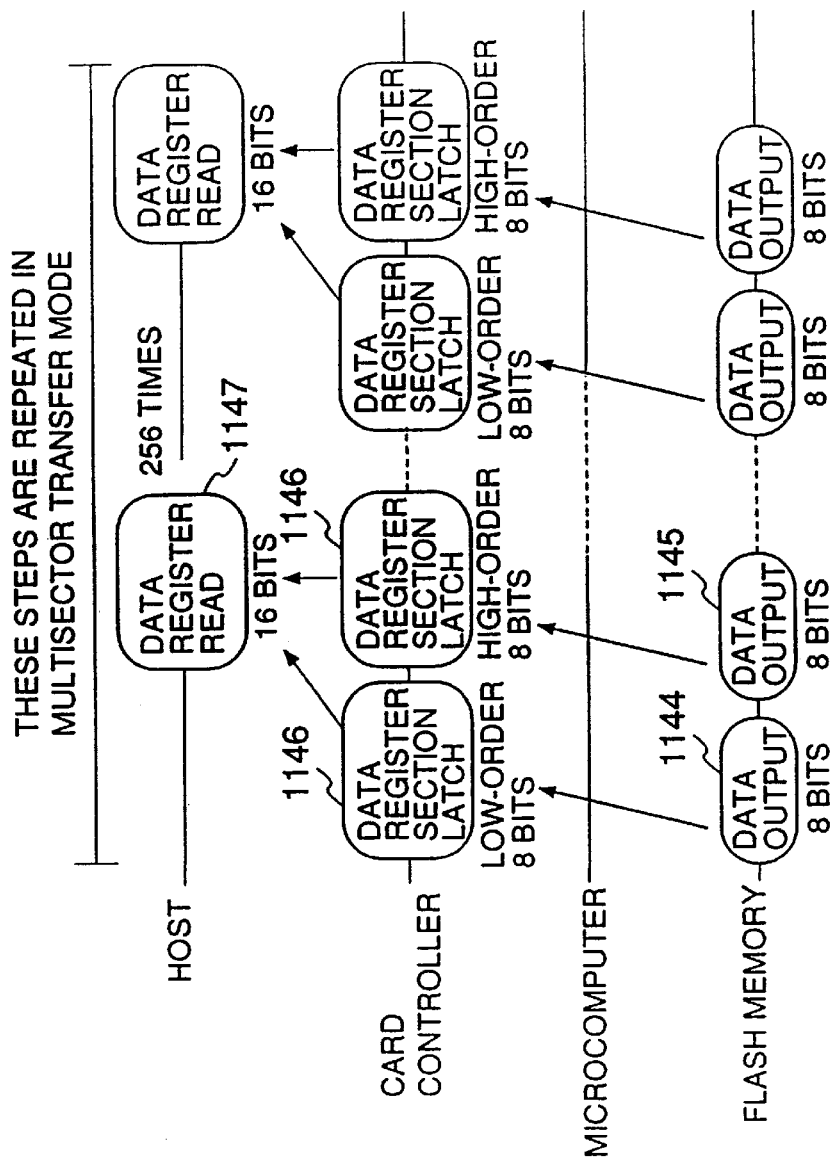
FIG. 37 is a sequence flow during FLASH sector read transfer according to first embodiment of the present invention.
Figure 38:
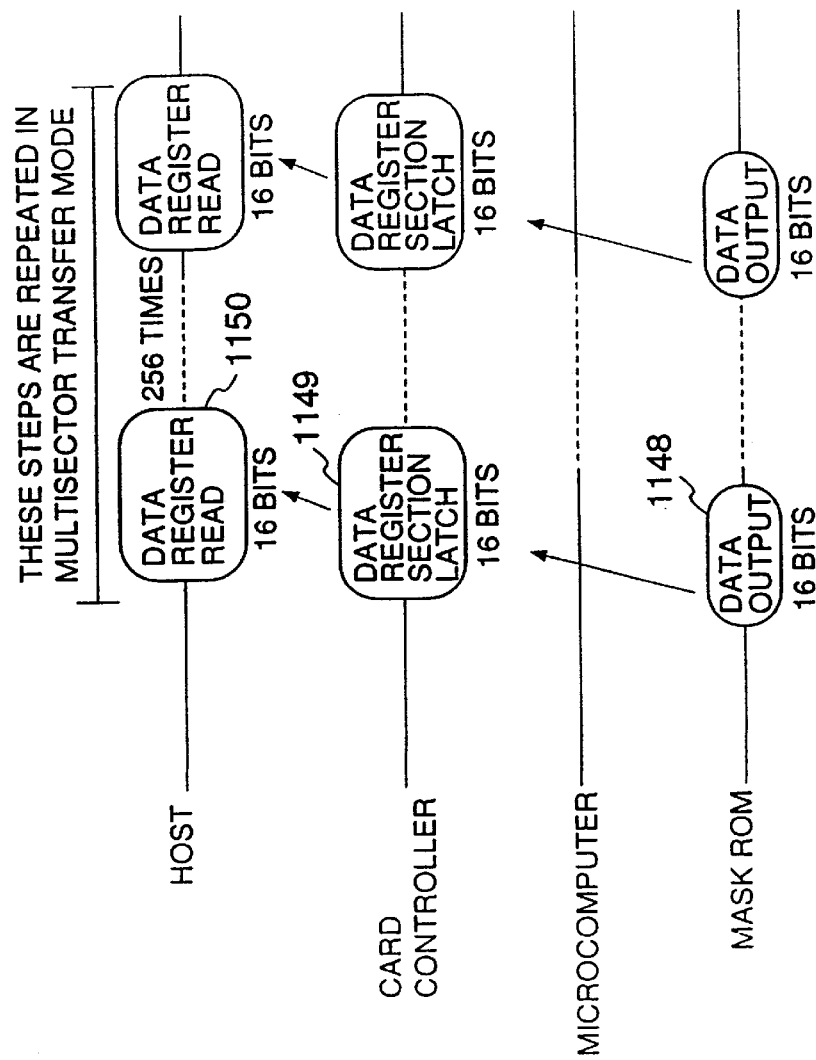
FIG. 38 is a sequence flow during MASK ROM sector read transfer according to first embodiment of the present invention.
Figure 39:
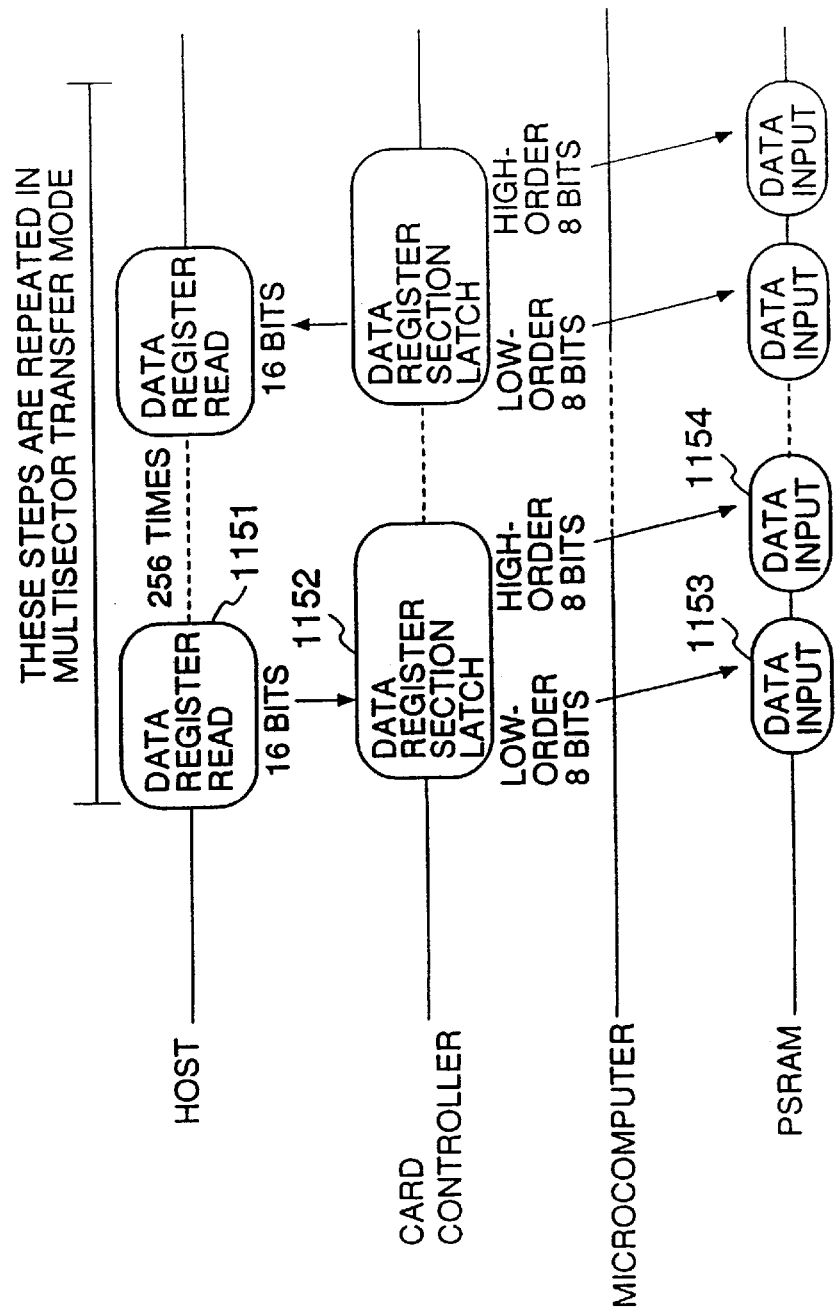
FIG. 39 is a sequence flow during PSRAM sector write transfer according to first embodiment of the present invention.

A sequence flow during the sector transfer is described with reference to FIGS. 37 to 39. First, FLASH sector read transfer in FIG. 37 is discussed. Low-order 8-bit data is output at step 1144 and high-order 8-bit data is output at step 1145 from FLASH memory. The data is latched in the data register section in the card controller at step 1146 to enable 16-bit data to be output when the host reads the data register at step 1147. This operation is repeated 256 times for one sector. Next, MASK ROM sector read transfer in FIG. 38 is discussed. 16-bit data output from MASK ROM at step 1148 is latched in the data register section in the card controller at step 1149 to enable 16-bit data to be output when the host reads the data register at step 1150. This operation is repeated 256 times for one sector. Next, sector write transfer to PSRAM in FIG. 39 is discussed. When the host writes 16-bit data into the data register at step 1151, it is latched in the data register section in the card controller at step 1152. First the low-order eight bits of the written 16-bit data are written into PSRAM at step 1153 and next the high-order eight bits are written into PSRAM at step 1154. This operation is repeated 256 times for one sector. In the multisector transfer mode, the processing is performed consecutively for as many sectors as specified.

Figure 40:
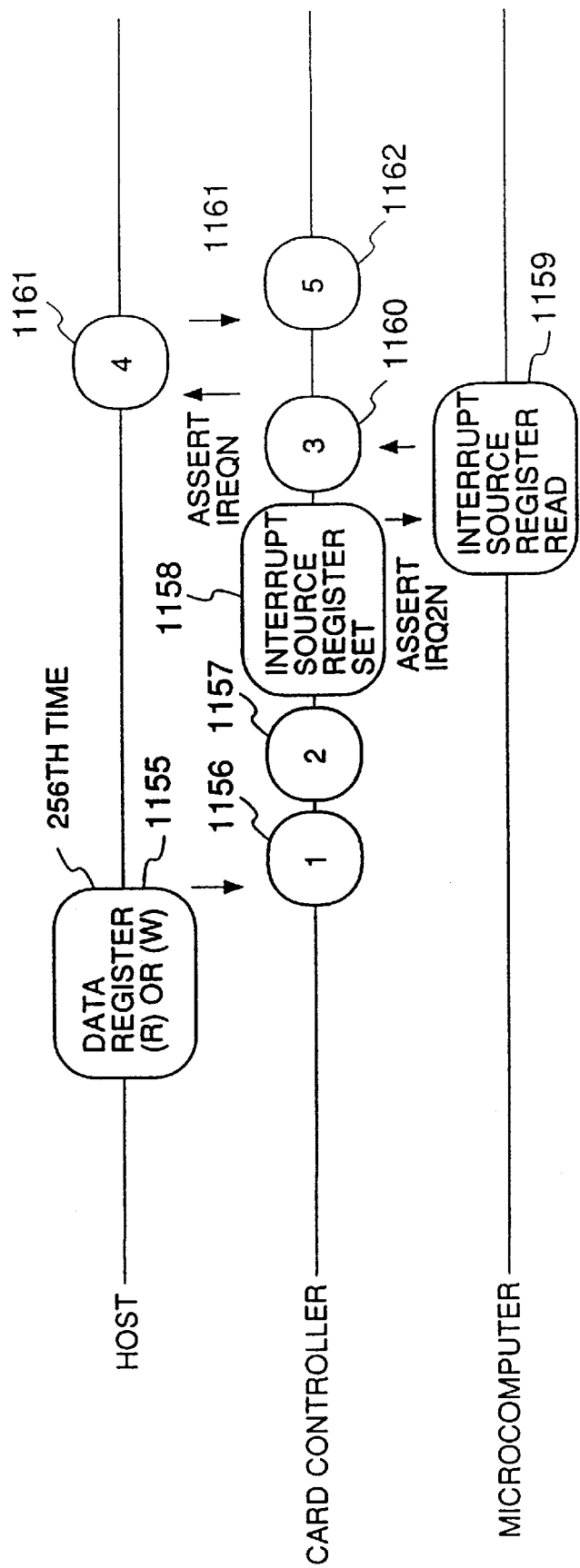
FIG. 40 is a sequence flow of sector transfer termination processing according to first embodiment of the present invention.

A sequence flow of sector transfer termination processing is described with reference to FIG. 40. When the 256th data register read/write occurs at step 1155, it means sector transfer termination. Then, the card controller clears the sector transfer start register at step 1156 and clears bit 3 (data transfer request bit) of the status register at step 1157. After this, the card controller sets bit 6 of the interrupt source register at step 1158 and outputs an interrupt signal (IRQ2N) to the microcomputer. When receiving the interrupt signal, the microcomputer reads the interrupt source register at step 1159 and recognizes that the sector transfer terminates, and sets the IREQ register in the card controller at step 1160. Then, the card controller sends an interrupt signal (IREQN) to the host, which then reads the status register. That is, the host sees that bit 3 of the status register is 0, and recognizes that the sector transfer terminates at step 1161. In response to reading the status register, the card controller negates IREQN at step 1162.

Figure 41:
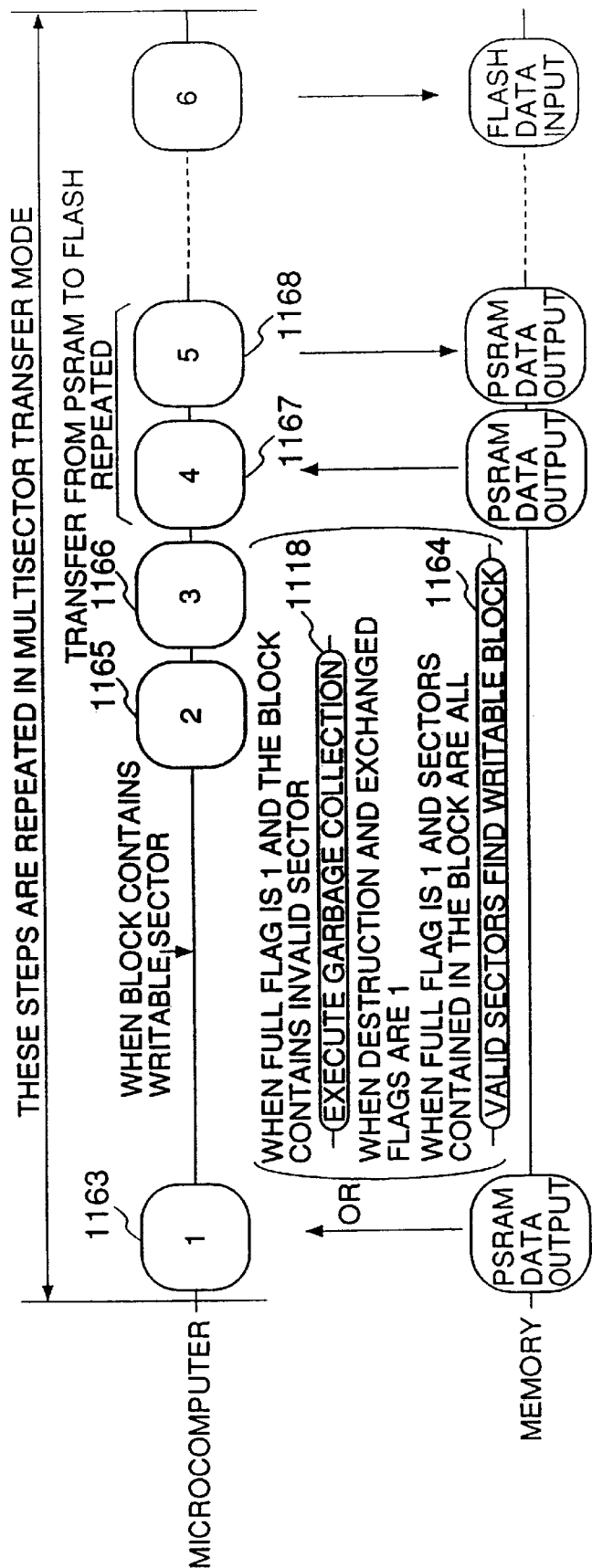
FIG. 41 is a sequence flow of internal processing after sector transfer termination according to first embodiment of the present invention.

An internal processing sequence flow after the sector write transfer terminates is described with reference to FIG. 41. First, the microcomputer reads the block flag table at step 1163 to see the state of the block containing the sector of the physical sector number pointed to by the write pointer. The block flag table stores destruction flags, full flags, exchange request flags, and exchanged flags. If the destruction flag or exchanged flag for the block is set to 1, the write pointer (high-order seven bits of physical sector number) is updated and a writable block is found at step 1164. If the full flag for the block is set to 1 and the sectors contained in the block are all valid sectors, the block pointer is updated and a writable block is found at step 1164. If the full flag for the block is set to 1 and the block contains an invalid sector, garbage collection is executed at step 1118. If no flags are set for the block and the block contains a writable sector or when the garbage collection has been executed, the following operation is performed: First, the microcomputer writes the sector number of the sector buffer which stores 1-sector data into the write buffer bank register at step 1165 and writes the physical sector number pointed to by the write pointer into the first file bank register at step 1166. Next, the microcomputer reads 1-byte data from the sector buffer at step 1167 and writes the data into FLASH at step 1168. The operation is repeated 512 times for one sector (512 bytes). After this, the physical sector table, logical sector table, and block status table are updated. In the multisector write mode, all the steps described above are repeated.

Figure 42:
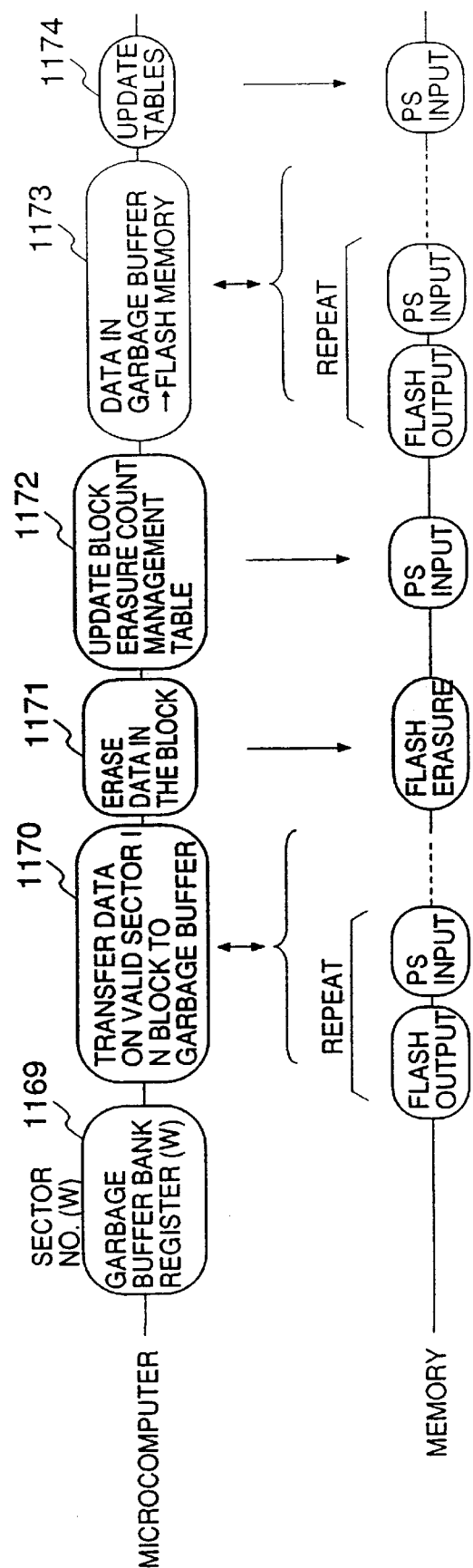
FIG. 42 is a sequence flow of garbage collection according to first embodiment of the present invention.

A sequence flow of garbage collection is described with reference to FIG. 42. First, the microcomputer writes the sector number of the sector buffer which stores 1-sector data into the garbage buffer bank register at step 1169. Next, the microcomputer transfers data on one valid sector (512 bytes) in the block to the garbage buffer one byte at a time at step 1170. The operation is repeated for all valid sectors in the block. Next, the microcomputer erases the data in FLASH in the block at step 1171 and updates the block erasure count management table at step 1172. After this, the microcomputer writes the data in the garbage buffer into FLASH at step 1173 and updates the physical sector table, logical sector table, and status table at step 1174. Then, the microcomputer returns to step 1165 of the internal processing after the sector write termination in FIG. 41, and writes the write data on the current sector in the write buffer into FLASH.

Figure 43:
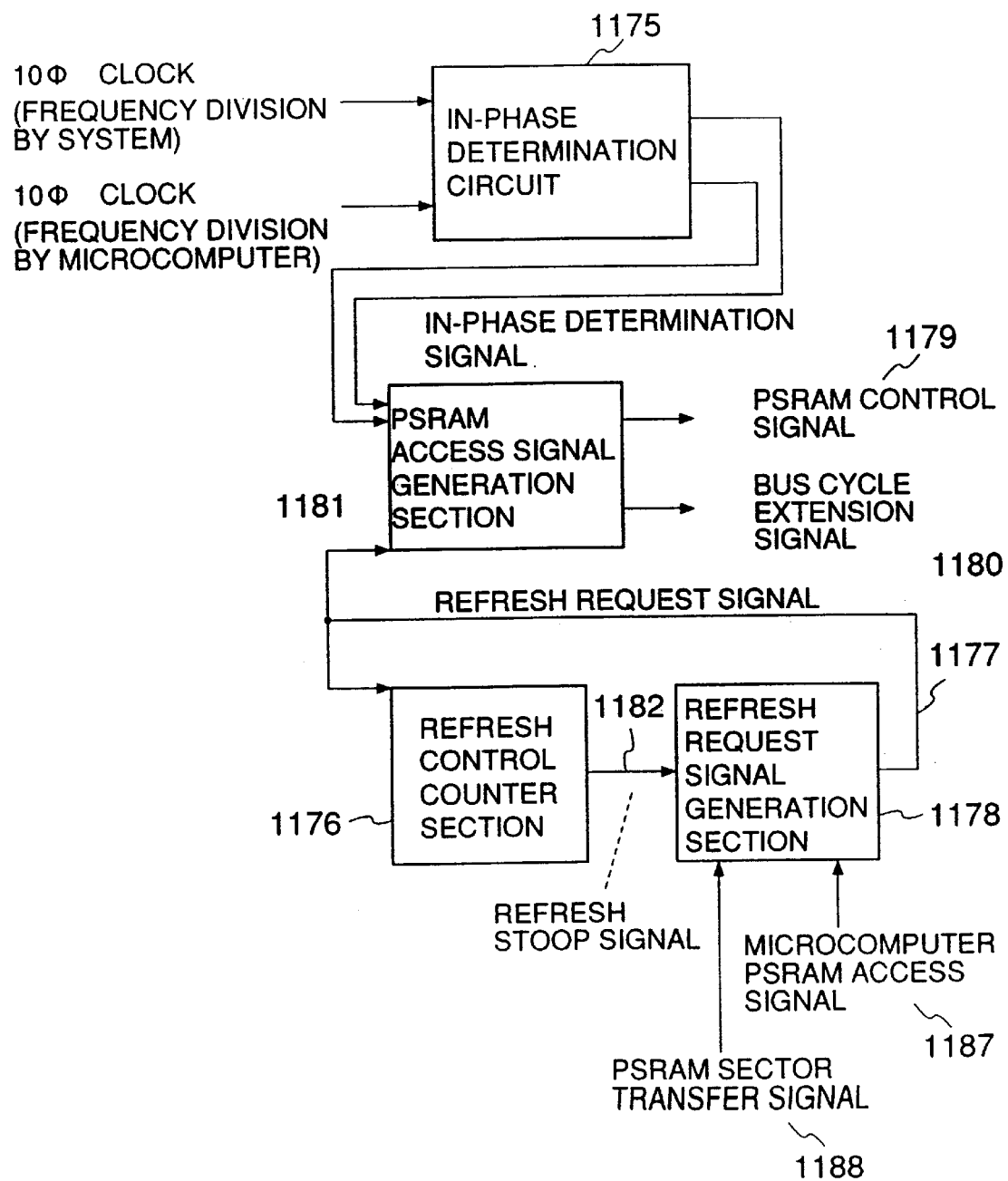
FIG. 43 is a block diagram of a PSRAM refresh control section according to first embodiment of the present invention.

Next, a PSRAM refresh method is discussed. First, arbitration of PSRAM refresh and other memory operations is discussed with reference to FIG. 43. FIG. 43 shows a block diagram of logical blocks for executing the arbitration in the control section 1059 contained in the card controller 1009. The logical blocks are an in-phase determination circuit 1175 for determining whether two clocks of the same frequency divided by two different devices are in phase or opposite phase, a refresh control counter section 1176 consisting of two counters for measuring the refresh count and the elapsed time from starting refresh, a refresh request signal generation section 1178 for generating a PSRAM refresh request signal 1177, and a PSRAM access signal generation section 1181 for generating a PSRAM control signal 1179 and a bus cycle extension signal 1180 sent to the microcomputer. The refresh request signal generation section 1178 and the PSRAM access signal generation section 1181 make up refresh control signal output means.

First, the basic operation when PSRAM is not written or read is discussed. At the same time as power on reset is negated, the block 1178 starts outputting a refresh request signal 1177 to the block 1181. When receiving the signal, the block 1181 outputs a refresh control signal 1179 to PSRAM. The block 1176 measures the refresh count and the elapsed time from starting refresh, when the refresh count reaches a given count, a refresh stop signal 1182 is output to the block 1178 for suppressing power consumption of PSRAM. When receiving the signal, the block 1178 stops outputting the refresh request signal 1177. Resultantly, the PSRAM refresh control signal 1179 from the block 1181 stops. After this, when the elapsed time from starting the refresh reaches a given time, the block 1176 stops outputting the refresh stop signal 1182. The block 1178 restarts outputting the refresh request signal 1177. At the same time, outputting the PSRAM refresh control signal from the block 1181 is also restarted. Next, the operation when sector transfer to and from PSRAM starts when the PSRAM is being refreshed is described. If PSRAM is refreshed during sector transfer, the data transfer performance of the system bus is lowered. Then, at the time the block 1178 stops outputting the refresh request signal 1177. Resultantly, the PSRAM refresh control signal 1179 from the block 1181 stops. After the sector transfer terminates, the block 1178 restarts outputting the refresh request signal 1177 and the block 1181 restarts outputting the PSRAM refresh control signal.

Next, the operation if the microcomputer writes or reads data into or from PSRAM when it is being refreshed is described. PSRAM refresh and PSRAM write or read from the microcomputer are executed in the same bus cycle by extending the microcomputer bus cycle. By the way, at power on reset, 10φ clock output of the microcomputer and 10φ clock provided by dividing the system clock for generating the refresh control signal 1179 may be out of phase. Thus, the timing relationship between the write or read control signal and the refresh control signal 1179 and out-of-phase of the clocks must be considered to determine how many clocks are to be extended. Therefore, when the microcomputer accesses PSRAM, the block 1175 determines out-of-phase state of the clocks and sends information to the block 1181, then the block 1181 outputs PSRAM write or read and refresh control signals and a wait signal (WAITN) 1180 for extending the microcomputer bus cycle.

Figure 44:
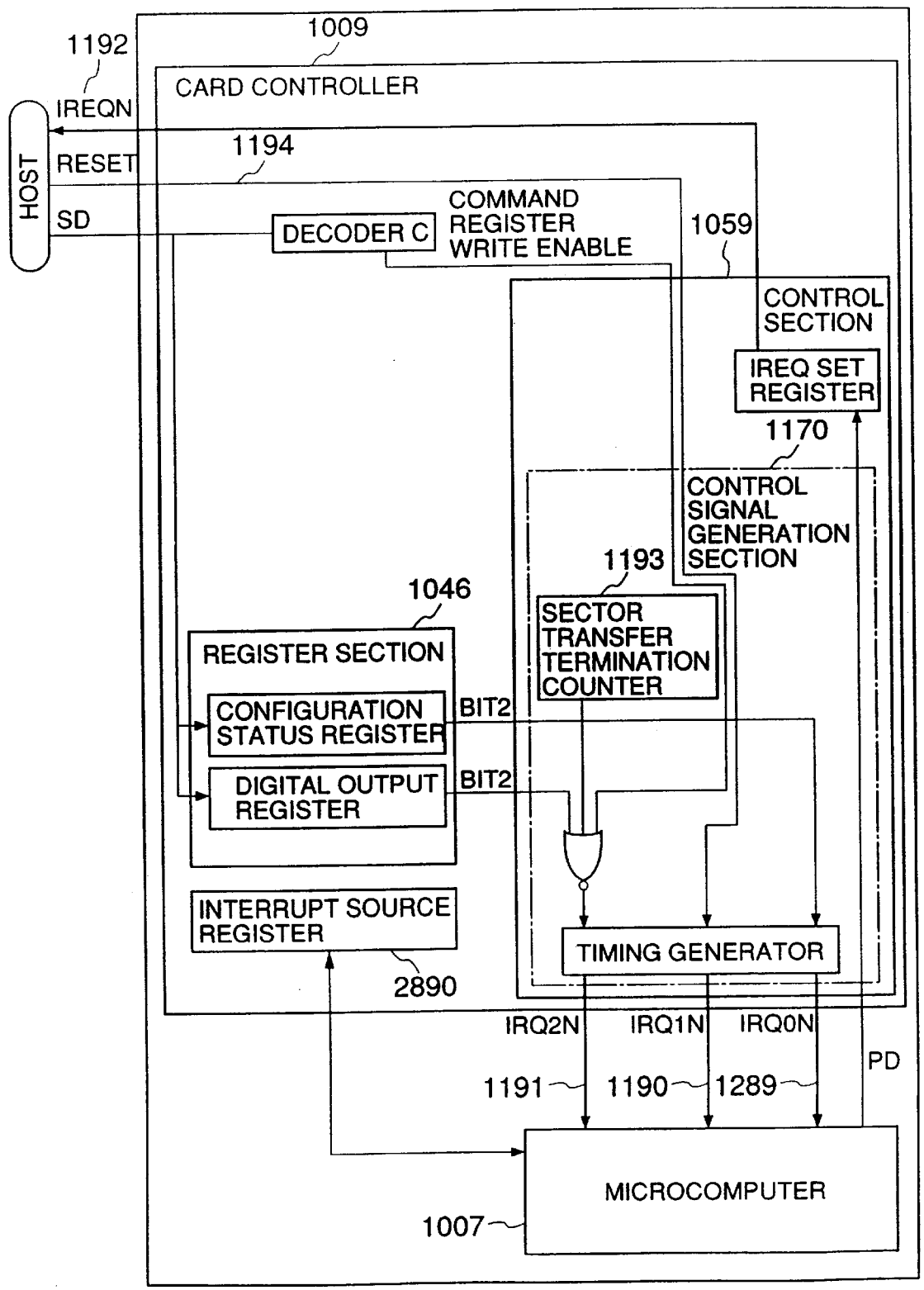
FIG. 44 is an illustration of interrupt signal generation operation according to first embodiment of the present invention.

Next, the operation of interrupt signals output from the card controller is described with reference to FIG. 44 (hardware configuration). The card controller provides four interrupt signals IRQ0N 1289, IRQ1N 1190, IRQ2N 1191, and IREQN 1192. IRQ0N 1289 is provided to cause the microcomputer 1007 to perform power off processing. Specifically, the interrupt is asserted when the host writes 1 into bit 2 (power down bit) of the configuration status register in the card controller 1009. IRQ1N 1190 is provided to cause the microcomputer 1007 to perform initialization processing when hardware reset is applied. Specifically, the interrupt is asserted when a hardware reset signal (RESET) 1194 is received from the host. IRQ2N 1191 is provided to cause the microcomputer 1007 to perform initialization processing when software reset is applied, and to perform command write processing when a command is written. It is also used to inform the microcomputer 1007 of the sector transfer termination and cause the microcomputer 1007 to perform sector transfer termination processing and internal processing after the termination. Specifically, when the host writes 1 into bit 2 of a digital output register in the card controller 1009 when software reset is applied, when the host writes a command into the command register, or when the sector transfer termination counter 1193 in the control signal generation section 1070 detects the sector transfer termination, IRQ2N 1191 is asserted. At this time, to enable the microcomputer to distinguish the three interrupt sources from each other, the source contents are in an interrupt source register (interrupt source storage means) 2890 in the card controller. IREQN 1192 is an interrupt output to the host upon completion of microcomputer processing at command write or upon completion of transfer termination processing by the microcomputer 1007 after the sector transfer termination. Specifically, the interrupt is asserted when the microcomputer 1007 sets 1 in the IREQ set register. When the power is turned on, IREQN 1192 is asserted when RESN 1019 (FIG. 2) is received from the power-on reset IC; it indicates BUSY during initialization. The IREQN 1192 sending operation is described in detail in the description of the sequence flows and therefore will not be discussed again.

Figure 45:
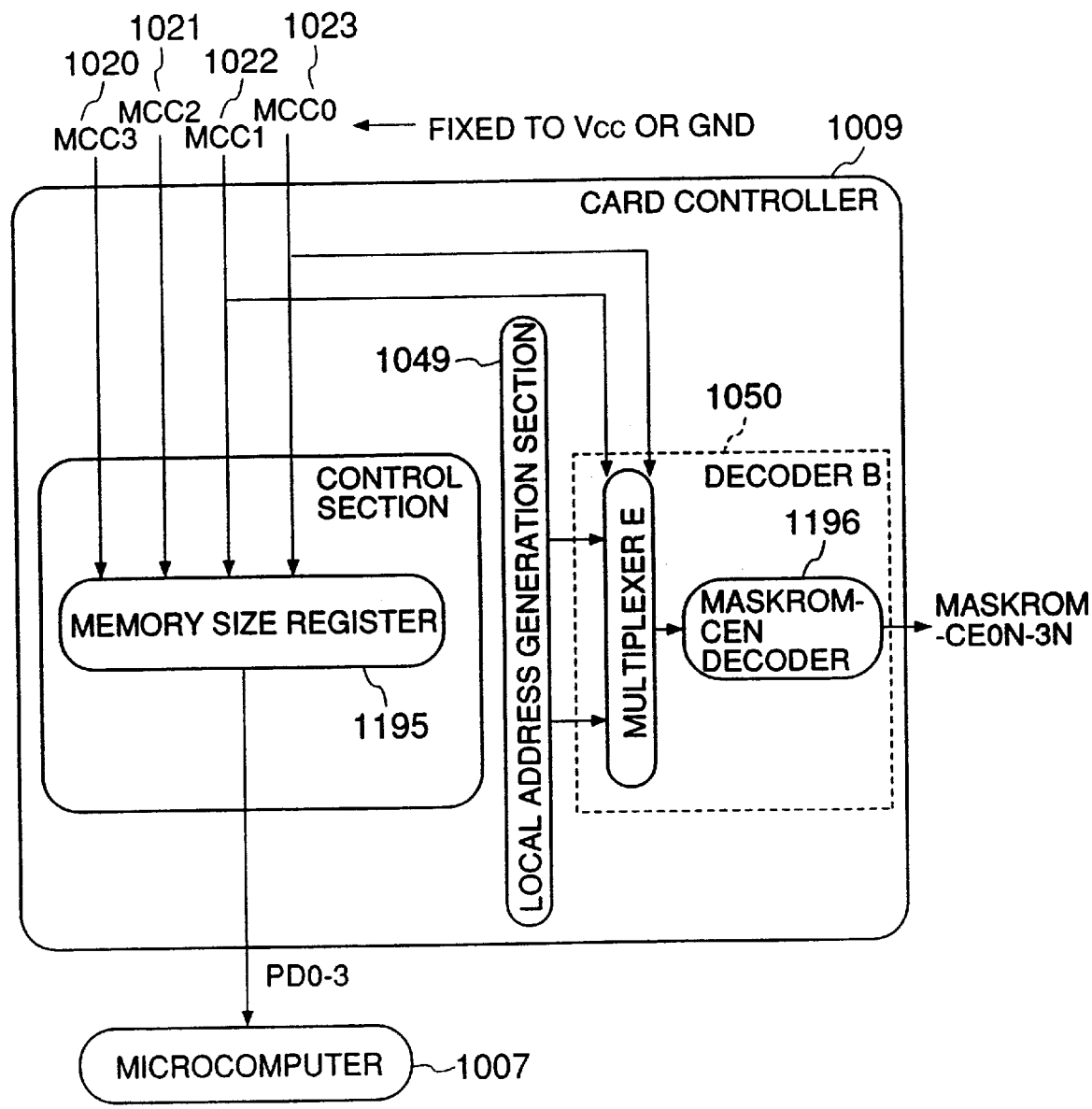
FIG. 45 is an illustration of setting MCC pins according to a first embodiment of the present invention.

Next, the operation of MCC pins for setting the FLASH memory and MASK ROM installation capacities are described with reference to FIG. 45. MCC0 pin 1023, MCC1 pin 1022, MCC2 pin 1021, and MCC3 pin 1020 of the card controller are fixed to Vcc or GND.

When the power is turned on, the microcomputer 1007 reads a memory size register 1195 for calculating the FLASH and MASK ROM installation capacities. The memory size register 1195 is an 8-bit register whose bits 0–3 correspond to values of MCC0–MCC3; bits 4–7 are not used. Specific MCC pin setting is discussed. The FLASH installation capacity can be set to 4 MB, 6 MB, or 8 MB by means of MCC3 pin 1020 and MCC2 pin 1021. Since 1-MW ×8-bit FLASH is used in the embodiment, 4 MB, 6 MB, and 8 MB correspond to four, six, and eight FLASH chips respectively. The MASK ROM installation capacity can be set to 4 MB, 6 MB, or 8 MB by means of MCC1 pin 1022 and MCC0 pin 1023. Since eight 512-KW ×8-bit MASK ROM chips as 4 MB or six or eight 1-MW ×8-bit MASK ROM chips as 6 MB or 8 MB are used in the embodiment, the decode address of a MASK ROM-CEN decoder 1196 (high-order address of local address) is changed according to the value of MCC1 pin 1022 and MCC0 pin 1023.

Figure 46:
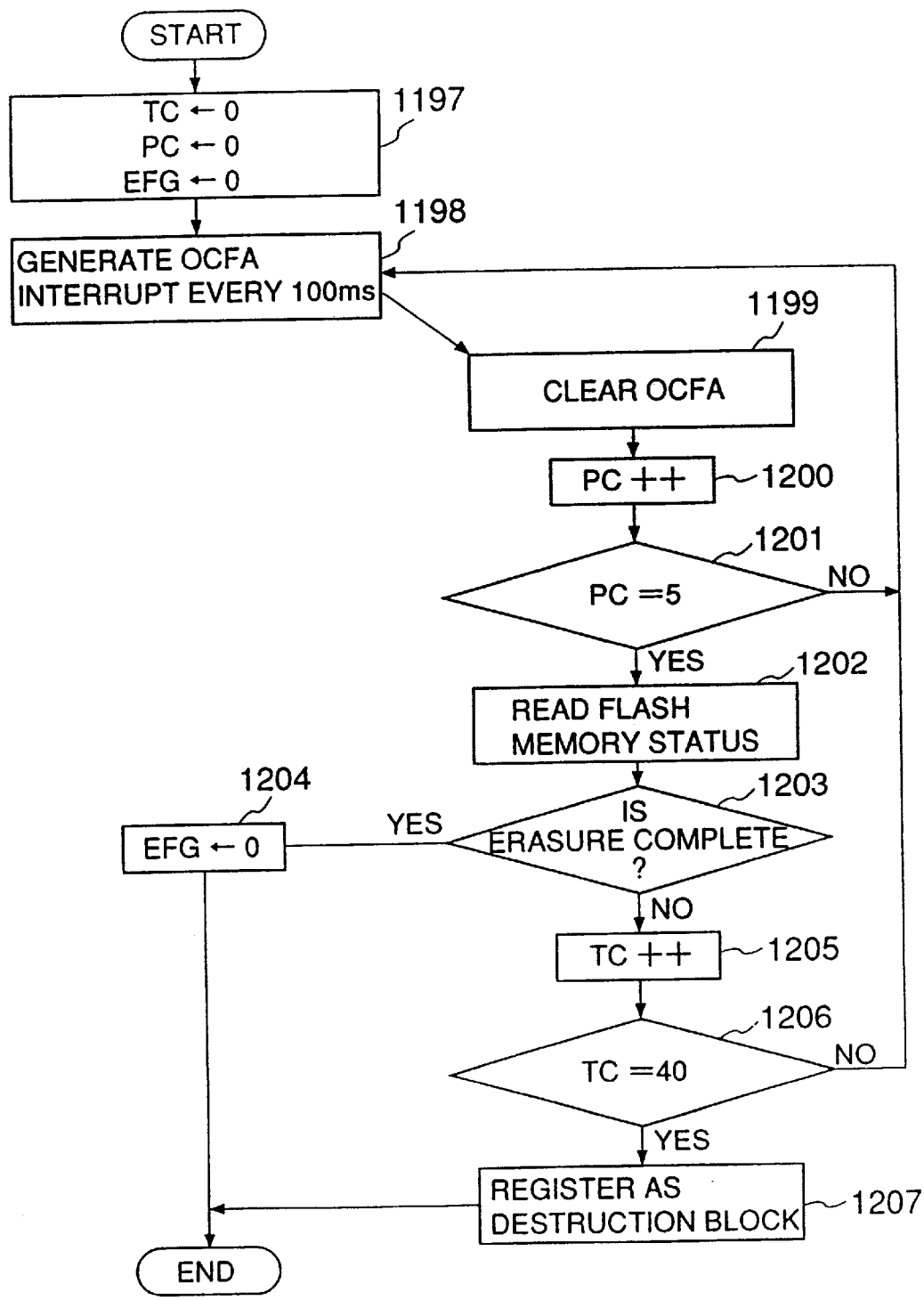
FIG. 46 is a flowchart of monitoring FLASH memory erasure time according to first embodiment of the present invention.

Next, determination of a destruction block is described. In the embodiment, when the data in a sector unit written temporarily into the PSRAM write buffer area is stored in the file area of the FLASH memory, the upper limit time of FLASH memory write or erasure is monitored, thereby detecting a defective block and registering it as a destruction block. How the destruction block is determined is described. Measurement is started when the microcomputer issues a FLASH memory erasure or write command. First, a method by monitoring the FLASH memory erasure time is discussed. FIG. 46 shows a flowchart of monitoring the erasure time. As initialization, a timeout counter (TC) and a polling counter (PC) are cleared and an erasing flag (EFG) is set at step 1197. A 16-bit timer of the microcomputer is used to set an output compare flag A every 100 ms for generating an interrupt in the microcomputer at step 1198. After clearing the output compare flag A at step 1199, the microcomputer increments the polling counter by one at step 1200. When the polling counter is set to 5 at step 1201, the microcomputer reads the status register of the FLASH memory at step 1202. (This means that the status register is read every 500 ms.) If erasure is complete at step 1203, it indicates that the block is not defective. The erasing flag is cleared at step 1204 and the routine is terminated. If erasure is not complete at step 1203, the timeout counter is incremented by one at step 1205. At this time, if the timeout counter is not 40 at step 1206, no operation is performed. If the timeout counter is 40 at step 1206, it means that the nonerasure state continues for 500 ms ×40=20 s. The block is registered as a destruction block at step 1207, and then the routine is terminated. This is because the maximum erasure time in block units of the FLASH memory is 10 s.

Figure 47:
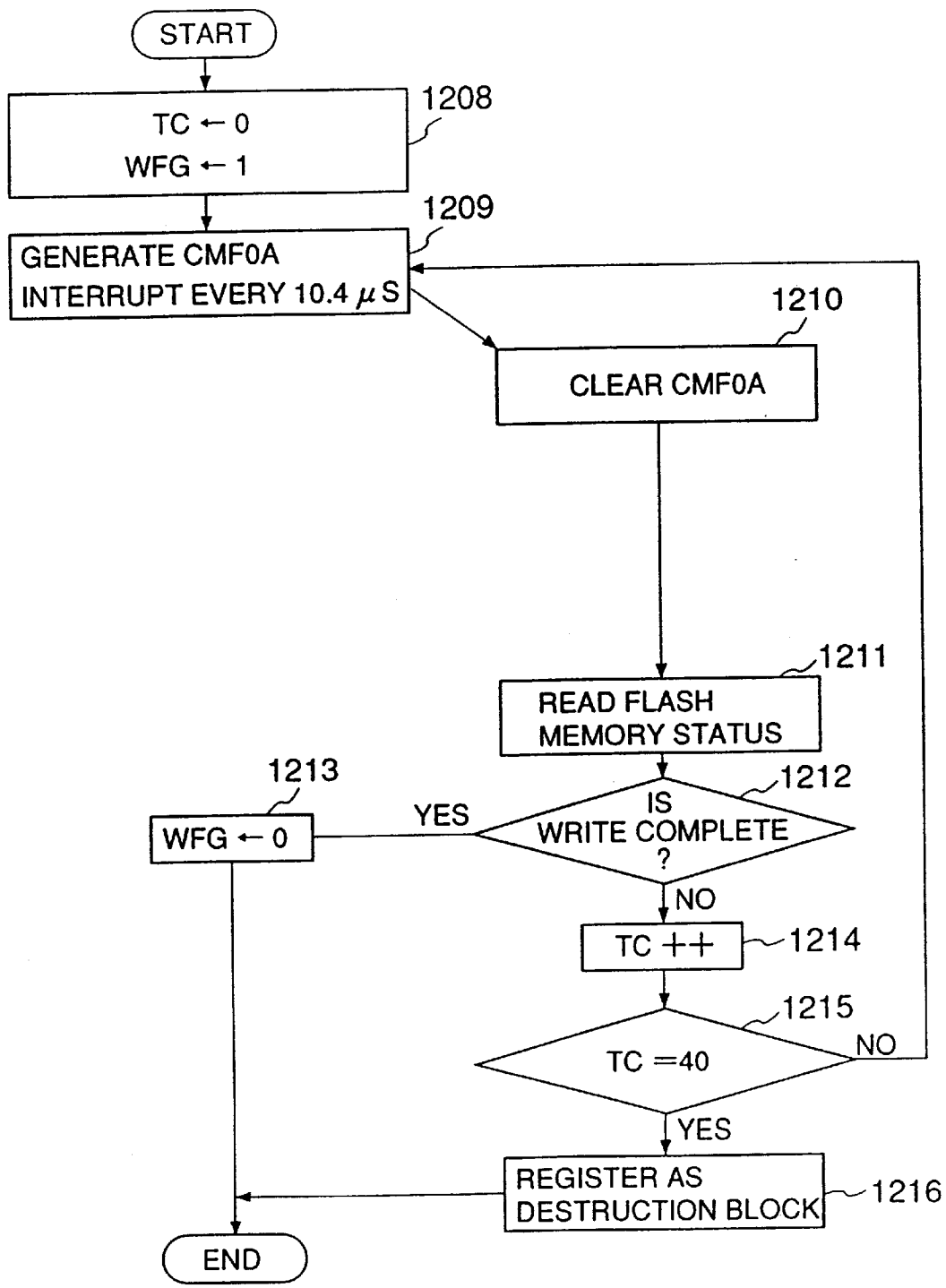
FIG. 47 is a flowchart of monitoring FLASH memory write time according to first embodiment of the present invention.

Next, a method by monitoring the FLASH memory write time is discussed. FIG. 47 shows a flowchart of monitoring the write time. As initialization, the TC is cleared and a writing flag (WFG) is set at step 1208. An 8-bit timer of the microcomputer is used to set a compare match flag A every 10.4 μs for generating an interrupt in the microcomputer at step 1209. After clearing the compare match flag A at step 1210, the microcomputer reads the status register of the FLASH memory at step 1211. If write is complete at step 1212, it indicates that the block is not defective. The writing flag is cleared at step 1213 and the routine is terminated. If write is not complete at step 1212, the timeout counter is incremented by one at step 1214. At this time, if the timeout counter is not 40 at step 1215, no operation is performed. If the timeout counter is 40 at step 1215, it means that the nonwrite state continues for 10.4 μs ×40=416 μs. The block is registered as a destruction block at step 1216, then the routine is terminated. Although an interrupt is generated every given time for monitoring the time in the example, if it takes time to perform interrupt processing and rewrite performance is adversely affected, the status register of the FLASH memory may be polled to simply determine the write or erasure termination.

Figure 48:
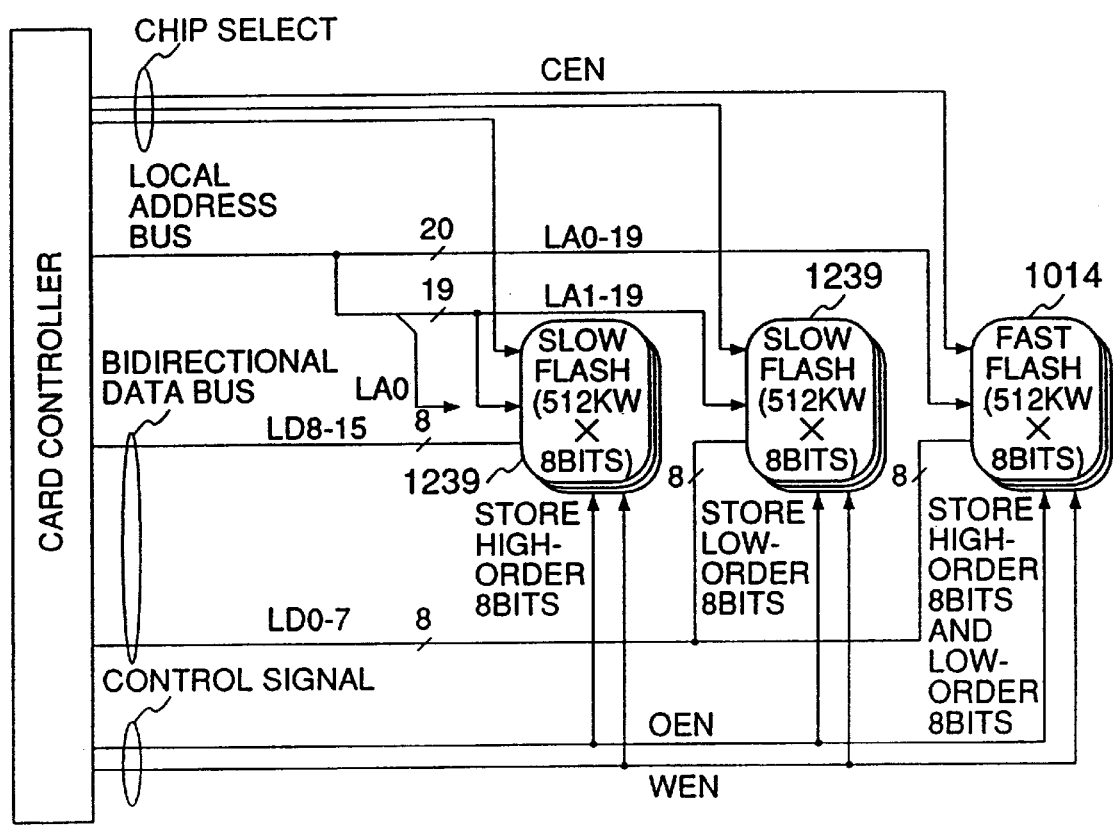
FIG. 48 is an illustration of an example in which fast and slow FLASH chips are mixed for use according to first embodiment of the present invention.

Next, an extension example is discussed in which FLASH memory having slow access time, 1239, and FLASH memory having fast access time, 1014, are mixed for use. In the embodiment, to make erasure block units the same as chip block units, the FLASH memory having fast access time, 1014, is used for executing interleave transfer eight bits at a time. On the other hand, to use the FLASH memory having slow access time, 1239, together with the FLASH memory 1014 because of restriction on costs, etc., they can be mixed for use as shown in FIG. 48 by changing the circuit of the card controller 1009. That is, the fast-access FLASH memory 1014 and the slow-access FLASH memory 1239 are used. In this case, however, high-order eight bits and low-order eight bits must be stored in different chips of the slow FLASH memory 1239, thus the erasure block units become double. Only the change part is described. In the embodiment, when FLASH sector read transfer is executed, a read is executed twice for one read from the host. However, if two reads are executed for the slow FLASH memory 1239, the operation cannot catch up with the host read cycle. Then, the least significant bit of an address, LA0, is not used and CEN of the high-order chip and CEN of the low-order chip are asserted at the same timing so that the two chips can be handled as one word as MASK ROM is accessed. LD8–LD15 are connected to the high-order chip of the FLASH memory 1239 as a bidirectional bus for writing. LD0–LD7 of the bidirectional bus are connected to the low-order chip of the FLASH memory 1239 as before. However, an access from the microcomputer is made in 8-bit units, in which case CEN of the high-order chip and CEN of the low-order chip must be controlled separately. Thus, 16 bits can be read by one read operation.

According to the invention, there is provided a system which is excellent in high-speed access performance compared with other file storage systems, namely, does not require seek time and performs read and write at high speed compared with magnetic disk units and has a write buffer intended particularly for high-speed writing compared with a storage system using a conventional flash memory. The system according to the invention is slower compared with a storage using a volatile memory as storage media, but has advantages such as unnecessary backup power and low costs compared with the storage.

The erasure count is recorded and data is exchanged between a block having a large erasure count and a block having a small erasure count, so that the flash memory rewrite life becomes even among the blocks, prolonging the effective life. This is based on the fact that the data stored in the block having a large erasure count is considered as data frequently rewritten. Therefore, a practical system life as a file storage system can be provided.

At this time, a plurality of types of data are stored on one type of chip, for example, system files and interface information are stored in mask ROM. Thus, the number of necessary parts can be reduced compared with the case in which only one type of data is stored on one type of chip. This point contributes to miniaturization such as putting the system into a card.

A file storage using an expensive flash memory, compared with a magnetic storage unit presently used as storage media, can be provided at low costs by using inexpensive ROM in parts.

IC card configuration information and access information are stored internally and can be accessed externally so that the system according to the invention can be compliant with the IC card standard.

If the host bus width is 16 bits, the memory bus width must be adjusted because many flash memories are currently manufactured in 8-bit width. By using mask ROM having 16-bit width as mask ROM, bus width adjustment is not required for mask ROM, thus performance can be improved and the number of circuits can be reduced.

Memory requiring refresh operation is used as volatile memory because of low cost. When the memory is not accessed, it is refreshed and refresh operation is minimized under the control, thereby eliminating useless processing time and contributing to performance improvement.

Embodiment 2

Figure 50:
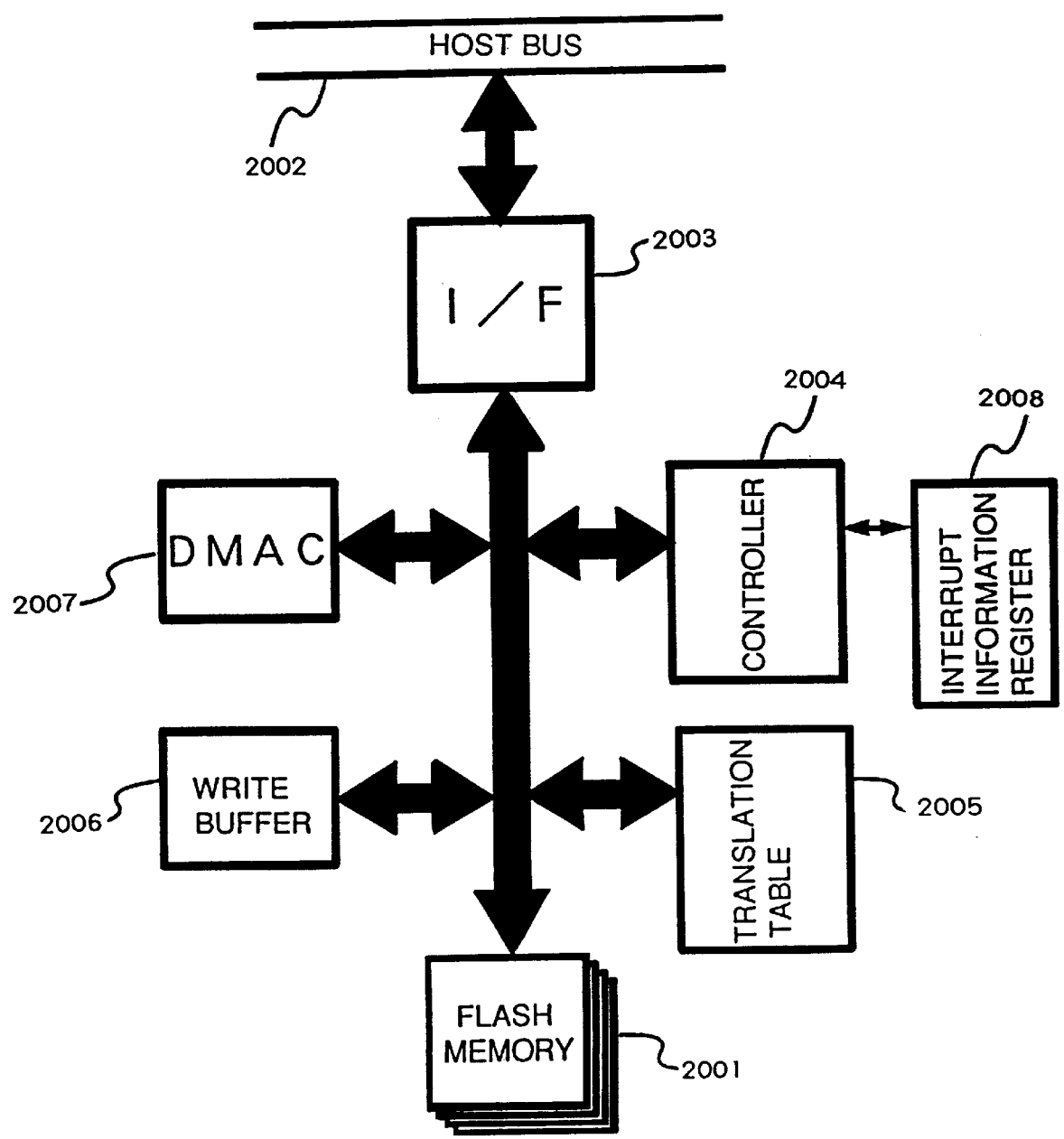
FIG. 50 is a block diagram of a flash memory system according to second embodiment of the present invention.

A second embodiment of the invention is described. FIG. 50 is a block diagram of the second embodiment of the invention. A flash memory system according to the second embodiment of the invention comprises a flash memory 2001 as storage media, a bus 2002 of an information apparatus used as a host of the flash memory system, an interface circuit 2003 consisting of registers, buses, etc., for interfacing with the host bus 2002, a controller (control section) 2004 which controls the entire flash memory system, an address translation table (information storage means) 2005 for converting from logical addresses used for the host to manage file data into physical addresses indicating physical storage locations, a write buffer 2006 for storing at high speed file data transferred from the host to raise apparent processing speed (therefore, volatile memory such as SRAM or DRAM meeting the demand for high-speed writing), a DMA (dynamic memory access) controller 2007 for overcoming the weak point that the operation speed of the controller 2004 is lower than that of the host bus 2002 to transfer data at high speed, and an interrupt information register (interrupt information storage means) 2008 for storing the operation state when processing is interrupted upon receipt of an access request from the host while data in the write buffer 2006 is being transferred to the flash memory 2001. (The operation state is stored for later restart.)

FIG. 60 shows an example of the translation table 2005, wherein 3-sector data transferred from the host bus 2001 is retained in blocks 1 to 3 of the write buffer 2006 and the data in blocks 1 to 3 is written into sector 3 of chip 0 of the flash memory 2001, sector 2 of chip 1, and sector 7 of chip 2 respectively. The flag indicates that the data from the host is not yet transferred to the flash memory and remains in the write buffer.

The translation table is not limited to the example in FIG. 60; it is possible for no flags to be provided, in which case the block numbers of the write buffer memory may be erased for the data having been transferred to the flash memory instead of the flag function. If the physical addresses of the write buffer and flash memory are made contiguous, data locations can be known from the physical addresses and the table capacity can be reduced.

In operation, when it becomes necessary to store or read file data, the host sends an access request via the host bus 2002. When file data is stored, the host specifies the logical address to store the data and transfers the data; when file data is read, the host specifies the logical address on management and requests that file data stored here should be transferred. These requests are made by setting in registers contained in the interface circuit 2003. When recognizing the processing request contents set in the interface circuit 2003, the controller 2004 references the translation table or rewrites the contents of the translation table 2005 to ensure that the logical address specified by the host correctly matches the physical address indicating the actual storage location of the data. If the request is to store file data, the controller 2004 writes the logical address specified by the host and the physical address of the write buffer in which the data is to be stored into the translation table 2005. If the file data already stored in the past should be updated, the past data becomes unnecessary and the controller 2004 enters information indicating whether or not the physical address at which the past data is stored is valid (this information is required because data at the same logical address is stored at a different physical address in the flash memory) in the translation table 2004.

To accept write data transferred from the host, the controller 2004 starts the DMAC 2007 for storing the data in the write buffer 2006. If unnecessary data stored in the flash memory 2001 is erased at the same time, the processing time can be used efficiently. On the other hand, if the request is to read file data, the controller 2004 references the translation table 2005 from the logical address specified by the host to find out where the file data requested by the host is physically stored, and sets it in the DMAC 2007, then starts the DMAC 2007 for transferring the data to the host bus 2002 at high speed.

The file data storage location may be the flash memory 2001 or the write buffer 2006. This should be found by referencing the translation table 2005. Therefore, the controller 2004 must select the memory to be accessed by the DMAC in response to the contents of the referenced translation table 2005.

An outline of the operation of the flash memory system in response to access requests from the host has been given. The controller performs internal processing of transferring the data stored in the write buffer to the flash memory 2001 until the host makes a new access request after termination of processing for the access requests from the host. However, if all data in the write buffer has been transferred to the flash memory, the flash memory system completely enters the wait state for the host to issue a new command. If the data transfer is not executed from the write buffer to the flash memory, when the power is turned off, the data in the write buffer, a volatile memory cannot retain its data and the most recently stored file data is lost. Since the amount of data that can be stored in the write buffer is limited, preferably data transfer to the flash memory is always executed so long as data not stored in the flash memory remains in the write buffer.

If an access request is received from the host while data transfer is being executed from the write buffer to the flash memory, the current transfer processing being executed is interrupted and the flash memory system responds to the access request from the host. Necessary status data is recorded in the interrupt information register 2008 so that the interrupted processing can be restarted upon completion of processing for the access request from the host. A register or memory in the controller 2004 may be used as the interrupt information register 2008.

Figure 51:
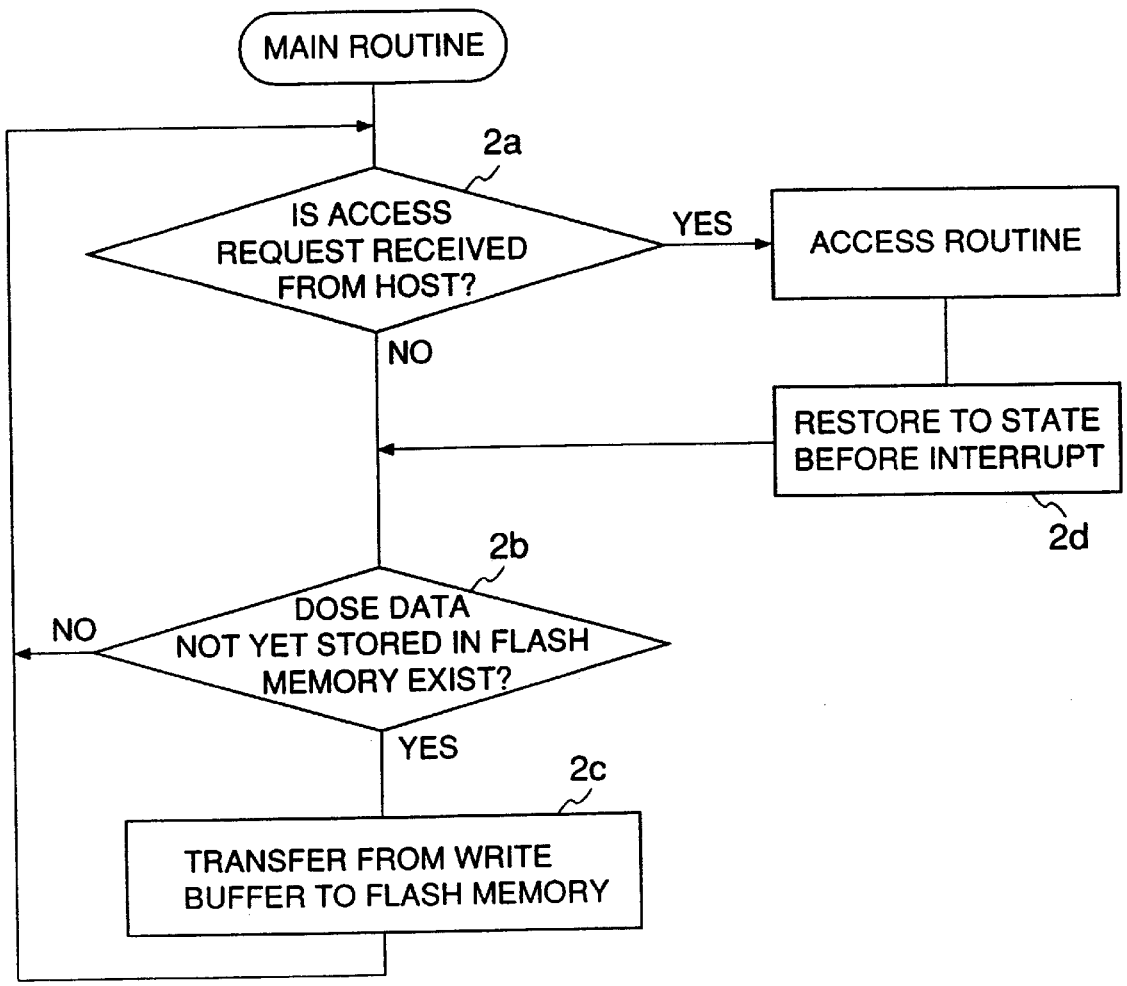
FIG. 51 is a flowchart of a main routine of a control program in second embodiment of the invention.

The operation of the controller 2004 discussed above is described in flowcharts of FIG. 51 and later. FIG. 51 is a flowchart of a main routine of the controller 2004. In the basic operation flow, first a check is made to see if an access request is received from the host at step 2a. If it is received, control jumps to an access routine; otherwise, control goes to the next step. A check is made to see if data not stored in the flash memory exists in the write buffer at step 2b. If it exists, the data is transferred to the flash memory for storage in predetermined units such as sectors or words at step 2c.

If all data is already stored in the flash memory, a wait is made for the host to access the flash memory system. If control jumps to the access routine at step 2a, when the access routine terminates and control is returned to the main routine, the state is restored to the state recorded in the interrupt information register at step 2d to restart the main routine. The flow is repeated in the main routine.

Figure 52:
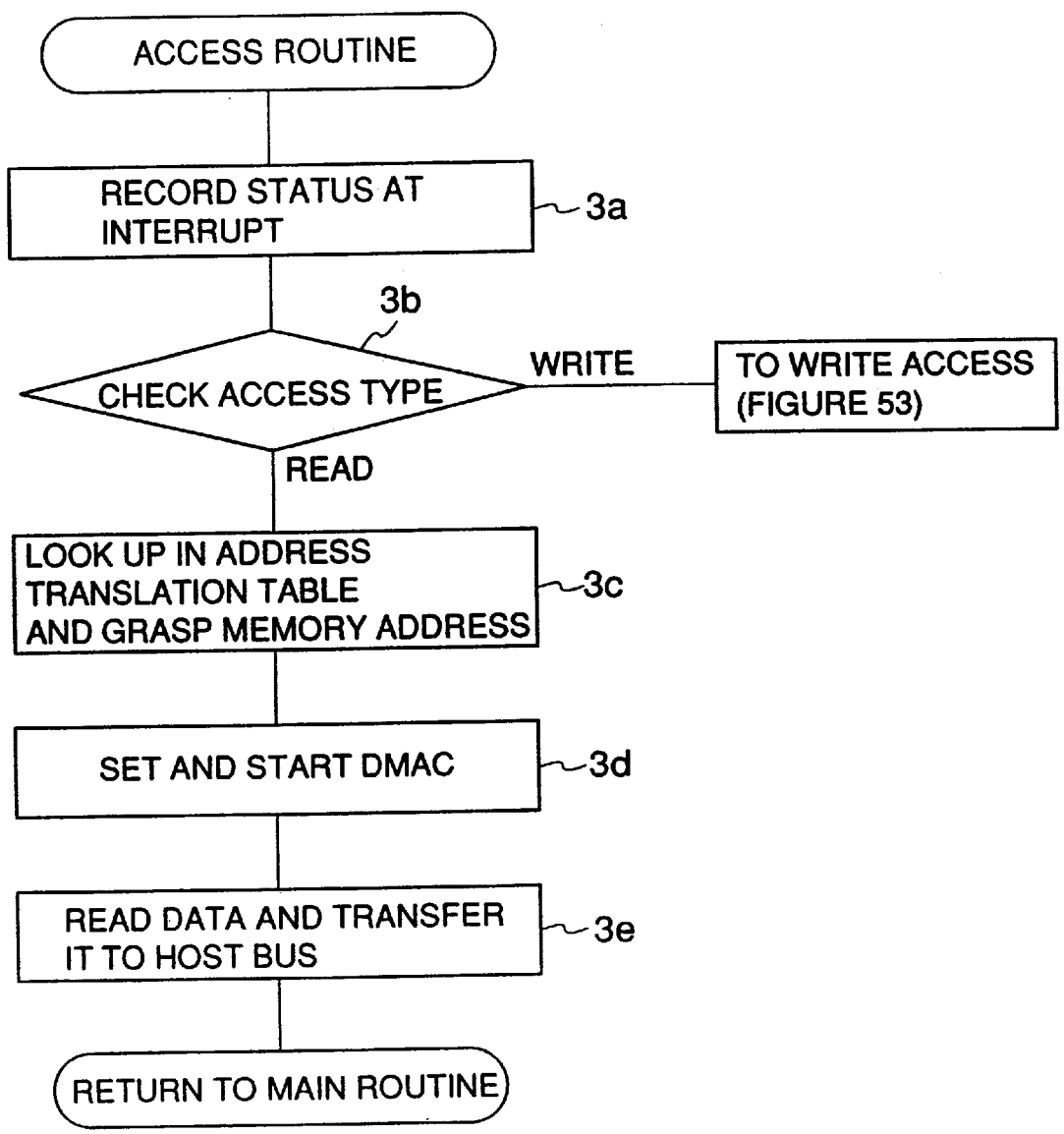
FIG. 52 is a flowchart of an access routine of the control program in second embodiment of the invention.
Figure 53:
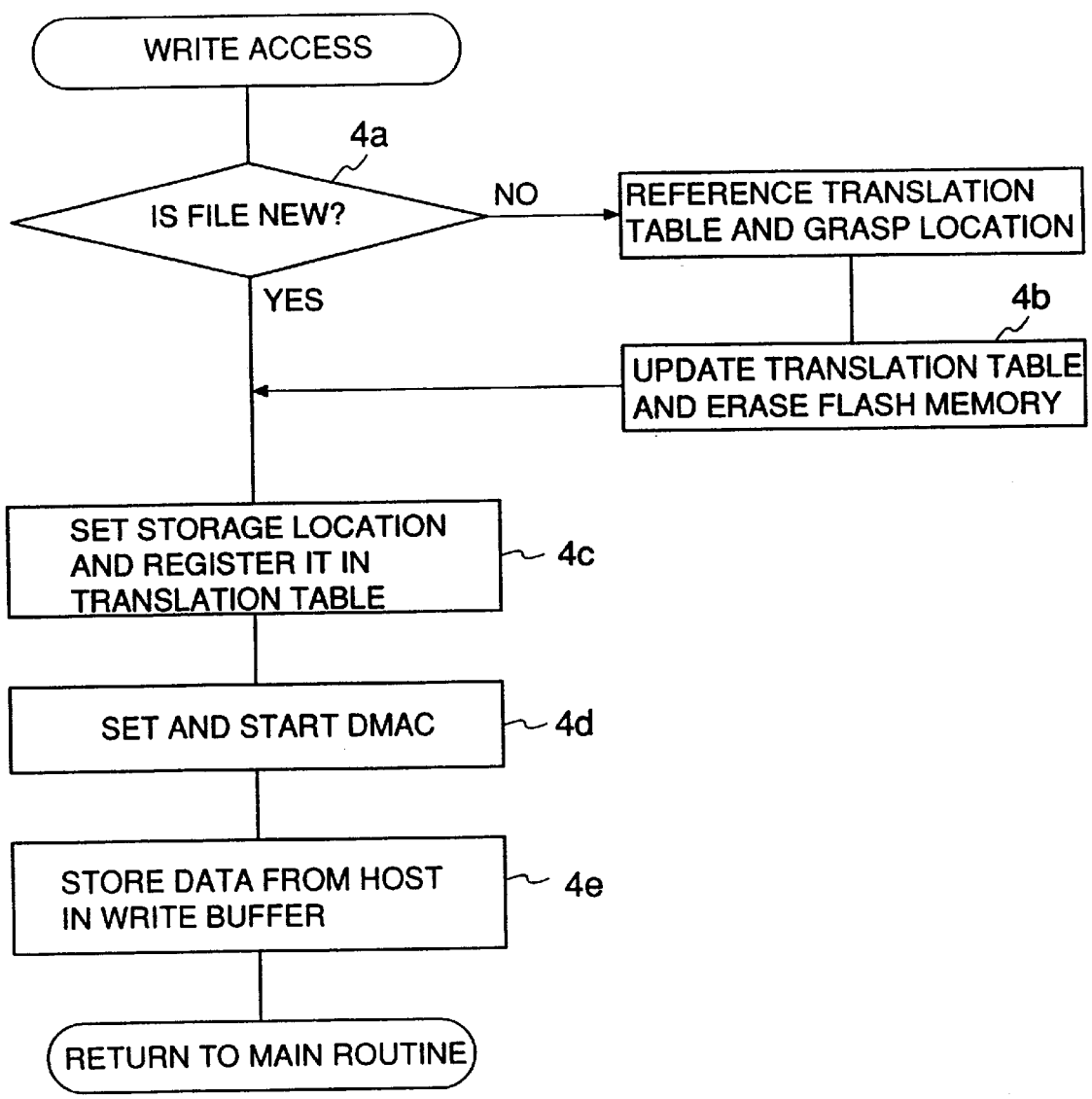
FIG. 53 is a flowchart of a write access routine of the control program in second embodiment of the invention.

FIGS. 52 and 53 are flowcharts of the access routines. In FIG. 52, first the state in the main routine when control jumps to the access routine is stored in the interrupt information register 2008 in FIG. 50 at step 3a so that the main routine operation can be restarted when control is returned to the main routine. The logical address and physical address of a write sector, etc., are stored in the register 2008. Next, the access type from the host is determined and control branches to the corresponding process at step 3b. The subsequent read access process is shown in FIG. 52. In the read access process, first, address conversion is made. The host specifies a desired file by indicating the logical address, but the logical address does not indicate the actual storage location in the memory, thus the address translation table is accessed in order to convert from the logical address into a physical address and the actual storage location in the memory is evaluated for reading at step 3c. After the address conversion is made, the DMAC access address is set and the DMAC is started at step 3d. Read data is transferred to the host bus and the access is completed at step 3e. Then, control is returned to the main routine.

On the other hand, a write access is shown in FIG. 53. First, a check is made to see if the specified file was stored in the past at step 4a. Whether or not the file was stored in the space can be determined by checking to see if its physical address exists in the table. If the file is a file stored in the past, the translation table is referenced and the physical location of the file is evaluated, then the translation table is updated (even if the logical address of the file remains the same, the file. is stored at a different physical address to prolong the rewrite life, thus the physical address of the file must be updated) and erasure operation is performed for the flash memory at step 4b. At the same time, update file write operation is performed. Since erasure operation is automatically performed in the flash memory, if the chip where the erasure operation is performed differs from the chip where the write operation is performed, the erasure operation and write operation can be performed concurrently. If the file is new at step 4a, write operation is started. First, the storage location of the file is determined and the correspondence between the logical address and the physical address is recorded at step 4c. Next, the DMAC access address is set and the DMAC is started at step 4d. Data from the host is stored in the write buffer at step 4e. The write operation is now complete and control is returned to the main routine. The flow sequence on the flowchart may be changed wherever appropriate. Since the DMAC executes actual data transfer to and from the host after the DMAC is set and started in FIGS. 52 and 53, the controller enters the wait or standby state in the meantime. Although the erasure operation is performed in the write routine in FIG. 53, it may be performed when data is written into the flash memory in the main routine or another file arrangement routine may be provided for erasure. Particularly when flash memory erasure units are larger than file management units and it is inevitable that a number of files exist in one erasure unit, it is the most efficient practice to provide a garbage collection routine in which erasure operation is performed.

Figure 59:
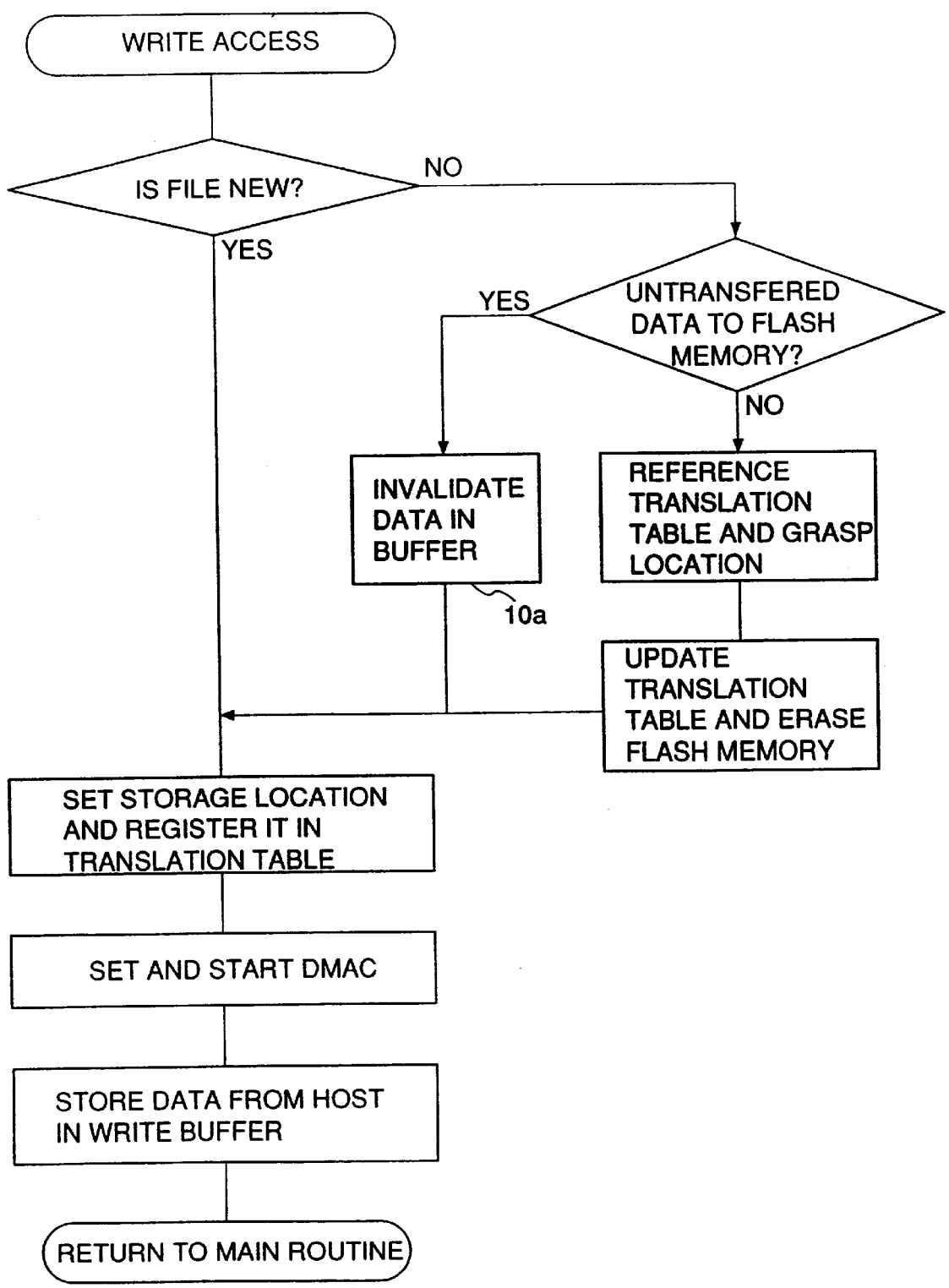
FIG. 59 is a flowchart showing process when untransferred file is updated in second embodiment of the invention.

An example in which data from the host is stored in the write buffer as an application from FIG. 53 is discussed with reference to FIG. 59. When data not yet transferred to the flash memory and remaining in the write buffer is updated, the previously stored data becomes unnecessary. Then, the data is erased or a flag for invalidating the data is set and the data is not transferred to the flash memory.

Figure 54:
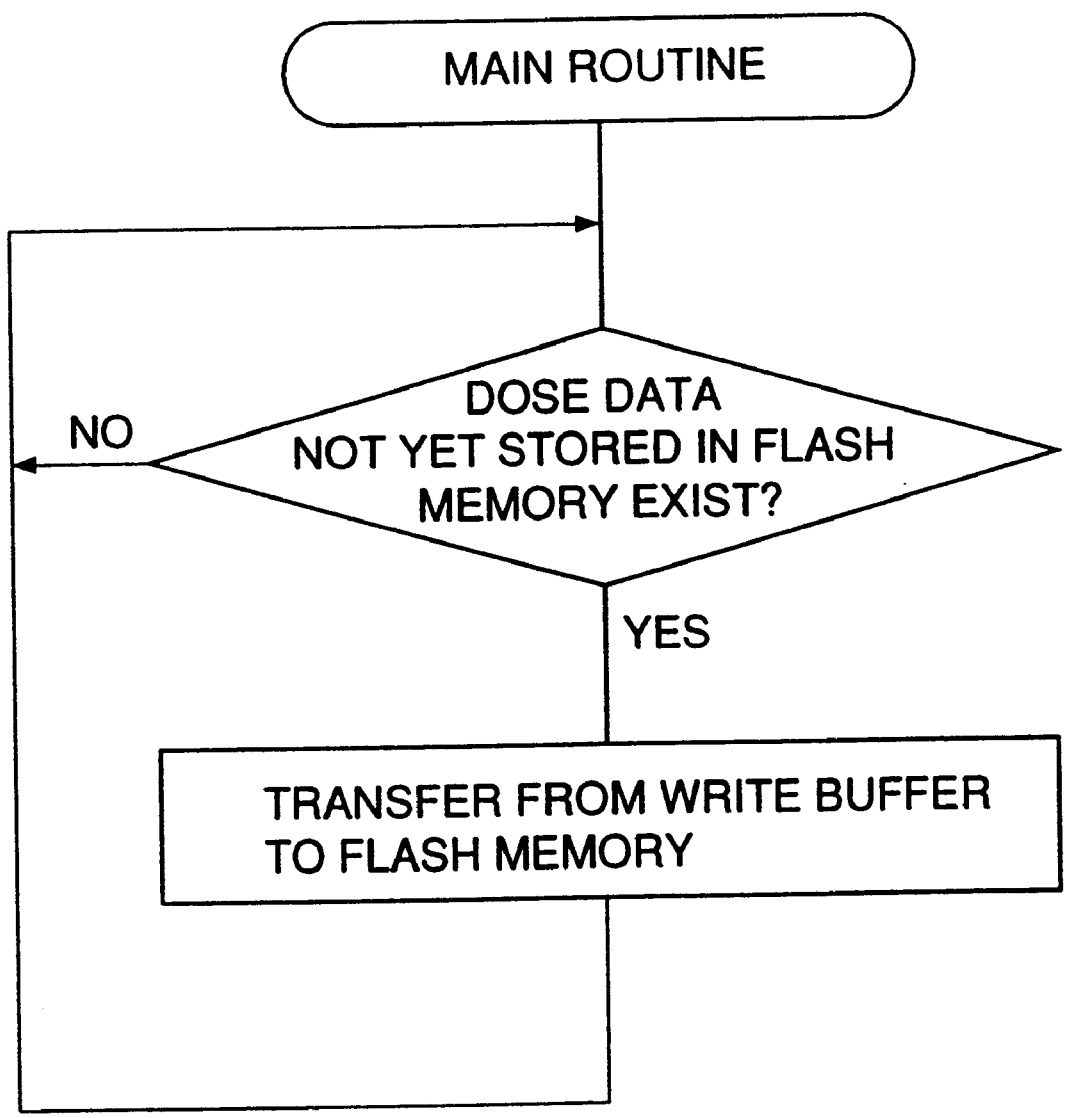
FIG. 54 is a flowchart of a main routine for handling a hardware interrupt in second embodiment of the invention.

By the way, another example in the main routine in FIG. 51 is given. In the example in FIG. 51, an access request from the host is received in software. It is also possible to forcibly make the transition to the access routine in response to a hardware interrupt. In this case, the main routine is simplified as shown in FIG. 54 and the transition step to the access routine is not executed by software. The method can respond promptly to an access request from the host. Software becomes slightly complicated for performing normal processing when the transition to the access routine is made in response to an interrupt and when control is returned to the main routine after interrupt processing terminates, but if the interrupt state is recorded in detail, normal return can be made.

Figure 55:
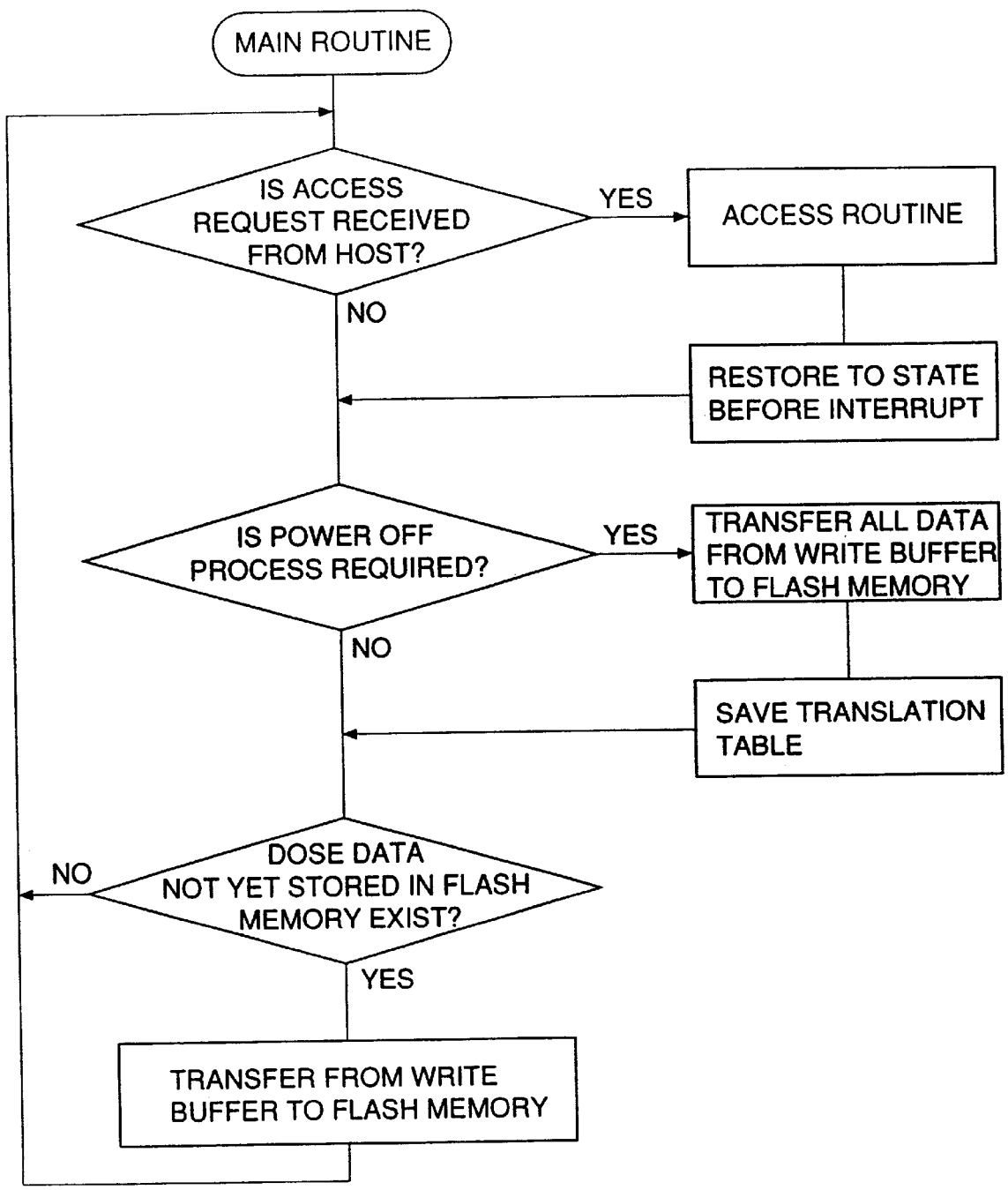
FIG. 55 is a flowchart of a main routine covering power off process in second embodiment of the invention.

In addition, FIG. 55 shows a main routine containing a reset and power off process. The process becomes important particularly when the translation table is stored in a volatile memory. If data in the translation table is lost, it means that the entire file data is lost, thus the data in the translation table needs to be saved in a nonvolatile memory at reset or power off. A writable nonvolatile memory used only for saving the translation table data may be provided. If a part of the flash memory to store data is used for this purpose, the number of parts can be reduced.

Figure 56:
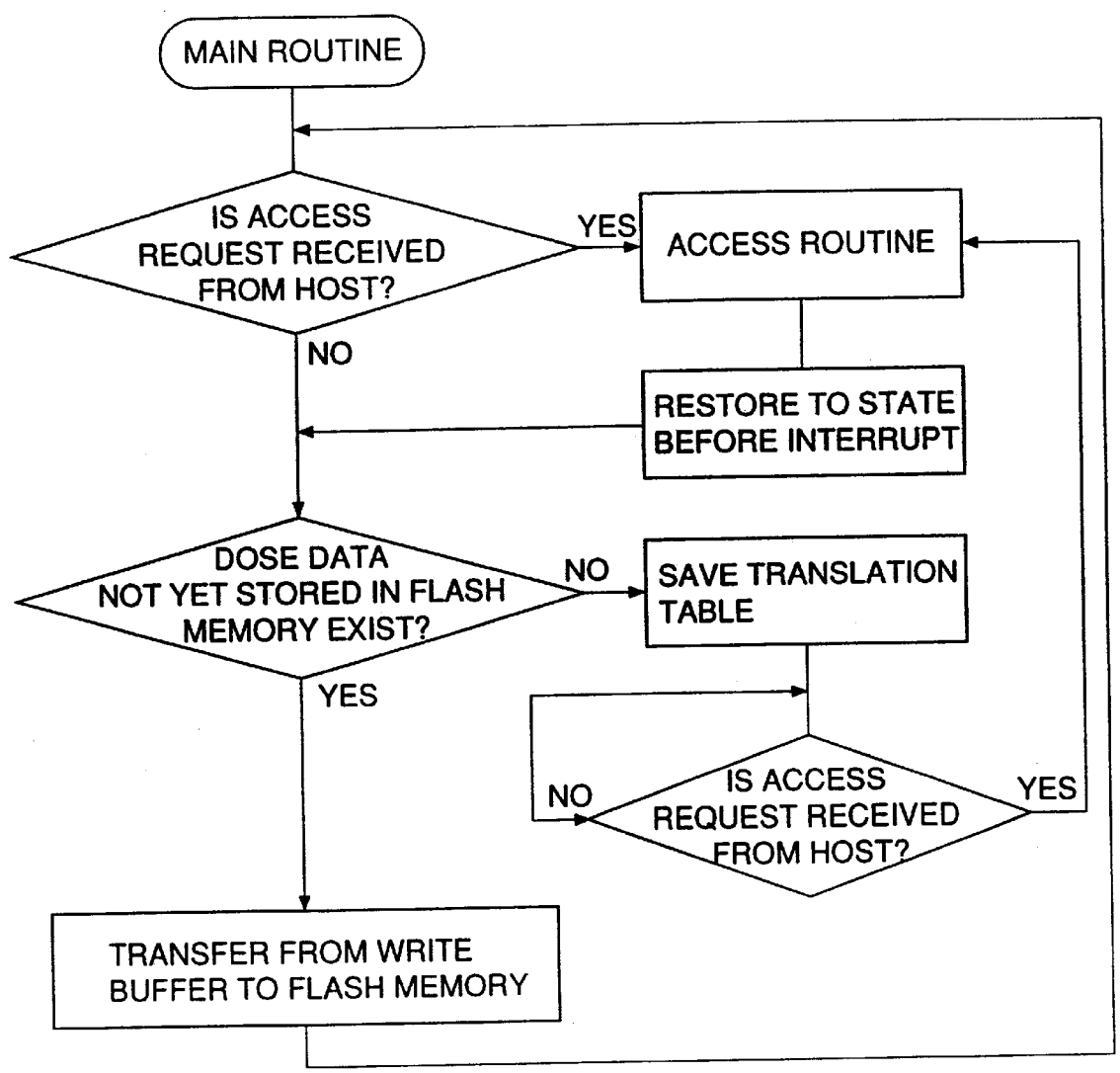
FIG. 56 is a flowchart of a main routine containing translation table save process in second embodiment of the invention.

A routine shown in FIG. 56 may be used to avoid the save process. In the routine, when data has been transferred from the write buffer to the flash memory for storage and the controller waits for the host to issue a command, the save process is executed. This eliminates the need for performing special processing at reset or power off, thus the user need not wait. However, care must be taken so as not to reset or turn off the power during write or save processing.

Since the saved translation table is frequently rewritten, if it is saved in a nonvolatile memory whose write count is limited, the life of the nonvolatile memory need to be examined. If a part of the flash memory is used as a translation table save area as described above, the save area should be moved without specifying only one place. This method can be easily carried out by recording a code indicating the save area in the part of the memory used as the save area. When the translation table in a volatile memory is lost because of power off, the save area code can be retrieved from all storage areas of the flash memory to ascertain the location of the save area. As an alternative method, if only the physical location of the final save area is written into a part of a nonvolatile memory when the power is turned off, the time can be saved.

Figure 57:
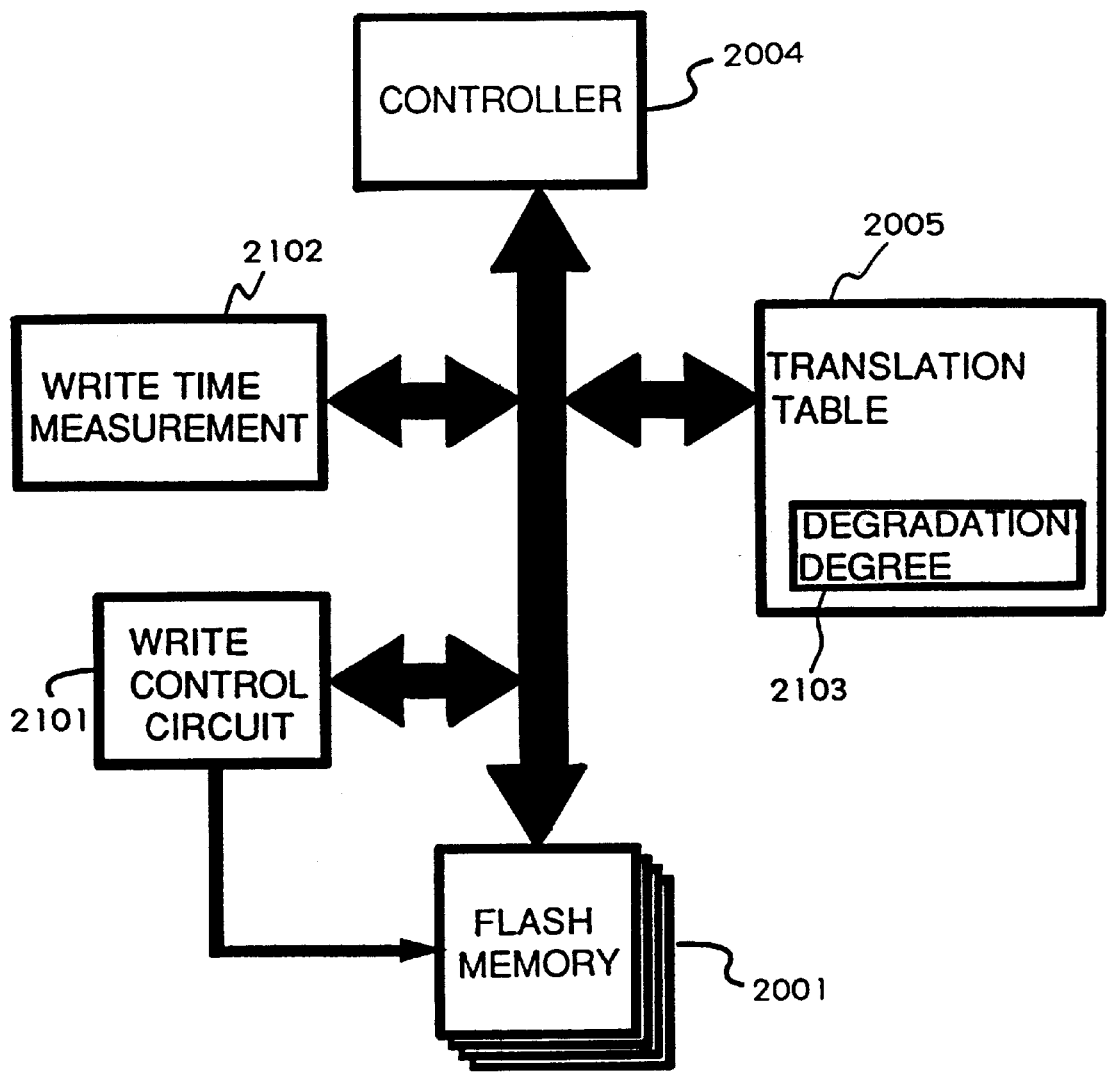
FIG. 57 is a block diagram of a flash memory system in which a degradation diagnosis is made based on the write time in second embodiment of the invention.

Next, an embodiment for preventing access performance from lowering due to degradation of the flash memory is discussed with reference to FIG. 57 which shows means for ascertaining degradation of the flash memory. In FIG. 57, numeral 2101 is a flash memory write control circuit, numeral 2102 is a write time measurement circuit, and numeral 2103 is a degradation degree information table (degradation degree storage means) provided in the translation table and corresponding to each erasure block of the flash memory. Other numerals denote the same members as described above. When writing into the flash memory 2001, the controller 2004 (degradation degree diagnosis means) starts the write control circuit 2101 and the write time measurement circuit 2102 for grasping the time taken for writing. The controller 2004 determines how much the flash memory is degraded in response to the time, and writes the degradation degree into the degradation degree information table in the translation table. For the degradation degree, the write time is classified into eight levels, for example. Level 1 is set in the range of 10 to 100 µs and level 2 is set in the range of 100 to 1000 µs, for example. If level 8 is set when the allowable write time is exceeded, namely, when the unusable state is entered, the information can also serve as a record of defective sectors.

Figure 58:
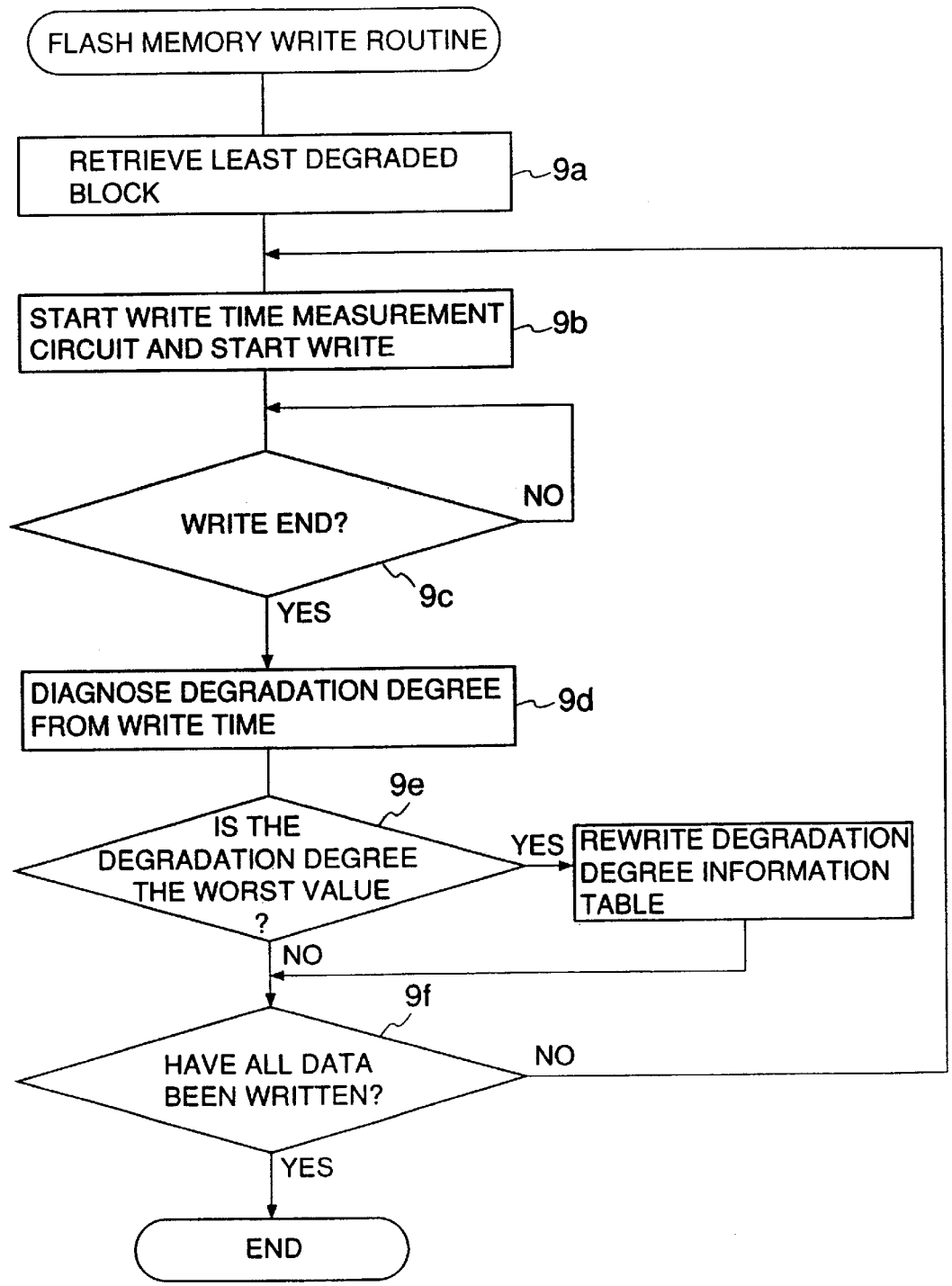
FIG. 58 is a flowchart of a write routine in which a degradation diagnosis is made based on the write time in second embodiment of the invention.

The controller 2004 uses the degradation degree when the physical address is determined to store data. That is, data write into blocks whose degradation degree is judged to be great is avoided as much as possible, thereby preventing performance from lowering due to degradation. A flowchart showing the control sequence is discussed with reference to FIG. 58. FIG. 58 is a flowchart of measuring the write time to diagnose the degradation degree in a flash memory write operation. The diagnosis is made based on the fact that flash memory has a feature that the time required for writing is prolonged as degradation is advanced. The flash memory write routine in FIG. 58 shows writing into one erased block. When the host makes a write access and write data is stored in the write buffer, the routine is started. First, a block having the lowest degradation degree is looked up in the degradation degree information table at step 9*a*. If all blocks are at the same degradation level, any desired block is selected. As a result, all blocks will degrade evenly. When a write block is found, the write time measurement circuit is started for each write unit to start measuring the write time, and at the same time, actual flash memory write is started at step 9*b*. A wait is made until the memory write terminates at step 9*c*. Upon completion of the write, the time required for the write is read from the write time measurement circuit and the degradation degree is diagnosed at step 9*d*. If the degradation degree diagnosis result is the worst among the write units written so far in the single block, the result is stored in the degradation degree information table at step 9*e*. In the flash memory in which a plurality of writes form one erasure block, one piece of the degradation degree information is provided for one erasure block. The degradation degree is diagnosed in each write unit and the worst value in the single block is judged as the degradation degree of the block. The degradation degree is considered to differ for each bit, and even if one bit degrades, reliability of the entire area in the block lowers. However, for simplification of the control program, the time only at a specific point in a block may be measured to determine the entire degradation degree.

When all desired data has been written at step 9*f*, the write routine is terminated. If data to be processed remains, control returns to step 9*b*.

Thus, degradation of the flash memory can also be averaged throughout the entire flash memory area. Although the write time is measured to evaluate the degradation degree in the embodiment, the erasure time may be measured to evaluate the degradation degree.

The time is measured by the circuit, but if it is measured by the software of the controller, the hardware can be reduced.

As the effect of the invention, slow write of the flash memory does not lead to lowering of storage performance. The flash memory matches DRAM in read access speed, but has a write access time 10 times as long as DRAM. Moreover, the flash memory requires erasure operation and if data is simply written into the flash memory, storage performance is lowered. Even if a simple write buffer is provided to solve the problem, when the host accesses the flash memory system at this time, the host is made to wait, lowering performance. According to the invention, the flash memory system does not make the host wait and can respond to an access request from the host as long as the write buffer does not overflow. Data transfer can be executed from the write buffer to the flash memory whenever appropriate to prevent the write buffer from overflowing.

The flash memory system has processing means for taking steps when the power is turned off, and the wait time of the user of the flash memory system according to the invention can be reduced as much as possible. An increase in the erasure time or write time due to degradation which is a feature of the flash memory is considered and an increase in the wait time of the user due to degradation of the flash memory is suppressed.

Embodiment 3

A third embodiment of the invention is described with reference to block diagrams and flowcharts. The embodiment is characterized by the fact that when a write error occurs on a semiconductor disk made of flash memory chips, data is written into an alternate write area for extending the disk life. Further, a salvation method when the alternate write area becomes insufficient and a method of informing the user of an error are discussed.

In the description that follows, the capacities of flash memory devices, semiconductor disks, storage tables, etc., can be set to any desired size. Proper values are used as the capacities, but the invention is not affected even if the values are changed. Likewise, an assignment method of the flash memory, storage tables, etc., to address space is not determined uniquely and they can be assigned to any desired addresses; the invention is not affected by the method of assigning to the address space.

Figure 61:
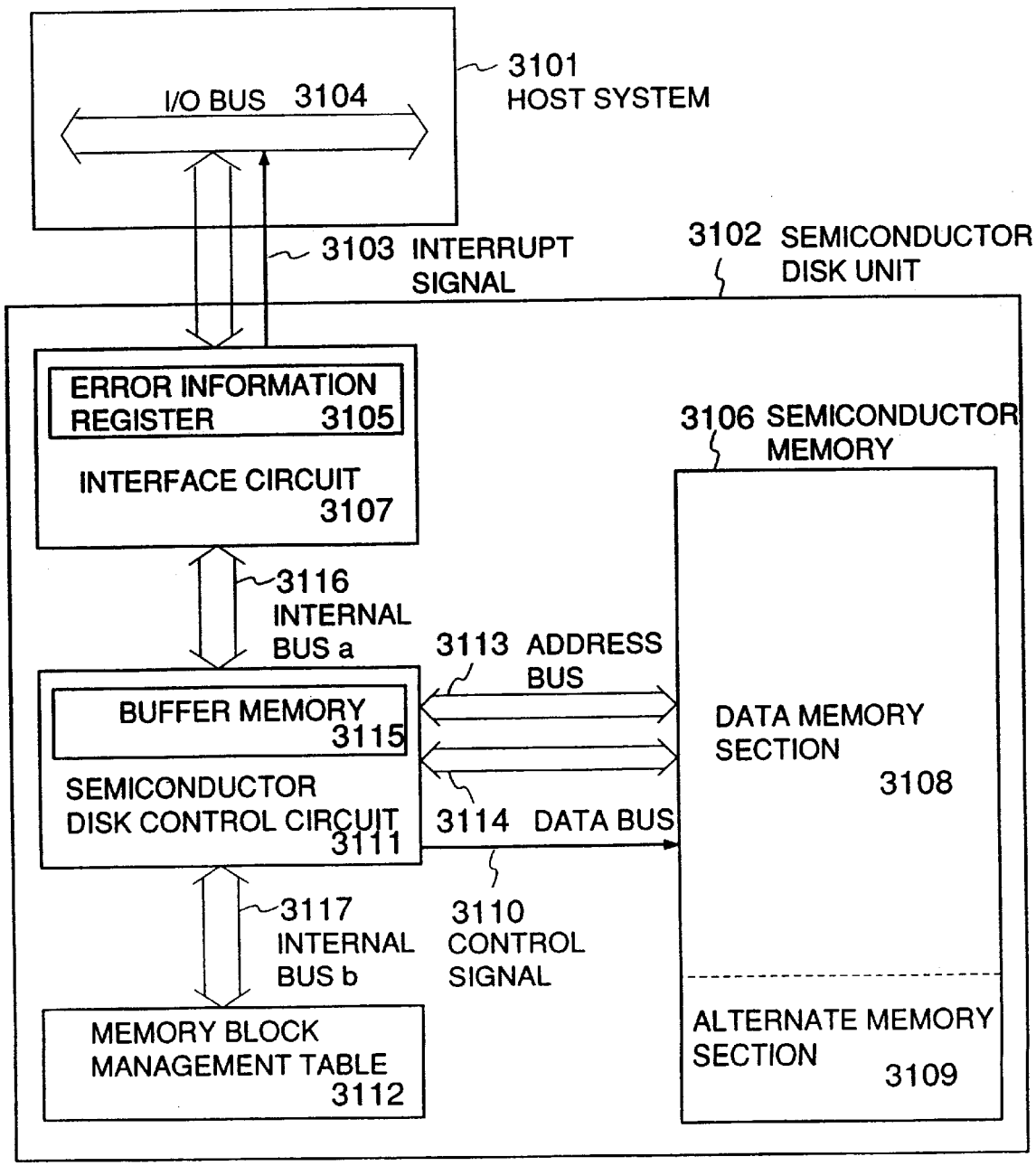
FIG. 61 is a block diagram of a semiconductor disk system according to a third embodiment of the invention.

FIG. 61 shows a block diagram of the third embodiment of the invention, wherein numeral 3102 is a semiconductor disk unit, which is connected to an I/O bus 3104 of a host system 3101 for transferring information to and from the host system 3101. The semiconductor disk unit 3102 comprises an error information register 3105, an interface circuit 3107, a buffer memory 3115, a semiconductor disk control circuit 3111, a memory block management table 3112, and a semiconductor memory 3106, which are connected to each other by an internal bus a 3116, an internal bus b 3117, an address bus 3113, a data bus 3114, and a control signal 3110. Further, the semiconductor memory 3106 comprises a data memory section 3108 which stores file data and an alternate memory section 3109 used as an alternate memory.

The buffer memory 3115 is a memory which temporarily stores data written into or read from the semiconductor memory 3106 and uses SRAM or DRAM which can be read and written to easily and at high speed. The semiconductor memory 3106 is made of flash memory (nonvolatile memory) chips; the data memory section 3108 and the alternate memory section 3109 are provided with 16 flash memory chips each consisting of 2 M bytes (1 M bytes=$2^{20}$ bytes=1048576 bytes). Therefore, the storage capacity of the semiconductor memory 3106 is 32 M bytes. 2 M-byte space of the 32 M bytes is assigned to the alternate memory section 3109, thus the storage capacity of the semiconductor disk unit 3102 becomes 30 M bytes. The memory block management table 3112 uses a 512 K-byte flash memory (1 K bytes=$2^{10}$ bytes =1024 bytes) for storing address information of the semiconductor memory 3106 corresponding to disk block numbers and use of memory area corresponding to each block. Data is written into the semiconductor memory 3106 and the memory block management table 3112 in 512-byte block units, predetermined write units. The capacities of the flash memory devices, semiconductor disk, memory block management table, etc., can be set to any desired value, as described above. They may also be made of discrete memory chips.

The error information register 3105 is means for retaining predetermined error information; to inform the host system 3101 of an error occurring in the semiconductor disk unit 3102, information on the error is written into the error information register 3105. The interface circuit 3107 receives an instruction from the I/O bus 3104 or outputs an interrupt signal 3103 to the I/O bus 3104.

The semiconductor disk control circuit 3111 controls the entire semiconductor disk unit 3102 by using the internal bus a 3116, internal bus b 3117, address bus 3113, data bus 3114, and control signal 3110. The semiconductor disk control circuit 3111 controls read/write of the buffer memory 3115, error information register 3105, memory block management table 3112, and semiconductor memory 3106 by using the address bus 3113, data bus 3114, and control signal 3110. The semiconductor disk control circuit 3111 also controls erasure operation in the memory block management table 3112 and the semiconductor memory 3106, which are made of flash memory chips requiring the erasure operation.

Figure 62:
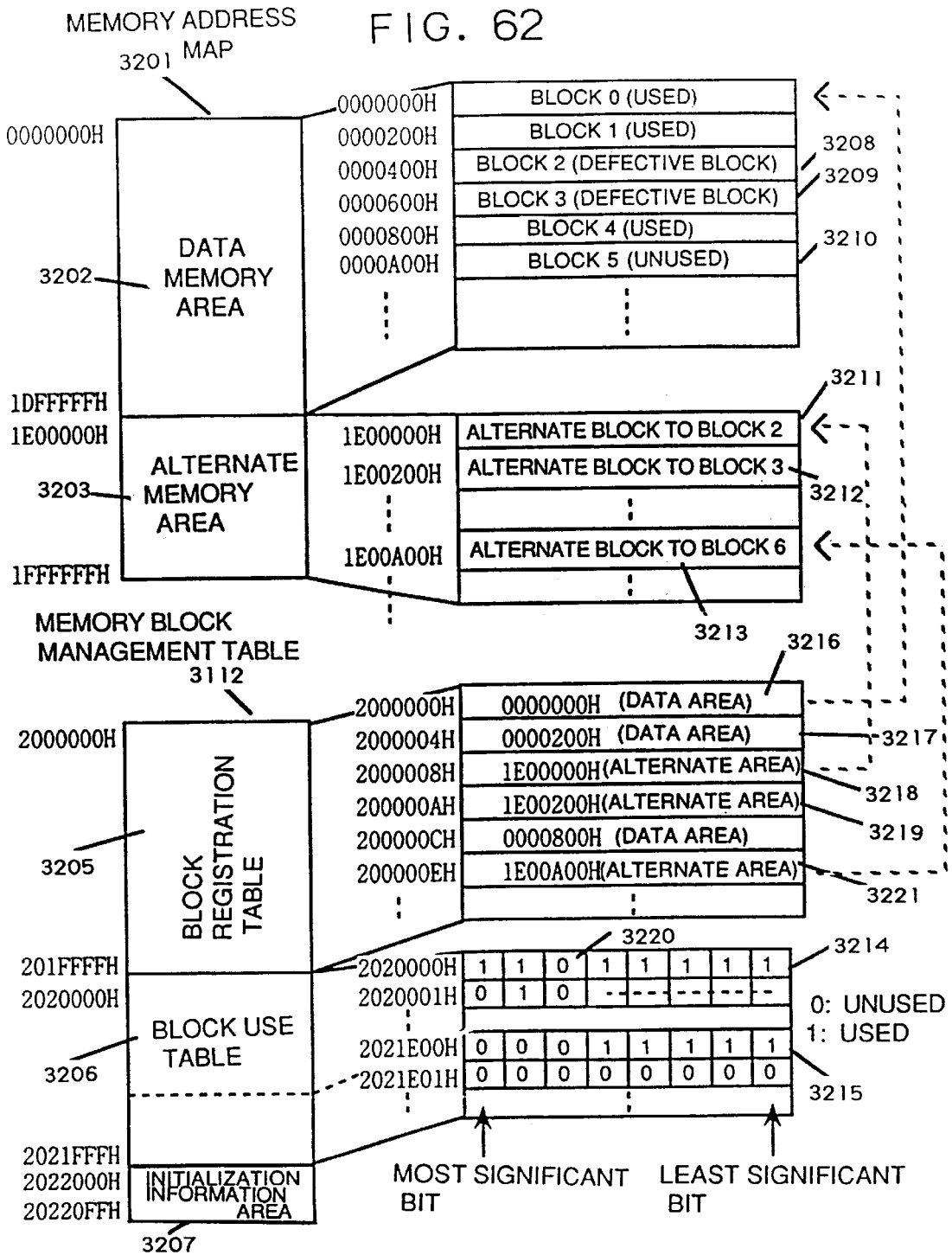
FIG. 62 is an illustration showing a correspondence example between a memory block management table and a memory map according to third embodiment of the invention.

FIG. 62 shows an example of the correspondence between a memory address map of the semiconductor memory 3106 and the memory block management table 3112. The memory block management table 3112 is memory management means for retaining information as to whether or not each block of the semiconductor memory is used in a block use table, and when the control circuit detects an error, for assigning an unused block as an alternate block in place of the error incurring block of the semiconductor memory and retaining the correspondence between the assigned alternate block and the error incurring block in a block registration table. As shown in the memory address map 3201, the 30 M-byte data memory section 3108 comprises a data memory area 3202 (30 M-byte space from address 0000000H (H denotes hexadecimal notation) to address 1DFFFFFH) and the 2 M-byte alternate memory section 3109 comprises an alternate memory area 3203 (2 M-byte space from addresses 1E00000H to 1FFFFFFH). Since data is written in 512-byte units in the embodiment, one block contains 200H addresses. For example, block 0 ranges from address 0000000H to address 00001FFH. Likewise, block 1 ranges from address 0000200H to address 00003FFH, block 2 ranges from address 0000400H to address 00005FFH, block 3 ranges from address 0000600H to address 00007FFH, . . . , as shown in the memory address map 3201. Address 1E00000H and later are assigned to alternate memory blocks in the same manner. As described above, assignment of the addresses is not unique and the addresses may be assigned in any desired manner.

The memory block management table comprises a block registration table 3205 for registering semiconductor memory addresses corresponding to blocks, a memory block use table 3206 for registering information as to whether or not each block of the data memory section 3108 is used, and an initialization information area 3207 for registering initialization information of the entire system.

The formats of the block registration table 3205 and the memory block use table 3206 are as shown in FIG. 62. The block registration table 3205, which lists addresses of the semiconductor memory 3106 corresponding to blocks, has a capacity of four bytes (32 bits) per entry of one block. The block registration table 3205 starts at address 2000000H and represents one block every 4H addresses. Block 0 is indicated by the address information stored in the 4-byte entry 3216 starting at address 2000000H. Likewise, block 1 is indicated by the address information stored in the 4-byte entry 3217 starting at address 2000004H and block 2 is indicated by the address information stored in the 4-byte entry 3218 starting at address 2000008H.

The block use table 3206 stores information as to whether or not each block of the data memory section 3108 and the alternate memory section 3109 is used. The use state of one block is represented by 1-bit information; in the embodiment, an unused block is represented as 0 and a used block as 1. An empty block in the alternate memory section 3109 can be found by searching the block use table for a "0" bit indicating an unused block. The block use table 3206 starts at address 2020000H and represents the use state of eight blocks per 1-byte use information entry. The least significant bit of one byte represents the block having the smallest block number. That is, the 1-byte use information 3214 at address 2020000H represents the use state of eight blocks from blocks 0 to 7. For example, if the bit sequence of the one byte is 11011111b (b denotes binary notation), it indicates that only block 5 is unused. The region from addresses 2020000H to 2021DFFH represents the use state of the data memory section 3108 and the region from addresses 2021E00H to 2021FFFH represents the use state of the alternate memory section 3109.

Figure 77:
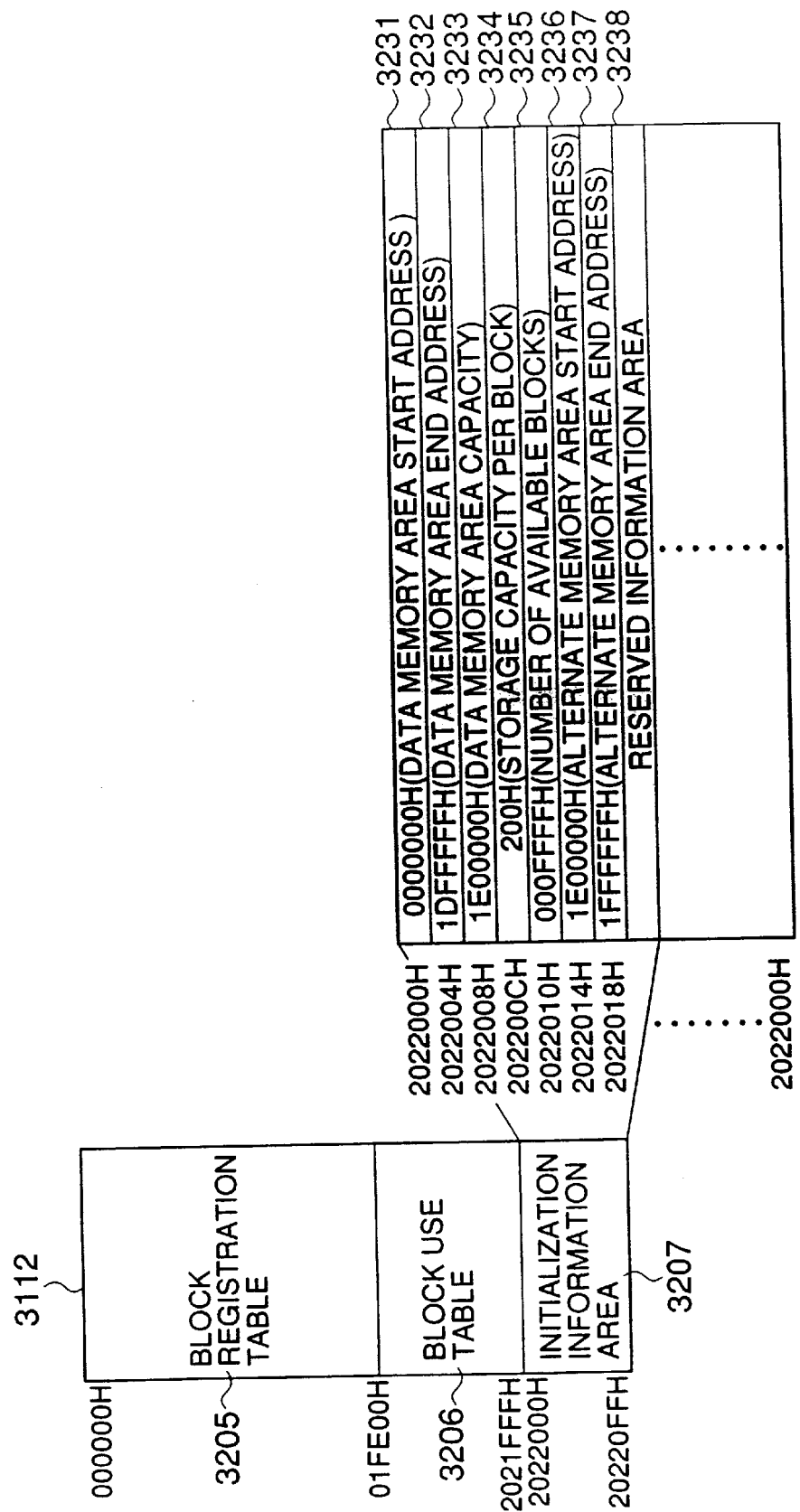
FIG. 77 is an illustration of the contents of an initialization information area in the third embodiment.

Further, FIG. 77 shows a specific example of information stored in the initialization information area 3207. In FIG. 77, the initialization information area 3207 is an area which stores initialization information such as start address information 3231 of the data memory area 3202, end address information 3232 of the data memory area 3202, data memory area capacity 3233, storage capacity per block 3234, the number of available blocks 3235, start address information 3236 of the alternate memory area 3203, end address information 3237 of the alternate memory area 3203, and reserved information area 3238. Necessary information is written into the initialization information area 3207 when the entire disk system is initialized.

Figure 67:
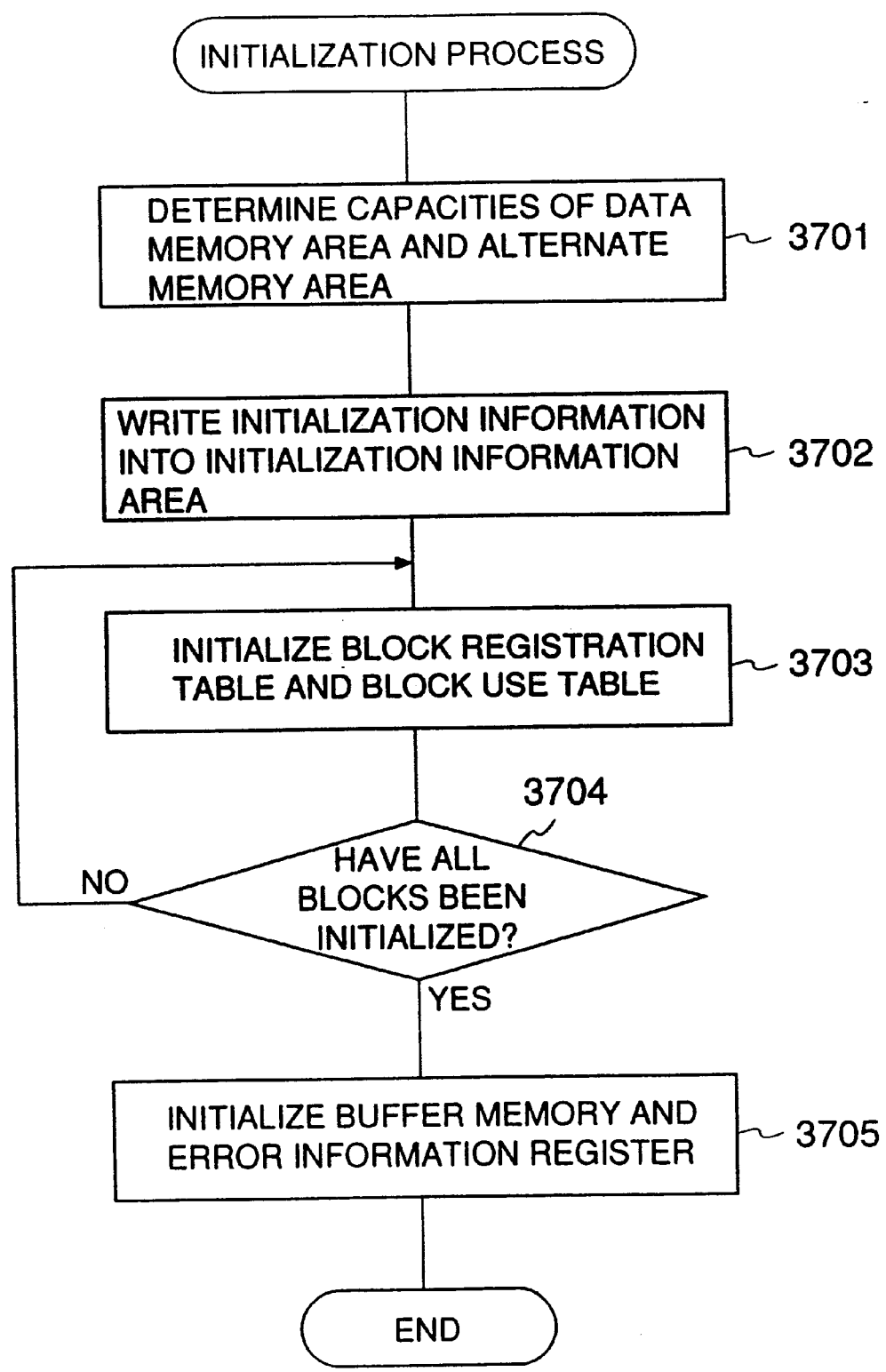
FIG. 67 is a flowchart showing a process sequence of initialization operation in the third embodiment of the invention.
Figure 78:
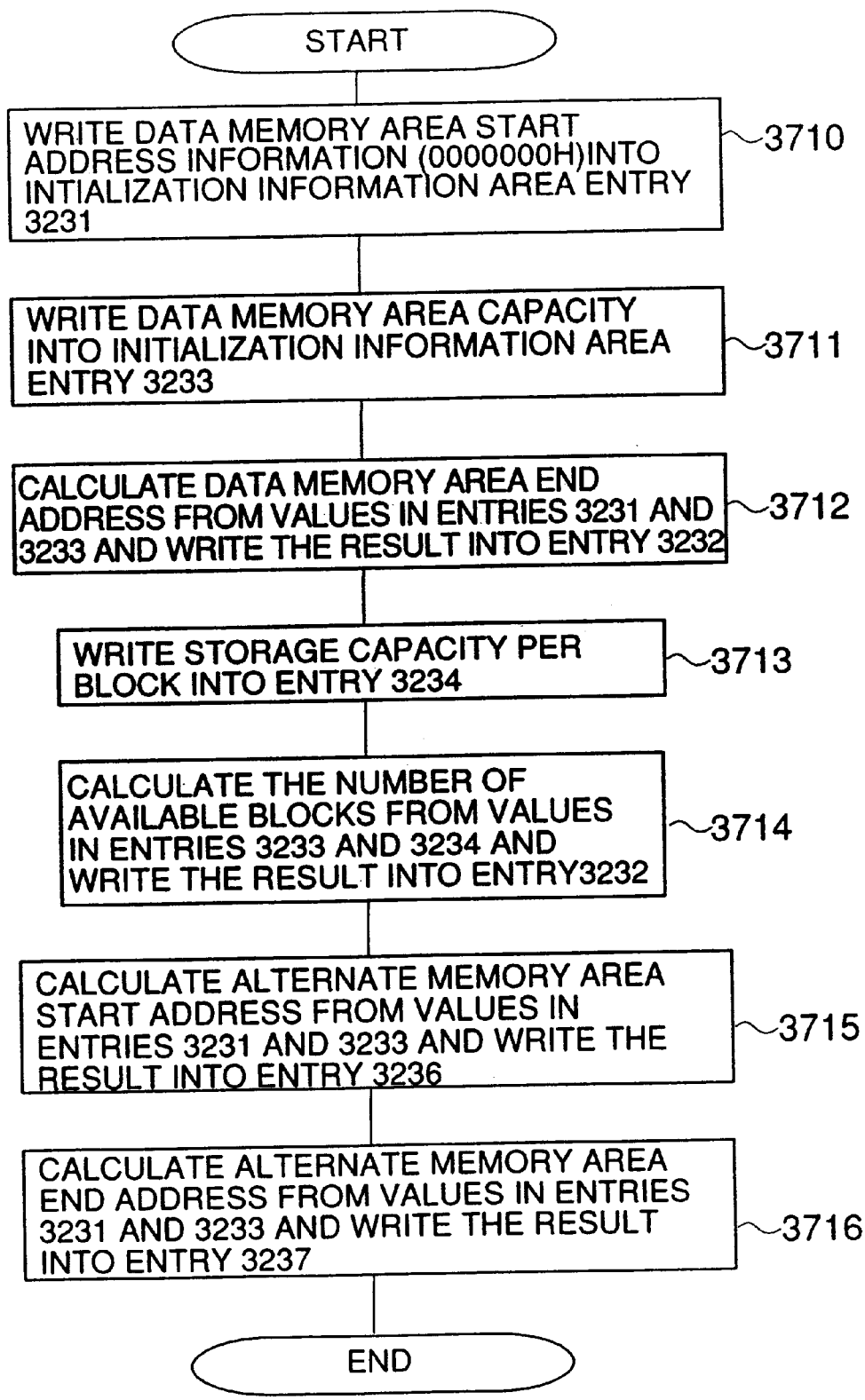
FIG. 78 is a flowchart of setting the initialization information area in the third embodiment.

Next, the initialization operation of the entire disk system is described with reference to FIG. 67. The initialization operation, which is required to use the disk unit, is performed by the host system which executes a format command, etc. In the initialization operation in the embodiment, first the capacities of the data memory area 3202 and the alternate memory area 3203 are determined at step 3701. The user can specify the capacities through a keyboard 3122 (shown in FIG. 73), or host system input means to set the capacity of the alternate memory area 3203 as he or she desires. The user specifies information such as the data memory area capacity and the storage capacity per block. Jumper pins, etc., may be used for hardware setting in the semiconductor disk control circuit 3111. The capacities may be calculated from the block use table or may be determined by executing write/read check on the data memory area 3202 and the alternate memory area 3203. The specified initialization information is written into the initialization information area 3207 at step 3702. Step 3710 to 3716 in FIG. 78 show a write flow into the initialization information area 3207. The host system instructs through the interface circuit 3107, the semiconductor disk control circuit 3111 to write the specified initialization information into the entries of the initialization information area 3207 indicated by predetermined addresses. The initialization information written into the initialization information area 3207 can define the address spates of the data memory section 3108 and the alternate memory section 3109.

Next, the block registration table 3205 and the block use table 3206 are initialized at step 3703. First, address information corresponding to each disk block is written into the block registration table 3205. For example, to initialize block 0, address information 0000000H corresponding to block 0 of the data memory area 3202 is written into the 4-byte entry starting at address 2000000H of the block registration table 3205 corresponding to the block 0. Likewise, to initialize block 1, address information 0000200H corresponding to block 1 of the data memory area 3202 is written into the 4-byte entry starting at address 2000004H of the block registration table 3205. The operation is repeated for all blocks of the data memory area 3202 and the alternate memory area 3203 at step 3704. Further, if necessary, the error information register 3105 and the buffer memory 3115 are initialized. The initialization of the entire disk is now complete. The initialization operation only needs to be executed when the semiconductor disk unit 3102 is first used or when a disk format instruction is executed.

How to determine the block registration table 3205 and the block use table 3206 for the capacities of the data memory area 3202 and the alternate memory area 3203 is also described. The data memory area 3202 and the alternate memory area 3203 are 32 M bytes in total and the minimum unit managed in the block registration table is one block, 512 bytes, thus 32 M bytes/512 bytes=65536, namely, 64 K bytes (1 K bytes are 1024 bytes) are required. Therefore, at least 64 K bytes in the range of addresses 0000H to FFFFH (in the embodiment, addresses 2000000H to 200FFFFH) may be allocated to the block registration table 3205. Since 128 K bytes from addresses 2000000H to 200FFFFH are allocated in the embodiment, address information of space of a maximum of 64 M bytes can be registered for both the data memory area 3202 and the alternate memory area 3203. In the block use table 3206, one bit is required per block and eight blocks can be managed per byte. Therefore, total number of blocks, 65536/8=8192, namely, at least 8 K-byte space may be allocated to the block use table 3206. Since 16 K bytes from addresses 2020000H to 2021FFFH are allocated in the embodiment, the use state of a maximum of 131072 blocks, namely, 67108864 bytes (64 K bytes) can be managed. A semiconductor memory of any desired size can be controlled by allocating proper space to the block registration table 3205 and the block use table 3206.

Figure 73:
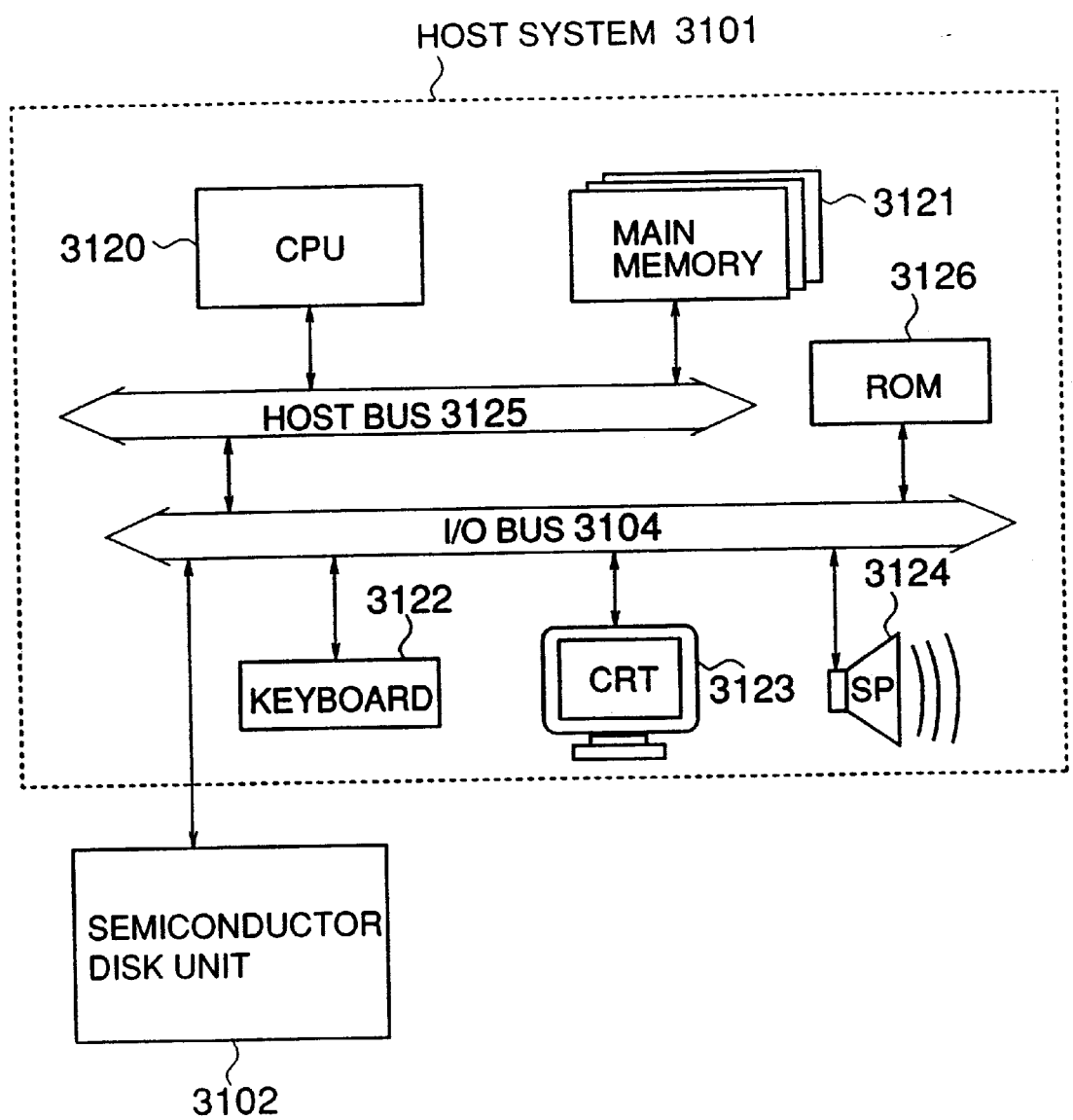
FIG. 73 is a block diagram of a host system according to the third embodiment of the present invention.

Next, FIG. 73 shows a block diagram of the host system 3101. In the host system 3101, CPU 3120 is connected to main memory 3121 via a host bus 3125 and further connected via the I/O bus 3104 to ROM 3126, keyboard 3122, CRT 3123, and loudspeaker 3124. The keyboard 3122 is input means for accepting data and initialization information entered by the user. The CRT 3123, one of the output means, displays information such as the operation result of the CPU 3120 and error information. The loudspeaker 3124, one of the output means, produces a warning or alarm sound, etc., when an error occurs. The ROM 3126 or the main memory 3121 stores programs for predetermined processing such as read/write and interrupt processing.

Next, the read operation and write operation of the semiconductor disk unit 3102 according to the embodiment are discussed with reference to FIGS. 63 to 65.

First, assume that a file data read instruction is received via the I/O bus 3104 from the host system 3101. In this case, the semiconductor disk control unit 3111 first handles the instruction; the control operation varies depending on how the instruction is given. For example, if allocation information of read file data is given with the sector number and track number like a magnetic disk, etc., the allocation information must be converted into a physical address of the data memory section 3108. For simplicity, in the embodiment, file allocation information from the I/O bus 3104 is given with a block number of the data memory section 3108. The block number is converted into the high-order bits of the physical address.

Figure 63:
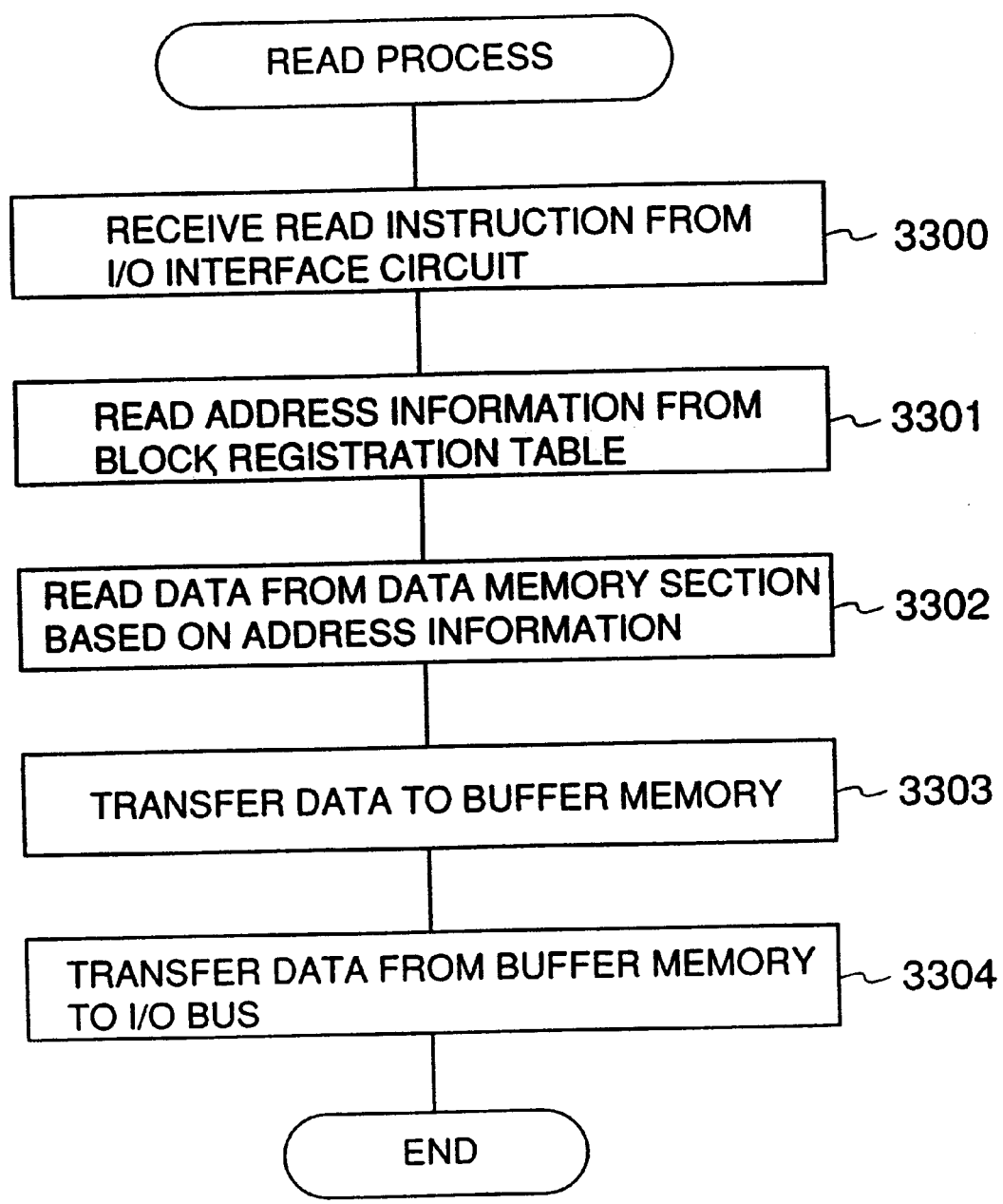
FIG. 63 is a flowchart showing a process sequence of read operation in the third embodiment of the invention.

FIG. 63 shows a read process sequence of the semiconductor disk control circuit 3111. As shown in FIG. 63, the semiconductor disk control circuit 3111 reads address information of the semiconductor memory 3106 corresponding to the block number received from the I/O bus 3104 from the block registration table 3205 of the memory block management table 3112 at step 3301. For example, to read block 0, 4-byte address information 3216 starting at address 2000000H of the block registration table 3205; to read block 1, 4-byte address information 3217 starting at address 2000004H of the block registration table 3205. Next, based on the address information read at step 3101, 512-byte information is read from the region corresponding to the block number of the data memory section 3108, for example, if block 0 is read, address 0000000H indicated by the address information 3216 at step 3302. The data is temporarily transferred to the buffer memory at step 3303. Then, the data is transferred via the interface circuit 3107 to the I/O bus 3104 at step 3304.

Here, for the block which became defective at the previous writing like the region 3208 of block 2 starting at address 0000400H of the data memory area 3202 shown in FIG. 62, address information of the alternate memory section 3109 is registered in the block registration table 3205. That is, the address information of the 512-byte region 3211 starting at address 1E00000H of the alternate memory area 3203 is registered. Therefore, to read block 2, data is read from the block 2 alternate region in the alternate memory section 3109, namely, the 512-byte region 3211 starting at address 1E00000H at step 3302, and is transferred via the interface circuit 3107 to the I/O bus 3104. The alternate memory area registration method is described in the write operation below.

The semiconductor disk control circuit 3111 controls data read from the memory block management table 3112, the data memory section 3108, and the alternate memory section 3109. The semiconductor disk control circuit 3111 also controls transfer of the read data to the I/O bus 3104 by controlling the internal bus a 3116, the internal bus b 3117, the address bus 3113, the data bus 3114, the control signal 3110, and the interface circuit 3107. Thus, to read file data, the address information of the semiconductor memory corresponding to the target block is read and data in the data memory section 3108 or the alternate memory section 3109 is read in response to the address information.

Next, assume that a file data write instruction is received via the I/O bus 3104 from the host system 3101. FIG. 64 shows a write process sequence of the semiconductor disk control circuit 3111. First, when accepting a write instruction from the interface circuit 3107 at step 3400, the semiconductor disk control circuit 3111 transfers file data given from the I/O bus 3104 to the buffer memory 3115 at step 3401. Since writing into the flash memory takes time compared with reading from the flash memory, the step is performed to reduce the wait time of the host system. The minimum capacity of the buffer memory 3115 should be the write unit capacity into the flash memory or larger. Next, the address information of the semiconductor memory 3106 corresponding to the block number for the write is read from the block registration table 3205 of the memory block management table 3112 at step 3402. Next, the file data in the buffer memory 3115 is written into the semiconductor memory. 3106 at step 3403 based on the address information read at step 3402. For example, in the embodiment, to write into block 3, the 4-byte address information 3129 starting at address 200000AH of the block registration table 3205 is read out. The data is written into the 512-byte block 3212 starting at address 1E00200H (alternate memory section 3109) indicated by the address information. Next, a check is made at step 3404 to see if the writing into the data memory section 3108 or the alternate memory section 3109 has been performed normally. A write error occurs in the flash memory when write operation is performed frequently only into specific blocks and the limit of the flash memory write count is exceeded. If the flash memory has a check function as a command, the check at step 3404 can be easily performed by using the command; otherwise, by reading data from the current write address and comparing the data with the contents of the buffer memory 3115. If the writing is normal at step 3404, the process of the file data write instruction received via the I/O bus 3104 from the host system is terminated (step 3410).

On the other hand, when the writing is abnormal at step 3404, the subsequent sequence is described. For example, if writing into block 3 cannot be performed normally, first the block use table 3206 is searched for an unused block of the alternate memory section 3109 at step 3405; the region at address 2021E00H and later of the block use table 3206 is searched for a "0" bit. In the embodiment, the sixth least significant bit of the 1-byte information 3214 at address 2021E00H is 0, thus the semiconductor disk control circuit 3111 determines that the sixth block of the alternate memory area 3203, namely, the 512-byte block starting at address 1E00A00H is an unused block. Next, whether or not an unused block is found is checked at step 3406. In the embodiment, an unused block exists and thus is used as the alternate block to block 3. The address information 1E00A00H indicating the sixth block of the alternate memory section 3109 is written into address 200000CH of the block registration table 3205 corresponding to block 3 of the semiconductor disk unit 3102 and the bit 3220 of the block use table 3206 indicating the block 3213 is set to 1 at step 3407. Next, block erasure is executed for the block 3213 used as the alternate block at step 3408 and the contents of the buffer memory 3115 are written into the alternate block at step 3409. If the alternate memory section does not contain any alternate block at step 3406, a proper error code is written into the error information register 3105 shown in FIG. 61 and an interrupt signal 3103 is output to the I/O bus 3104 at step 3411. When acknowledging the interrupt signal 3103, the host system interrupts the currently executed processing and reads the contents of the error information register 3105. Then, the host system 3101 again performs write operation into another block of the data memory section 3108 of the semiconductor disk unit 3102 or informs the user that the alternate memory section 3109 of the semiconductor disk unit 3102 is exhausted, as described below.

Thus, even if defective blocks exist, the entire flash memory life can be extended by using alternate blocks. Although a write check is made only at step 3404 in the embodiment, whether or not erasure is executed normally may be checked at the step next to step 3408. A check as to whether or not write is executed normally may be added at the step next to step 3409. If an error is detected at the check, write processing into a given alternate block at steps 3405 to 3410 is again performed.

Figure 79:
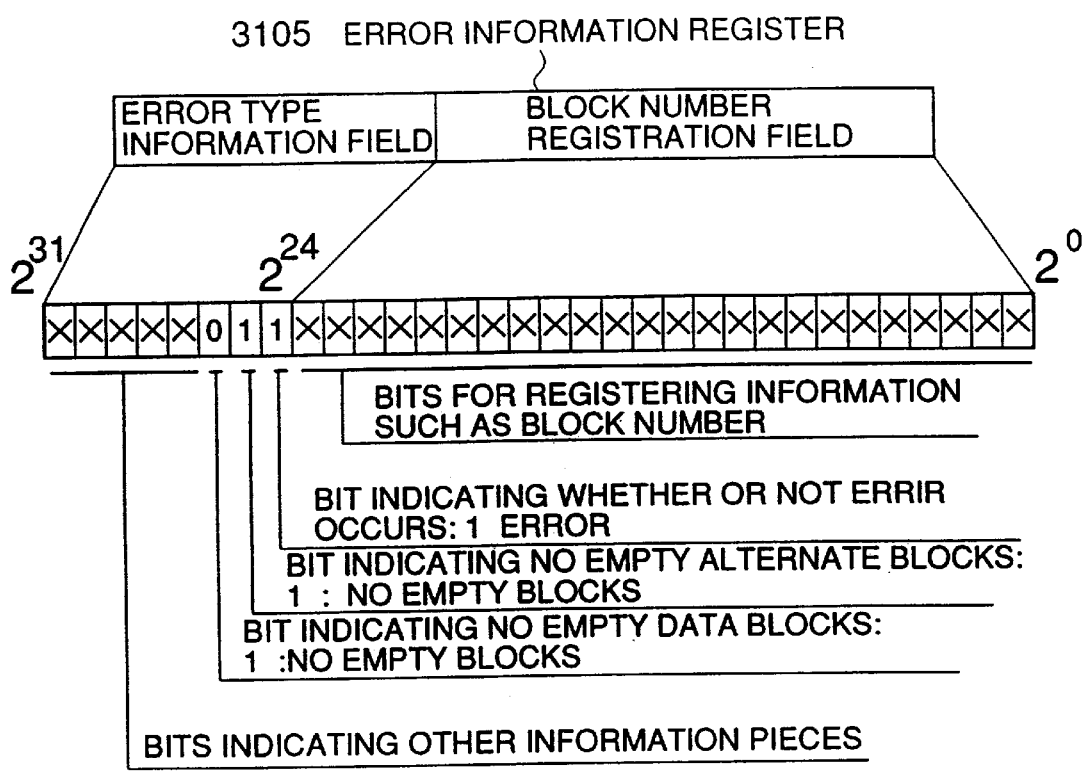
FIG. 79 is an illustration showing the format of an error information register according to the third embodiment of the present invention.
Figure 80:
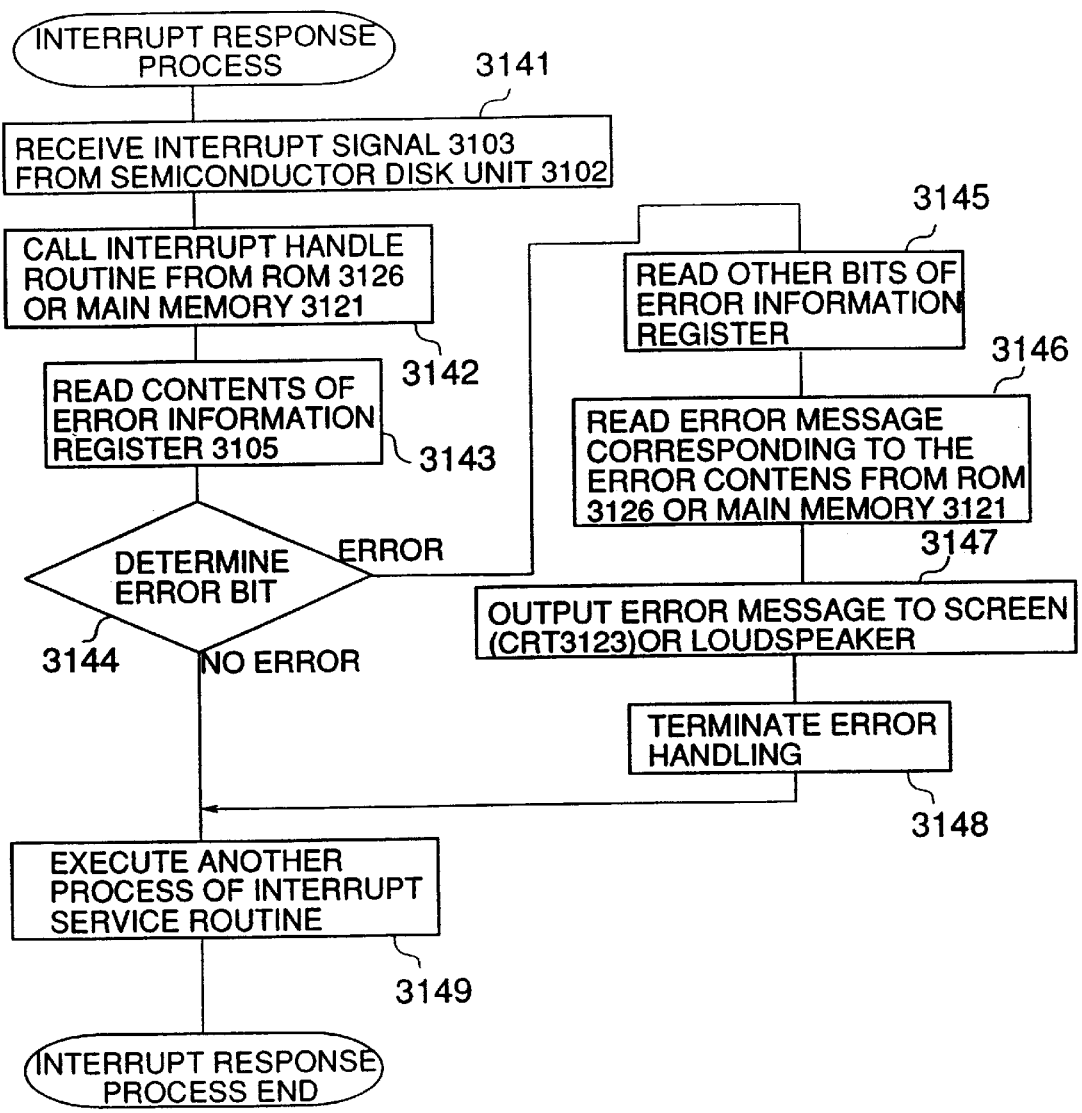
FIG. 80 is a flowchart showing interrupt response operation in the third embodiment of the present invention.

Next, the contents of the error information register 3105 and the host system processing are discussed with reference to FIGS. 79 and 80. FIG. 79 shows the contents of the error information register 3105. FIG. 80 shows the host system response operation to an interrupt signal.

When a write error occurs, the semiconductor disk control circuit 3111 generates an interrupt signal by information means and stores information on the error in the error information register 3105 as shown in FIG. 79. As the stored error information, a bit indicating whether or not an error occurs and a bit indicating no empty alternate blocks are set when no unused blocks exist in the alternate memory area 3203 as described above. When no empty data blocks exist in the data memory area 3202, a bit indicating whether or not an error occurs and a bit indicating no empty data blocks are set. For the error incurring block, address information such as the block number of the block can be set in a block number registration field of the error information register 3105.

Figure 81:
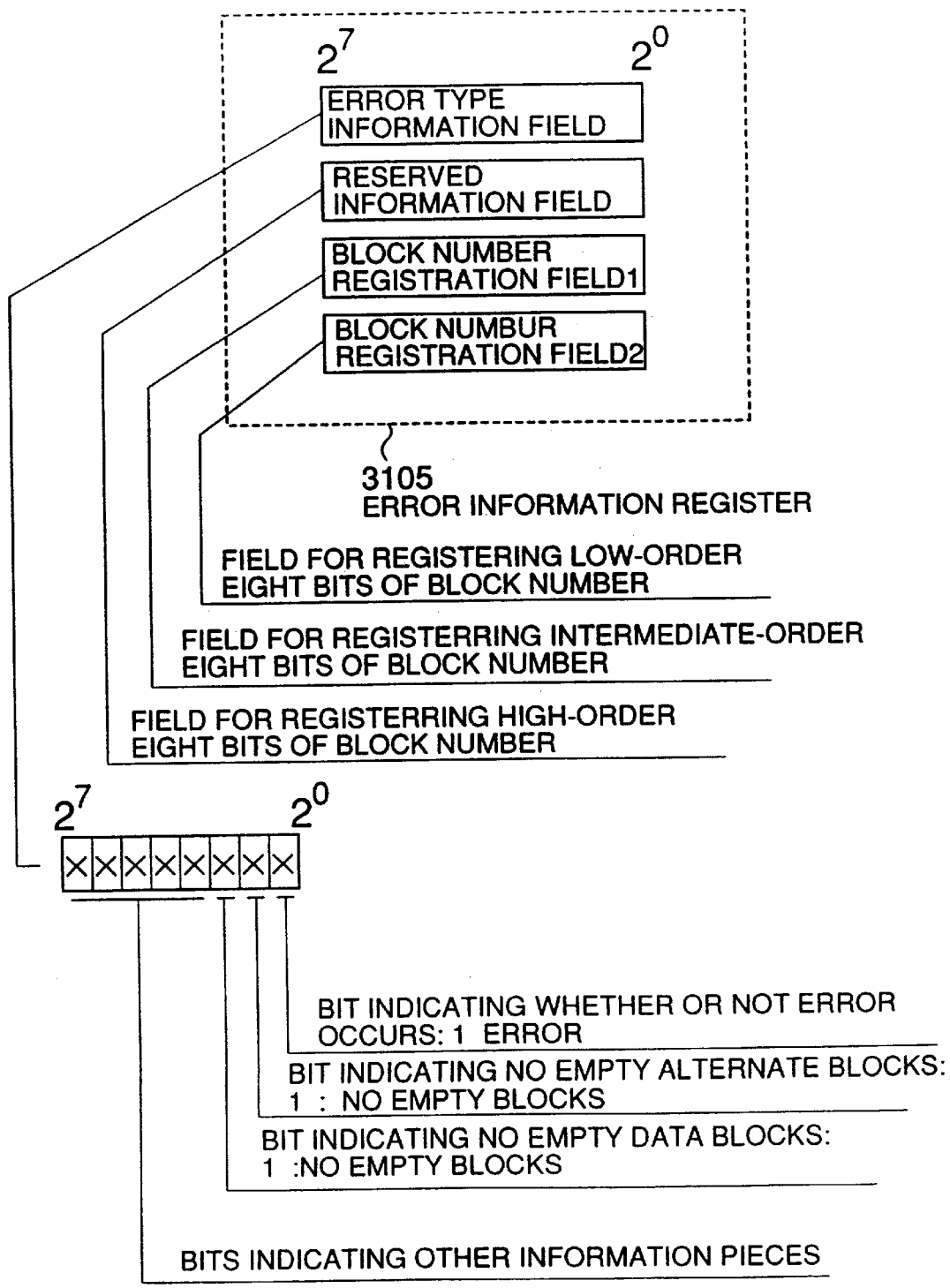
FIG. 81 is an illustration showing the format of another example of the error information register in the third embodiment of the present invention.

The error information register may be divided into an error information type field, reserved information field, and block number registration fields 1 and 2, as shown in FIG. 81. When an error occurs, the semiconductor disk control circuit 3111 sets error information as described above.

When an error occurs, the host system performs processing as shown in FIG. 80. In FIG. 80, when receiving an interrupt signal from the semiconductor disk unit 3102 at step 3141, the host system 3101 performs interrupt response processing. Instead of receiving the interrupt signal, the host system 3101 may poll the error information register 3105 to read the register contents. When an interrupt occurs, an interrupt handling routine stored in the ROM 3126 or the main memory 3121 is called at step 3142. The contents of the error information register 3105 are read at step 3143. The bit indicating whether or not an error occurs is determined at step 3144. If no error occurs, another process of the interrupt service routine is executed and the interrupt processing is terminated at step 3149. If the error bit is set, other contents of the error information register 3105 are read at step 3145. An error message corresponding to the error contents is read from the ROM 3126 or the main memory 3121 at step 3146. The read error message is output to a screen of display means or alarm sound or a voice message indicating error occurrence is output through output means at step 3147. Another predetermined process corresponding to the error information may be executed.

Figure 74:
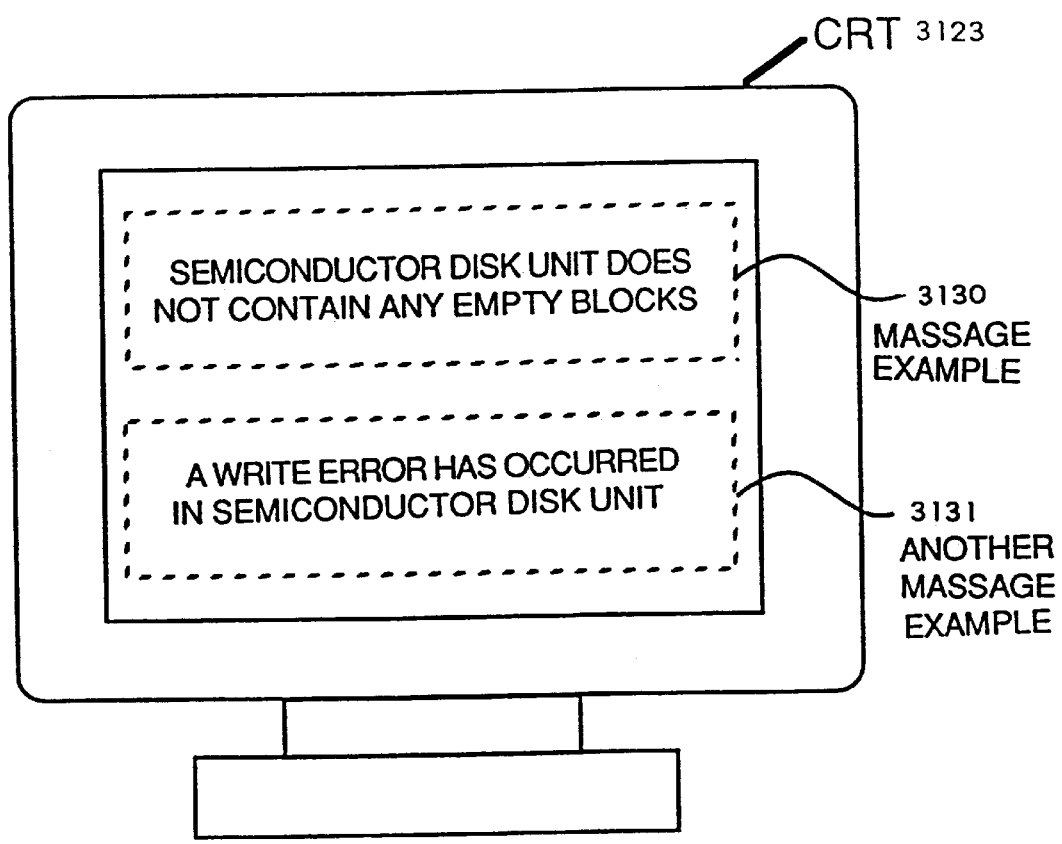
FIG. 74 is an illustration representing error message output examples according to the third embodiment of the present invention.

FIG. 74 shows an example of how to inform the user of an error.

In FIG. 74, when an error occurs, the CPU 3120 outputs error information stored in the main memory 3121 or the like to the CRT 3123. The error information may be a message, such as the example 3130 informing the user that the semiconductor disk does not contain any empty blocks or another message such as the example 3131 informing the user that a write error has occurred. A beep sound or synthetic voice may be used as an alarm sound. In addition, the semiconductor disk unit 3102 may be provided with one or more LEDs, which are turned on depending on the error contents.

Thus, the user can be informed that an error has occurred.

Figure 65:
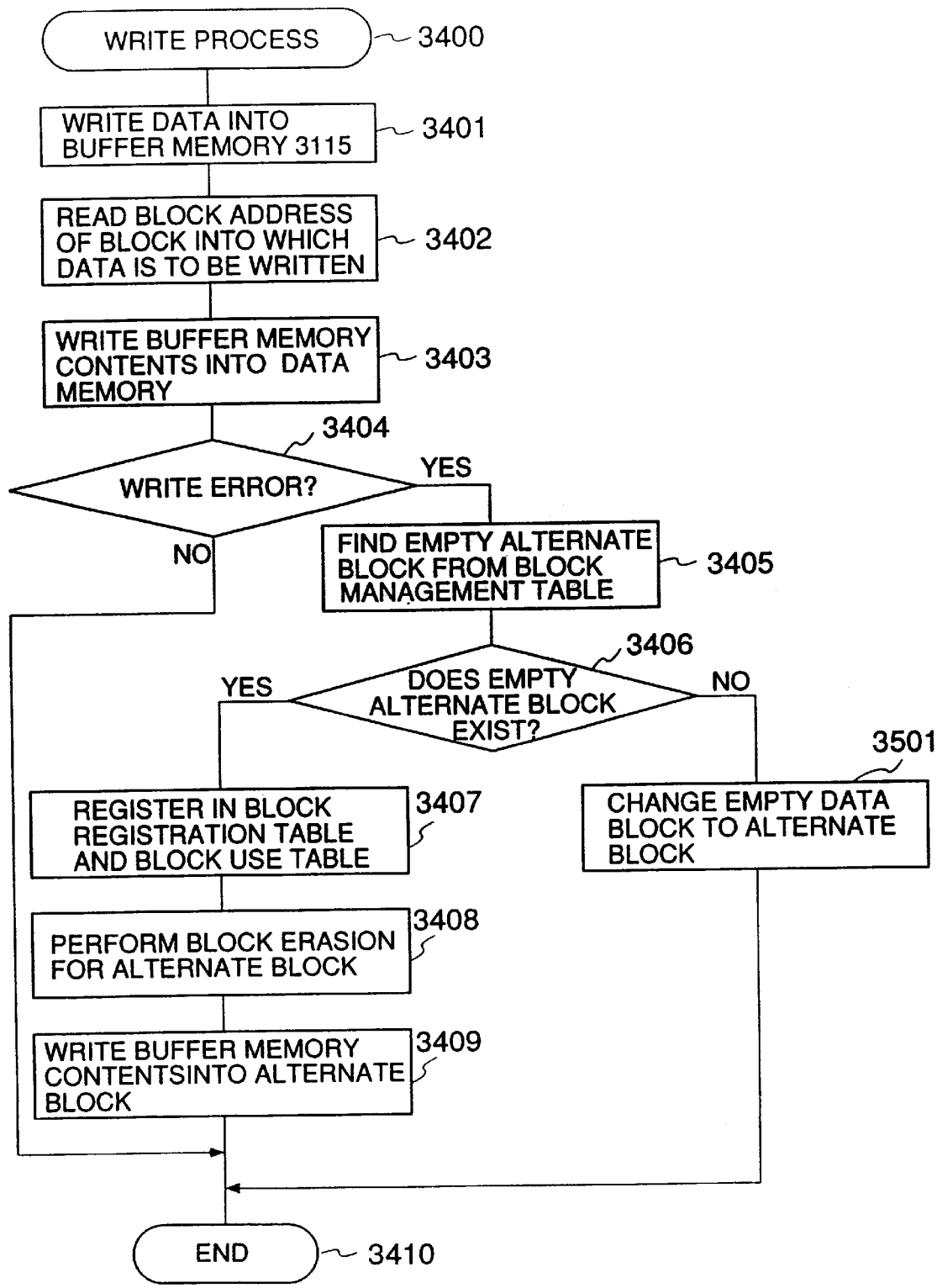
FIG. 65 is a flowchart showing another process sequence of write operation in the third embodiment of the invention.

Next, FIG. 65 shows a write operation flowchart where if an unused block is not found in the alternate memory section 3109 in the write process described above, an unused block of the data memory section 3108 is found for use as an alternate block.

Figure 64:
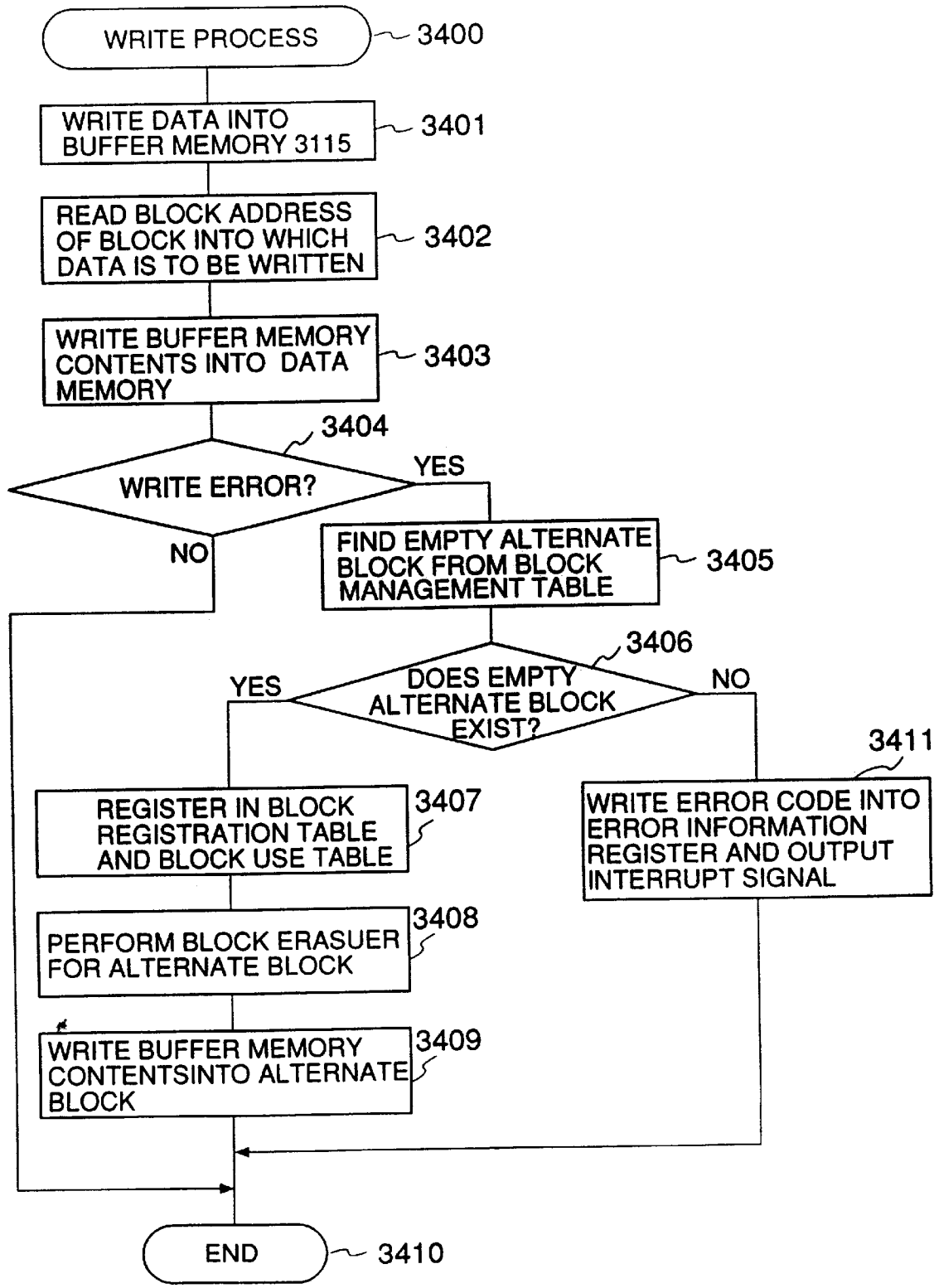
FIG. 64 is a flowchart showing a process sequence of write operation according to third embodiment of the invention.

In FIG. 65, as in the process shown in FIG. 64, when a write error occurs, an empty block of the alternate memory section 3109 is found at step 3405. If no empty block is found at step 3406, an empty block of the data memory section 3109 is found and assigned to an alternate block at step 3501. The detailed operation of the step 3501 is discussed with reference to a flowchart shown in FIG. 66. Other steps in FIG. 65 are the same as those in FIG. 64 and therefore will not be discussed again.

Figure 66:
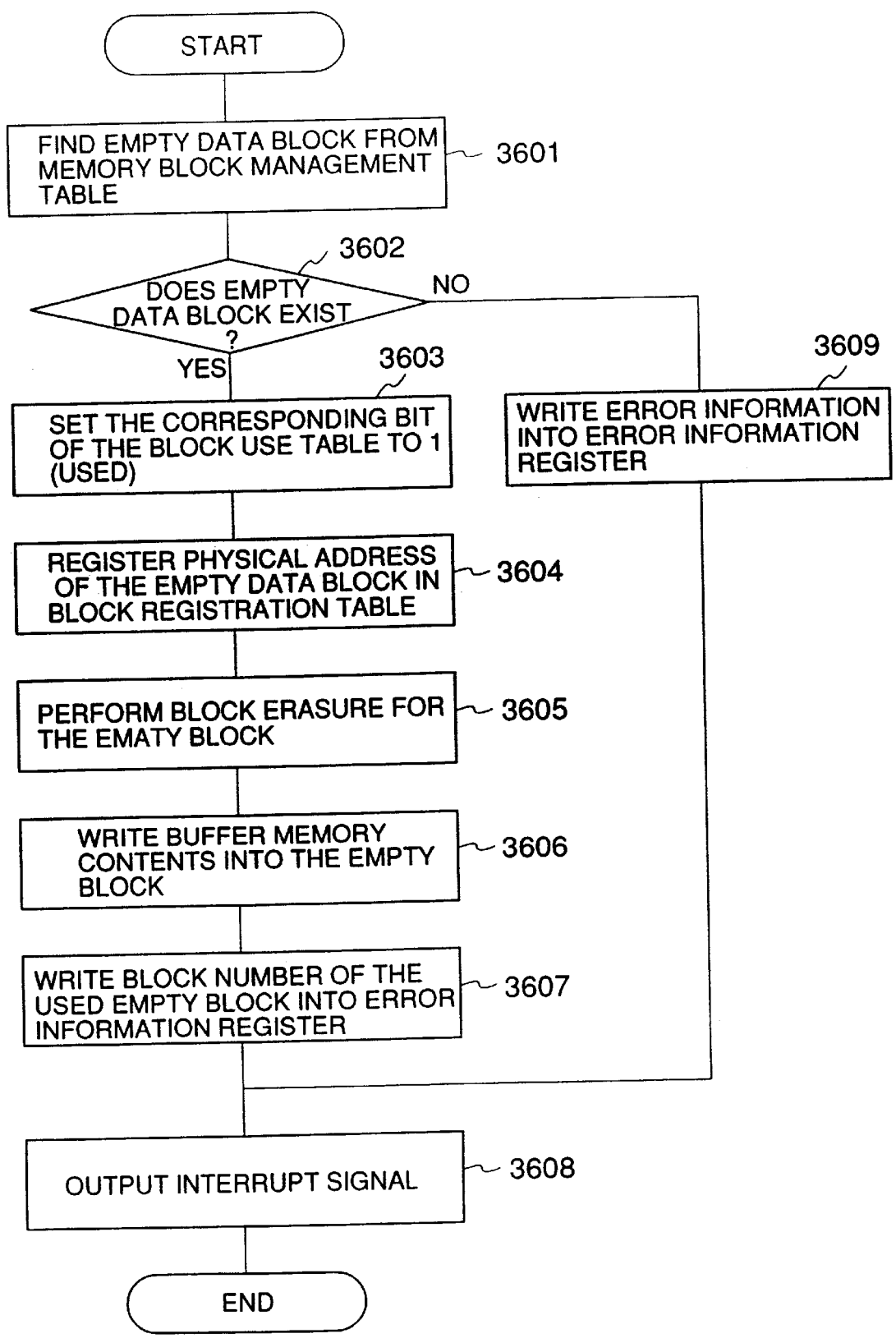
FIG. 66 is a flowchart showing a registration process sequence of an alternate block in the third embodiment of the invention.

In FIG. 66, first the block use table 3206 of the memory block management table 3204 shown in FIG. 62 is searched for an unused block of the data memory section 3108 at step 3601. Specifically, the region at addresses 2020000H to 2021DFFFH of the block use table 3206 is searched for a bit set to 0. In the embodiment, the sixth least significant bit of the 1-byte information 3214 at address 2020000H is 0. As described above, it means that the sixth block of the data memory area 3202, namely, the 512-byte block 3210 starting at address 0000A00H is an unused block. Next, whether or not the data memory section 3108 contains an unused block is checked at step 3602. Since the block 3210 exists as an empty block in the embodiment, the bit 3220 of the block use table 3206 corresponding to the block 3210 is set to 1 (used) at step 3603. Next, at step 3604, the address information 3221 of the found empty block of the data memory area 3202 is written into the 4-byte entry starting at address 200000EH of the block registration table 3205 in FIG. 62 corresponding to the block 3210 into which data is to be written. In the embodiment, to write data into block 5, address information 0000A00H is written into address 200000EH of the block registration table 3205. Subsequently, block erasure is executed for the empty block of the data memory section 3108 at step 3605 and the contents of the buffer memory 3115 are written into the empty block 3210 at step 3606.

By the way, the block 3210 of the data memory section 3108 used as the alternate write area at the above-mentioned steps is a block originally used as a data area. Thus, there is a chance that the host system 3101 will issue another write instruction into the block 3210 of the data memory section 3108. Then, information such as the block number of the empty block of the data memory section 3108 used as the alternate area is written into the error information register 3105 at step 3607 and an interrupt signal 3103 is output to the host system 3101 at step 3608. When acknowledging the interrupt signal 3103, the host system 3101 may interrupt the current processing, read the block number contained in the error information register 3105, and perform proper processing such as inhibiting use of the block.

If the data memory section 3108 does not contain any empty block at step 3602, error information indicating that no empty blocks are found is written into the error information register 3105 at step 3609 and an interrupt signal 3103 is output to the host system 3101 at step 3608. When acknowledging the interrupt signal 3103, the host system 3101 may interrupt the currently executed processing and perform proper processing such as informing the user that the semiconductor disk unit 3102 is exhausted.

Figure 76:
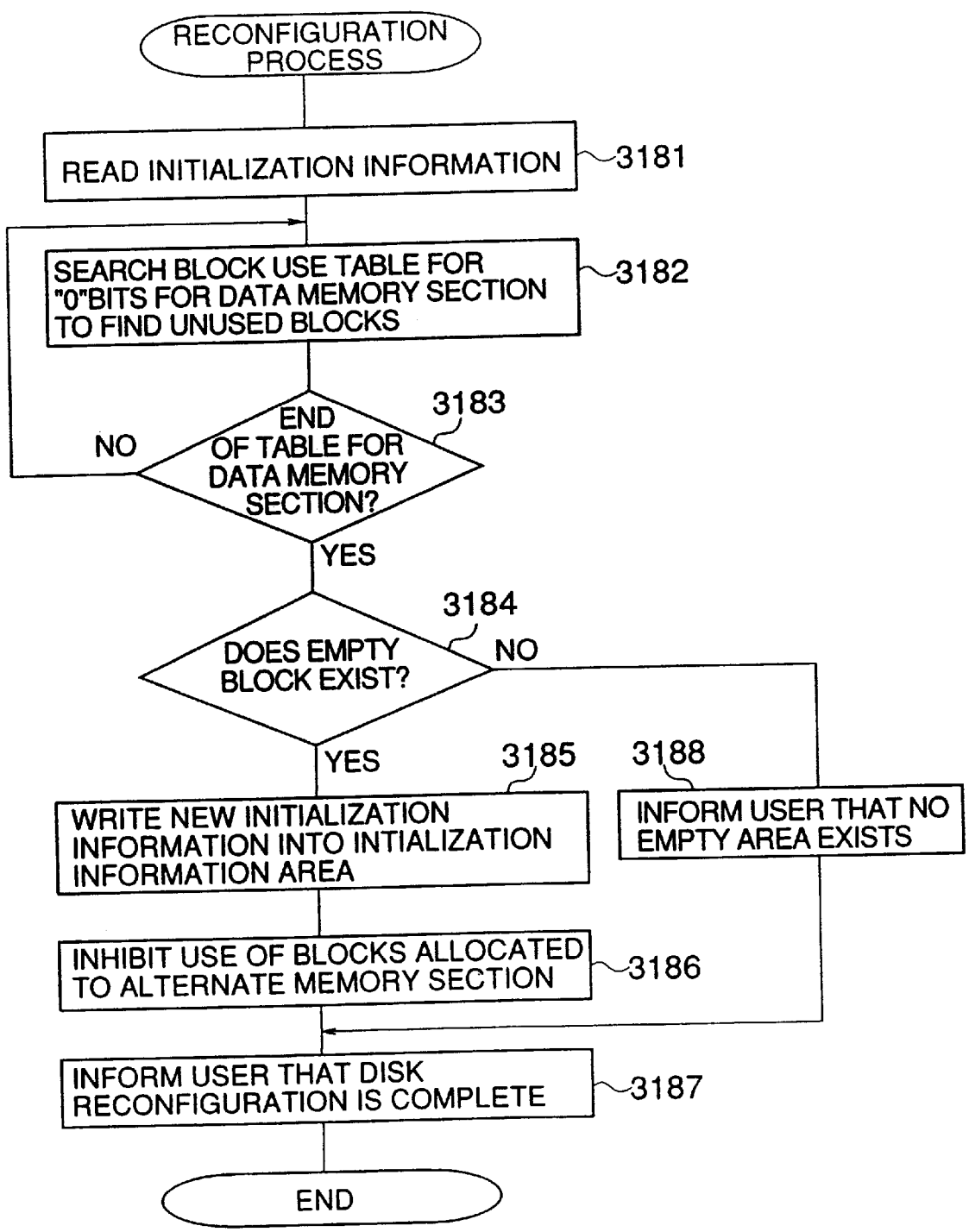
FIG. 76 is a flowchart showing reconfiguration of semiconductor disk unit in the third embodiment of the present invention.

The reconfiguration operation of the data memory section and the alternate memory section as a processing method at the semiconductor disk control circuit in the embodiment is described with reference to a flowchart shown in FIG. 76. In the embodiment, when a write error occurs, an empty block is found in the alternate memory section 3109 and data is written into the found block, as described above. When there are no empty blocks of the alternate memory section 3109, empty blocks can be found in the data memory section 3108 to reconfigure the semiconductor disk unit 3102. To do this, in FIG. 76, first at step 3181, initialization information is read from the memory block management table 3112 shown in FIG. 62 and the block use table is searched for "0" bits for the data memory section 3108 to find unused blocks at step 3182 until the end of the table for the data memory section is reached at step 3183.

At step 3184, a check is made to see if empty blocks exist. If no empty blocks exist, the user is informed that no empty area exists at step 3188. If one or more empty blocks exist, the blocks are newly allocated to the alternate memory section 3109 and new initialization information is written into the initialization information area of the memory block management table 3112 at step 3185. Further, the blocks allocated to the alternate memory section are reported to the host system through the error information register 3105 for inhibiting use of the blocks at step 3186. Then, the user is informed that disk reconfiguration is complete at step 3187. The reconfiguration process is now complete.

The alternate memory section may also be reconfigured in the same manner as described above.

Figure 68:
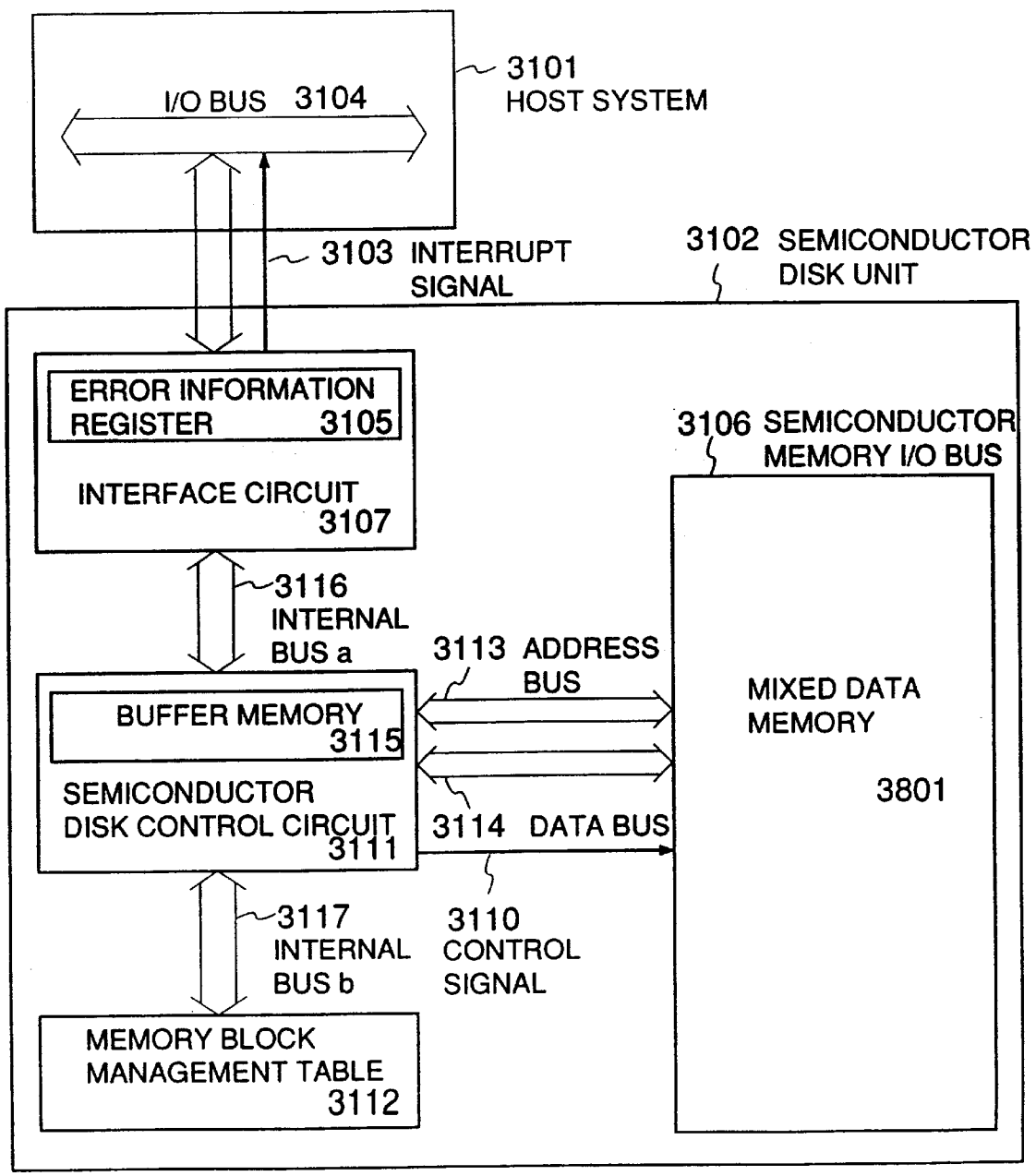
FIG. 68 is a block diagram of an example of the semiconductor disk system according to the third embodiment.
Figure 69:
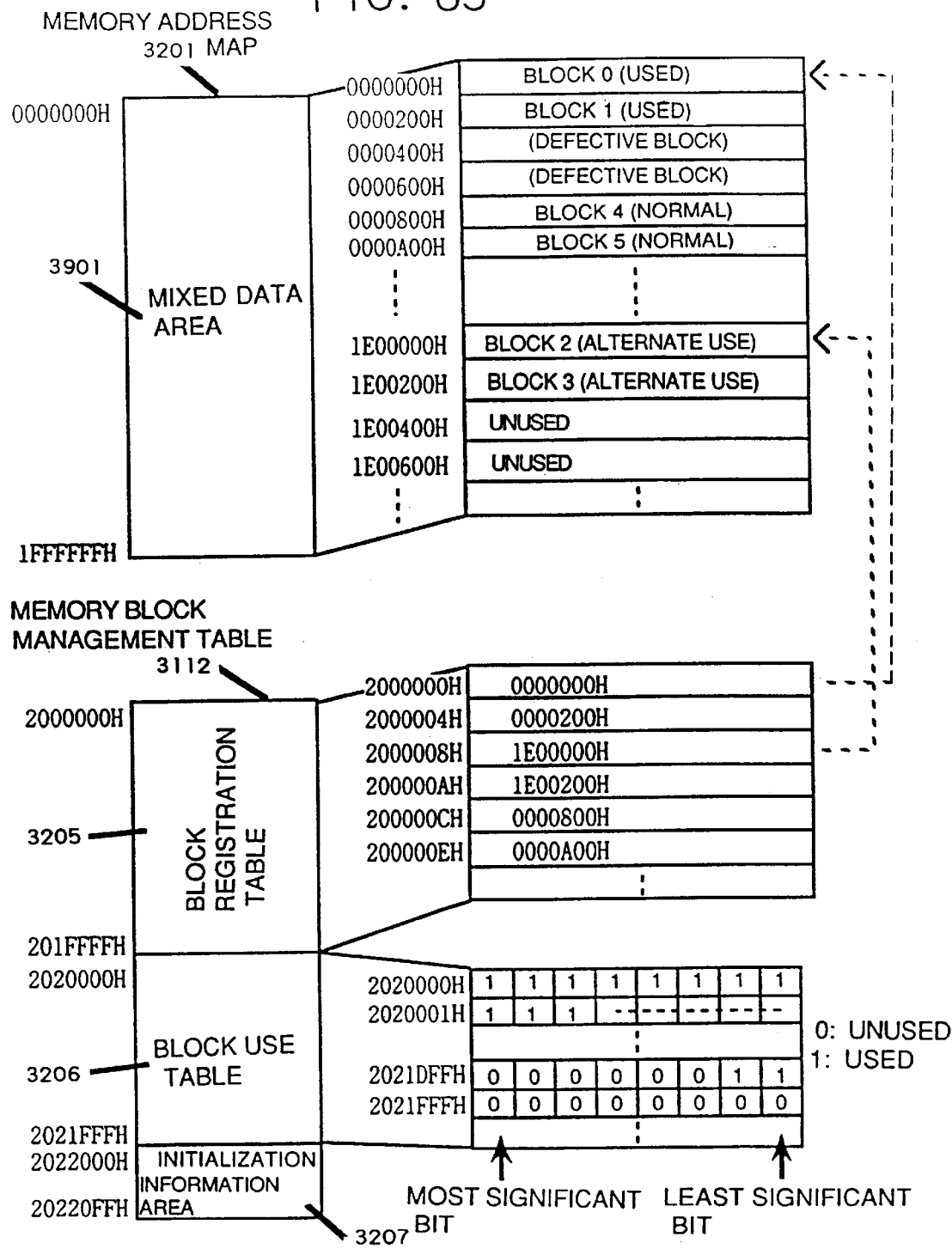
FIG. 69 is an illustration showing an example of a memory block management table in the example in FIG. 68.

Next, an example of the semiconductor disk system according to the third embodiment is discussed. In the example, the data memory section 3108 and the alternate memory section 3109 of the semiconductor memory 3106 are mixed as a mixed data memory 3801, as shown in FIG. 68. FIG. 69 shows an example of the correspondence between a memory map of the mixed data memory 3801 shown in FIG. 68 and memory block management table 3112. In FIG. 69, as shown in the memory address map 3201, a mixed data area 3901 has data blocks and alternate blocks mixed and has a capacity of 32 M bytes in total in the range of addresses 00000000H to 1FFFFFFH. In the example, the 30 M-byte space is actually used as a data area and the remaining 2 M-byte space is used as an alternate block area. The capacities of these two areas are not fixed and can be changed by the user who sets proper values in the initialization information area when the semiconductor disk unit is initialized. How to determine the capacities of the initialization information area 3207, block registration table 3205, and block use table 3206 is the same as in the example in FIG. 62.

Figure 70:
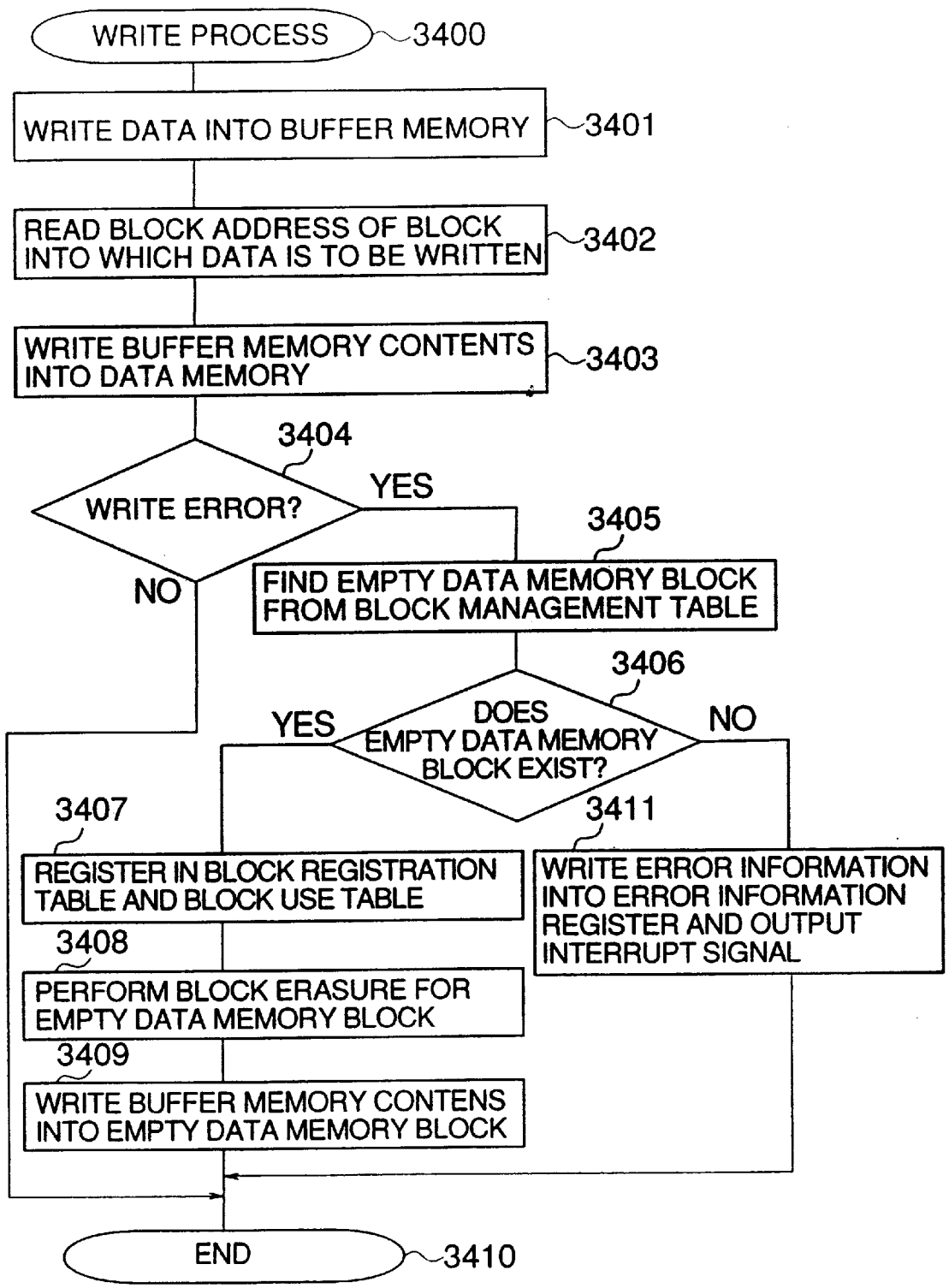
FIG. 70 is a flowchart showing a write process sequence in the example in FIG. 68.

Next, the operation in the example shown in FIG. 68 is described with reference to FIG. 70. The read operation can be executed as shown in the flowchart of FIG. 63. The write operation is executed as at steps 3401 to 3404 in the write process flowchart of FIG. 64. In the example shown in FIG. 69, the data block area and alternate block area are mixed. Therefore, when a write error occurs at step 3404 in FIG. 70, the entire block use table 3206 is searched for "0" bits (indicating empty blocks) at step 3405. The subsequent steps of the write operation are executed as those shown in the flowchart of FIG. 64.

Figure 71:
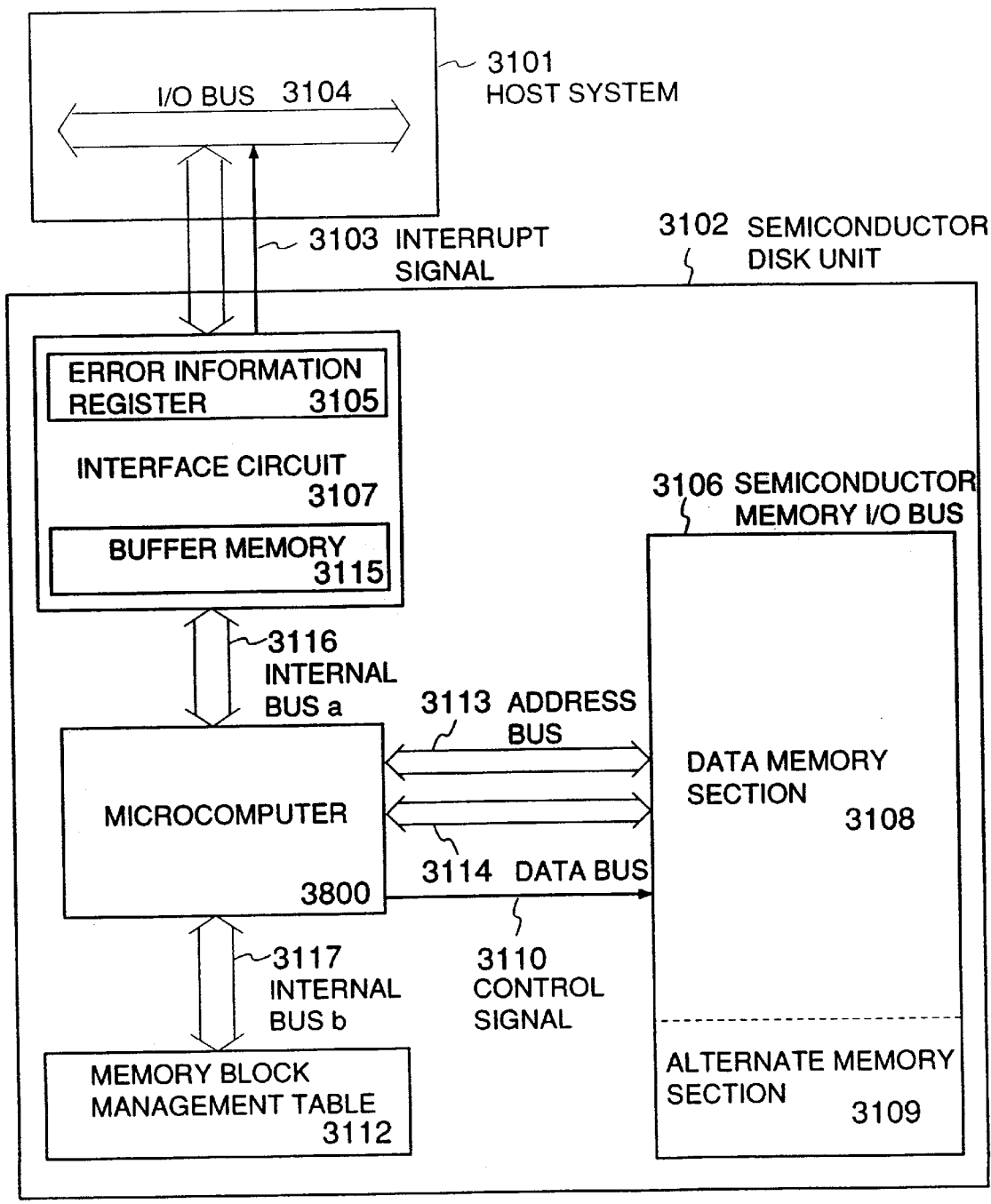
FIG. 71 is a block diagram of a second example of the semiconductor disk system according to the third embodiment.

Further, FIG. 71 shows a second example of the semiconductor disk system according to the third embodiment of the invention. In the example shown in FIG. 71, a microcomputer 3800, called a CPU, MPU, MCU, or the like, is used as the semiconductor memory control circuit 3111 shown in FIG. 61 and buffer memory 3115 is contained in the interface circuit 3107. The semiconductor disk unit 3102 using the microcomputer 3800 is normally controlled by a program stored in a read-only memory (ROM). In the example shown in FIG. 71, the microcomputer 3800 may be a one-chip microcomputer containing a ROM or a specific address space of the memory block management table 3112 or the semiconductor memory 3106 may be allocated to the control program of the microcomputer 3800. An discrete ROM chip may be mounted. The operation of the semiconductor disk system shown in FIG. 71 is basically the same as that shown in FIG. 61 except that the microcomputer 3800 replaces the semiconductor disk control circuit 3111.

Although only one alternate memory area 3203 and one data memory area 3202 are provided in the examples shown in FIGS. 61, 68, and 71, more than one alternate memory area 3202 and more than one data memory area may be provided by adding new address information and capacities to the initialization information area.

Figure 72:
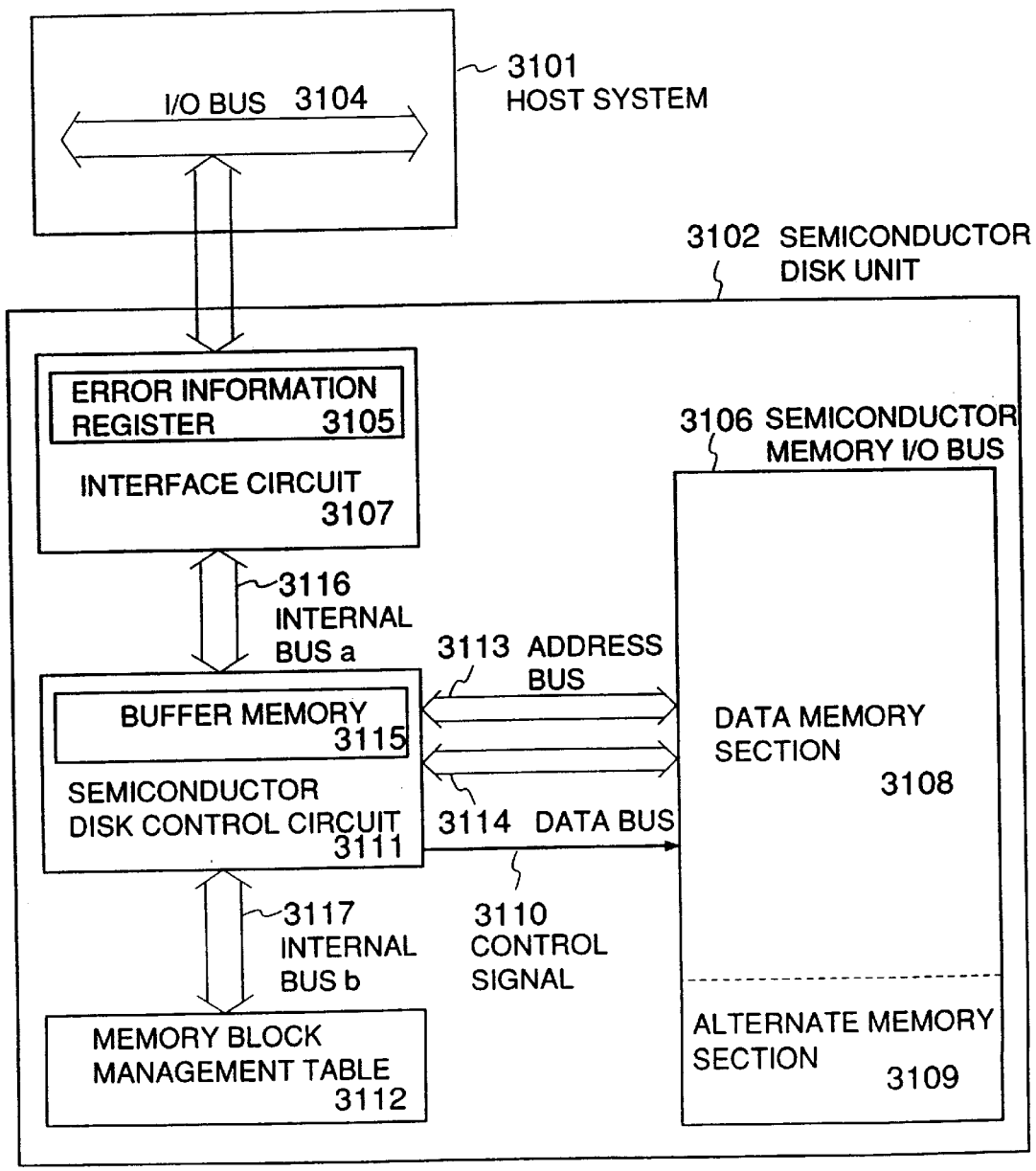
FIG. 72 is a block diagram of a third example of the semiconductor disk system according to the third embodiment.

Next, FIG. 72 shows a third example of the semiconductor disk system according to the third embodiment, in which no interrupt signal 3103 is used. When a flash memory write error or the like occurs in the semiconductor disk unit 3102, the semiconductor disk control circuit 3111 writes error information into the error information register 3105 and the host system 3101 polls the error information register 3105 to read the register contents through the I/O bus 3104 to discover that the error has occurred. Other operation of the semiconductor disk system shown in FIG. 72 is the same as that shown in FIG. 61.

Figure 75:
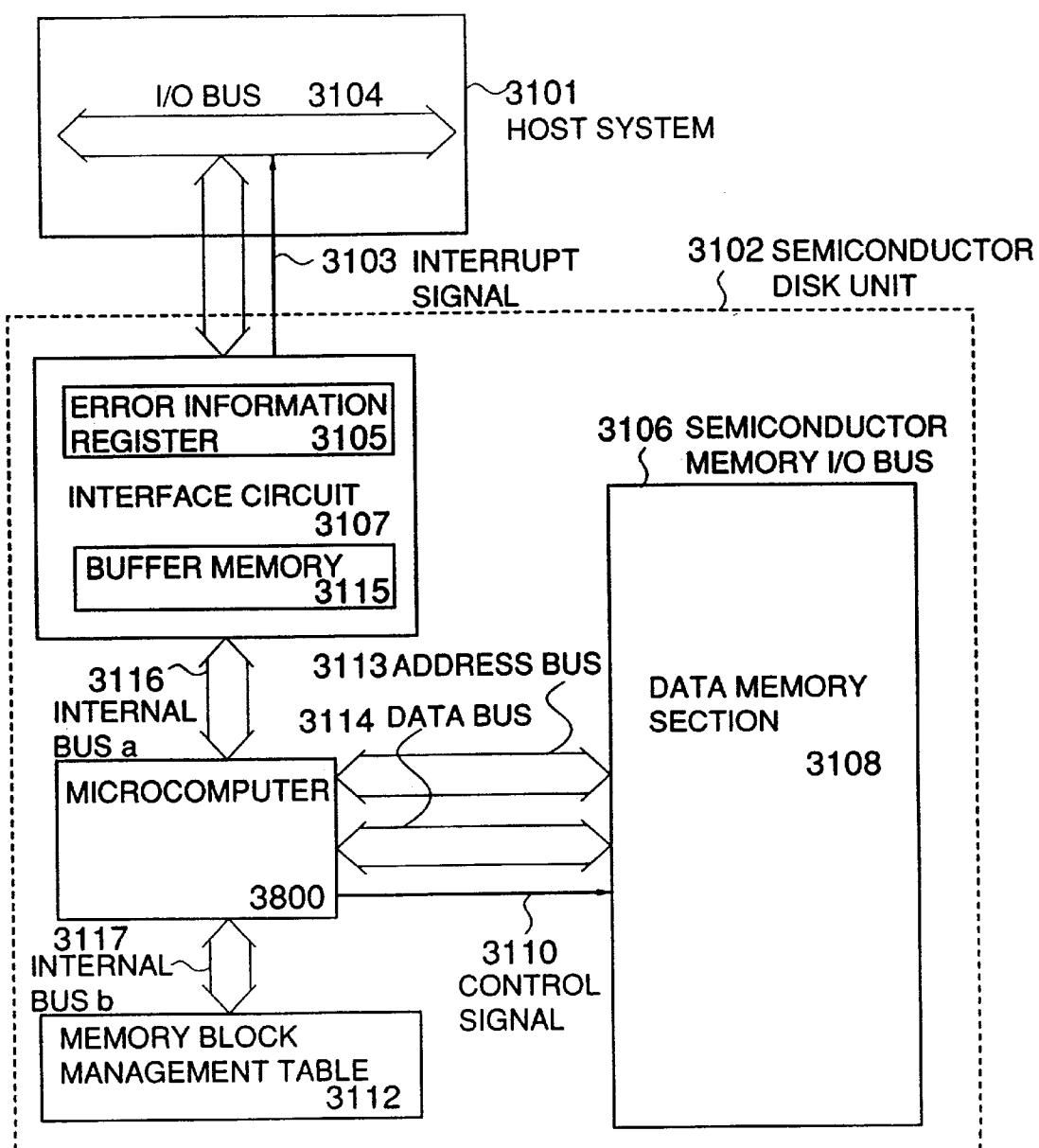
FIG. 75 is a block diagram of a fourth example of the semiconductor disk system according to the third embodiment.

Next, a fourth example of the semiconductor disk system according to the third embodiment is discussed, in which the alternate memory section 3109 in FIG. 61 does not exist, that is, the semiconductor memory 3106 consists of the data memory section 3108 only. In the example, when a flash memory write error occurs, memory block use information is retrieved in the memory block management table 3112 to find an empty block in the data memory section 3108, and data is written into the found empty block as an alternate block. Further, block information of the block of the data memory section 3108 used as the alternate block is written into the error information register 3105 to inform the host system 3101. Other operation of the semiconductor disk system shown in FIG. 75 is the same as that shown in FIG. 61.

As described above, the invention is characterized by the fact that when the flash memory is exhausted or the alternate memory area used as alternate blocks when a write error occurs is unusable in the semiconductor disk unit using the flash memory, proper processing such as informing the host system and the user is performed. Therefore, the flash memory read/write control system and the memory block management table forming method are not limited to those described in the specification. The means for informing the user of error occurrence is not limited to the means described here. According to the embodiment of the invention, the semiconductor disk unit can be salvaged from a flash memory write error, thus the semiconductor disk unit life can be prolonged.

According to the invention, a semiconductor disk using a flash memory as storage media can be salvaged from a write error caused by the limit of the flash memory write count and therefore the semiconductor disk life can be prolonged. When the semiconductor disk cannot be salvaged from an error, the user is informed of the fact, and can thus take proper steps for preventing data from being lost.

Embodiment 4

A fourth embodiment of the invention is described with reference to the accompanying drawings.

Figure 82:
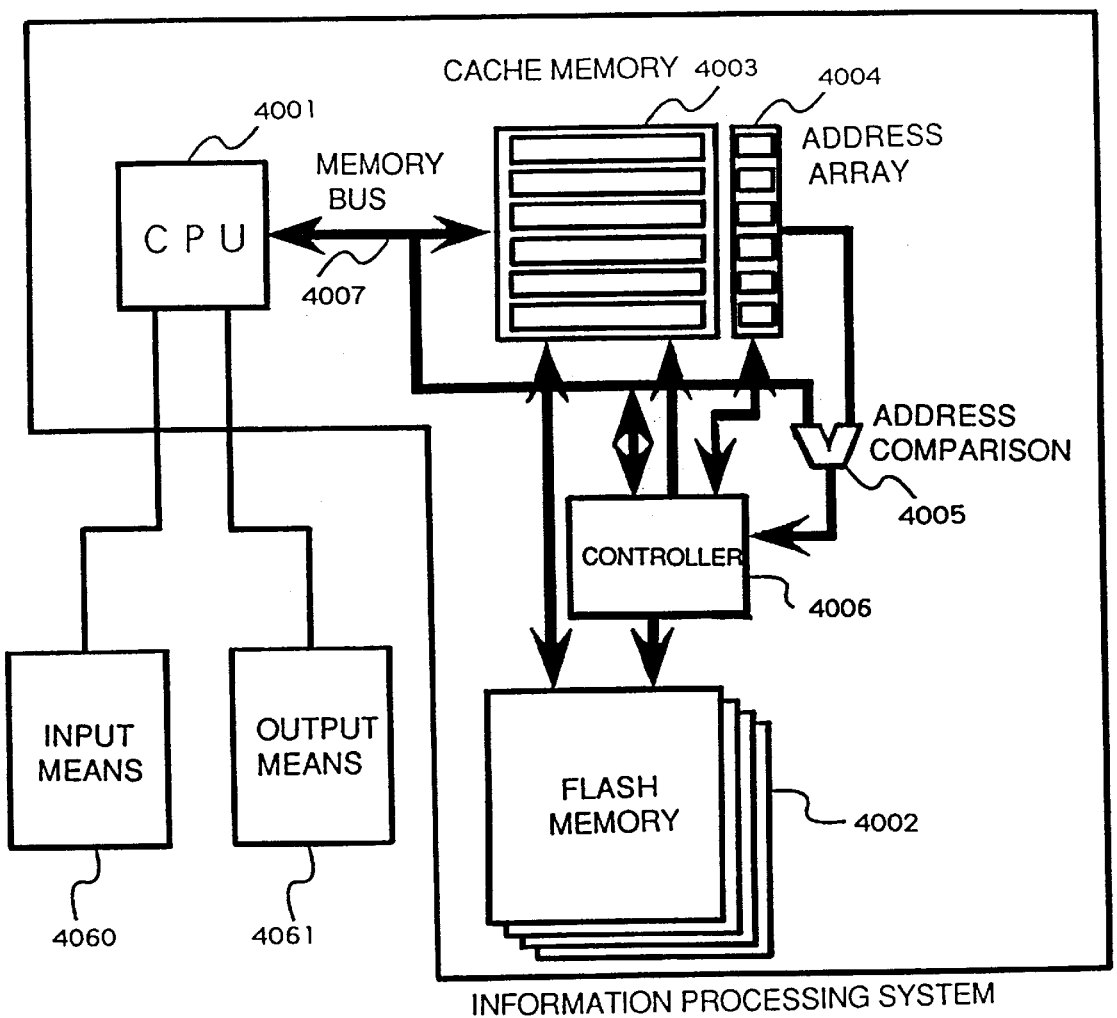
FIG. 82 is a schematic block diagram of a fourth embodiment of an information processing system using a flash memory as a main memory.

FIG. 82 is a block diagram of an information processing system according to the fourth embodiment of the invention, wherein numeral 4001 is a CPU (central processing unit) which executes programs and processes data, numeral 4002 is a flash memory which is a large-capacity nonvolatile memory storing the programs, data, etc., handled by the CPU 4001, and numeral 4003 is a cache memory which is a volatile memory temporarily storing data such as data transferred from the flash memory and write data. from the CPU 4001. The cache memory 4003 can be made of a DRAM (dynamic random access memory), an SRAM (static random access memory), or the like, for example. Numeral 4004 is an address array for recording CPU addresses assigned to data stored in the cache memory 4003, which are output by the CPU to access the data, and their appendant information. Numeral 4005 is an address comparison circuit for comparing the address corresponding to the data whose access is requested by the CPU 4001 with the addresses recorded in the address array 4004. Numeral 4006 is a controller which controls the information processing system so that accurate data can be accessed at high speed as much as possible in response to an access request made by the CPU 4001. Numeral 4007 is a memory bus of the CPU 4001. The address array 4004, the address comparison circuit 4005, and the controller 4006 can be made of electronic devices such as CMOS (complementary metal oxide semiconductor) transistors, resistors, ROM which stores predetermined processing programs, RAM, and CPU. In the description that follows, assume that the address space in which addresses accessed by the CPU 4001 exist is allocated to the flash memory 4002. Numeral 4060 is input means having at least a function for an external system including the user to enter commands such as data access commands and addresses; for example, it is implemented by a mouse or keyboard. Numeral 4061 is means having an output function of messages (described below) and necessary information; it can be implemented by print means such as a printer or display means such as a CRT, EL display, or liquid crystal display.

Next, the operation of the information processing system is described.

In a general information processing system comprising a CPU and memories, a volatile memory such as DRAM is used as a main memory for considering the access speed. In contrast, a nonvolatile memory needs to be used to provide a so-called resume function, quick start function, etc., much demanded for portable personal computers, etc., for example; SRAM backed up with a battery has many demerits with respect to capacity and reliability and electrically erasable programmable ROM has very slow rewrite time and is difficult to use.

Then, in the fourth embodiment, a volatile memory is adopted as the cache memory for temporarily storing data, etc., and is connected directly to the memory bus 4007 of the CPU 4001 and the flash memory is used as the substantial main memory. This means that the flash memory 4002, which is the main memory, is not directly accessed from the CPU 4001 and therefore the slow access speed to the main memory scarcely affects the operation of the CPU 4001.

Referring again to FIG. 82, the CPU 4001 accesses the cache memory 4003 via the memory bus 4007. The access address is input to the address comparison circuit 4005, which then compares the address with addresses previously registered in the address array 4004. If the address matches one of the registered addresses, which will be hereinafter referred to as an "address hit," the controller 4006 accesses the location in the cache memory 4003 corresponding to the address. In contrast, if the address does not match any of the registered addresses, which will be hereinafter referred to as an "address miss," the controller 4006 registers the address in the address array 4004. After this, the controller 4006 transfers the data corresponding to the address to the cache memory for storage and accesses the location in the flash memory 4002 corresponding to the address.

Figure 83:
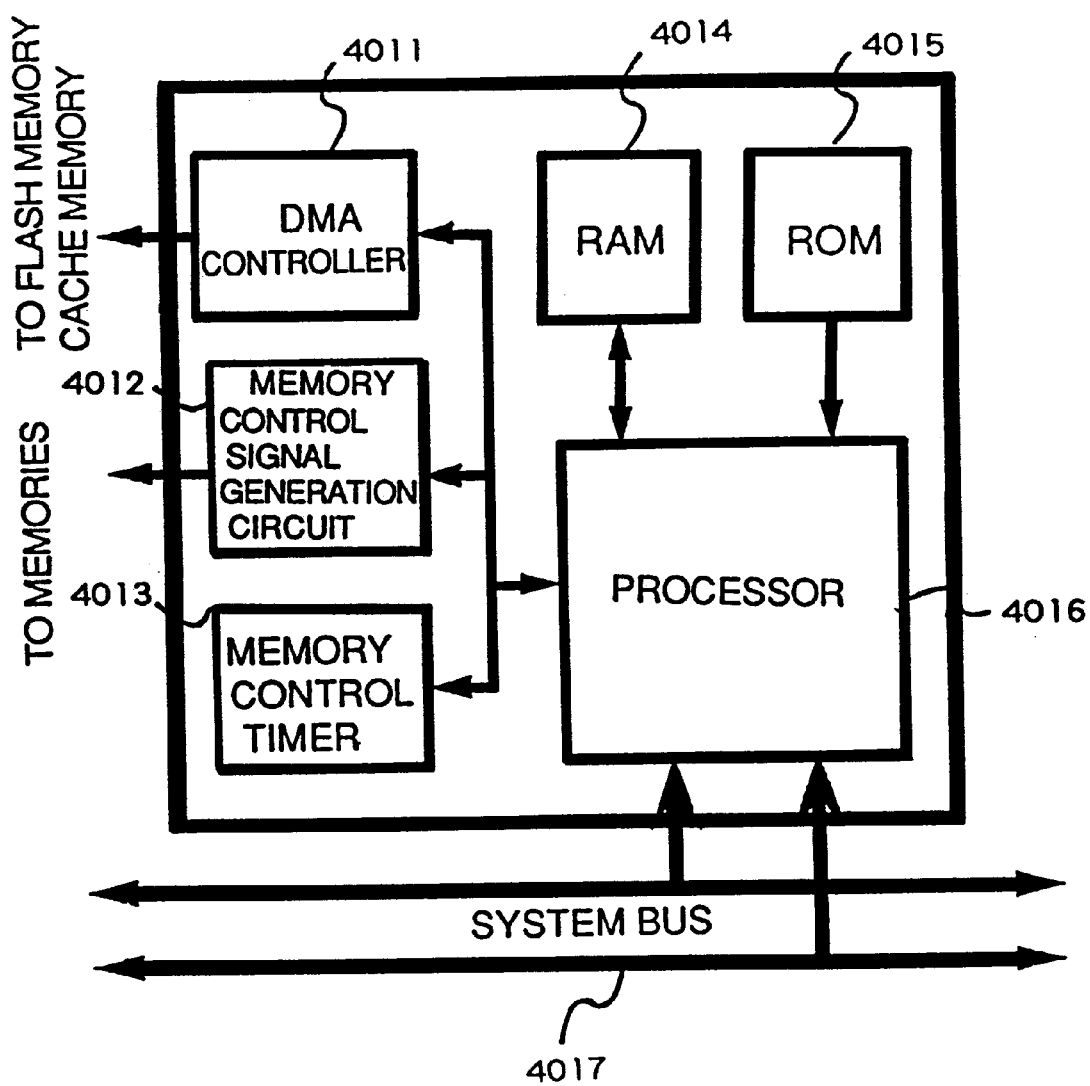
FIG. 83 is a block diagram of a controller in the information processing system using the flash memory as the main memory in FIG. 82.

FIG. 83 shows a block diagram of the controller 4006.

In FIG. 83, numeral 4011 is a DMA (direct memory access) controller for generating consecutive addresses at high speed and accessing the memories at high speed; it is used when consecutive data of several ten to several hundred bytes is transferred. Numeral 4012 is a memory control signal generation circuit for generating control signals to control the operation of the cache memory, address array, etc., as well as the flash memory. For example, it can be implemented by CPU, ROM, RAM, gates, or a program stored in ROM. If DRAM is used as the cache memory, etc., the memory control signal generation circuit may provide a refresh controller to refresh the DRAM. Numeral 4013 is a memory control timer which is means for measuring the time of erasure, write, etc., of the contents of the flash memory; it can be implemented by CPU, ROM, RAM, CMOS, or a program stored in ROM. Numeral 4014 is a volatile data memory used as a work area for control program execution or an area for temporarily storing data from the memory bus, address array information, or data transferred in the system. Numeral 4015 is a ROM which stores a control program and numeral 4016 is a processor which executes the control program for controlling the entire information processing system of the invention. Numeral 4017 is a bus provided to transfer addresses, data, etc., within the system.

Figure 84:
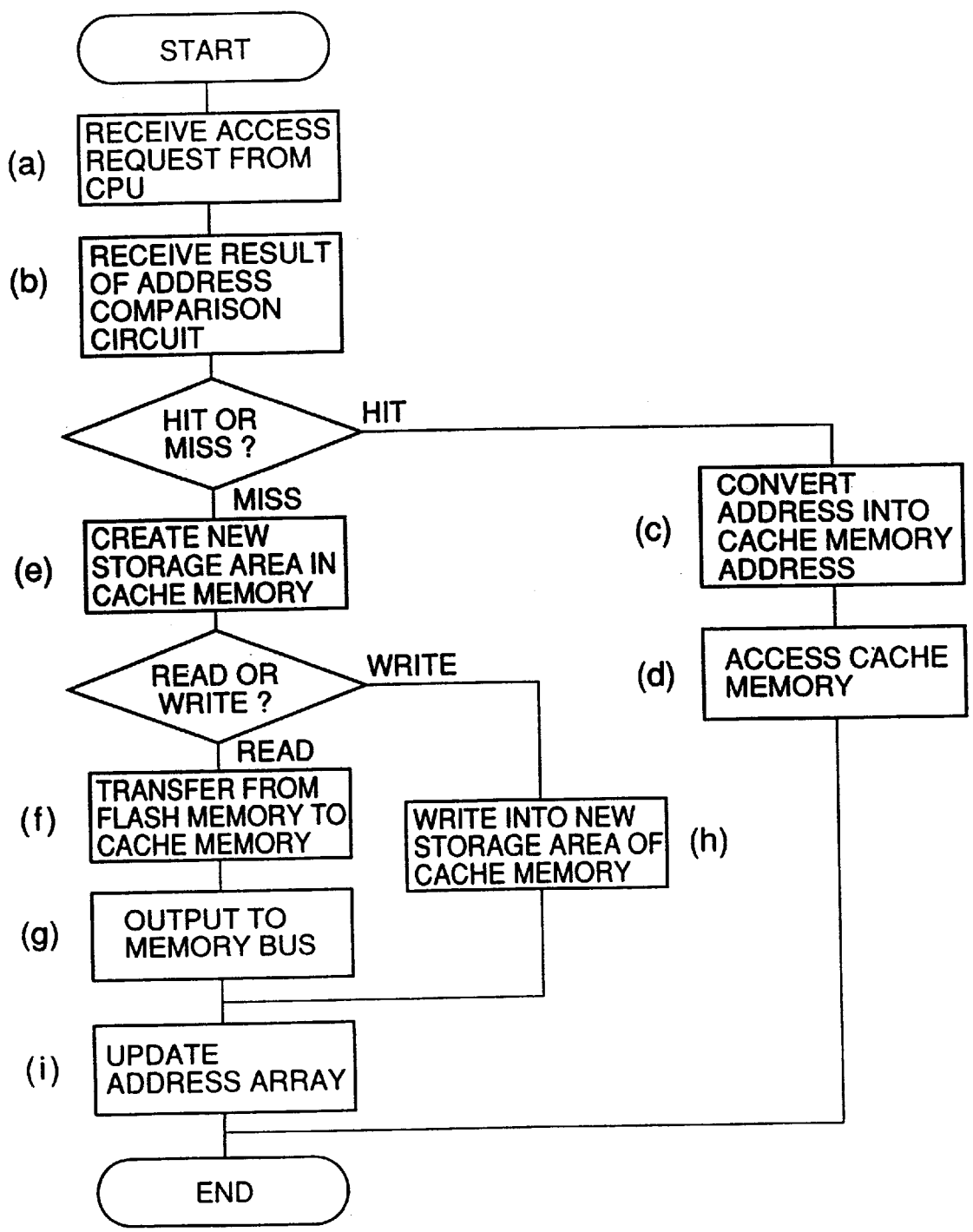
FIG. 84 is an operation flowchart of the controller in the information processing system using the flash memory as the main memory in FIG. 82.

FIG. 84 shows a flowchart for explaining the operation of the controller 4006, namely, processing performed by the control program.

As shown in FIG. 84, first an access request to one address is issued from the CPU 4001 at step a. The address is input to the address comparison circuit 4005, which then compares the address with the addresses registered in the address array 4004 at step b. If an address hit occurs, it means that desired data exists in the cache memory 4003. Then, the address is converted into its corresponding address in the cache memory 4003 in response to the information stored in the address array 4004 at step c, and the corresponding location of the cache memory 4003 is accessed according to the cache memory address at step d. That is, if a read access is made, the data in the cache memory 4003 is output to the CPU 4001 via the memory bus 4007; if a write access is made, data input from the CPU 4001 via the memory bus 4007 is written into the corresponding location in the cache memory 4003. On the other hand, if an address miss occurs, a new data area for storing data is created in the cache memory 4003 at step e. Process at step e will be discussed in detail following the description of the flowchart.

Now, if a new data storage area is created, the area is accessed. If a read access is made, data stored at the corresponding address is read from the flash memory 4002 and is transferred to the cache memory 4003 for storage at step f and further output to the memory bus 4007 at step g. If a write access is made, data from the CPU 4001 is written into the new data storage area of the cache memory 4003 at step h. Last, the address array is updated to the new write. That is, the miss address is registered in the address array at step i.

The operation of the controller 4006 has been outlined.

The process at step e is described in detail. Preferably, the controller 4006 is designed to monitor the amount of data stored in the volatile storage means and provide an area in which no data is stored having a predetermined capacity or more so that the data amount does not exceed a predetermined value.

Now, if the information processing system does not perform much processing after it starts operation, the cache memory contains a large number of unused data blocks and a new storage area may be allocated in the unused data area without performing a special process. However, if the unused area is not available, a data storage area must be created even by erasing already stored data. Thus, "access history", which is information indicating in what sequence the CPU has accessed the cache memory, is stored corresponding to each address registered in the address array 4004. Data stored in the cache memory and estimated to be least accessed in the future is found for improving performance such as the percentage of presence of data to be accessed in the cache memory, which will be hereinafter referred to as "hitting average," and the access speed.

For this purpose, information indicating relative oldness of addresses last accessed may be recorded. An address, the last access to which is the oldest (existing in the most past direction on the time axis) among the recorded addresses, can be found in response to the record contents, and the data at the address may be erased from the cache memory 4003. If the information concerning the access history is stored in the address array 4004, it is efficient in improvement of the processing speed, etc.

However, as the cache memory capacity becomes large, the access history becomes very complicated and large capacity is needed to record the relative oldness; a different approach is required.

As one approach, the access history record can be simplified although the hitting average is greatly decreased. For example, it is possible to select the data to be erased at random, or if data is written starting at the top of the cache memory 4003 in order and the written data is also erased starting at the top in order, so-called FIFO control can be easily provided for erasing data in the order in which the data has been written. If a set associative method used with general cache memory systems is adopted, address comparison is simplified. The set associative method is well known and therefore will not be discussed here.

By the way, some problems arise on practical application to adopt the set associative method. When a request to write into one address is received from the CPU 4001 and an address miss occurs, address data in the cache memory is written back into the flash memory and a new data storage area is created, as described above. In this case, flash memory data rewrite takes a long time, leading to extensive lowering of system performance such as lowering the processing speed. Then, control of the controller 4006 can be executed as shown in FIG. 85 for preventing system performance from being lowered.

Figure 85:
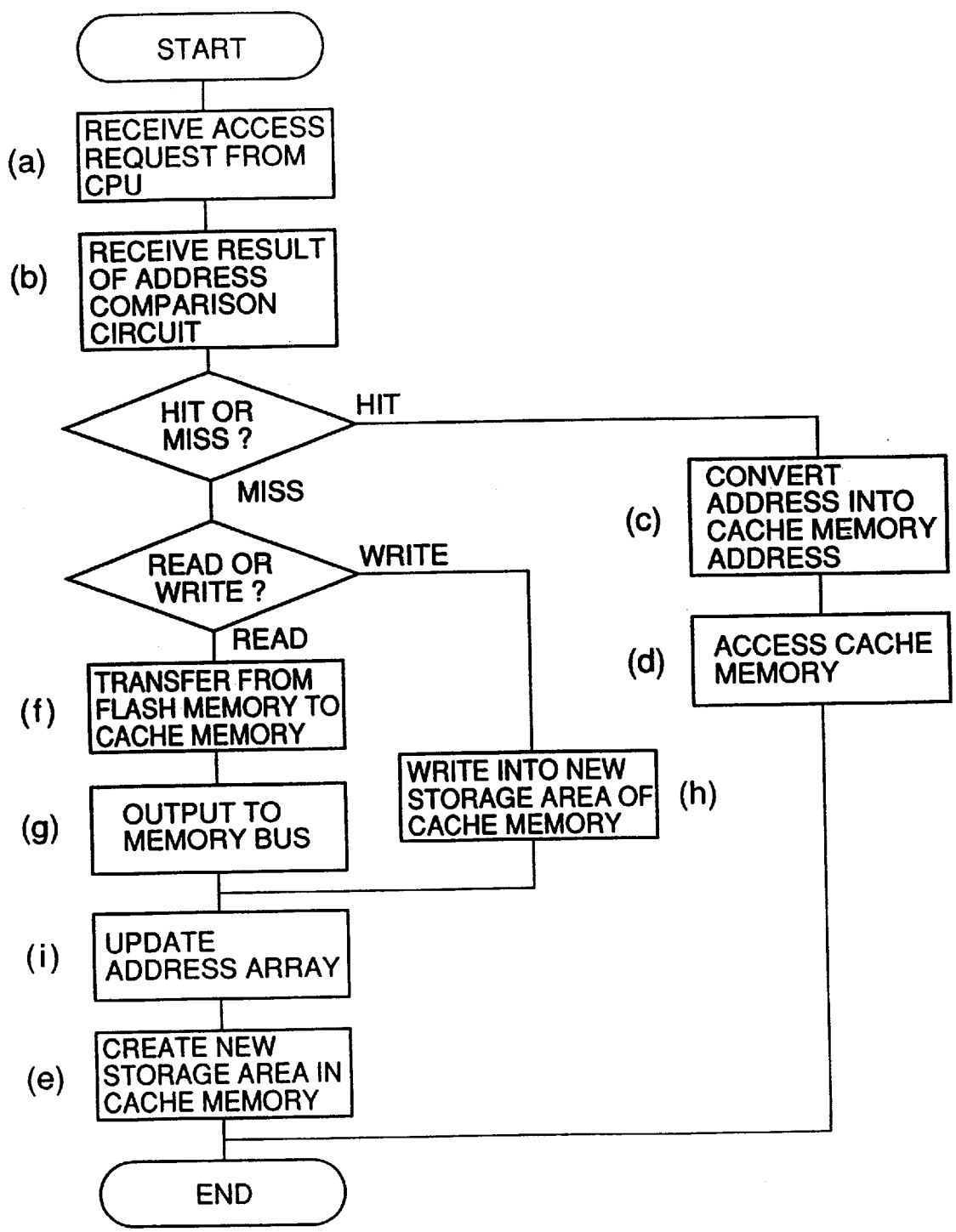
FIG. 85 is a flowchart illustrating operation of the controller for high-speed processing at a miss in the forth embodiment of the present invention.

The process flow in FIG. 85 is the same as that in FIG. 84 except the creation timing of a new storage area at step e. In FIG. 85, the step of creating a new storage area is entered upon completion of the data transfer from the CPU 4001. That is, a new storage area is always provided and if a write request received from the CPU 4001 is an address miss, data is written into the new storage area, thereby, preventing the flash memory rewrite time from affecting the operation of the CPU 4001. However, in this method, an area in which no data exists is always provided in the cache memory and the stored data capacity of the cache memory is decreased by this area. Thus, it must be considered that the hitting average will decrease. Of course, the effect of suppressing lowering of the system performance due to the flash memory rewrite time is great.

At this time, assuming that the cache memory 4003 adopts a well-known 4-way set associative method, data is stored in three sets only and the remaining one set is always kept empty except after a write access for a miss occurring when a request is received from the CPU. Therefore, access history information may be retained and updated up to the third set.

Another problem is that the batched erasure unit capacity in the flash memory is very large compared with one access data. This means that the CPU accesses data of several bytes at a time, while the flash memory is erased in units of several hundred bytes or more. Therefore, if, after several-byte data is transferred from the flash memory to the cache memory for a read access, rewrite of the data occurs and the data is rewritten in the cache memory, the corresponding data in the flash memory area will be rewritten at some future time. At this time, rewrite of only the several-byte data is not enabled in the flash memory, thus the entire erasure area is read into another volatile memory for storage and the corresponding data portion in the volatile memory is rewritten, then the data in the volatile memory is again written into the flash memory area from which data has been erased. This means that a step of writing data back into the flash memory is required. At this time, if data pieces in a single erasure area exist in the cache memory separately, it is efficient to perform the writing back at the same time. Therefore, when data is written back into the flash memory, processing becomes complicated and it takes up processing time. Therefore, when data in the flash memory is transferred to the cache memory, the unit erasure area is transferred in a batch, an access history is recorded for each unit erasure area, and writing back into the flash memory is also performed for each unit erasure area. This eliminates the need for a process in which cache memory data existing in the same area of the flash memory is saved and written or found. That is, if a write access occurs, all data in the unit erasure area containing the data specified in the write access may be expanded in the cache memory.

However, when data is read, if several hundred bytes or more must be read to read several-byte data, it is inefficient. Then, when desired data is transferred to the cache memory for a read access, as many bytes as necessary are transferred to the cache memory and when data is transferred for a write access, all the unit erasure area is transferred, whereby the read operation and write operation can be performed efficiently.

As information stored in the address array, a flag indicating whether or not data in the cache memory has been rewritten may be set for producing a large effect of improvement of the processing speed, etc.

Next, an example of containing a serial buffer is discussed as a flash memory application example. In the invention, the flash memory costs become an important factor for determining the system costs. Since the main memory made of nonvolatile memory chips needs to have a large capacity, the flash memory chips making up the main memory must be inexpensive. One of the large factors for determining the memory costs is a "cell area" representing the size of a cell, a unit providing the memory function. Since the storage capacity of a given area is determined by the area occupied by one storage cell, the cell area is closely related to the memory chip costs. The sacrifice of a random access must be made to miniaturize the area of one cell as much as possible in the flash memory. Data on one line on a chip having a certain capacity is accessed in a batch and transferred to a serial buffer that can be accessed sequentially. Then, a serial access is made to the external area from the serial buffer for outputting the data. Therefore, to access one data entry, the data on the same line is accessed in a batch; it takes access time and resultantly the random access performance is lowered. In this case, however, for a request to access continuous data, the first access is slow, but after this, a serial access can be made at high speed. Normally, during program execution, a fast serial access is very useful from access locality.

Now, an example of applying the serial access to the invention is discussed.

Figure 86:
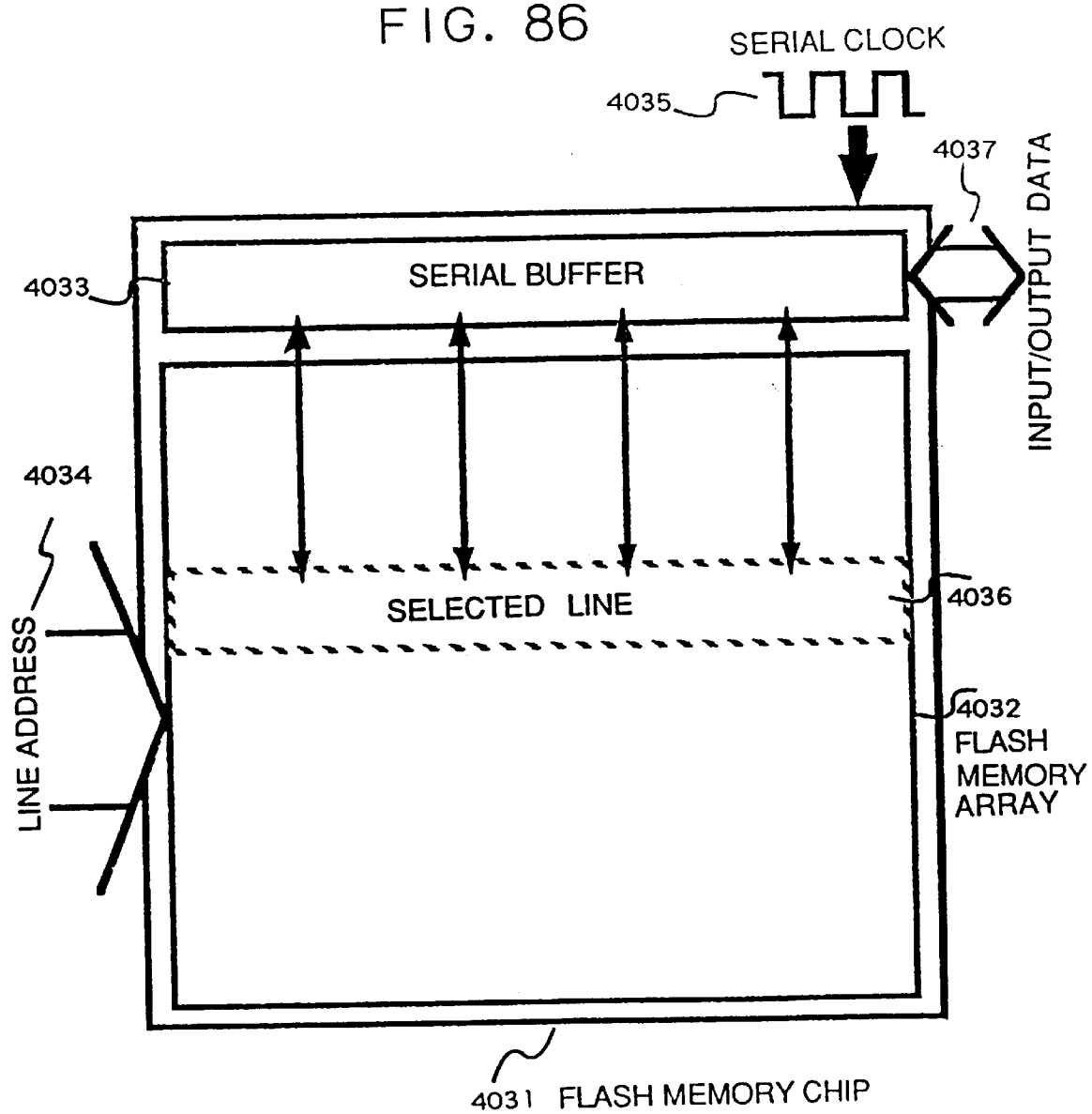
FIG. 86 is an illustration of operation of a flash memory in a line access system according to the forth embodiment of the present invention.

FIG. 86 is a configuration example of a flash memory used in the example.

In FIG. 86, numeral 4031 is a flash memory chip, numeral 4032 is a flash memory array, numeral 4033 is a serial buffer, numeral 4034 is an access address, numeral 4035 is a serial clock, numeral 4036 is line data transferred between the flash memory array 4032 and the serial buffer 4033, and numeral 4037 is data input/output to/from the memory chip. The address means a line address for transferring all data on one line.

In operation, if a read access is made, first, when the line address 4034 for accessing the flash memory chip 4031 is input, the data 4036 existing on the line in the flash memory array 4032 corresponding to the line address is transferred to the serial buffer 4033 in a batch. The transferred data is taken out in order from the serial buffer 4033 by inputting the serial clock 4035. If a write access is made, first, data is input to the serial buffer 4033 in order conforming to the input timing of the serial clock 4035. After the data input is completed, the data is transferred to the line set by the line address 4034 in the flash memory array 4032. The operation of the flash memory has been outlined.

An example in which the flash memory is used is discussed with reference to FIGS. 87 to 89.

Figure 87:
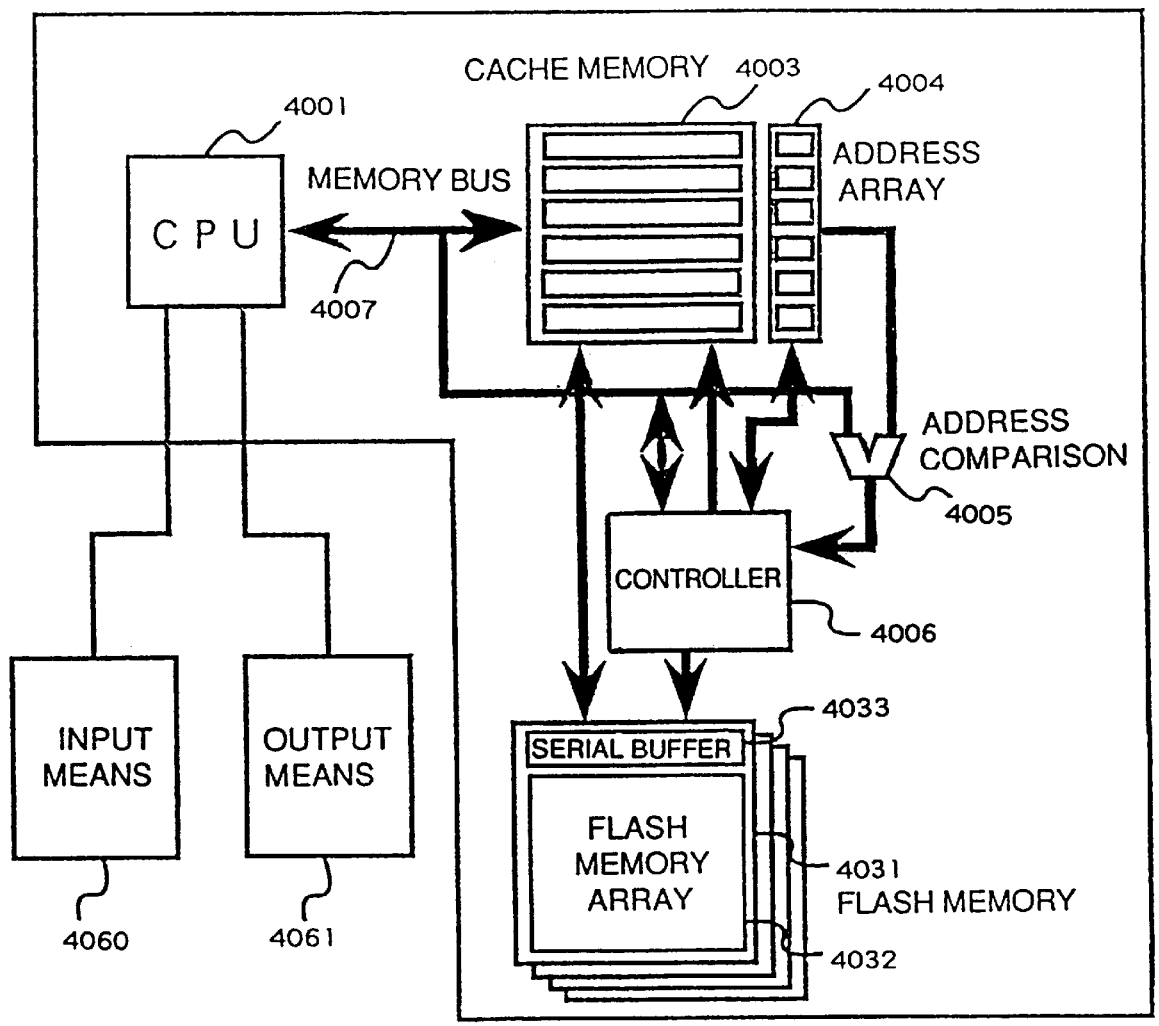
FIG. 87 is a block diagram of a main memory system using a flash memory according to the forth embodiment of the present invention.

FIG. 87 shows the hardware configuration, which is almost the same as that shown in FIG. 82 except for the configuration of controller 4006 (described below). Other members identical with those previously described with reference to FIG. 82 are denoted by the same reference numerals in FIG. 87. The flash memory chips 4031 described with reference to FIG. 86 are used as the portion of the flash memory 4002 in FIG. 82.

Figure 88:
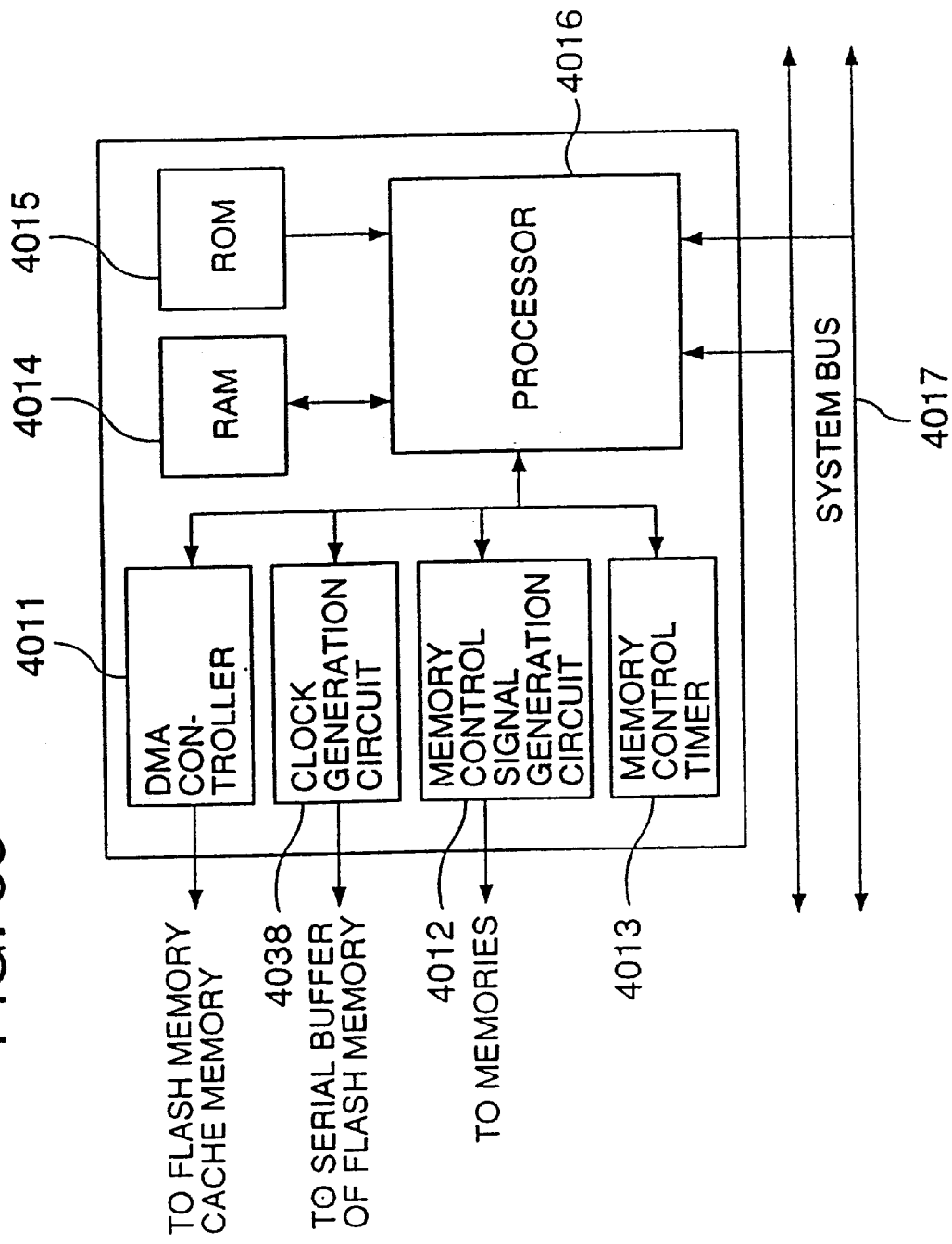
FIG. 88 is a block diagram of a controller in the main memory system using the flash memory according to the forth embodiment of the present the invention.

FIG. 88 shows a configuration example of the controller 4006 in the example, wherein numeral 4038 is a clock generation circuit for the serial buffer 4033. Other members identical with those previously described with reference to FIG. 83 are denoted by the same reference numerals in FIG. 88.

Figure 89:
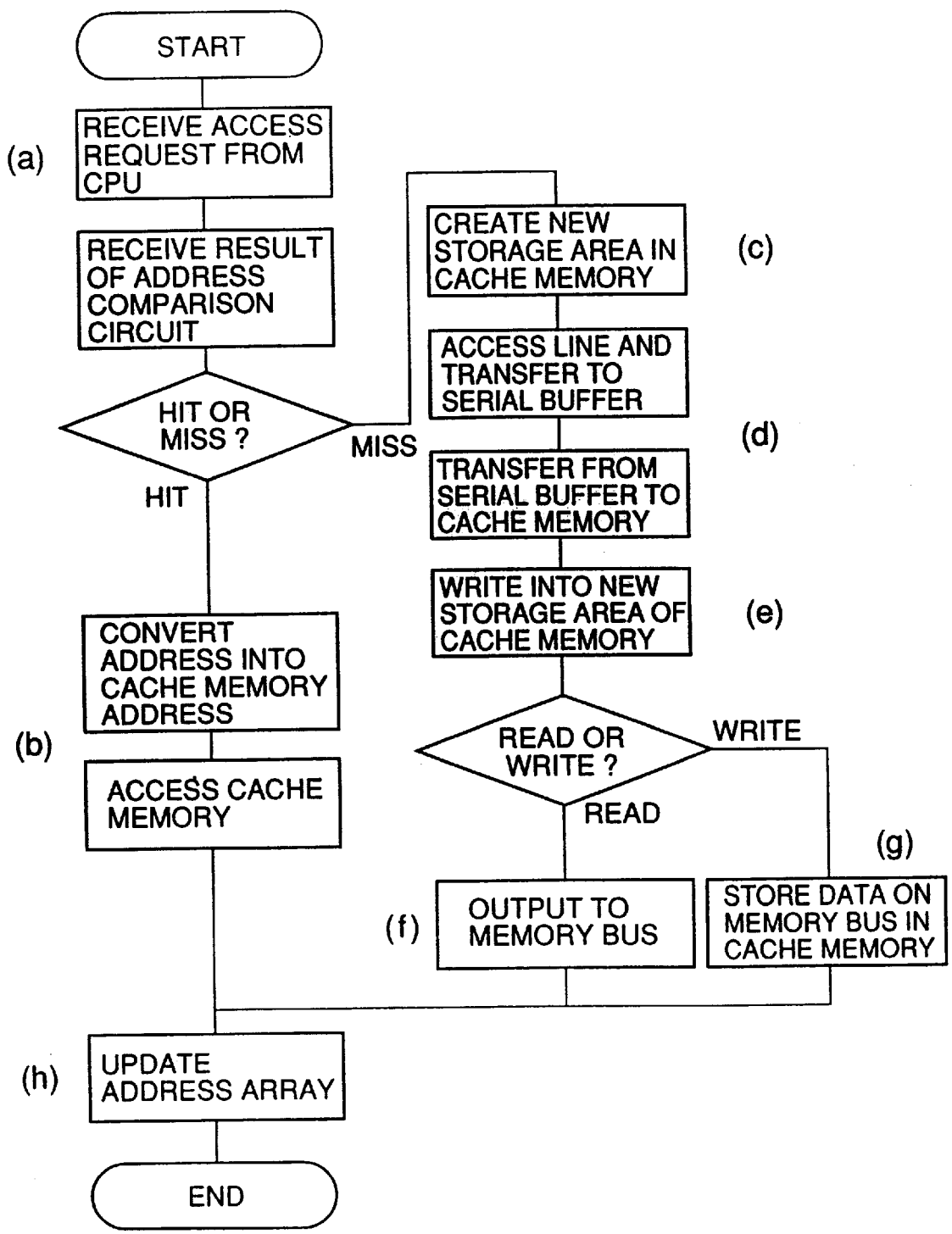
FIG. 89 is a flowchart illustrating the operation of the controller shown in FIG. 88.

FIG. 89 is a flowchart showing the operation of the controller 4006, wherein the difference in handling addresses of the CPU 4001 and those of the flash memory 4031 is at stake.

The operation is described with reference to FIGS. 86, 87, and 89. First, an access request is received from the CPU 4001 at step a. If an address hit occurs, the cache memory 4003 is accessed at step b; if an address miss occurs, a new storage area to store data is created in the cache memory 4003 at step c.

The address 4034 of the line containing the address for accessing the flash memory 4031 is given, the line data is transferred to the serial buffer 4033, and the serial clock 4035 is input for reading data at step d. The read data is stored in the new storage area of the cache memory 4003 at step e. If the access is a read, further, desired data is output onto the memory bus 4007 of the CPU 4001 from the new storage area at step f.

On the other hand, if the access is a write, data is written into the location corresponding to the access address in the new storage area at step g.

Last, the address array contents are updated at step h and the process is terminated. To improve processing performance at a miss, preferably, after the access of the CPU 4001 ends, a step of creating a new storage area is executed to provide the area before an actual write request occurs, as in the process shown in FIG. 85.

The example assumes that address array and access history records are all set in line units.

Another example of using a flash memory chip containing a serial buffer where the serial access start address can be set is discussed. Particularly, first, to access a desired line, the address of the line is input. The intra-line location of the first data to be output when a serial clock is input after data on the line is transferred to the serial buffer can be specified by inputting an address.

For example, if the 128th data piece of 512 data pieces is required assuming that the length of one data piece is one byte and that one line consists of 512 bytes, the address of the line and the address indicating the 128th entry in the line are specified. Thus, the first output data after a serial clock is input becomes the 128th data piece; the desired data can be accessed instantaneously. If an access can be made in such a manner, when data existing in an intermediate location of a line is taken out, as many serial clock pulses as the location number on the line need not be input and a random access can be executed at comparatively high speed regardless of the line access structure.

The example of using the flash memory is described in more detail with reference to FIGS. 90(A), 90(B) and 91.

Figure 90:
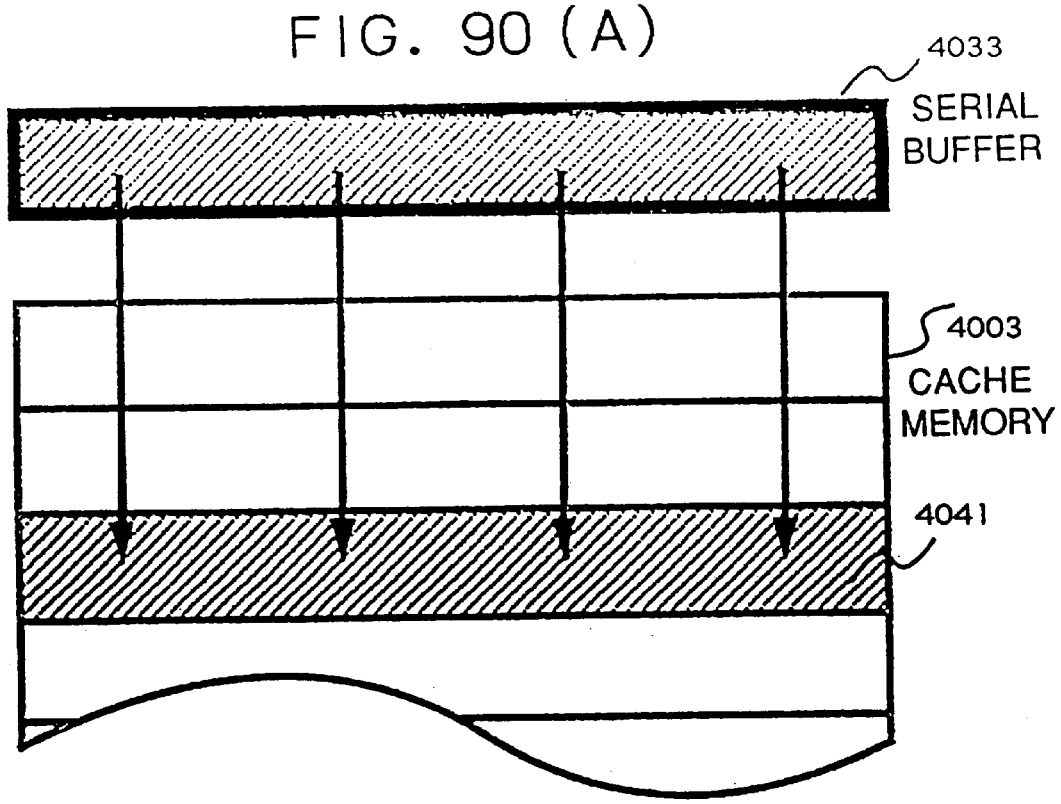
FIGS. 90(A) and 90(B) are illustrations of data transfer between a serial buffer of a flash memory and a cache memory in a line access.
Figure 90:
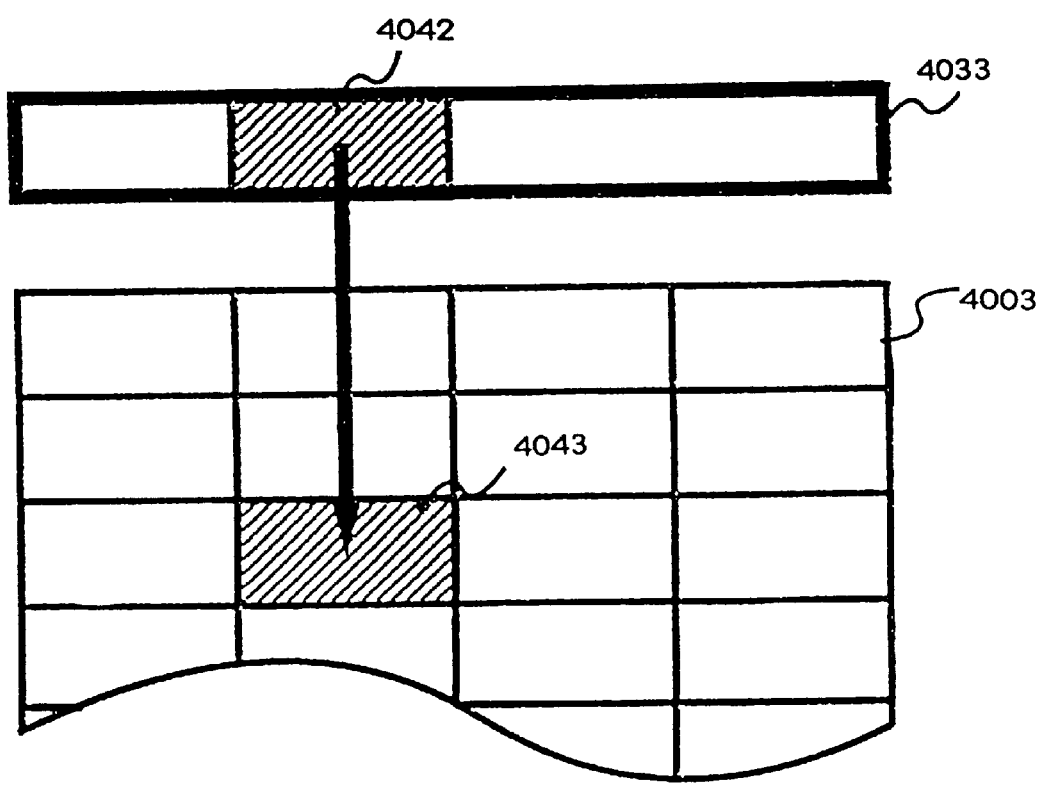

FIGS. 90(A) and 90(B) show data handling at a read access in comparison with the example shown in FIGS. 87 and 88. In FIG. 90 (A), numeral 4003 is the cache memory and numeral 4033 is equivalent to the serial buffer 4033 of the flash memory 4031 shown in FIG. 86. Data can be input/output to/from the serial buffer 4033 when a serial clock 4035 is input. Assume that the top address in serial buffer 4033 shown in FIG. 90(B) can be specified. Numeral 4041 is a destination area in the cache memory and has a capacity equal to that of the serial buffer 4033. Numeral 4042 denotes a field one to several bytes distant from the address specified as the top in the serial buffer 4033 and has a capacity equal to the data storage unit of the cache memory 4003. The capacity is determined by the CPU performance, cache memory capacity, etc. Numeral 4043 is a destination of transfer data 4042 in the serial buffer 4033 and is one of the fields into which the area of the cache memory 4003 is divided in storage units.

In FIG. 90 (A), 1-line data transferred from the flash memory array to the serial buffer 4033 is transferred intact to the cache memory 4003 for storage. This means that data is handled according to the flowchart shown in FIG. 89. The data amount depends on the flash memory structure, specifically, the serial buffer capacity.

Since the flash memory is designed to erase stored data in a batch in one capacity unit, high integration of the memory structure is enabled. The serial buffer size depends on the unit capacity of batch erasure, thus some degree of size is inevitable because of characteristics of the flash memory.

At present, a memory having a batch erasure unit capacity of 512 bytes matching the sector capacity at a hard disk drive (HDD) is developed. If such a memory is adopted, the data transfer unit becomes 512 bytes in FIG. 90 (A).

On the other hand, in FIG. 90 (B), the capacity is further divided for transferring data. Therefore, data can also be transferred in small units, such as several bytes, thereby improving the transfer time.

Since the area of the cache memory 4003 is divided into a large number of storage locations in small units, it can be expected that the hitting average is raised during execution of a program in which a long sequential access does not often occur. Of course, data may be stored at contiguous addresses simply to deal with a sequential access.

Figure 91:
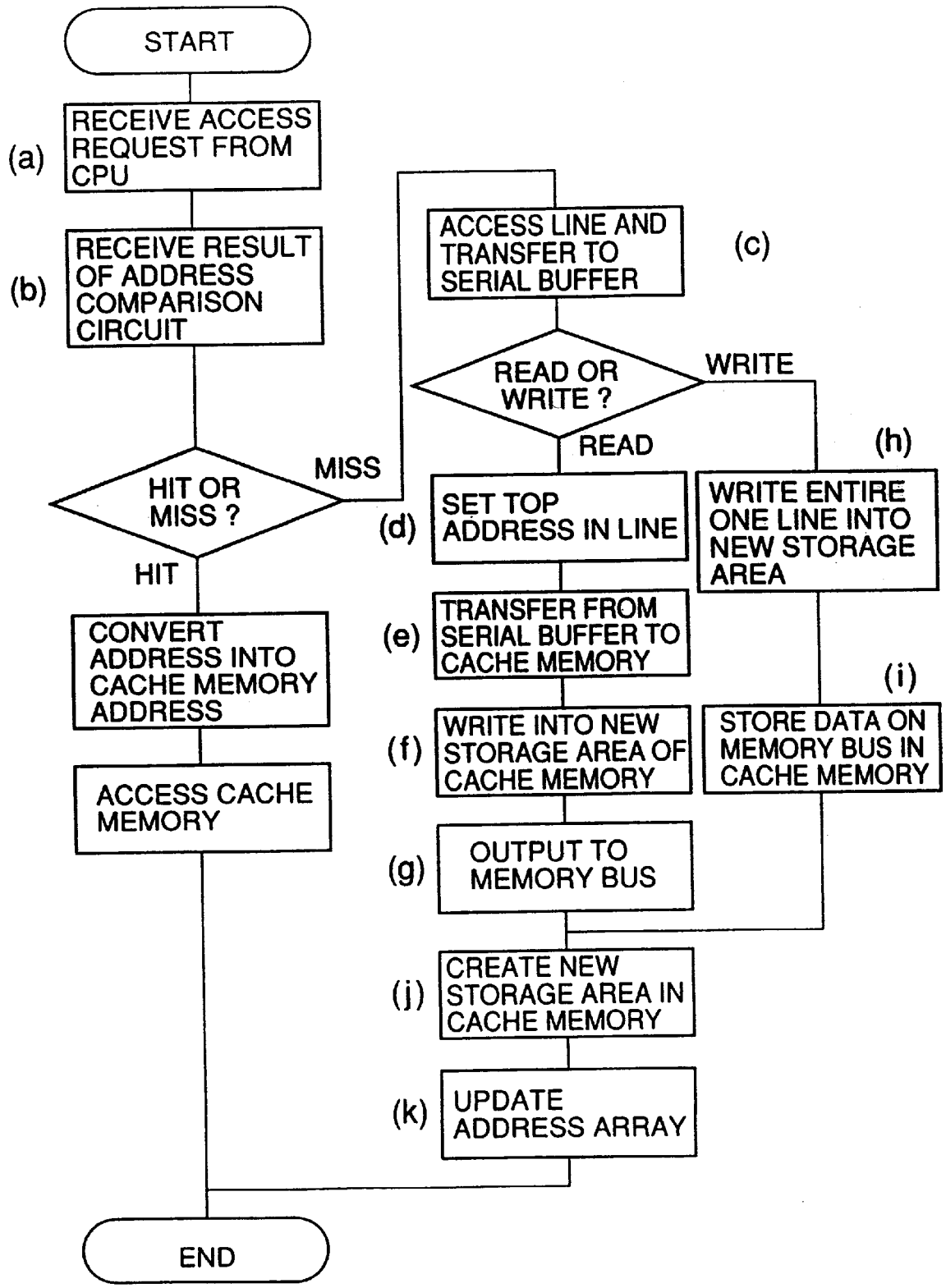
FIG. 91 is a flowchart illustrating the operation of controller when a flash memory where an address in a serial buffer can be set is used in the forth embodiment of the present.

FIG. 91 shows a flowchart for explaining the operation shown in FIG. 90 (B).

First, an access request is received from the CPU 4001 at step a. Next, the address value is compared with the addresses in the address array 4004 to determine an address hit or miss at step b. If an address hit occurs, the cache memory 4003 is accessed. If a miss occurs, one line containing the access address is transferred from the flash memory array 4032 to the serial buffer 4033 at step c. If the access is a read, the top address in the access data line is set at step d. Serial clock 4035 is input to the serial buffer 4033 and desired data is taken out at step e. Next, the data is stored in a new storage area provided in the cache memory 4003 at step f. The CPU 4001 accesses the cache memory 4003 and the accessed data is output onto the memory bus 4007 at step g.

If the access is a write, all of the data transferred to the serial buffer 4033 at step c is transferred to the cache memory 4003 at step h. For the data transferred to the cache memory 4003, write data from the CPU 4001 is written into the access place at step i. At step j, a new storage area is created in the cache memory 4003 for the next miss access. Last, information stored in the address array 4004 is updated conforming to the current state at step k. For creation of a new storage area at step j, if a read access is made to a unit storage area of the cache memory 4003, data need not be written back, thus data may be simply overwritten into the unit storage area; if a write access is made, processing is performed in line units, thus a candidate line is determined and data existing on the line is stored in the serial buffer 4033 and transferred to the flash memory array 4032.

In a cache memory system mounted in an information processing system using DRAM and SRAM in combination, several bytes to several 10 bytes are used as a 1-block capacity to raise cache capacity. Likewise, in the embodiment of the invention, control may be simplified and hitting average may be improved by transferring data between the cache memory and the flash memory in units of 16 bytes, 64 bytes, etc., rather than word units of the CPU.

Steps taken when the CPU careers out of control for some reason in a system using a large-capacity nonvolatile main memory are discussed.

To cope with such an accident, for example, a register which stores a write inhibit flag is provided for each erasure unit of the flash memory and the write inhibit flag is turned on for normally unrewritten data. To rewrite a write inhibit area, its corresponding write inhibit flag is turned off to prevent the CPU from being interrupted, then new data is written into the area. If a write into the area occurs with the flag on, the CPU is interrupted and requests the user to take proper action, for example, by displaying a message on a display such as CRT of output means 4061. At the time, the user can recognize that the CPU is in a runaway state, for example, from the display message, and can select data to be saved among data in the cache memory. A program counter contained in the CPU can also be reset. If a similar flag register is also provided in the address array, safety for data in the cache memory is improved.

Figure 92:
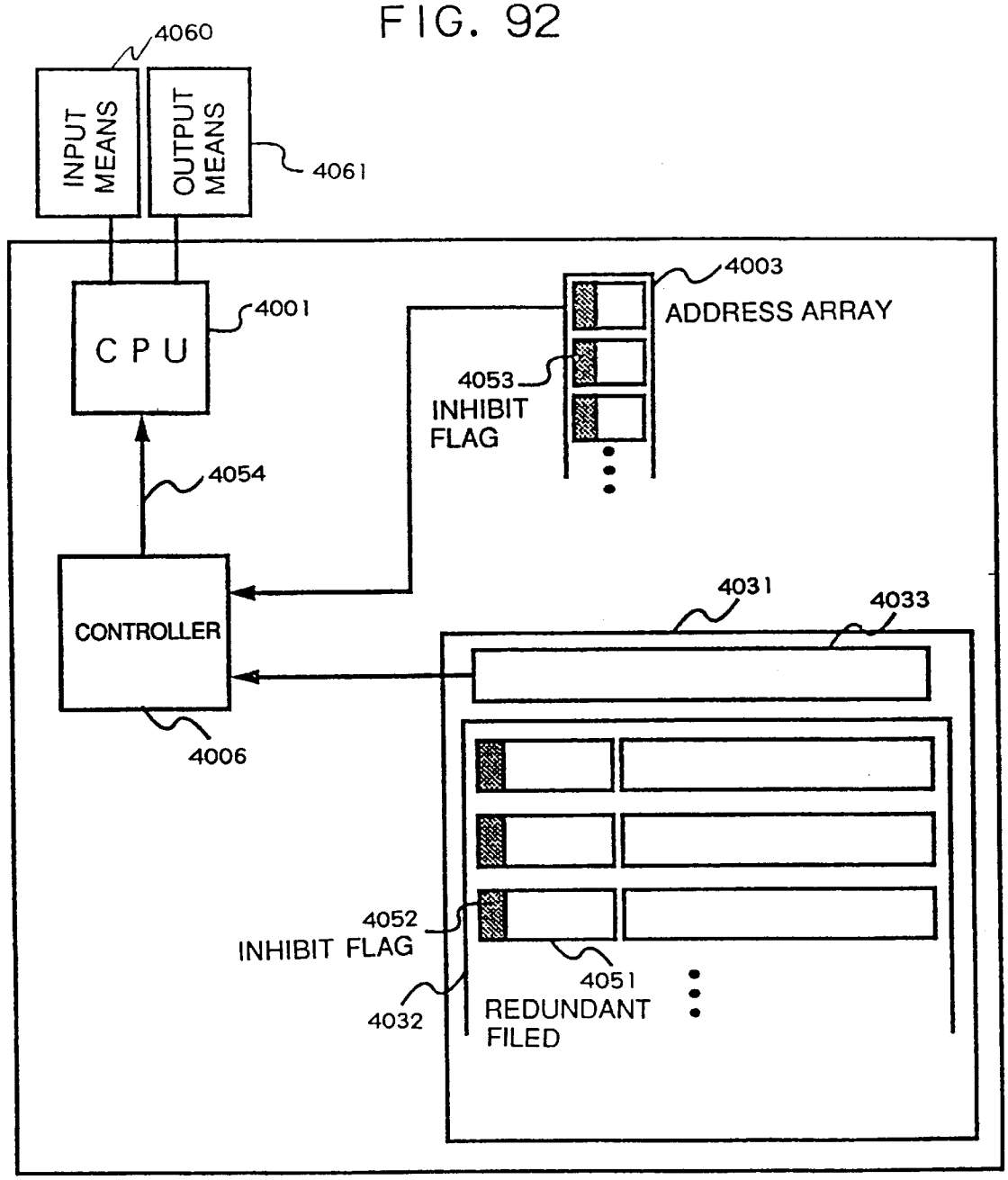
FIG. 92 is an illustration of a configuration example of write inhibit means in the forth embodiment of the present.

FIG. 92 shows a block diagram of a system for carrying out the process.

In FIG. 92, numeral 4001 is a CPU, numeral 4003 is an address array, numeral 4006 is a controller, numeral 4060 is input means, numeral 61 is output means, numeral 4051 is a redundant field provided for each erasure unit of a flash memory, numeral 4052 is a write inhibit flag set in the redundant field 4051, numeral 4053 is a write inhibit flag provided in the address array, and numeral 4054 is an interrupt request signal sent to the CPU, preferably, an unmaskable interrupt signal.

The input means 4060 has at least a function for an external system including the user to enter commands such as data access commands and instructions given to respond to messages (described below); for example, it is implemented by a mouse or keyboard. The output means has an output function of messages (described below) and other necessary information; it can be implemented by display means such as a CRT, EL display, or liquid crystal display.

When a request to write into the flash memory 4031 or the cache memory 4003 occurs, the controller references the write inhibit flag 52 or 53 corresponding to the write access and if the write inhibit flag is on, generates an interrupt request signal 4054 given to the CPU 4001. When receiving the signal, the CPU 4001 unconditionally executes a sequence in which the user is requested to respond to an inquiry. The following are possible as a user response: (1) write, (2) determine runaway state, (3) specify data saved in the main memory from the cache memory, (4) clear the program counter, (5) clear the cache memory, etc. A message may be displayed on a display such as a CRT requesting the user to make a response to an inquiry. The user may respond to the inquiry with a necessary instruction entered through an input device such as a mouse or keyboard. The CPU 4001 may be adapted to perform processing corresponding to the instruction according to a prestored program.

Now, losing important data due to CPU runaway can be avoided to some degree.

In all examples given above, the cache memory 4003 is connected directly to the CPU 4001 via the bus. However, in some information apparatus, a memory bus controller, SRAM cache system, or the like may be inserted between the CPU 4001 and the cache memory 4003. In the invention, the CPU 4001 also contains this configuration. It is an important point that the cache memory 4003 is directly connected to the memory bus contained in the information processing system.

When the power is turned off to stop a job, data in the cache memory needs to be saved in the flash memory. Data in the cache memory accessed as a read and therefore not rewritten need not be saved. In contrast, for data accessed as a write and therefore rewritten, new data exists in the cache memory, but not in the flash memory. If the data is not saved, the most recent data is lost.

To provide a so-called resume function, when data is saved, it is also necessary to store information stored in the registers of the CPU and internal data existing in the data storage sections of a display, input/output devices, etc. That is, the resume function can be provided by saving all data required for restarting. Thus, the power is not turned off by a mechanical switch and means for executing a sequence of logically processing power off information is required. Such means can be provided by using CPU, ROM, RAM, CMOS. In this case, a program for the CPU to perform necessary processing may be stored in the ROM.

To prevent data stored in the cache memory from being lost, it is effective to write the data in the cache memory back into the flash memory periodically. If an SRAM or FRAM (ferroelectric random access memory) with backup power is used as the cache memory, data will not be lost although a high-speed random access is enabled.

As described above, according to the invention, a system using a flash memory having a slow data rewrite speed as the main memory can be constructed and the resume function and the quick start function can be easily provided without battery backup.

Since the flash memory that can be less expensive than DRAM is used as the main memory, the large-capacity main memory can be provided at low cost.

Further, the main memory is made of nonvolatile storage means, whereby a magnetic disk unit or any other external storage device becomes unnecessary, simplifying the system. Furthermore, a file access during processing can be made at high speed, improving the system performance. In addition, the invention is characterized by the fact that the memory system can use various flash memory chips of not only NOR type intended mainly for random access performance, but also NAND and AND types in the line access system.

Figure 93:
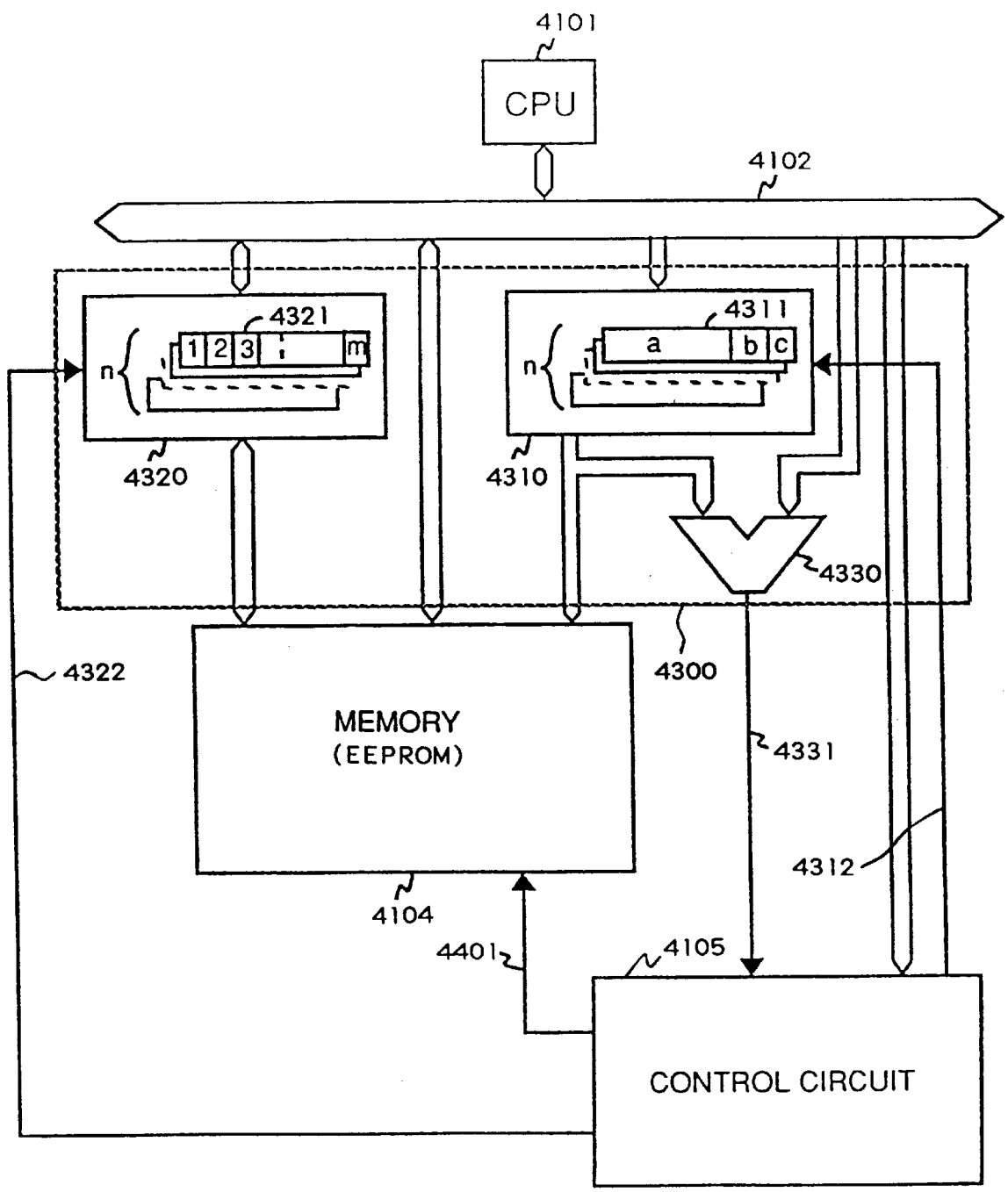
FIG. 93 is a schematic block diagram showing an example intended for high-speed write back processing in the forth embodiment of the invention.

FIG. 93 shows a schematic block diagram of another example system.

In FIG. 93, numeral 4101 is a CPU, numeral 4102 is a bus, numeral 4300 is a cache memory system in a copy back system, numeral 4104 is a main memory consisting of flash memory chips where one block consists of m bytes (m being an integer), and numeral 4105 is a control circuit. The cache memory system 4300 contains an address array 4310 for retaining address information, a cache memory 4320 for retaining data, and an address comparator 4330 for comparing the addresses in the address array 4310 with an address from the CPU 4101. The cache memory for retaining data, 4320, consists of n m-byte registers 4321 (n being an integer). The address array for retaining addresses, 4310, is made up of n registers 4311 each consisting of an address field a for retaining address information, an erasure information field b for retaining information indicating whether or not the block in the memory 4104 corresponding to the address information retained in the address field a is already erased, and an update information field c for retaining information indicating whether or not the corresponding register in the address array 4310 is updated. The update information field c is an already existing field, but the erasure information field b is a new field provided in the invention. Numerals 4312 and 4322 are control signals of the address array 4310 and the cache memory 4320.

Figure 94:
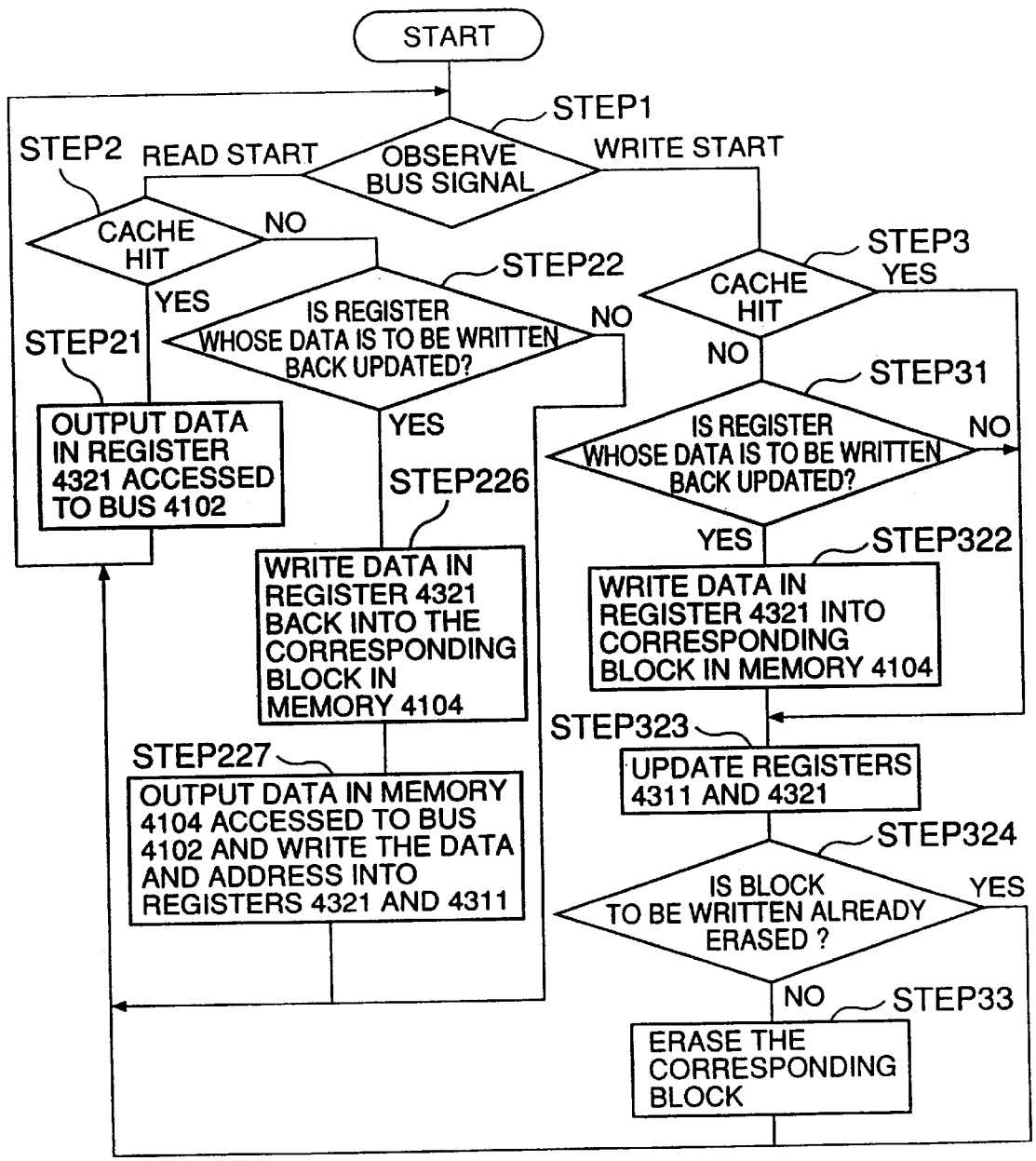
FIG. 94 is a process flowchart of a control circuit shown in FIG. 93.

FIG. 94 is a process flowchart of the control circuit 4105 in FIG. 93. The example system in FIGS. 93 and 94 assumes that the CPU 4101 always accesses the memory 4104 in block size units of the memory 4104.

The process flow shown in FIG. 94 is discussed.

When a read access to the memory 4104 from the CPU 4101 occurs at step 1, if a cache hit is determined in response to a hit determination signal 4331 from the comparator 4330 at step 2, data is output from the corresponding register 4321 in the cache memory 4320 to the bus 4102 at step 21 and the CPU 4101 reads the data. Likewise, if a miss is determined at the read access, when it is recognized that the register 4321 into which data is to be written back in the cache memory 4320 is not updated from information in the update information field c of the register 4311 selected according to a cache memory replacement algorithm at step 22, step 226 at which data in the register 4321 is written back into the memory 4104 is omitted and data in the corresponding block in the memory 4104 is output to the bus 4102 and the address and data are written into the corresponding registers 4311 and 4321 respectively in the cache memory 4300 at step 227.

In the specification, the state in which the register 4321 is not updated refers to a state in which the data in the corresponding block in the memory 4104 is the same as the data stored in the register 4321. At step 227, information indicating non-update is written into the update information field c of the register 4311. Upon completion of step 227, control is returned to step 1 at which a wait is made for the CPU 4101 to make another access.

When a miss is determined at the read access from the CPU 4101, if it is recognized that the register 4321 in the cache memory 4320 is updated from information in the update information field c of the register 4311 selected according to the replacement algorithm at step 22, control goes to step 226 at which a write is made into the corresponding block in the memory 4104 from the register 4321, namely, the updated data in the cache memory is written back into the corresponding block in the memory 4104. Subsequently, the data in the block in the memory 4104 accessed as read from the CPU 4101 is output to the bus 4102 and at the same time, the data and address are written into the registers 4321 and 4311 at step 227. As described above, at step 227, information indicating non-update is written into the update information field c of the register 4311, and upon completion of step 227, control is returned to step 1 at which a wait is made for the CPU 4101 to make another access.

When a write access to the memory 4104 from the CPU 4101 occurs at step 1, if a cache hit is determined at step 3, write address and data are written into registers 4311 and 4321 at step 323.

When a miss is determined at step 3 and if it is recognized that data retained in the register 4321 is already updated from information in the update information field c of the register 4311 selected according to the replacement algorithm at step 31, all data in the register 4321 is written back into the corresponding block in the memory 4104 at step 322. At step 322, information indicating non-erasure is also written into the erasure information field b of the register 4311. Upon completion of step 322, the write address and data from the CPU 4101 are written into the registers 4311 and 4321 at step 323. At step 323, information indicating already updated is also written into the update information field c of the register 4311.

If it is recognized that the data retained in the register 4321 is not updated from the information in the update information field c of the register 4311 at step 31, control goes to step 323 because writing back of data at step 322 is not required.

Upon completion of step 323, whether or not the block to be written is already erased is determined. If it is not erased, previous erasure process of the block is started at step 33. Then, control is returned to step 1 at which a wait is made for the CPU 4101 to make a new access.

The process flow in FIG. 94 is characterized by the fact that the corresponding block in the memory 4104 is previously erased at step 33 after the registers 4311 and 4321 are updated at step 323. In this case, originally, updating the registers 4311 and 4321 in the cache memory in the copy back system would have sufficed. However, since information indicating updated is set in the update information field c accompanying the updating, the contents of the register 4321 will be written back into the corresponding block in the memory 4104 in the future. At this time, erasing the block will be required before the writing back. Since the corresponding block which will be erased in the future is previously erased in the example system, the erasure step which should be performed before data is written back into a new block in the memory 4104 (step 322) when a cache miss occurs at the next or later write access is omitted, namely, the erasure time is saved.

Figure 98:
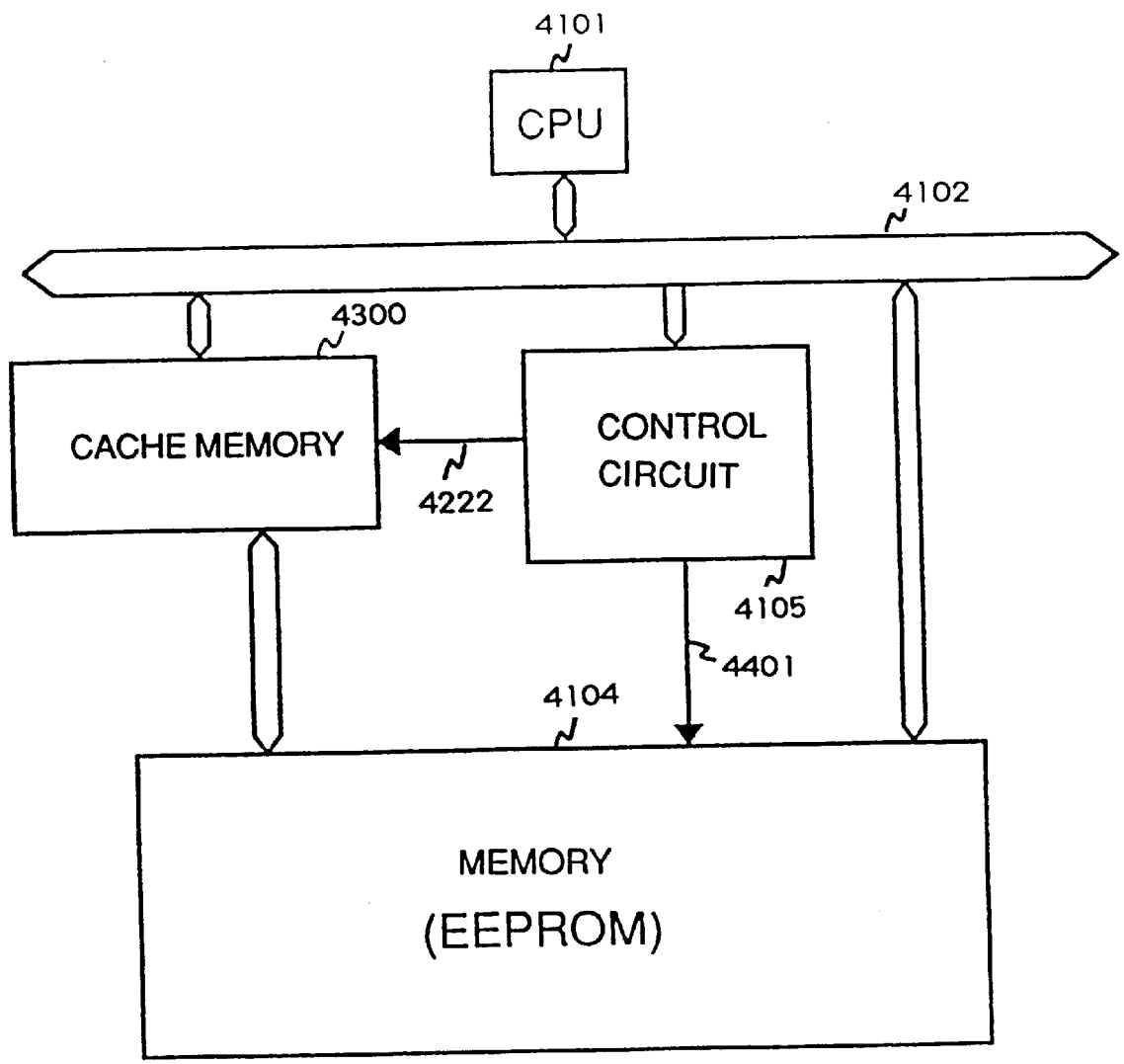
FIG. 98 is a block diagram of one embodiment of a system for embodying the invention.
Figure 99A:
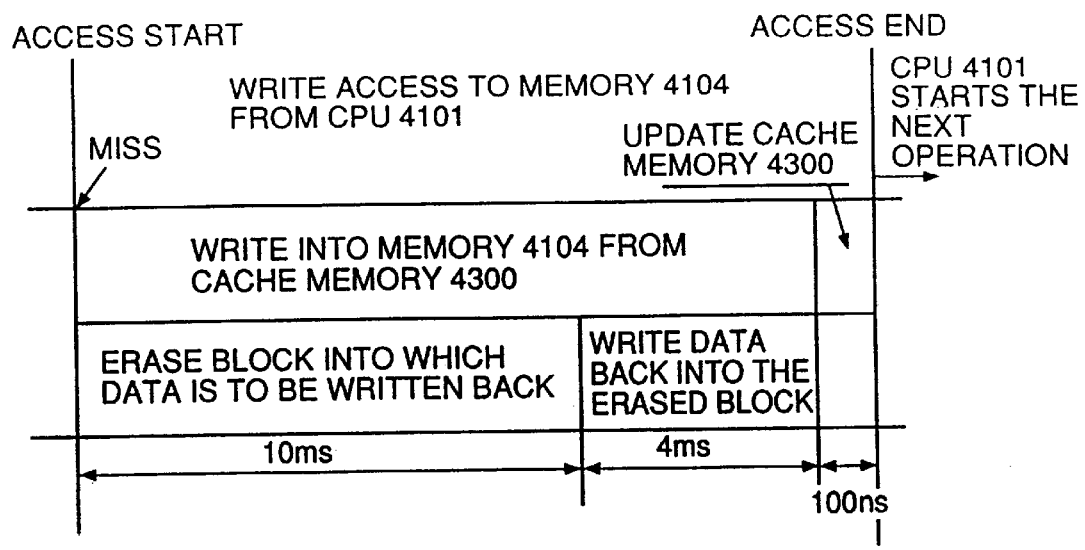
FIG. 99 is a drawing showing one example of the effect of the forth embodiment of the present invention.
Figure 99B:
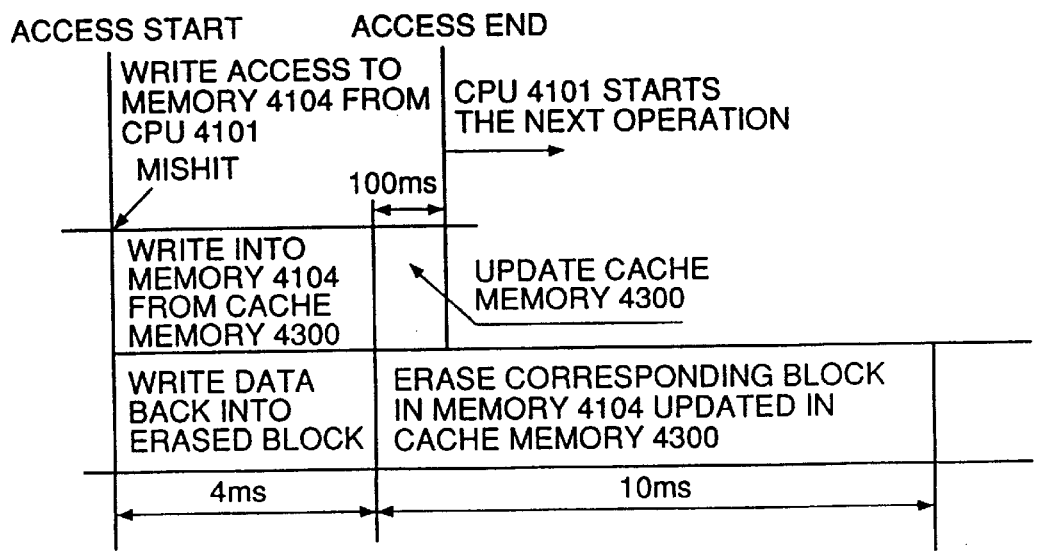

Referring to FIG. 99, the effect of the example system is described. To compare the access time in a conventional system with that in the example system, assume that the block erasure time is 10 ms, that the write time into the block is 4 ms, and that the update time of the cache memory shown in FIG. 98 is 100 ns. Now, assume that the CPU 4101 makes a write access to the memory 4104 and that an address miss occurs. In the conventional system, when the address miss occurs, erasing the block into which data is to be written back from a selected data register (10 ms) is started, then the data in the register 4321 in the cache memory 4300 is written back into the block in the memory 4104 (4 ms) and further the cache memory 4300 is updated (100 ns). The access write is now complete and the CPU 4101 starts the next operation. Therefore, the write access takes about 14 ms in total.

In contrast, in the example system of the invention, when the address miss occurs, the block into which data is to be written back has already been erased even if the selected data register is already updated (write back required). Therefore, the step of writing data back into the block (4 ms) can be started immediately. Thus, the write access in the example system takes about 4 ms in total, indicating that the write access time can be reduced by about 70% for the CPU 4101 to start the next operation compared with that in the conventional system. Performed as the next step is erasure of the corresponding block when the data updated in the cache memory 4300 is written back.

Figure 95:
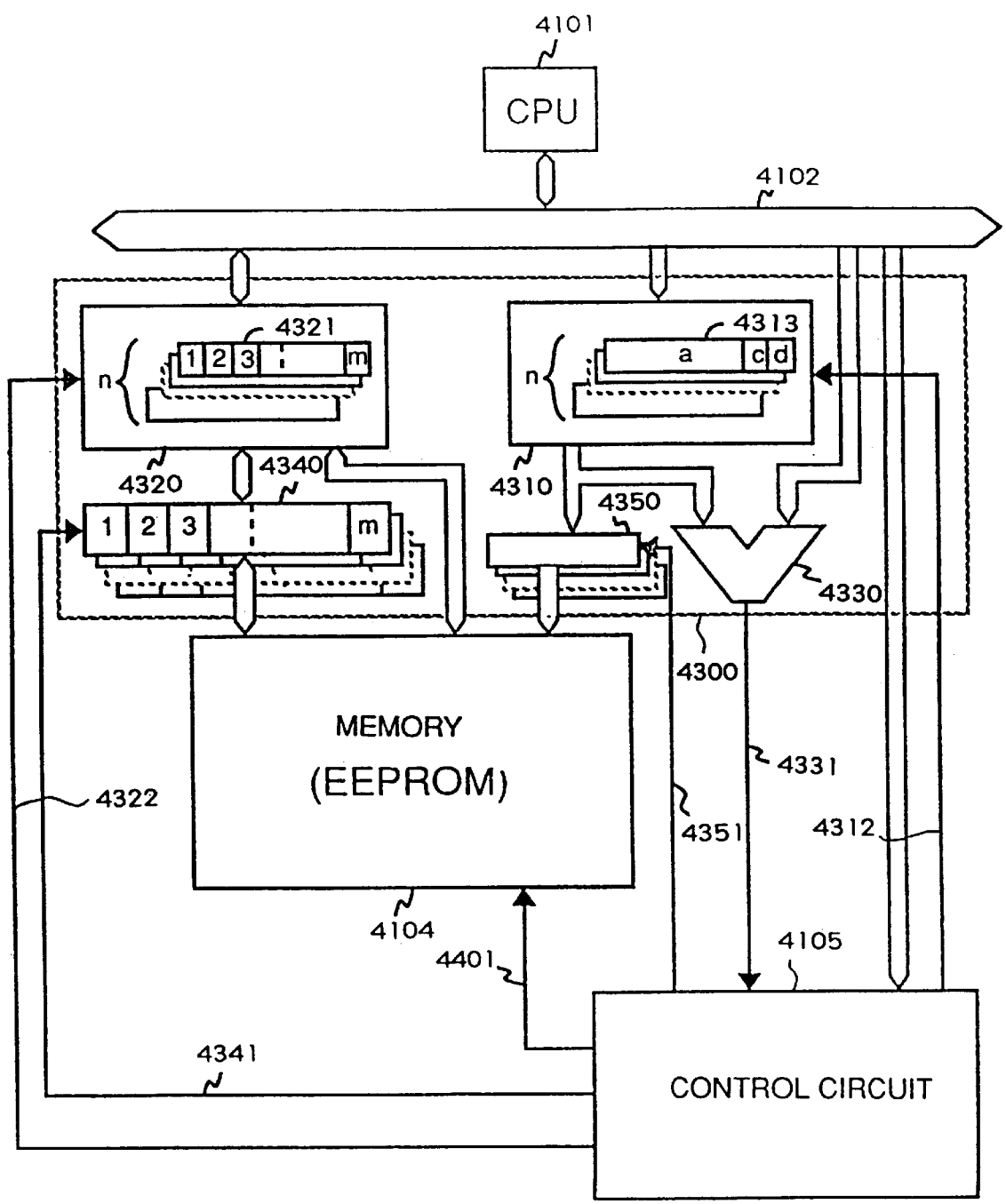
FIG. 95 is a schematic block diagram showing another example intended for high-speed write back processing in the for the embodiment of the present invention.

FIG. 95 shows a schematic block diagram of an example system when the size of access data to the memory 4104 from the CPU 4101 is smaller than the block size of the memory 4104. Members identical with those shown in FIG. 93 are denoted by the same reference numerals in FIG. 95.

In FIG. 95, numeral 4313 is a register consisting of an address information field a for retaining address information, an update information field c for retaining information indicating whether or not the corresponding register 4321 in the cache memory 4320 has been updated, and an update area information field d for retaining information indicating an updated area in the register 4321. Numeral 4350 is an address information register used to write into the memory 4104 and numeral 4340 is an m-byte data register used to write into the memory (m bytes correspond to one block of the memory 4104). n address information registers 4350 are provided corresponding to the registers 4313 of the address array 4310. Likewise, n data registers 4340 are provided corresponding to the registers 4321 of the cache memory 4320.

Figure 96:
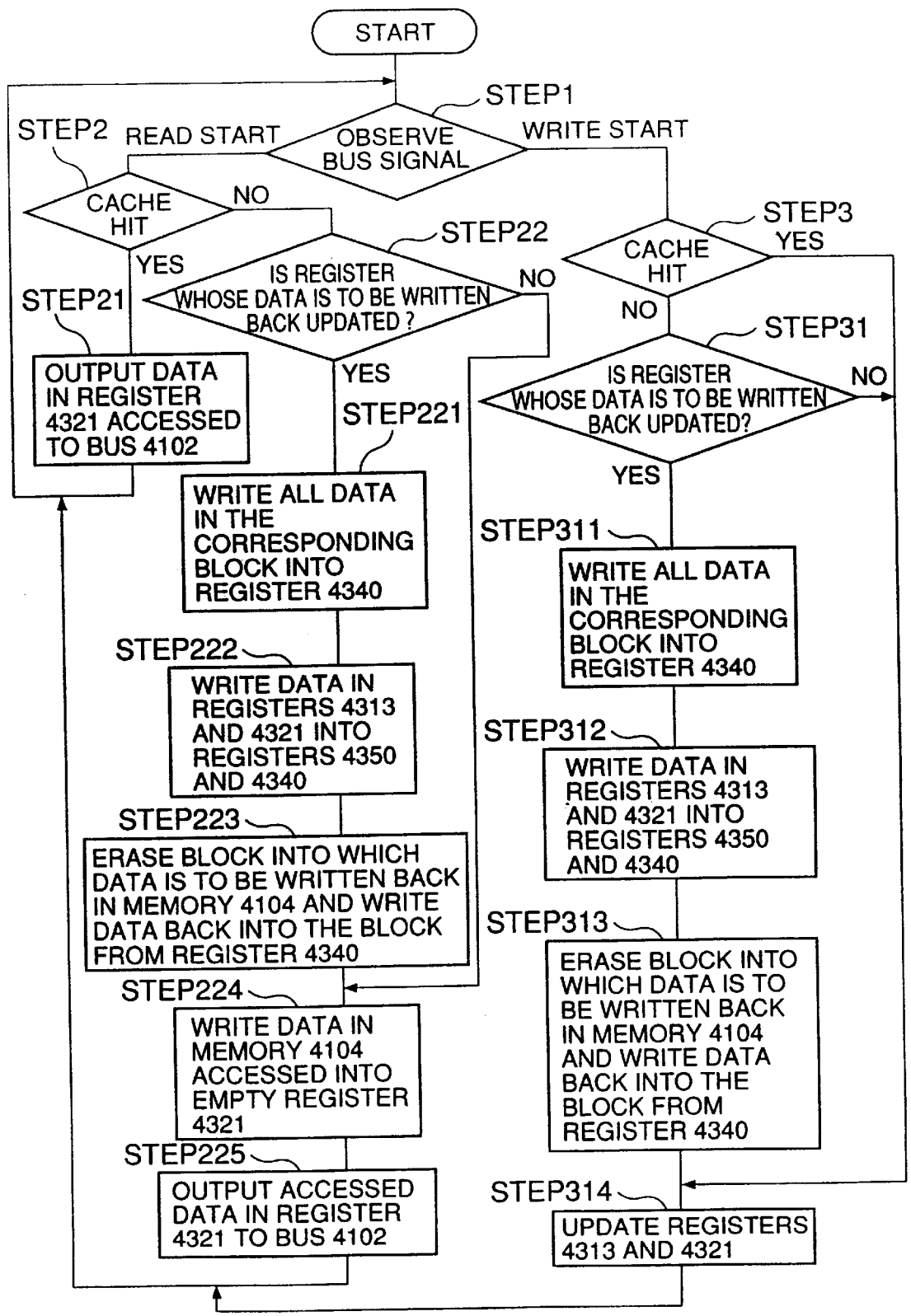
FIG. 96 is a process flowchart of a control circuit shown in FIG. 95.
Figure 97:
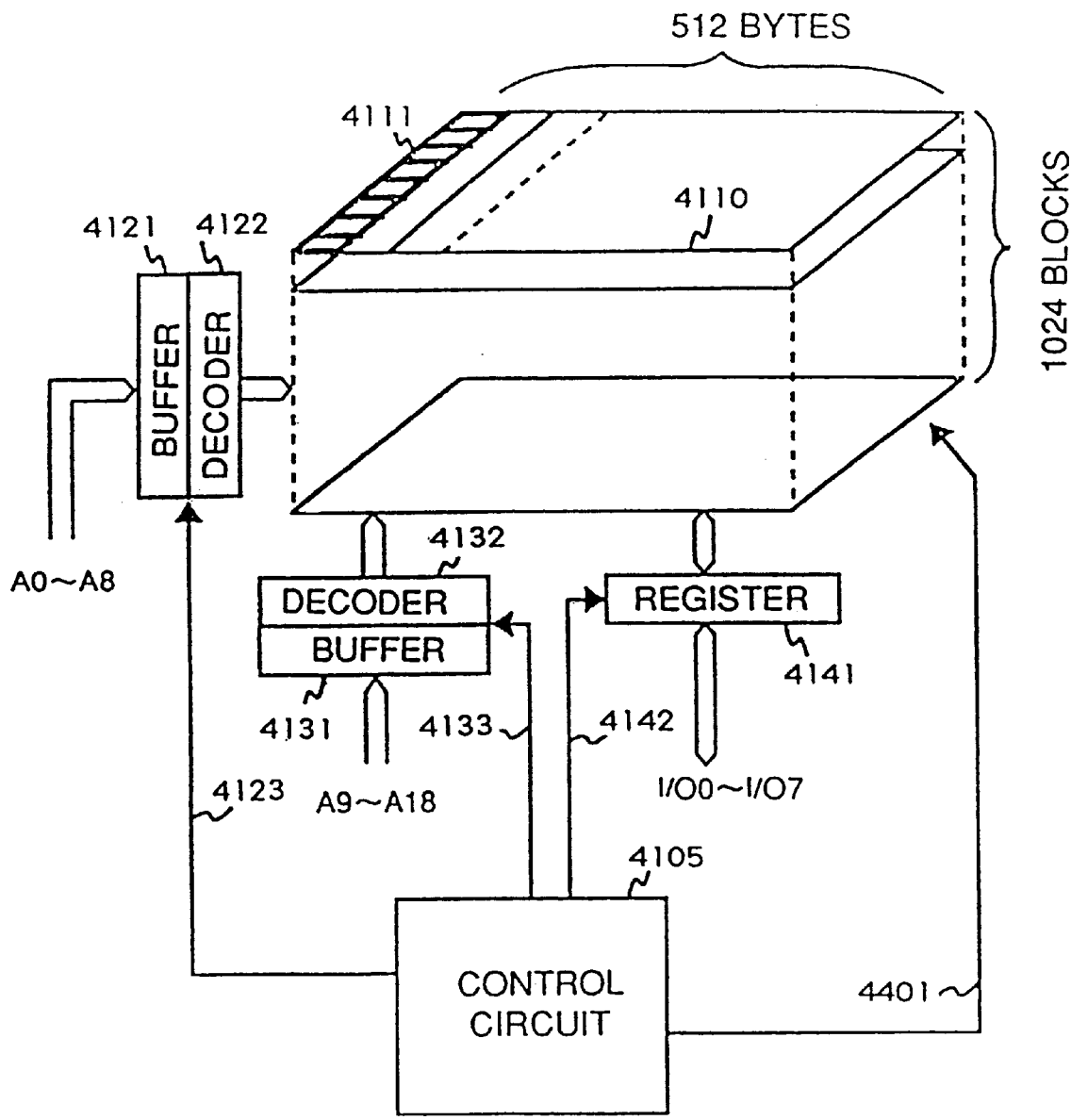
FIG. 97 is a schematic drawing showing a flash memory having a memory size of 524288 bytes.

FIG. 96 shows a process flow of the control circuit 4105 in FIG. 95. The process flow is discussed. In the process, for the block erasure operation in the example system in FIG. 93, steps taken for the difference between the access data size and the block size is only described. A process flow considering the block erasure operation is described below.

When a read access to the memory 4104 from the CPU 4101 occurs at step 1, if a cache hit is determined in response to a hit determination signal 4331 from the comparator 4330 at step 2, data in the corresponding area of the accessed register 4321 is output to the bus 4102 at step 21 and the CPU 4101 reads the data. Likewise, if a miss is determined at the read access at step 2, when it is recognized that the register 4321 into which data is to be written back in the cache memory 4320 is not updated from information in the update information field c of the register 4313 selected according to a cache memory replacement algorithm at step 22, all data in the block of the memory 4104 corresponding to the read address from the CPU 4101 is written into the register 4321 at step 224.

In the specification, as described above, the state in which the register 4321 is not updated refers to a state in which the data stored in the register 4321 is the same as the corresponding data in the memory 4104. At step 224, information indicating non-update is written into the update information field c of the register 4311. Upon completion of step 224, the accessed data in the register 4321 requested by the CPU 4101 is output to the bus 4102 at step 225.

If it is recognized that the register 4321 into which data is to be written back is updated at step 22, all data in the block of the memory 4104 corresponding to the address information in the register 4313 is read out and written into the register 4340 at step 221. Upon completion of step 221, only data updated in the register 4321 is written into the corresponding area of the register 4340 in response to information in the update area information field d of the register 4313 and the address information in the register 4313 is written into the register 4350 at step 222. Upon completion of step 222, the block of the memory 4104 corresponding to the address information in the register 4350 is erased and all data in the register 4340 is written into the erased block at step 223. Upon completion of step 223, control goes to steps 224 and 225. Upon completion of step 225, control is returned to step 1 at which a wait is made for the CPU 4101 to make another access.

When a write access to the memory 4104 from the CPU 4101 occurs at step 1, if a cache hit is determined at step 3, control goes to step 314 at which write data from the CPU 4101 is written into the corresponding area of the register 4321 and information indicating updated is written into the update information field c of the register 4313 and information indicating the updated area of the register 4321 is written into the update area information field d. When a miss is determined at step 3 and if it is recognized that the register 4321 into which data is to be written back is not updated from information in the update information field c of the register 4311 at step 31, control goes to step 314 and the registers are updated as described above. As described above, in the specification, the state in which the register 4321 is not updated refers to a state in which the corresponding data in the memory 4104 is the same as the data stored in the register 4321. If it is recognized that the register 4321 into which data is to be written back in the memory 4104 is already updated at step 31, all data in the block of the memory 4104 corresponding to the address information in the register 4313 is read out and written into the register 4340 at step 311. Upon completion of step 311, only data updated in the register 4321 is written into the corresponding area of the register 4340 in response to information in the update area information field d of the register 4313 and the address information in the register 4313 is written into the register 4350 at step 312. Upon completion of step 312, the block of the memory 4104 corresponding to the address information in the register 4350 is erased and all data in the register 4340 is written into the erased block at step 313. Upon completion of step 313, control goes to steps 314 and the registers are updated as described above. Upon completion of step 314, control is returned to step 1 at which a wait is made for the CPU 4101 to make another access.

According to the example system discussed with reference to FIG. 95, even if the size of a write access from the CPU 4101 is smaller than the block size of the memory 4104, data in the block to be written back is temporarily stored in a register 4340 and only the block part into which new data is to be written is updated in the register 4340, then all the data in the register 4340 is written into the corresponding block of the memory 4104 in a batch, thereby enabling a partial write in the block. Even if the size of a read access from the CPU 4101 is smaller than the block size of the memory 4104, all data in a given block is temporarily stored in a register 4321 and only the corresponding data in the register 4321 is output to the bus 4102, whereby partial data in the block can be read out.

Figure 100:
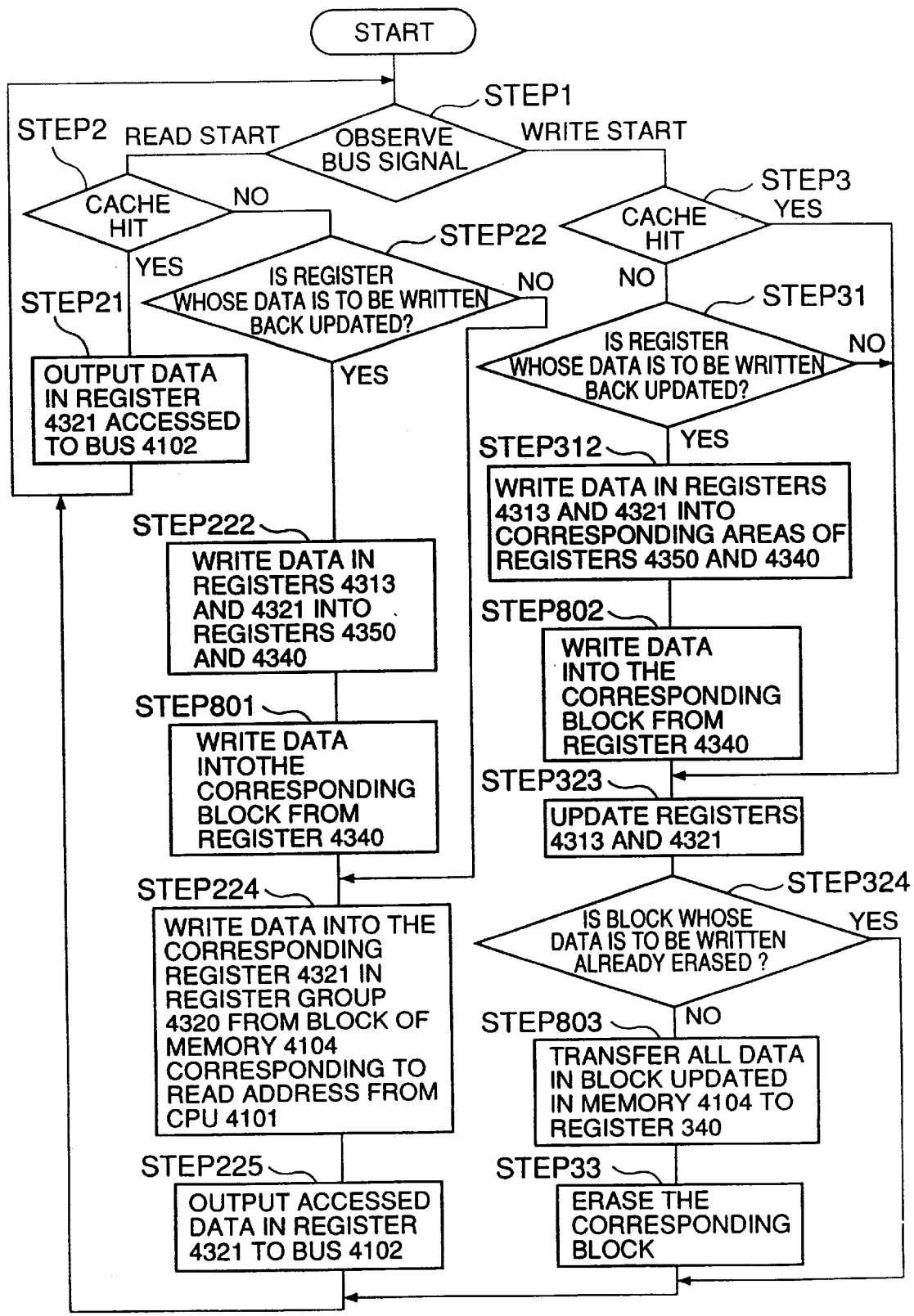
FIG. 100 is a flowchart showing a process flow provided by combining the process flows in FIGS. 94 and 96.

FIG. 100 is a process flow provided by combining the steps in FIGS. 94 and 96 for considering previous block erasure in FIG. 94 in the process flow in FIG. 96. Therefore, the erasure information field b shown in FIG. 93 is added to the register 4313 in FIG. 95.

Steps identical with or similar to those previously described with reference to FIGS. 94 and 96 are denoted by the same reference numerals in FIG. 100. Step 223 in FIG. 96 is replaced with step 801 and steps 322 in FIG. 94 and step 313 in FIG. 96 are replaced with step 802. Step 803 is newly added preceding step 33 in FIG. 94. The flow enables previous block erasure if the size of a write access from the CPU 4101 is smaller than the block size of the memory 4104.

The flow in which a cache memory hit occurs at step 3 and the information in the erasure information field b of the corresponding register 4313 indicates that the block of the memory 4104 corresponding to the memory write access is not updated and thus control goes to step 803 is possible under either of the following two conditions: In one condition, before update is executed by the hit memory write access, steps 224 and 225 are executed by a miss read access, thereby reading data from block of the memory 4104 and storing the data in register 4321. In this case, the read block of the memory 4104 is not erased. Thus, if a write access is made to the same address in the state, it becomes a cache hit memory write access and control goes to step 803 from step 3. In the other condition, a memory write access to the memory 4104 occurs when only the data in the memory 4104 is valid and the data in the cache memory registers 4321, 4313, 4340, 4350 is invalid, namely, in the empty state after the off-to-on transition of power is made. Since register replacement does not occur at this time, the memory write access can be handled as a cache hit. The corresponding block in the memory 4104 is only erased and update is omitted. Only the corresponding register 4321 is updated. Therefore, control goes to step 803 from step 3.

Figure 101:
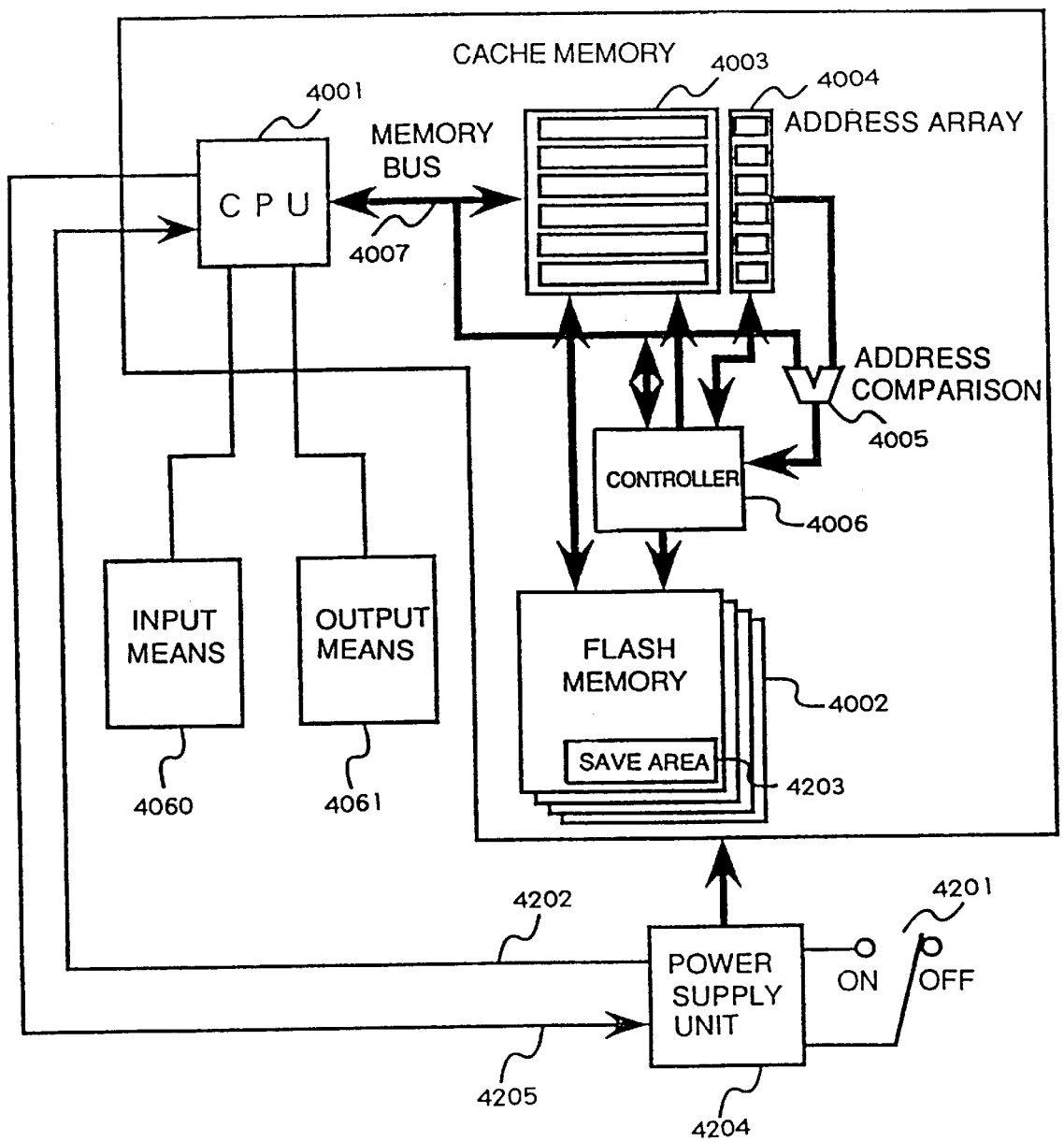
FIG. 101 is a block diagram of an example system for retaining data in an address array according to the forth embodiment of the present invention.
Figure 102:
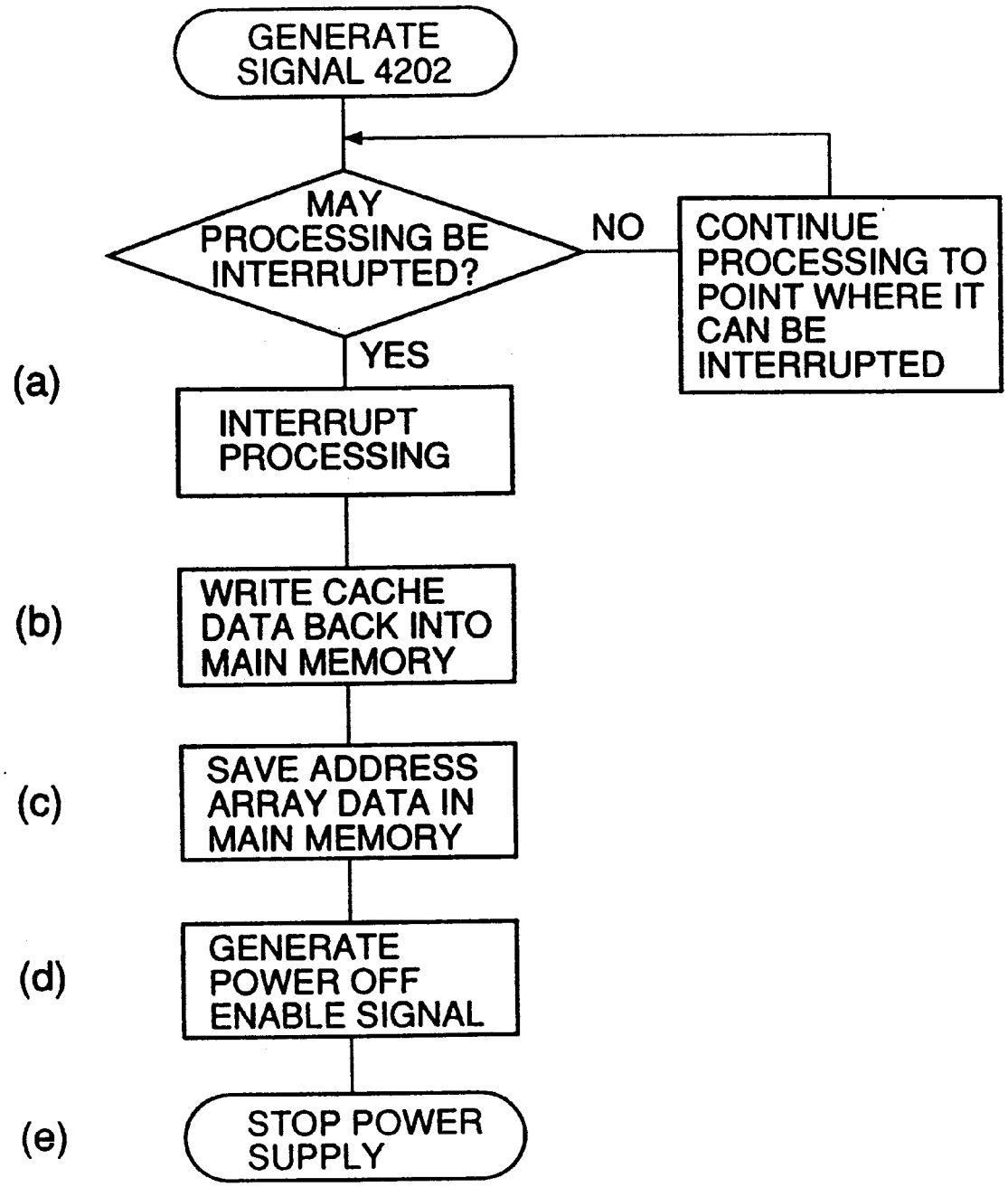
FIG. 102 is a flowchart showing an operation flow of saving address array data by a controller in the example system in FIG. 101.

Another example of the fourth embodiment is discussed with reference to FIGS. 101 to 103. FIG. 101 is a drawing showing that an area to save address array data is reserved in flash memory 4002. Members identical with those previously described are denoted by the same reference numerals in FIG. 101. In FIG. 101, numeral 4201 is a power switch of the information processing system; the power switch 4201 is not a switch for mechanically turning off the power and has a function of outputting a power off request signal 4202 to the CPU 4001 through a power supply unit 4204 of the information processing system. When receiving the power off request signal 4202, the CPU 4001 is adapted to execute a power off routine. Numeral 4203 is an address array data save area reserved in the flash memory 4002. Numeral 4205 is a power off enable signal output to the power supply unit 4204 from the CPU 4001. The power off enable signal 4205 is negated whenever the information processing system operates; when the power switch 4201 is turned off and the CPU 4001 completes execution of the power off routine, the signal 4205 is asserted and at this time, the power supply unit 4204 operates so as to stop the power supply. FIG. 102 is a power off routine executed after the CPU 4001 receives the power off request signal 4202.

Referring to FIG. 101, the operation of the example system is described according to the flow in FIG. 102.

Assume that the CPU 4001 receives the power off request signal 4202 while it is performing some processing. The current processing is interrupted at step a except when the current processing cannot be interrupted because it is related to an external device. If it cannot be interrupted, the CPU 4001 continues the current processing until it reaches a condition in which it may be interrupted. Preferably, the processing should be interruptable in every condition. Next, write data from the CPU 4001 stored in the cache memory 4003 is written back into the corresponding area of the flash memory 4002 by referencing the address array 4004 at step b. If write data and read data are not distinguished or a process is to be simplified, all data in the cache memory may be written back. However, it takes time and preferably only write data is written back. Next, address data, stored in the address array 4004, indicating the correspondence between data in the cache memory 4003 and data in the flash memory 4002 is saved in the save area 4203 of the flash memory 4002 at step c. Upon completion of these steps, the CPU 4001 outputs the power off enable signal 4205 to the power supply unit 4204 at step d. When receiving the signal 4205, the power supply unit 4204 stops power supply to the information processing system at step e.

Figure 103:
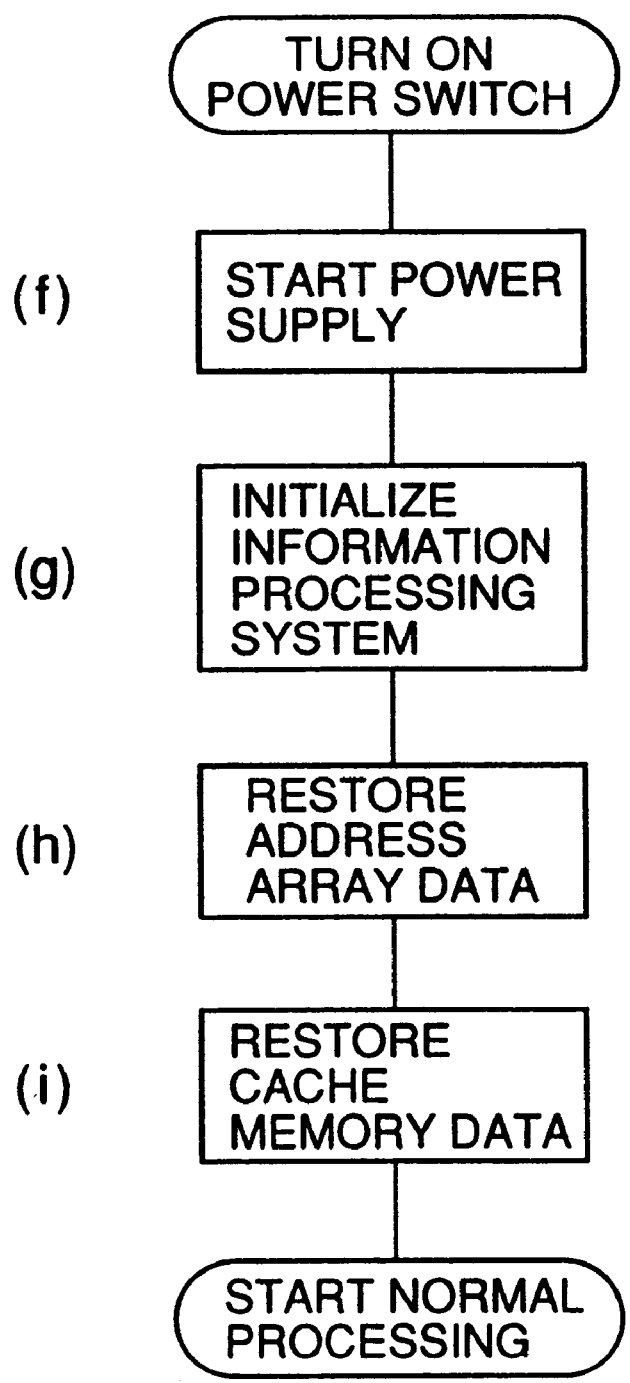
FIG. 103 is a flowchart showing an operation flow of restoring address array data and cache memory data by the controller in the example system in FIG. 101.

On the other hand, FIG. 103 is a flow when power supply is started. Referring to FIG. 101, the flow is discussed. First, when the power switch is turned on, unconditionally the power supply unit 4204 operates so as to supply power to the information processing system at step f. Next, the CPU 4001 executes initialization processing required for the information processing system at step g, such as checking the devices for operation and setting in the internal registers. Next, the data in the address array data save area 4203 of the flash memory 4002 is transferred to the address array 4004 at step h. Next, the address array 4 is referenced and the data stored in the cache memory 4003 just before the power is turned off is taken out from the corresponding area of the flash memory 4002 and stored in the corresponding area of the cache memory 4003 at step i. By executing these steps, the cache memory can be easily restored to the state before the power was turned off and can respond to a later access from the CPU with a high hitting average. If the steps are not executed, several successive misses occur in accessing for some time after the power is again supplied to start up the information processing system, causing considerable performance degradation.

A volatile memory is used as the address array 4004 in the examples. However, if a nonvolatile memory is used as the address array 4004, after the power is turned on again, neither the step of saving the data stored in the address array 4004 nor the step of restoring the saved data of the address array 4004 are required. In this case, the address array 4004 can preferably be accessed at random (for both read and write), thus an SRAM or FRAM (ferroelectric random access memory) with backup power should be used.

An example of a system for reducing damage when the power is turned off abruptly is discussed. The data written by a write access and stored in the cache memory will be lost when the power is turned off before the data is written back into the flash memory. Thus, when the power is turned off, the data must be stored in the flash memory. To save the data when the power is turned off, a power off request is recognized before the actual power off is executed, and after the data is stored in the flash memory, the power is turned off. However, if the power is turned off abruptly, the data cannot be stored in the flash memory and the data stored in the cache memory, but not written back into the flash memory will be lost. This also applies to saving the address array data in the above-given example. To prevent such an accident from occurring as much as possible, the data in the cache memory is written back into the flash memory periodically.

Figure 49:
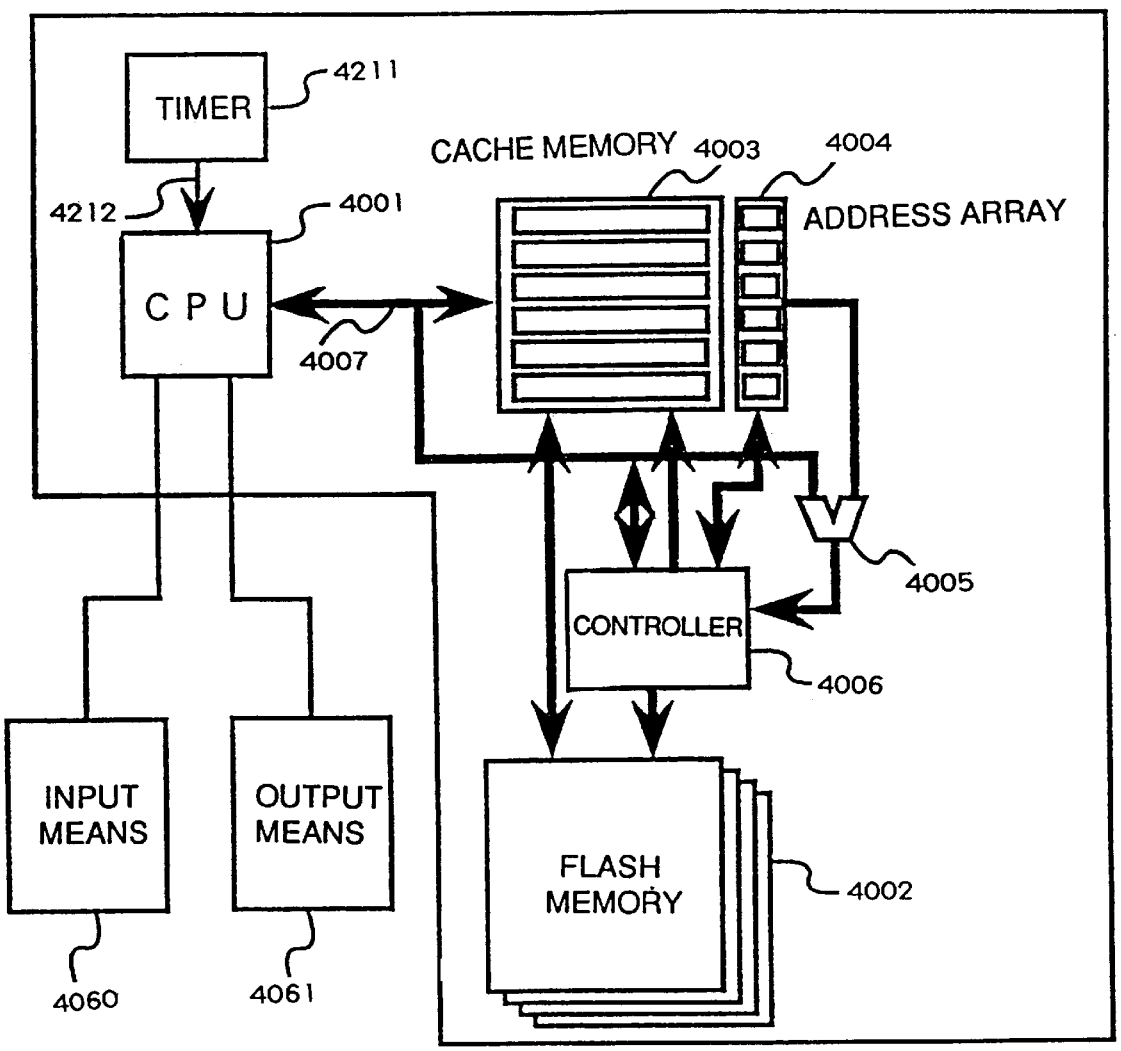
FIG. 49 is a block diagram of an example system for writing back cache memory data every given time according to the fourth embodiment of the present invention.

FIG. 49 shows a configuration for the purpose, wherein numeral 4211 is a timer for measuring the periodical time and numeral 4212 is a timer interrupt signal input to the CPU every given period of time. Other numerals are the same as those discussed earlier The timer 4211 generates the timer interrupt signal 4212 every given time period and sends it to the CPU 4001. When receiving the signal, the CPU 4001 writes the data stored in the cache memory 4003, but not written back into the flash memory 4002, into the corresponding area of the flash memory 4002.

If the given time period measured by the timer 4211 is short, rewriting of the flash memory 4002 occurs often, degrading the flash memory 4002. In contrast, if the time period is long, when abrupt power off occurs, the possibility that the data will be lost, and the lost data amount become large. Therefore, the time interval should be made as short as possible at a degree at which the flash memory is not destroyed. Preferably, the time interval is determined by the number of times the flash memory can be rewritten and the life of the information processing system. An expression to calculate the time interval is given below:

$$(\text{time interval}) >= \frac{(\text{use time of information processing system})}{(\text{number of times flash memory can be written})} \quad \text{Expression 1}$$

For example, assuming that the information processing system is used for eight hours a day on average and its goal life is five years and that the number of times the flash memory can be rewritten is 1000000, data can be saved every 53 seconds. If the data stored in the address array is saved at the same time, even if a volatile memory is used as the address array, the probability that the data will be lost due to abrupt power off becomes low and lowering the hitting average just after restart-up can be avoided.

Needless to say, even if the example system is provided, the final data should be saved when the power is turned off.

According to the invention, a flash memory can be used as a main memory of an information processing system to provide the resume function and the quick start function without backup power; a large-capacity main memory can be constructed at low cost.

At this time, save processing at power off is performed for securing safety of data. Further, write protect means taken for program upset is provided for increasing safety of data.

According to the invention, a memory block which will be erased in the future is previously erased accompanying the copy back cache memory contents being updated, thus if a write back into the block occurs, an erasure step is omitted and immediately a write step can be started. Therefore, the access time to a memory system using a flash memory can be reduced.

Means for enabling cache memory data to be restored when the power is temporarily turned off and on again can be provided for improving the hitting average after the power is turned on again.

Data in the cache memory or address array is written into the flash memory periodically, whereby the data will not be lost, or the amount of lost data can be reduced, even if the power supply is stopped abruptly.

What is claimed is:

1. A storage system having a semiconductor memory section comprising a storage section using a flash memory as a storage medium and a host system which transfers information to and from said semiconductor memory section, said semiconductor memory section including:
an interface circuit transferring information to and from said host system;
a control circuit controlling a read/write of information from/into said storage section and detecting an error incurring area of said storage section; and memory management means retaining a used or unused state for each area of said storage section, upon detection of an error by said control circuit, for allocating an unused area as an alternate area in place of the error incurring area of said storage section and retaining a correspondence between the allocated alternate area and the error incurring area, said control circuit referencing said memory management means for controlling a read/write of information from/into said storage section.

2. A storage system as claimed in claim 1 wherein said control circuit comprises information means, upon detection of an error incurring area of said storage section, for sending error information indicating detection of the error incurring area of said storage section to said host system and said host system comprises means for detecting receipt of the error information from said information means and means for outputting error information upon detection of receipt of the error information by said information detection means.

3. A storage system as claimed in claim 1 wherein said semiconductor memory section further includes means for retaining predetermined error information;

said control circuit, upon detection of an error incurring area of said storage section, sets error information indicating detection of the error occurring area of said storage section in said error information retention means; and said host system comprises detection means for referencing said error information retention means for detecting the error information and means for outputting error information upon detection of the error information by said detection means.

4. A storage system as claimed in claim 3 wherein said control circuit further detects that no alternate area becomes available in said storage section and further sets error information indicating that no alternate area becomes available in said storage section in said error information retention means.

5. A storage system as claimed in claim 1 wherein said host system comprises input means for accepting an instruction for previously setting a data area for storing data and the alternate area of said storage section as initialization information and setting means responsive to the instruction accepted through said input means for setting the initialization information in said memory management means and said memory management means is responsive to the setting of said setting means for dividing said storage section into the data area and the alternate area for management.

6. A storage system as claimed in claim 5 wherein said memory management means comprises reallocation means for detecting an unused block of an empty area of the data area when no further alternate areas are available, and reallocating the detected unused block to the alternate area and reallocation information means for informing said host system that the unused block is set as the alternate area when the block is reallocated by said reallocation means, and the host system inhibits use of the unused block upon receipt of reallocation information from said reallocation information means.

7. A method for controlling storage in a semiconductor memory using a flash memory as a storage medium comprising the steps of:

previously retaining a write address corresponding to address information indicated for a write from an external system;

retaining a used or unused state of an area indicated by the storage medium write address and upon receipt of a write instruction together with address information from the external system, referencing the previously retained write address corresponding to the address information;

writing into the area indicated by the write address;

setting the used state for the area at the writing and retaining the state;

determining whether or not a write error occurs during writing;

if a write error occurs, allocating an unused area as an alternate area in place of the error incurring area and writing into the alternate area;

changing the previously retained write address to a write address of the alternate area for updating the write address; and informing the external system that the alternate area is used.

8. A method for controlling storage in a semiconductor memory using a flash memory as a storage medium comprising the steps of:

accepting an instruction for dividing a semiconductor memory area into a data area for storing data and an alternate area, when a write error occurs, for allocating an area other than the error incurring area and previously retaining a write address of the data area corresponding to address information and an address of the alternate area in response to the instruction;

retaining a used or unused state of the data area and the alternate area for each address;

upon receipt of a write instruction together with address information, referencing the previously retained write address corresponding to the address information; writing into the area indicated by the time of write address;

setting the used state for the area at the writing and retaining the state;

determining whether or not a write error occurs during writing;

if a write error occurs, allocating an unused area as an alternate area in place of the error incurring area and writing into the alternate area;

changing the previously retained write address to a write address of the alternate area for updating the write address; and setting the used state for the alternate area and retaining the state.

* * * * *